United States Patent
Sorrells et al.

(10) Patent No.: US 8,295,800 B2
(45) Date of Patent: *Oct. 23, 2012

(54) APPARATUS AND METHOD FOR DOWN-CONVERTING ELECTROMAGNETIC SIGNALS BY CONTROLLED CHARGING AND DISCHARGING OF A CAPACITOR

(75) Inventors: David F. Sorrells, Middleburg, FL (US); Michael J. Bultman, Jacksonville, FL (US); Robert W. Cook, Switzerland, FL (US); Richard C. Looke, Jacksonville, FL (US); Charley D. Moses, Jr., DeBary, FL (US); Gregory S. Rawlins, Chuluota, FL (US); Michael W. Rawlins, Lake Mary, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/876,356

(22) Filed: Sep. 7, 2010

(65) Prior Publication Data
US 2011/0059715 A1    Mar. 10, 2011

Related U.S. Application Data

(60) Continuation of application No. 10/961,342, filed on Oct. 12, 2004, now Pat. No. 7,822,401, which is a division of application No. 09/855,851, filed on May 16, 2001, now Pat. No. 7,010,286, which is a continuation-in-part of application No. 09/550,644, filed on Apr. 14, 2000, now Pat. No. 7,515,896.

(60) Provisional application No. 60/204,796, filed on May 16, 2000, provisional application No. 60/213,363, filed on Jun. 21, 2000, provisional application No. 60/272,043, filed on Mar. 1, 2001.

(51) Int. Cl.
*H04B 1/26* (2006.01)
*H04B 15/00* (2006.01)

(52) U.S. Cl. ......... 455/313; 455/323; 455/334; 455/318
(58) Field of Classification Search ................. 455/313, 455/323, 334, 318, 316, 319, 325, 333, 339, 455/340–341, 130, 197.2, 203, 262, 265, 455/284, 287, 326; 327/356–360
See application file for complete search history.

(56) References Cited

U.S. PATENT DOCUMENTS
2,057,613 A    10/1936    Gardner
(Continued)

FOREIGN PATENT DOCUMENTS
DE         1936252         1/1971
(Continued)

OTHER PUBLICATIONS

Aghvami, H. et al., "Land Mobile Satellites Using the Highly Elliptic Orbits—The UK T-SAT Mobile Payload," *Fourth International Conference on Satellite Systems for Mobile Communications and Navigation*, IEE, pp. 147-153 (Oct. 17-19, 1988).

(Continued)

*Primary Examiner* — Pablo Tran
(74) *Attorney, Agent, or Firm* — Workman Nydegger

(57) ABSTRACT

Methods, systems, and apparatuses for down-converting and up-converting an electromagnetic signal. In embodiments, the invention operates by receiving an electromagnetic signal and recursively operating on approximate half cycles of a carrier signal. The recursive operations can be performed at a sub-harmonic rate of the carrier signal. The invention accumulates the results of the recursive operations and uses the accumulated results to form a down-converted signal. In embodiments, up-conversion is accomplished by controlling a switch with an oscillating signal, the frequency of the oscillating signal being selected as a sub-harmonic of the desired output frequency. When the invention is being used in the frequency modulation or phase modulation implementations, the oscillating signal is modulated by an information signal before it causes the switch to gate a bias signal. The output of the switch is filtered, and the desired harmonic is output.

7 Claims, 94 Drawing Sheets

U.S. PATENT DOCUMENTS

| | | | |
|---|---|---|---|
| 2,241,078 A | 5/1941 | Vreeland | |
| 2,270,385 A | 1/1942 | Skillman | |
| 2,283,575 A | 5/1942 | Roberts | |
| 2,358,152 A | 9/1944 | Earp | |
| 2,410,350 A | 10/1946 | Labin et al. | |
| 2,451,430 A | 10/1948 | Barone | |
| 2,462,069 A | 2/1949 | Chatterjea et al. | |
| 2,462,181 A | 2/1949 | Grosselfinger | |
| 2,472,798 A | 6/1949 | Fredendall | |
| 2,497,859 A | 2/1950 | Boughtwood et al. | |
| 2,499,279 A | 2/1950 | Peterson | |
| 2,530,824 A | 11/1950 | King | |
| 2,802,208 A | 8/1957 | Hobbs | |
| 2,985,875 A | 5/1961 | Grisdale et al. | |
| 3,023,309 A | 2/1962 | Foulkes | |
| 3,069,679 A | 12/1962 | Sweeney et al. | |
| 3,104,393 A | 9/1963 | Vogelman | |
| 3,114,106 A | 12/1963 | McManus | |
| 3,118,117 A | 1/1964 | King et al. | |
| 3,226,643 A | 12/1965 | McNair | |
| 3,246,084 A | 4/1966 | Kryter | |
| 3,258,694 A | 6/1966 | Shepherd | |
| 3,383,598 A | 5/1968 | Sanders | |
| 3,384,822 A | 5/1968 | Miyagi | |
| 3,454,718 A | 7/1969 | Perreault | |
| 3,523,291 A | 8/1970 | Pierret | |
| 3,548,342 A | 12/1970 | Maxey | |
| 3,555,428 A | 1/1971 | Perreault | |
| 3,614,627 A | 10/1971 | Runyan et al. | |
| 3,614,630 A | 10/1971 | Rorden | |
| 3,617,892 A | 11/1971 | Hawley et al. | |
| 3,617,898 A | 11/1971 | Janning, Jr. | |
| 3,621,402 A | 11/1971 | Gardner | |
| 3,622,885 A | 11/1971 | Kruszynski et al. | |
| 3,623,160 A | 11/1971 | Giles et al. | |
| 3,626,315 A | 12/1971 | Stirling et al. | |
| 3,626,417 A | 12/1971 | Gilbert | |
| 3,629,696 A | 12/1971 | Bartelink | |
| 3,643,168 A | 2/1972 | Manicki | |
| 3,662,268 A | 5/1972 | Gans et al. | |
| 3,689,841 A | 9/1972 | Bello et al. | |
| 3,694,754 A | 9/1972 | Baltzer | |
| 3,702,440 A | 11/1972 | Moore | |
| 3,714,577 A | 1/1973 | Hayes | |
| 3,716,730 A | 2/1973 | Cerny, Jr. | |
| 3,717,844 A | 2/1973 | Barret et al. | |
| 3,719,903 A | 3/1973 | Goodson | |
| 3,735,048 A | 5/1973 | Tomsa et al. | |
| 3,736,513 A | 5/1973 | Wilson | |
| 3,737,778 A | 6/1973 | Van Gerwen et al. | |
| 3,739,282 A | 6/1973 | Bruch et al. | |
| 3,740,636 A | 6/1973 | Hogrefe et al. | |
| 3,764,921 A | 10/1973 | Huard | |
| 3,767,984 A | 10/1973 | Shinoda et al. | |
| 3,806,811 A | 4/1974 | Thompson | |
| 3,809,821 A | 5/1974 | Melvin | |
| 3,852,530 A | 12/1974 | Shen | |
| 3,868,601 A | 2/1975 | MacAfee | |
| 3,940,697 A | 2/1976 | Morgan | |
| 3,949,300 A | 4/1976 | Sadler | |
| 3,967,202 A | 6/1976 | Batz | |
| 3,980,945 A | 9/1976 | Bickford | |
| 3,987,280 A | 10/1976 | Bauer | |
| 3,991,277 A | 11/1976 | Hirata | |
| 4,003,002 A | 1/1977 | Snijders et al. | |
| 4,004,237 A | 1/1977 | Kratzer | |
| 4,013,966 A | 3/1977 | Campbell | |
| 4,016,366 A | 4/1977 | Kurata | |
| 4,017,798 A | 4/1977 | Gordy et al. | |
| 4,019,140 A | 4/1977 | Swerdlow | |
| 4,020,487 A * | 4/1977 | Winter | 341/170 |
| 4,032,847 A | 6/1977 | Unkauf | |
| 4,035,732 A | 7/1977 | Lohrmann | |
| 4,045,740 A | 8/1977 | Baker | |
| 4,047,121 A | 9/1977 | Campbell | |
| 4,048,598 A | 9/1977 | Knight | |
| 4,051,475 A | 9/1977 | Campbell | |
| 4,066,841 A | 1/1978 | Young | |
| 4,066,919 A | 1/1978 | Huntington | |
| 4,080,573 A | 3/1978 | Howell | |
| 4,081,748 A | 3/1978 | Batz | |
| 4,115,737 A | 9/1978 | Hongu et al. | |
| 4,130,765 A | 12/1978 | Arakelian et al. | |
| 4,130,806 A | 12/1978 | Van Gerwen et al. | |
| 4,132,952 A | 1/1979 | Hongu et al. | |
| 4,142,155 A | 2/1979 | Adachi | |
| 4,143,322 A | 3/1979 | Shimamura | |
| 4,145,659 A | 3/1979 | Wolfram | |
| 4,158,149 A | 6/1979 | Otofuji | |
| 4,170,764 A | 10/1979 | Salz et al. | |
| 4,173,164 A | 11/1979 | Adachi et al. | |
| 4,204,171 A | 5/1980 | Sutphin, Jr. | |
| 4,210,872 A | 7/1980 | Gregorian | |
| 4,220,977 A | 9/1980 | Yamanaka | |
| 4,241,451 A * | 12/1980 | Maixner et al. | 455/202 |
| 4,245,355 A | 1/1981 | Pascoe et al. | |
| 4,250,458 A | 2/1981 | Richmond et al. | |
| 4,253,066 A | 2/1981 | Fisher et al. | |
| 4,253,067 A | 2/1981 | Caples et al. | |
| 4,253,069 A | 2/1981 | Nossek | |
| 4,286,283 A | 8/1981 | Clemens | |
| 4,308,614 A | 12/1981 | Fisher et al. | |
| 4,313,222 A | 1/1982 | Katthan | |
| 4,320,361 A | 3/1982 | Kikkert | |
| 4,320,536 A | 3/1982 | Dietrich | |
| 4,334,324 A | 6/1982 | Hoover | |
| 4,346,477 A | 8/1982 | Gordy | |
| 4,355,401 A | 10/1982 | Ikoma et al. | |
| 4,356,558 A | 10/1982 | Owen et al. | |
| 4,360,867 A | 11/1982 | Gonda | |
| 4,363,132 A | 12/1982 | Collin | |
| 4,363,976 A | 12/1982 | Minor | |
| 4,365,217 A | 12/1982 | Berger et al. | |
| 4,369,522 A | 1/1983 | Cerny, Jr. et al. | |
| 4,370,572 A | 1/1983 | Cosand et al. | |
| 4,380,828 A | 4/1983 | Moon | |
| 4,384,357 A | 5/1983 | deBuda et al. | |
| 4,389,579 A | 6/1983 | Stein | |
| 4,392,255 A | 7/1983 | Del Giudice | |
| 4,393,352 A | 7/1983 | Volpe et al. | |
| 4,393,395 A | 7/1983 | Hacke et al. | |
| 4,405,835 A | 9/1983 | Jansen et al. | |
| 4,409,877 A | 10/1983 | Budelman | |
| 4,430,629 A | 2/1984 | Betzl et al. | |
| 4,439,787 A | 3/1984 | Mogi et al. | |
| 4,441,080 A | 4/1984 | Saari | |
| 4,446,438 A | 5/1984 | Chang et al. | |
| 4,456,990 A | 6/1984 | Fisher et al. | |
| 4,463,320 A | 7/1984 | Dawson | |
| 4,470,145 A | 9/1984 | Williams | |
| 4,472,785 A | 9/1984 | Kasuga | |
| 4,479,226 A | 10/1984 | Prabhu et al. | |
| 4,481,490 A | 11/1984 | Huntley | |
| 4,481,642 A | 11/1984 | Hanson | |
| 4,483,017 A | 11/1984 | Hampel et al. | |
| 4,484,143 A | 11/1984 | French et al. | |
| 4,485,347 A | 11/1984 | Hirasawa et al. | |
| 4,485,488 A | 11/1984 | Houdart | |
| 4,488,119 A | 12/1984 | Marshall | |
| 4,504,803 A | 3/1985 | Lee et al. | |
| 4,510,467 A | 4/1985 | Chang et al. | |
| 4,517,519 A | 5/1985 | Mukaiyama | |
| 4,517,520 A | 5/1985 | Ogawa | |
| 4,518,935 A | 5/1985 | van Roermund | |
| 4,521,892 A | 6/1985 | Vance et al. | |
| 4,562,414 A | 12/1985 | Linder et al. | |
| 4,563,773 A | 1/1986 | Dixon, Jr. et al. | |
| 4,571,738 A | 2/1986 | Vance | |
| 4,577,157 A | 3/1986 | Reed | |
| 4,583,239 A | 4/1986 | Vance | |
| 4,591,736 A | 5/1986 | Hirao et al. | |
| 4,591,930 A | 5/1986 | Baumeister | |
| 4,596,046 A | 6/1986 | Richardson et al. | |
| 4,601,046 A | 7/1986 | Halpern et al. | |
| 4,602,220 A | 7/1986 | Kurihara | |
| 4,603,300 A | 7/1986 | Welles, II et al. | |
| 4,612,464 A | 9/1986 | Ishikawa et al. | |

| | | | | | | |
|---|---|---|---|---|---|---|
| 4,612,518 A | 9/1986 | Gans et al. | 4,970,703 A | 11/1990 | Hariharan et al. | |
| 4,616,191 A | 10/1986 | Galani et al. | 4,972,436 A | 11/1990 | Halim et al. | |
| 4,621,217 A | 11/1986 | Saxe et al. | 4,982,353 A | 1/1991 | Jacob et al. | |
| 4,628,517 A | 12/1986 | Schwarz et al. | 4,984,077 A | 1/1991 | Uchida | |
| 4,633,510 A | 12/1986 | Suzuki et al. | 4,995,055 A | 2/1991 | Weinberger et al. | |
| 4,634,998 A | 1/1987 | Crawford | 5,003,621 A | 3/1991 | Gailus | |
| 4,648,021 A | 3/1987 | Alberkrack | 5,005,169 A | 4/1991 | Bronder et al. | |
| 4,651,034 A | 3/1987 | Sato | 5,006,810 A | 4/1991 | Popescu | |
| 4,651,210 A | 3/1987 | Olson | 5,006,854 A | 4/1991 | White et al. | |
| 4,653,117 A | 3/1987 | Heck | 5,010,585 A | 4/1991 | Garcia | |
| 4,660,164 A | 4/1987 | Leibowitz | 5,012,245 A | 4/1991 | Scott et al. | |
| 4,663,744 A | 5/1987 | Russell et al. | 5,014,130 A * | 5/1991 | Heister et al. | 348/687 |
| 4,675,882 A | 6/1987 | Lillie et al. | 5,014,304 A | 5/1991 | Nicollini et al. | |
| 4,688,237 A | 8/1987 | Brault | 5,015,963 A | 5/1991 | Sutton | |
| 4,688,253 A | 8/1987 | Gumm | 5,016,242 A | 5/1991 | Tang | |
| 4,716,376 A | 12/1987 | Daudelin | 5,017,924 A | 5/1991 | Guiberteau et al. | |
| 4,716,388 A | 12/1987 | Jacobs | 5,020,149 A | 5/1991 | Hemmie | |
| 4,718,113 A | 1/1988 | Rother et al. | 5,020,154 A | 5/1991 | Zierhut | |
| 4,726,041 A | 2/1988 | Prohaska et al. | 5,020,745 A | 6/1991 | Stetson, Jr. | |
| 4,733,403 A | 3/1988 | Simone | 5,023,572 A | 6/1991 | Caldwell et al. | |
| 4,734,591 A | 3/1988 | Ichitsubo | 5,047,860 A | 9/1991 | Rogalski | |
| 4,737,969 A | 4/1988 | Steel et al. | 5,052,050 A | 9/1991 | Collier et al. | |
| 4,740,675 A | 4/1988 | Brosnan et al. | 5,058,107 A | 10/1991 | Stone et al. | |
| 4,740,792 A | 4/1988 | Sagey et al. | 5,062,122 A | 10/1991 | Pham et al. | |
| 4,743,858 A | 5/1988 | Everard | 5,063,387 A | 11/1991 | Mower | |
| 4,745,463 A | 5/1988 | Lu | 5,065,409 A | 11/1991 | Hughes et al. | |
| 4,751,468 A | 6/1988 | Agoston | 5,083,050 A | 1/1992 | Vasile | |
| 4,757,538 A | 7/1988 | Zink | 5,091,921 A | 2/1992 | Minami | |
| 4,761,798 A | 8/1988 | Griswold, Jr. et al. | 5,095,533 A | 3/1992 | Loper et al. | |
| 4,768,187 A | 8/1988 | Marshall | 5,095,536 A | 3/1992 | Loper | |
| 4,769,612 A | 9/1988 | Tamakoshi et al. | 5,111,152 A | 5/1992 | Makino | |
| 4,771,265 A | 9/1988 | Okui et al. | 5,113,094 A | 5/1992 | Grace et al. | |
| 4,772,853 A | 9/1988 | Hart | 5,113,129 A | 5/1992 | Hughes | |
| 4,785,463 A | 11/1988 | Janc et al. | 5,115,409 A | 5/1992 | Stepp | |
| 4,789,837 A | 12/1988 | Ridgers | 5,122,765 A | 6/1992 | Pataut | |
| 4,791,584 A | 12/1988 | Greivenkamp, Jr. | 5,124,592 A * | 6/1992 | Hagino | 327/552 |
| 4,801,823 A | 1/1989 | Yokoyama | 5,126,682 A | 6/1992 | Weinberg et al. | |
| 4,806,790 A | 2/1989 | Sone | 5,131,014 A | 7/1992 | White | |
| 4,810,904 A | 3/1989 | Crawford | 5,136,267 A | 8/1992 | Cabot | |
| 4,810,976 A | 3/1989 | Cowley et al. | 5,140,705 A | 8/1992 | Kosuga | |
| 4,811,362 A | 3/1989 | Yester, Jr. et al. | 5,150,124 A | 9/1992 | Moore et al. | |
| 4,811,422 A | 3/1989 | Kahn | 5,151,661 A | 9/1992 | Caldwell et al. | |
| 4,814,649 A | 3/1989 | Young | 5,157,687 A | 10/1992 | Tymes | |
| 4,816,704 A | 3/1989 | Fiori, Jr. | 5,159,710 A | 10/1992 | Cusdin | |
| 4,819,252 A | 4/1989 | Christopher | 5,164,985 A | 11/1992 | Nysen et al. | |
| 4,833,445 A | 5/1989 | Buchele | 5,170,414 A | 12/1992 | Silvian | |
| 4,841,265 A | 6/1989 | Watanabe et al. | 5,172,019 A | 12/1992 | Naylor et al. | |
| 4,845,389 A | 7/1989 | Pyndiah et al. | 5,172,070 A | 12/1992 | Hiraiwa et al. | |
| 4,855,894 A | 8/1989 | Asahi et al. | 5,179,731 A | 1/1993 | Tränkle et al. | |
| 4,857,928 A | 8/1989 | Gailus et al. | 5,191,459 A | 3/1993 | Thompson et al. | |
| 4,862,121 A | 8/1989 | Hochschild et al. | 5,196,806 A | 3/1993 | Ichihara | |
| 4,866,441 A | 9/1989 | Conway et al. | 5,204,642 A | 4/1993 | Asghar et al. | |
| 4,868,654 A | 9/1989 | Juri et al. | 5,212,827 A | 5/1993 | Meszko et al. | |
| 4,870,659 A | 9/1989 | Oishi et al. | 5,214,787 A | 5/1993 | Karkota, Jr. | |
| 4,871,987 A | 10/1989 | Kawase | 5,218,562 A | 6/1993 | Basehore et al. | |
| 4,873,492 A | 10/1989 | Myer | 5,220,583 A | 6/1993 | Solomon | |
| 4,885,587 A | 12/1989 | Wiegand et al. | 5,220,680 A | 6/1993 | Lee | |
| 4,885,671 A | 12/1989 | Peil | 5,222,079 A | 6/1993 | Rasor | |
| 4,885,756 A | 12/1989 | Fontanes et al. | 5,222,144 A | 6/1993 | Whikehart | |
| 4,888,557 A | 12/1989 | Puckette, IV et al. | 5,222,250 A | 6/1993 | Cleveland et al. | |
| 4,890,302 A | 12/1989 | Muilwijk | 5,230,097 A | 7/1993 | Currie et al. | |
| 4,893,316 A | 1/1990 | Janc et al. | 5,239,496 A | 8/1993 | Vancraeynest | |
| 4,893,341 A | 1/1990 | Gehring | 5,239,686 A | 8/1993 | Downey | |
| 4,894,766 A | 1/1990 | De Agro | 5,239,687 A | 8/1993 | Chen | |
| 4,896,152 A | 1/1990 | Tiemann | 5,241,561 A | 8/1993 | Barnard | |
| 4,902,979 A | 2/1990 | Puckette, IV | 5,249,203 A | 9/1993 | Loper | |
| 4,908,579 A | 3/1990 | Tawfik et al. | 5,251,218 A | 10/1993 | Stone et al. | |
| 4,910,752 A | 3/1990 | Yester, Jr. et al. | 5,251,232 A | 10/1993 | Nonami | |
| 4,914,405 A | 4/1990 | Wells | 5,260,970 A | 11/1993 | Henry et al. | |
| 4,920,510 A | 4/1990 | Senderowicz et al. | 5,260,973 A | 11/1993 | Watanabe | |
| 4,922,452 A | 5/1990 | Larsen et al. | 5,263,194 A | 11/1993 | Ragan | |
| 4,931,716 A | 6/1990 | Jovanovic et al. | 5,263,196 A | 11/1993 | Jasper | |
| 4,931,921 A | 6/1990 | Anderson | 5,263,198 A | 11/1993 | Geddes et al. | |
| 4,943,974 A | 7/1990 | Motamedi | 5,267,023 A | 11/1993 | Kawasaki | |
| 4,944,025 A | 7/1990 | Gehring et al. | 5,278,826 A | 1/1994 | Murphy et al. | |
| 4,955,079 A | 9/1990 | Connerney et al. | 5,282,023 A | 1/1994 | Scarpa | |
| 4,965,467 A | 10/1990 | Bilterijst | 5,282,222 A | 1/1994 | Fattouche et al. | |
| 4,967,160 A | 10/1990 | Quievy et al. | 5,287,516 A | 2/1994 | Schaub | |
| 4,968,958 A | 11/1990 | Hoare | 5,293,398 A | 3/1994 | Hamao et al. | |

| | | | | | |
|---|---|---|---|---|---|
| 5,303,417 A | 4/1994 | Laws | 5,500,758 A | 3/1996 | Thompson et al. |
| 5,307,517 A | 4/1994 | Rich | 5,512,946 A | 4/1996 | Murata et al. |
| 5,315,583 A | 5/1994 | Murphy et al. | 5,513,389 A | 4/1996 | Reeser et al. |
| 5,319,799 A | 6/1994 | Morita | 5,515,014 A | 5/1996 | Troutman |
| 5,321,852 A | 6/1994 | Seong | 5,517,688 A | 5/1996 | Fajen et al. |
| 5,325,204 A | 6/1994 | Scarpa | 5,519,890 A | 5/1996 | Pinckley |
| 5,337,014 A | 8/1994 | Najle et al. | 5,523,719 A | 6/1996 | Longo et al. |
| 5,339,054 A | 8/1994 | Taguchi | 5,523,726 A | 6/1996 | Kroeger et al. |
| 5,339,395 A | 8/1994 | Pickett et al. | 5,523,760 A | 6/1996 | McEwan |
| 5,339,459 A | 8/1994 | Schiltz et al. | 5,528,068 A | 6/1996 | Ohmi |
| 5,345,239 A | 9/1994 | Madni et al. | 5,535,402 A | 7/1996 | Leibowitz et al. |
| 5,353,306 A | 10/1994 | Yamamoto | 5,539,770 A | 7/1996 | Ishigaki |
| 5,355,114 A | 10/1994 | Sutterlin et al. | 5,551,076 A | 8/1996 | Bonn |
| 5,361,408 A | 11/1994 | Watanabe et al. | 5,552,789 A | 9/1996 | Schuermann |
| 5,369,404 A | 11/1994 | Galton | 5,555,453 A | 9/1996 | Kajimoto et al. |
| 5,369,789 A | 11/1994 | Kosugi et al. | 5,557,641 A | 9/1996 | Weinberg |
| 5,369,800 A | 11/1994 | Takagi et al. | 5,557,642 A | 9/1996 | Williams |
| 5,375,146 A | 12/1994 | Chalmers | 5,559,468 A * | 9/1996 | Gailus et al. .................. 330/110 |
| 5,379,040 A | 1/1995 | Mizomoto et al. | 5,559,809 A | 9/1996 | Jeon et al. |
| 5,379,141 A | 1/1995 | Thompson et al. | 5,563,550 A | 10/1996 | Toth |
| 5,388,063 A | 2/1995 | Takatori et al. | 5,564,097 A | 10/1996 | Swanke |
| 5,389,839 A | 2/1995 | Heck | 5,574,755 A | 11/1996 | Persico |
| 5,390,215 A | 2/1995 | Antia et al. | 5,579,341 A | 11/1996 | Smith et al. |
| 5,390,364 A | 2/1995 | Webster et al. | 5,579,347 A | 11/1996 | Lindquist et al. |
| 5,400,084 A | 3/1995 | Scarpa | 5,584,068 A | 12/1996 | Mohindra |
| 5,400,363 A | 3/1995 | Waugh et al. | 5,589,793 A | 12/1996 | Kassapian |
| 5,404,127 A | 4/1995 | Lee et al. | 5,592,131 A | 1/1997 | Labreche et al. |
| 5,410,195 A * | 4/1995 | Ichihara ........................ 327/10 | 5,600,680 A | 2/1997 | Mishima et al. |
| 5,410,270 A | 4/1995 | Rybicki et al. | 5,602,847 A | 2/1997 | Pagano et al. |
| 5,410,541 A | 4/1995 | Hotto | 5,602,868 A | 2/1997 | Wilson |
| 5,410,743 A | 4/1995 | Seely et al. | 5,604,592 A | 2/1997 | Kotidis et al. |
| 5,412,352 A | 5/1995 | Graham | 5,604,732 A | 2/1997 | Kim et al. |
| 5,416,449 A | 5/1995 | Joshi | 5,606,731 A | 2/1997 | Pace et al. |
| 5,416,803 A | 5/1995 | Janer | 5,608,531 A | 3/1997 | Honda et al. |
| 5,422,909 A | 6/1995 | Love et al. | 5,610,946 A | 3/1997 | Tanaka et al. |
| 5,422,913 A | 6/1995 | Wilkinson | RE35,494 E | 4/1997 | Nicollini |
| 5,423,082 A | 6/1995 | Cygan et al. | 5,617,451 A | 4/1997 | Mimura et al. |
| 5,428,638 A | 6/1995 | Cioffi et al. | 5,619,538 A | 4/1997 | Sempel et al. |
| 5,428,640 A | 6/1995 | Townley | 5,621,455 A | 4/1997 | Rogers et al. |
| 5,434,546 A | 7/1995 | Palmer | 5,628,055 A | 5/1997 | Stein |
| 5,438,329 A | 8/1995 | Gastouniotis et al. | 5,630,227 A | 5/1997 | Bella et al. |
| 5,438,692 A | 8/1995 | Mohindra | 5,633,610 A | 5/1997 | Maekawa et al. |
| 5,440,311 A | 8/1995 | Gallagher et al. | 5,633,815 A | 5/1997 | Young |
| 5,444,415 A | 8/1995 | Dent et al. | 5,634,207 A | 5/1997 | Yamaji et al. |
| 5,444,416 A | 8/1995 | Ishikawa et al. | 5,636,140 A | 6/1997 | Lee et al. |
| 5,444,865 A | 8/1995 | Heck et al. | 5,638,396 A | 6/1997 | Klimek |
| 5,446,421 A | 8/1995 | Kechkaylo | 5,640,415 A | 6/1997 | Pandula |
| 5,446,422 A | 8/1995 | Mattila et al. | 5,640,424 A | 6/1997 | Banavong et al. |
| 5,448,602 A | 9/1995 | Ohmori et al. | 5,640,428 A | 6/1997 | Abe et al. |
| 5,449,939 A | 9/1995 | Horiguchi et al. | 5,640,698 A | 6/1997 | Shen et al. |
| 5,451,899 A | 9/1995 | Lawton | 5,642,071 A | 6/1997 | Sevenhans et al. |
| 5,454,007 A | 9/1995 | Dutta | 5,648,985 A | 7/1997 | Bjerede et al. |
| 5,454,009 A | 9/1995 | Fruit et al. | 5,650,785 A | 7/1997 | Rodal |
| 5,461,646 A | 10/1995 | Anvari | 5,659,372 A | 8/1997 | Patel et al. |
| 5,463,356 A | 10/1995 | Palmer | 5,661,424 A | 8/1997 | Tang |
| 5,463,357 A | 10/1995 | Hobden | 5,663,878 A | 9/1997 | Walker |
| 5,465,071 A | 11/1995 | Kobayashi et al. | 5,663,986 A | 9/1997 | Striffler |
| 5,465,410 A | 11/1995 | Hiben et al. | 5,668,836 A | 9/1997 | Smith et al. |
| 5,465,415 A | 11/1995 | Bien | 5,675,392 A | 10/1997 | Nayebi et al. |
| 5,465,418 A | 11/1995 | Zhou et al. | 5,678,220 A | 10/1997 | Fournier |
| 5,471,162 A | 11/1995 | McEwan | 5,678,226 A | 10/1997 | Li et al. |
| 5,471,665 A | 11/1995 | Pace et al. | 5,680,078 A | 10/1997 | Ariie |
| 5,479,120 A | 12/1995 | McEwan | 5,680,418 A | 10/1997 | Croft et al. |
| 5,479,447 A | 12/1995 | Chow et al. | 5,682,099 A | 10/1997 | Thompson et al. |
| 5,481,570 A | 1/1996 | Winters | 5,689,413 A | 11/1997 | Jaramillo et al. |
| 5,483,193 A | 1/1996 | Kennedy et al. | 5,691,629 A | 11/1997 | Belnap |
| 5,483,245 A | 1/1996 | Ruinet | 5,694,096 A | 12/1997 | Ushiroku et al. |
| 5,483,549 A | 1/1996 | Weinberg et al. | 5,697,074 A | 12/1997 | Makikallio et al. |
| 5,483,600 A * | 1/1996 | Werrbach ...................... 381/106 | 5,699,006 A | 12/1997 | Zele et al. |
| 5,483,691 A | 1/1996 | Heck et al. | 5,703,584 A | 12/1997 | Hill |
| 5,483,695 A | 1/1996 | Pardoen | 5,705,949 A | 1/1998 | Alelyunas et al. |
| 5,490,173 A | 2/1996 | Whikehart et al. | 5,705,955 A | 1/1998 | Freeburg et al. |
| 5,490,176 A | 2/1996 | Peltier | 5,710,992 A | 1/1998 | Sawada et al. |
| 5,493,581 A | 2/1996 | Young et al. | 5,710,998 A | 1/1998 | Opas |
| 5,493,721 A | 2/1996 | Reis | 5,714,910 A | 2/1998 | Skoczen et al. |
| 5,495,200 A | 2/1996 | Kwan et al. | 5,715,281 A | 2/1998 | Bly et al. |
| 5,495,202 A | 2/1996 | Hsu | 5,721,514 A | 2/1998 | Crockett et al. |
| 5,495,500 A | 2/1996 | Jovanovich et al. | 5,724,002 A | 3/1998 | Hulick |
| 5,499,267 A | 3/1996 | Ohe et al. | 5,724,041 A | 3/1998 | Inoue et al. |

| | | | | | | |
|---|---|---|---|---|---|---|
| 5,724,653 A | 3/1998 | Baker et al. | | 5,903,196 A | 5/1999 | Salvi et al. |
| 5,729,577 A | 3/1998 | Chen | | 5,903,421 A | 5/1999 | Furutani et al. |
| 5,729,829 A | 3/1998 | Talwar et al. | | 5,903,553 A | 5/1999 | Sakamoto et al. |
| 5,732,333 A | 3/1998 | Cox et al. | | 5,903,595 A | 5/1999 | Suzuki |
| 5,734,683 A | 3/1998 | Hulkko et al. | | 5,903,609 A | 5/1999 | Kool et al. |
| 5,736,895 A | 4/1998 | Yu et al. | | 5,903,827 A | 5/1999 | Kennan et al. |
| 5,737,035 A | 4/1998 | Rotzoll | | 5,903,854 A | 5/1999 | Abe et al. |
| 5,742,189 A | 4/1998 | Yoshida et al. | | 5,905,433 A | 5/1999 | Wortham |
| 5,745,846 A | 4/1998 | Myer et al. | | 5,905,449 A | 5/1999 | Tsubouchi et al. |
| 5,748,683 A | 5/1998 | Smith et al. | | 5,907,149 A | 5/1999 | Marckini |
| 5,751,154 A | 5/1998 | Tsugai | | 5,907,197 A | 5/1999 | Faulk |
| 5,757,858 A | 5/1998 | Black et al. | | 5,909,447 A | 6/1999 | Cox et al. |
| 5,757,864 A | 5/1998 | Petranovich et al. | | 5,909,460 A | 6/1999 | Dent |
| 5,757,870 A | 5/1998 | Miya et al. | | 5,911,116 A | 6/1999 | Nosswitz |
| RE35,829 E | 6/1998 | Sanderford, Jr. | | 5,911,123 A | 6/1999 | Shaffer et al. |
| 5,760,629 A | 6/1998 | Urabe et al. | | 5,914,622 A | 6/1999 | Inoue |
| 5,760,632 A | 6/1998 | Kawakami et al. | | 5,915,278 A | 6/1999 | Mallick |
| 5,760,645 A | 6/1998 | Comte et al. | | 5,918,167 A | 6/1999 | Tiller et al. |
| 5,764,087 A | 6/1998 | Clark | | 5,920,199 A | 7/1999 | Sauer |
| 5,767,726 A | 6/1998 | Wang | | 5,926,065 A | 7/1999 | Wakai et al. |
| 5,768,118 A | 6/1998 | Faulk et al. | | 5,926,513 A | 7/1999 | Suominen et al. |
| 5,768,323 A | 6/1998 | Kroeger et al. | | 5,933,467 A | 8/1999 | Sehier et al. |
| 5,770,985 A | 6/1998 | Ushiroku et al. | | 5,937,013 A | 8/1999 | Lam et al. |
| 5,771,442 A | 6/1998 | Wang et al. | | 5,943,370 A | 8/1999 | Smith |
| 5,777,692 A | 7/1998 | Ghosh | | 5,945,660 A | 8/1999 | Nakasuji et al. |
| 5,777,771 A | 7/1998 | Smith | | 5,949,827 A | 9/1999 | DeLuca et al. |
| 5,778,022 A | 7/1998 | Walley | | 5,952,895 A | 9/1999 | McCune, Jr. et al. |
| 5,781,600 A | 7/1998 | Reeve et al. | | 5,953,642 A | 9/1999 | Feldtkeller et al. |
| 5,784,689 A | 7/1998 | Kobayashi | | 5,955,992 A | 9/1999 | Shattil |
| 5,786,844 A | 7/1998 | Rogers et al. | | 5,959,850 A | 9/1999 | Lim |
| 5,787,125 A | 7/1998 | Mittel | | 5,960,033 A | 9/1999 | Shibano et al. |
| 5,790,587 A | 8/1998 | Smith et al. | | 5,970,053 A | 10/1999 | Schick et al. |
| 5,793,801 A | 8/1998 | Fertner | | 5,973,568 A | 10/1999 | Shapiro et al. |
| 5,793,817 A | 8/1998 | Wilson | | 5,973,570 A | 10/1999 | Salvi et al. |
| 5,793,818 A | 8/1998 | Claydon et al. | | 5,982,315 A | 11/1999 | Bazarjani et al. |
| 5,801,654 A | 9/1998 | Traylor | | 5,982,329 A | 11/1999 | Pittman et al. |
| 5,802,463 A | 9/1998 | Zuckerman | | 5,982,810 A | 11/1999 | Nishimori |
| 5,805,460 A | 9/1998 | Greene et al. | | 5,986,600 A | 11/1999 | McEwan |
| 5,809,060 A | 9/1998 | Cafarella et al. | | 5,994,689 A | 11/1999 | Charrier |
| 5,812,546 A | 9/1998 | Zhou et al. | | 5,995,030 A | 11/1999 | Cabler |
| 5,818,582 A | 10/1998 | Fernandez et al. | | 5,999,561 A | 12/1999 | Naden et al. |
| 5,818,869 A | 10/1998 | Miya et al. | | 6,005,506 A | 12/1999 | Bazarjani et al. |
| 5,825,254 A | 10/1998 | Lee | | 6,005,903 A | 12/1999 | Mendelovicz |
| 5,825,257 A | 10/1998 | Klymyshyn et al. | | 6,009,317 A | 12/1999 | Wynn |
| 5,834,979 A | 11/1998 | Yatsuka | | 6,011,435 A | 1/2000 | Takeyabu et al. |
| 5,834,985 A | 11/1998 | Sundegård | | 6,014,176 A | 1/2000 | Nayebi et al. |
| 5,834,987 A | 11/1998 | Dent | | 6,014,551 A | 1/2000 | Pesola et al. |
| 5,841,324 A | 11/1998 | Williams | | 6,018,262 A | 1/2000 | Noro et al. |
| 5,841,811 A | 11/1998 | Song | | 6,018,553 A | 1/2000 | Sanielevici et al. |
| 5,844,449 A | 12/1998 | Abeno et al. | | 6,026,286 A | 2/2000 | Long |
| 5,844,868 A | 12/1998 | Takahashi et al. | | 6,028,887 A | 2/2000 | Harrison et al. |
| 5,847,594 A | 12/1998 | Mizuno | | 6,031,217 A | 2/2000 | Aswell et al. |
| 5,859,878 A | 1/1999 | Phillips et al. | | 6,034,566 A | 3/2000 | Ohe |
| 5,864,754 A | 1/1999 | Hotto | | 6,038,265 A | 3/2000 | Pan et al. |
| 5,870,670 A | 2/1999 | Ripley et al. | | 6,041,073 A | 3/2000 | Davidovici et al. |
| 5,872,446 A | 2/1999 | Cranford, Jr. et al. | | 6,044,332 A | 3/2000 | Korsah et al. |
| 5,878,088 A | 3/1999 | Knutson et al. | | 6,047,026 A | 4/2000 | Chao et al. |
| 5,881,375 A | 3/1999 | Bonds | | 6,049,573 A | 4/2000 | Song |
| 5,883,548 A | 3/1999 | Assard et al. | | 6,049,706 A | 4/2000 | Cook et al. |
| 5,884,154 A | 3/1999 | Sano et al. | | 6,054,889 A | 4/2000 | Kobayashi |
| 5,886,547 A | 3/1999 | Durec et al. | | 6,057,714 A | 5/2000 | Andrys et al. |
| 5,887,001 A | 3/1999 | Russell | | 6,061,551 A | 5/2000 | Sorrells et al. |
| 5,892,380 A | 4/1999 | Quist | | 6,061,555 A | 5/2000 | Bultman et al. |
| 5,894,239 A | 4/1999 | Bonaccio et al. | | 6,064,054 A | 5/2000 | Waczynski et al. |
| 5,894,496 A | 4/1999 | Jones | | 6,067,329 A | 5/2000 | Kato et al. |
| 5,896,304 A | 4/1999 | Tiemann et al. | | 6,072,996 A | 6/2000 | Smith |
| 5,896,347 A | 4/1999 | Tomita et al. | | 6,073,001 A | 6/2000 | Sokoler |
| 5,896,562 A | 4/1999 | Heinonen | | 6,076,015 A | 6/2000 | Hartley et al. |
| 5,898,912 A | 4/1999 | Heck et al. | | 6,078,630 A | 6/2000 | Prasanna |
| 5,900,746 A | 5/1999 | Sheahan | | 6,081,691 A | 6/2000 | Renard et al. |
| 5,900,747 A | 5/1999 | Brauns | | 6,084,465 A * | 7/2000 | Dasgupta .................... 327/554 |
| 5,901,054 A | 5/1999 | Leu et al. | | 6,084,922 A | 7/2000 | Zhou et al. |
| 5,901,187 A | 5/1999 | Iinuma | | 6,085,073 A | 7/2000 | Palermo et al. |
| 5,901,344 A | 5/1999 | Opas | | 6,088,348 A | 7/2000 | Bell, III et al. |
| 5,901,347 A | 5/1999 | Chambers et al. | | 6,091,289 A | 7/2000 | Song et al. |
| 5,901,348 A | 5/1999 | Bang et al. | | 6,091,939 A | 7/2000 | Banh |
| 5,901,349 A | 5/1999 | Guegnaud et al. | | 6,091,940 A | 7/2000 | Sorrells et al. |
| 5,903,178 A | 5/1999 | Miyatsuji et al. | | 6,091,941 A | 7/2000 | Moriyama et al. |
| 5,903,187 A | 5/1999 | Claverie et al. | | 6,094,084 A | 7/2000 | Abou-Allam et al. |

| | | | |
|---|---|---|---|
| 6,097,762 A | 8/2000 | Suzuki et al. | |
| 6,098,046 A | 8/2000 | Cooper et al. | |
| 6,098,886 A | 8/2000 | Swift et al. | |
| 6,112,061 A | 8/2000 | Rapeli | |
| 6,121,819 A | 9/2000 | Traylor | |
| 6,125,271 A | 9/2000 | Rowland, Jr. | |
| 6,128,746 A | 10/2000 | Clark et al. | |
| 6,137,321 A | 10/2000 | Bazarjani | |
| 6,144,236 A | 11/2000 | Vice et al. | |
| 6,144,331 A | 11/2000 | Jiang | |
| 6,144,846 A | 11/2000 | Durec | |
| 6,147,340 A | 11/2000 | Levy | |
| 6,147,763 A | 11/2000 | Steinlechner | |
| 6,150,890 A | 11/2000 | Damgaard et al. | |
| 6,151,354 A | 11/2000 | Abbey | |
| 6,160,280 A | 12/2000 | Bonn et al. | |
| 6,167,247 A | 12/2000 | Kannell et al. | |
| 6,169,733 B1 | 1/2001 | Lee | |
| 6,175,728 B1 * | 1/2001 | Mitama | 455/323 |
| 6,178,319 B1 | 1/2001 | Kashima | |
| 6,182,011 B1 | 1/2001 | Ward | |
| 6,188,221 B1 | 2/2001 | Van de Kop et al. | |
| 6,192,225 B1 | 2/2001 | Arpaia et al. | |
| 6,195,539 B1 | 2/2001 | Galal et al. | |
| 6,198,941 B1 | 3/2001 | Aho et al. | |
| 6,204,789 B1 | 3/2001 | Nagata | |
| 6,208,636 B1 | 3/2001 | Tawil et al. | |
| 6,208,875 B1 | 3/2001 | Damgaard et al. | |
| RE37,138 E | 4/2001 | Dent | |
| 6,211,718 B1 | 4/2001 | Souetinov | |
| 6,212,369 B1 | 4/2001 | Avasarala | |
| 6,215,475 B1 | 4/2001 | Meyerson et al. | |
| 6,215,828 B1 | 4/2001 | Signell et al. | |
| 6,215,830 B1 | 4/2001 | Temerinac et al. | |
| 6,223,061 B1 | 4/2001 | Dacus et al. | |
| 6,225,848 B1 | 5/2001 | Tilley et al. | |
| 6,230,000 B1 | 5/2001 | Tayloe | |
| 6,246,695 B1 | 6/2001 | Seazholtz et al. | |
| 6,259,293 B1 | 7/2001 | Hayase et al. | |
| 6,266,518 B1 | 7/2001 | Sorrells et al. | |
| 6,275,542 B1 | 8/2001 | Katayama et al. | |
| 6,298,065 B1 | 10/2001 | Dombkowski et al. | |
| 6,307,894 B2 | 10/2001 | Eidson et al. | |
| 6,308,058 B1 | 10/2001 | Souetinov et al. | |
| 6,313,685 B1 | 11/2001 | Rabii | |
| 6,313,700 B1 | 11/2001 | Nishijima et al. | |
| 6,314,279 B1 | 11/2001 | Mohindra | |
| 6,317,589 B1 | 11/2001 | Nash | |
| 6,321,073 B1 | 11/2001 | Luz et al. | |
| 6,324,379 B1 | 11/2001 | Hadden et al. | |
| 6,327,313 B1 | 12/2001 | Traylor et al. | |
| 6,330,244 B1 | 12/2001 | Swartz et al. | |
| 6,332,007 B1 | 12/2001 | Sasaki | |
| 6,335,656 B1 | 1/2002 | Goldfarb et al. | |
| 6,353,735 B1 | 3/2002 | Sorrells et al. | |
| 6,363,126 B1 | 3/2002 | Furukawa et al. | |
| 6,363,262 B1 | 3/2002 | McNicol | |
| 6,366,622 B1 | 4/2002 | Brown et al. | |
| 6,366,765 B1 | 4/2002 | Hongo et al. | |
| 6,370,371 B1 | 4/2002 | Sorrells et al. | |
| 6,385,439 B1 | 5/2002 | Hellberg | |
| 6,393,070 B1 | 5/2002 | Reber | |
| 6,400,963 B1 | 6/2002 | Glöckler et al. | |
| 6,404,758 B1 | 6/2002 | Wang | |
| 6,404,823 B1 | 6/2002 | Grange et al. | |
| 6,408,018 B1 | 6/2002 | Dent | |
| 6,421,534 B1 | 7/2002 | Cook et al. | |
| 6,437,639 B1 | 8/2002 | Nguyen et al. | |
| 6,438,366 B1 | 8/2002 | Lindfors et al. | |
| 6,441,694 B1 | 8/2002 | Turcotte et al. | |
| 6,445,726 B1 | 9/2002 | Gharpurey | |
| 6,459,721 B1 | 10/2002 | Mochizuki et al. | |
| 6,509,777 B2 | 1/2003 | Razavi et al. | |
| 6,512,544 B1 | 1/2003 | Merrill et al. | |
| 6,512,785 B1 | 1/2003 | Zhou et al. | |
| 6,512,798 B1 | 1/2003 | Akiyama et al. | |
| 6,516,185 B1 | 2/2003 | MacNally | |
| 6,531,979 B1 | 3/2003 | Hynes | |
| 6,542,722 B1 | 4/2003 | Sorrells et al. | |
| 6,546,061 B2 | 4/2003 | Signell et al. | |
| 6,560,301 B1 | 5/2003 | Cook et al. | |
| 6,560,451 B1 | 5/2003 | Somayajula | |
| 6,567,483 B1 | 5/2003 | Dent et al. | |
| 6,580,902 B1 | 6/2003 | Sorrells et al. | |
| 6,591,310 B1 | 7/2003 | Johnson | |
| 6,597,240 B1 | 7/2003 | Walburger et al. | |
| 6,600,795 B1 | 7/2003 | Ohta et al. | |
| 6,600,911 B1 | 7/2003 | Morishige et al. | |
| 6,608,647 B1 | 8/2003 | King | |
| 6,611,569 B1 | 8/2003 | Schier et al. | |
| 6,618,579 B1 | 9/2003 | Smith et al. | |
| 6,625,470 B1 | 9/2003 | Fourtet et al. | |
| 6,628,328 B1 | 9/2003 | Yokouchi et al. | |
| 6,633,194 B2 | 10/2003 | Arnborg et al. | |
| 6,634,555 B1 | 10/2003 | Sorrells et al. | |
| 6,639,939 B1 | 10/2003 | Naden et al. | |
| 6,647,250 B1 | 11/2003 | Bultman et al. | |
| 6,647,270 B1 | 11/2003 | Himmelstein | |
| 6,686,879 B2 | 2/2004 | Shattil | |
| 6,687,493 B1 | 2/2004 | Sorrells et al. | |
| 6,690,232 B2 | 2/2004 | Ueno et al. | |
| 6,690,741 B1 | 2/2004 | Larrick, Jr. et al. | |
| 6,694,128 B1 | 2/2004 | Sorrells et al. | |
| 6,697,603 B1 | 2/2004 | Lovinggood et al. | |
| 6,704,549 B1 | 3/2004 | Sorrells et al. | |
| 6,704,558 B1 | 3/2004 | Sorrells et al. | |
| 6,731,146 B1 | 5/2004 | Gallardo | |
| 6,738,609 B1 | 5/2004 | Clifford | |
| 6,738,611 B1 | 5/2004 | Politi | |
| 6,741,139 B2 | 5/2004 | Pleasant et al. | |
| 6,741,650 B1 | 5/2004 | Painchaud et al. | |
| 6,775,684 B1 | 8/2004 | Toyoyama et al. | |
| 6,798,351 B1 | 9/2004 | Sorrells et al. | |
| 6,801,253 B1 | 10/2004 | Yonemoto et al. | |
| 6,813,320 B1 | 11/2004 | Claxton et al. | |
| 6,813,485 B2 | 11/2004 | Sorrells et al. | |
| 6,823,178 B2 | 11/2004 | Pleasant et al. | |
| 6,829,311 B1 | 12/2004 | Riley | |
| 6,836,650 B2 | 12/2004 | Sorrells et al. | |
| 6,850,742 B2 | 2/2005 | Fayyaz | |
| 6,853,690 B1 | 2/2005 | Sorrells et al. | |
| 6,865,399 B2 | 3/2005 | Fujioka et al. | |
| 6,873,836 B1 | 3/2005 | Sorrells et al. | |
| 6,876,846 B2 | 4/2005 | Tamaki et al. | |
| 6,879,817 B1 | 4/2005 | Sorrells et al. | |
| 6,882,194 B2 | 4/2005 | Belot et al. | |
| 6,892,057 B2 | 5/2005 | Nilsson | |
| 6,892,062 B2 | 5/2005 | Lee et al. | |
| 6,894,988 B1 | 5/2005 | Zehavi | |
| 6,909,739 B1 | 6/2005 | Eerola et al. | |
| 6,910,015 B2 | 6/2005 | Kawai | |
| 6,917,796 B2 | 7/2005 | Setty et al. | |
| 6,920,311 B2 | 7/2005 | Rofougaran et al. | |
| 6,959,178 B2 | 10/2005 | Macedo et al. | |
| 6,963,626 B1 | 11/2005 | Shaeffer et al. | |
| 6,963,734 B2 | 11/2005 | Sorrells et al. | |
| 6,973,476 B1 | 12/2005 | Naden et al. | |
| 6,975,848 B2 | 12/2005 | Rawlins et al. | |
| 6,999,747 B2 | 2/2006 | Su | |
| 7,006,805 B1 | 2/2006 | Sorrells et al. | |
| 7,010,286 B2 | 3/2006 | Sorrells et al. | |
| 7,010,559 B2 | 3/2006 | Rawlins et al. | |
| 7,016,663 B2 | 3/2006 | Sorrells et al. | |
| 7,027,786 B1 | 4/2006 | Smith et al. | |
| 7,039,372 B1 | 5/2006 | Sorrells et al. | |
| 7,050,508 B2 | 5/2006 | Sorrells et al. | |
| 7,054,296 B1 | 5/2006 | Sorrells et al. | |
| 7,065,162 B1 | 6/2006 | Sorrells et al. | |
| 7,072,390 B1 | 7/2006 | Sorrells et al. | |
| 7,072,427 B2 | 7/2006 | Rawlins et al. | |
| 7,076,011 B2 | 7/2006 | Cook et al. | |
| 7,082,171 B1 | 7/2006 | Johnson et al. | |
| 7,085,335 B2 | 8/2006 | Rawlins et al. | |
| 7,107,028 B2 | 9/2006 | Sorrells et al. | |
| 7,110,435 B1 | 9/2006 | Sorrells et al. | |
| 7,110,444 B1 | 9/2006 | Sorrells et al. | |
| 7,149,487 B2 | 12/2006 | Yoshizawa | |
| 7,190,941 B2 | 3/2007 | Sorrells et al. | |

| | | | |
|---|---|---|---|
| 7,193,965 B1 | 3/2007 | Nevo et al. | |
| 7,194,044 B2 | 3/2007 | Birkett et al. | |
| 7,194,246 B2 | 3/2007 | Sorrells et al. | |
| 7,197,081 B2 | 3/2007 | Saito | |
| 7,209,725 B1 | 4/2007 | Sorrells et al. | |
| 7,212,581 B2 | 5/2007 | Birkett et | |
| 7,218,899 B2 | 5/2007 | Sorrells et al. | |
| 7,218,907 B2 | 5/2007 | Sorrells et al. | |
| 7,224,749 B2 | 5/2007 | Sorrells et al. | |
| 7,233,969 B2 | 6/2007 | Rawlins et al. | |
| 7,236,754 B2 | 6/2007 | Sorrells et al. | |
| 7,245,886 B2 | 7/2007 | Sorrells et al. | |
| 7,272,164 B2 | 9/2007 | Sorrells et al. | |
| 7,292,835 B2 | 11/2007 | Sorrells et al. | |
| 7,295,826 B1 | 11/2007 | Cook et al. | |
| 7,308,242 B2 | 12/2007 | Sorrells et al. | |
| 7,321,640 B2 | 1/2008 | Milne et al. | |
| 7,321,735 B1 | 1/2008 | Smith et al. | |
| 7,321,751 B2 | 1/2008 | Sorrells et al. | |
| 7,358,801 B2 | 4/2008 | Perdoor et al. | |
| 7,376,410 B2 | 5/2008 | Sorrells et al. | |
| 7,379,515 B2 | 5/2008 | Johnson et al. | |
| 7,379,883 B2 | 5/2008 | Sorrells | |
| 7,386,292 B2 | 6/2008 | Sorrells et al. | |
| 7,389,100 B2 | 6/2008 | Sorrells et al. | |
| 7,433,910 B2 | 10/2008 | Rawlins et al. | |
| 7,454,453 B2 | 11/2008 | Rawlins et al. | |
| 7,460,584 B2 | 12/2008 | Parker et al. | |
| 7,483,686 B2 | 1/2009 | Sorrells et al. | |
| 7,496,342 B2 | 2/2009 | Sorrells et al. | |
| 7,515,896 B1 | 4/2009 | Sorrells et al. | |
| 7,529,522 B2 | 5/2009 | Sorrells et al. | |
| 7,539,474 B2 | 5/2009 | Sorrels et al. | |
| 7,546,096 B2 | 6/2009 | Sorrells et al. | |
| 7,554,508 B2 | 6/2009 | Johnson et al. | |
| 7,599,421 B2 | 10/2009 | Sorrells et al. | |
| 7,620,378 B2 | 11/2009 | Sorrells et al. | |
| 7,653,145 B2 | 1/2010 | Sorrells et al. | |
| 7,653,158 B2 | 1/2010 | Rawlins et al. | |
| 7,693,230 B2 | 4/2010 | Sorrells et al. | |
| 7,693,502 B2 | 4/2010 | Sorrells et al. | |
| 7,697,916 B2 | 4/2010 | Sorrells et al. | |
| 7,724,845 B2 | 5/2010 | Sorrells et al. | |
| 7,773,688 B2 | 8/2010 | Sorrells et al. | |
| 7,783,250 B2 | 8/2010 | Lynch | |
| 7,822,401 B2 | 10/2010 | Sorrells et al. | |
| 7,826,817 B2 | 11/2010 | Sorrells et al. | |
| 7,865,177 B2 | 1/2011 | Sorrells et al. | |
| 7,894,789 B2 | 2/2011 | Sorrells et al. | |
| 7,929,638 B2 | 4/2011 | Sorrells et al. | |
| 7,936,022 B2 | 5/2011 | Sorrells et al. | |
| 7,937,059 B2 | 5/2011 | Sorrells et al. | |
| 7,991,815 B2 | 8/2011 | Rawlins et al. | |
| 8,019,291 B2 | 9/2011 | Sorrells et al. | |
| 8,036,304 B2 | 10/2011 | Sorrells et al. | |
| 8,077,797 B2 | 12/2011 | Sorrells | |
| 8,160,196 B2 | 4/2012 | Parker et al. | |
| 8,160,534 B2 | 4/2012 | Sorrells et al. | |
| 8,190,108 B2 | 5/2012 | Sorrells et al. | |
| 8,190,116 B2 | 5/2012 | Sorrells et al. | |
| 2001/0015673 A1 | 8/2001 | Yamashita et al. | |
| 2001/0036818 A1 | 11/2001 | Dobrovolny | |
| 2002/0021685 A1 | 2/2002 | Sakusabe | |
| 2002/0037706 A1 | 3/2002 | Ichihara | |
| 2002/0080728 A1 | 6/2002 | Sugar et al. | |
| 2002/0098823 A1 | 7/2002 | Lindfors et al. | |
| 2002/0132642 A1 | 9/2002 | Hines et al. | |
| 2002/0163921 A1 | 11/2002 | Ethridge et al. | |
| 2003/0045263 A1* | 3/2003 | Wakayama et al. | 455/323 |
| 2003/0078011 A1 | 4/2003 | Cheng et al. | |
| 2003/0081781 A1 | 5/2003 | Jensen et al. | |
| 2003/0149579 A1 | 8/2003 | Begemann et al. | |
| 2003/0193364 A1 | 10/2003 | Liu et al. | |
| 2004/0125879 A1 | 7/2004 | Jaussi et al. | |
| 2006/0002491 A1* | 1/2006 | Darabi et al. | 375/330 |
| 2006/0039449 A1 | 2/2006 | Fontana et al. | |
| 2006/0209599 A1 | 9/2006 | Kato et al. | |

FOREIGN PATENT DOCUMENTS

| | | |
|---|---|---|
| DE | 35 41 031 A1 | 5/1986 |
| DE | 42 37 692 C1 | 3/1994 |
| DE | 196 27 640 A1 | 1/1997 |
| DE | 692 21 098 T2 | 1/1998 |
| DE | 196 48 915 A1 | 6/1998 |
| DE | 197 35 798 C1 | 7/1998 |
| EP | 0 035 166 A1 | 9/1981 |
| EP | 0 087 336 A1 | 8/1983 |
| EP | 0 099 265 A1 | 1/1984 |
| EP | 0 087 336 B1 | 7/1986 |
| EP | 0 254 844 A2 | 2/1988 |
| EP | 0 276 130 A2 | 7/1988 |
| EP | 0 276 130 A3 | 7/1988 |
| EP | 0 193 899 B1 | 6/1990 |
| EP | 0 380 351 A2 | 8/1990 |
| EP | 0 380 351 A3 | 2/1991 |
| EP | 0 411 840 A2 | 2/1991 |
| EP | 0 423 718 A2 | 4/1991 |
| EP | 0 411 840 A3 | 7/1991 |
| EP | 0 486 095 A1 | 5/1992 |
| EP | 0 423 718 A3 | 8/1992 |
| EP | 0 512 748 A2 | 11/1992 |
| EP | 0 529 836 A1 | 3/1993 |
| EP | 0 548 542 A1 | 6/1993 |
| EP | 0 512 748 A3 | 7/1993 |
| EP | 0 560 228 A1 | 9/1993 |
| EP | 0 632 288 A2 | 1/1995 |
| EP | 0 632 577 A1 | 1/1995 |
| EP | 0 643 477 A2 | 3/1995 |
| EP | 0 643 477 A3 | 3/1995 |
| EP | 0 411 840 B1 | 10/1995 |
| EP | 0 696 854 A1 | 2/1996 |
| EP | 0 632 288 A3 | 7/1996 |
| EP | 0 732 803 A1 | 9/1996 |
| EP | 0 486 095 B1 | 2/1997 |
| EP | 0 782 275 A2 | 7/1997 |
| EP | 0 785 635 A1 | 7/1997 |
| EP | 0 789 449 A2 | 8/1997 |
| EP | 0 789 449 A3 | 8/1997 |
| EP | 0 795 955 A2 | 9/1997 |
| EP | 0 795 955 A3 | 9/1997 |
| EP | 0 795 978 A2 | 9/1997 |
| EP | 0 817 369 A2 | 1/1998 |
| EP | 0 817 369 A3 | 1/1998 |
| EP | 0 837 565 A1 | 4/1998 |
| EP | 0 862 274 A1 | 9/1998 |
| EP | 0 874 499 A2 | 10/1998 |
| EP | 0 512 748 B1 | 11/1998 |
| EP | 0 877 476 A1 | 11/1998 |
| EP | 0 977 351 A1 | 2/2000 |
| FR | 2 245 130 | 4/1975 |
| FR | 2 669 787 A1 | 5/1992 |
| FR | 2 743 231 A1 | 7/1997 |
| GB | 2 161 344 A | 1/1986 |
| GB | 2 215 945 A | 9/1989 |
| GB | 2 324 919 A | 11/1998 |
| JP | 47-2314 | 2/1972 |
| JP | 55-66057 | 5/1980 |
| JP | 56-114451 | 9/1981 |
| JP | 58-7903 | 1/1983 |
| JP | 58-031622 | 2/1983 |
| JP | 58-133004 | 8/1983 |
| JP | 59-022438 | 2/1984 |
| JP | 59-123318 | 7/1984 |
| JP | 59-144249 | 8/1984 |
| JP | 60-58705 | 4/1985 |
| JP | 60-130203 | 7/1985 |
| JP | 61-30821 | 2/1986 |
| JP | 61-193521 | 8/1986 |
| JP | 61-232706 | 10/1986 |
| JP | 61-245749 | 11/1986 |
| JP | 62-12381 | 1/1987 |
| JP | 62-047214 | 2/1987 |
| JP | 63-54002 | 3/1988 |
| JP | 63-65587 | 3/1988 |
| JP | 63-153691 | 6/1988 |
| JP | 63-274214 | 11/1988 |
| JP | 64-048557 | 2/1989 |

| | | |
|---|---|---|
| JP | 2-39632 | 2/1990 |
| JP | 2-131629 | 5/1990 |
| JP | 2-276351 | 11/1990 |
| JP | 4-123614 | 4/1992 |
| JP | 4-127601 | 4/1992 |
| JP | 4-154227 | 5/1992 |
| JP | 5-175730 | 7/1993 |
| JP | 5-175734 | 7/1993 |
| JP | 5-327356 | 12/1993 |
| JP | 6-237276 | 8/1994 |
| JP | 6-284038 | 10/1994 |
| JP | 7-154344 | 6/1995 |
| JP | 7-169292 A | 7/1995 |
| JP | 7-307620 | 11/1995 |
| JP | 8-23359 | 1/1996 |
| JP | 8-32556 | 2/1996 |
| JP | 8-139524 | 5/1996 |
| JP | 8-288882 A | 11/1996 |
| JP | 9-36664 | 2/1997 |
| JP | 9-171399 | 6/1997 |
| JP | 10-22804 A | 1/1998 |
| JP | 10-41860 | 2/1998 |
| JP | 10-96778 | 4/1998 |
| JP | 10-173563 | 6/1998 |
| JP | 11-98205 | 4/1999 |
| WO | WO 80/01633 A1 | 8/1980 |
| WO | WO 91/18445 A1 | 11/1991 |
| WO | WO 94/05087 A1 | 3/1994 |
| WO | WO 95/01006 A1 | 1/1995 |
| WO | WO 95/19073 A2 | 7/1995 |
| WO | WO 96/02977 A1 | 2/1996 |
| WO | WO 96/08078 A1 | 3/1996 |
| WO | WO 96/39750 A1 | 12/1996 |
| WO | WO 97/08839 A2 | 3/1997 |
| WO | WO 97/08839 A3 | 3/1997 |
| WO | WO 97/38490 A1 | 10/1997 |
| WO | WO 98/00953 A1 | 1/1998 |
| WO | WO 98/24201 A1 | 6/1998 |
| WO | WO 98/40968 A2 | 9/1998 |
| WO | WO 98/40968 A3 | 9/1998 |
| WO | WO 98/53556 A2 | 11/1998 |
| WO | WO 99/23755 A1 | 5/1999 |
| WO | WO 00/31659 A1 | 6/2000 |

OTHER PUBLICATIONS

Akers, N.P. et al., "RF Sampling Gates: a Brief Review," *IEE Proceedings*, IEE, vol. 133, Part A, No. 1, pp. 45-49 (Jan. 1986).

Al-Ahmad, H.A.M. et al., "Doppler Frequency Correction for a Non-Geostationary Communications Satellite. Techniques for CERS and T-SAT," *Electronics Division Colloquium on Low Noise Oscillators and Synthesizers*, IEE, pp. 4/1-4/5 (Jan. 23, 1986).

Ali, I. et al., "Doppler Characterization for LEO Satellites," *IEEE Transactions on Communications*, IEEE, vol. 46, No. 3, pp. 309-313 (Mar. 1998).

Allan, D.W., "Statistics of Atomic Frequency Standards," *Proceedings of the IEEE Special Issue on Frequency Stability*, IEEE, pp. 221-230 (Feb. 1966).

Allstot, D.J. et al., "MOS Switched Capacitor Ladder Filters," *IEEE Journal of Solid-State Circuits*, IEEE, vol. SC-13, No. 6, pp. 806-814 (Dec. 1978).

Allstot, D.J. and Black Jr. W.C., "Technological Design Considerations for Monolithic MOS Switched-Capacitor Filtering Systems," *Proceedings of the IEEE*, IEEE, vol. 71, No. 8, pp. 967-986 (Aug. 1983).

Alouini, M. et al., "Channel Characterization and Modeling for Ka-Band Very Small Aperture Terminals," *Proceedings of the IEEE*, IEEE, vol. 85, No. 6, pp. 981-997 (Jun. 1997).

Andreyev, G.A. and Ogarev, S.A., "Phase Distortions of Keyed Millimeter-Wave Signals in the Case of Propagation in a Turbulent Atmosphere," *Telecommunications and Radio Engineering*, Scripta Technica, vol. 43, No. 12, pp. 87-90 (Dec. 1988).

Antonetti, A. et al., "Optoelectronic Sampling in the Picosecond Range," *Optics Communications*, North-Holland Publishing Company, vol. 21, No. 2, pp. 211-214 (May 1977).

Austin, J. et al., "Doppler Correction of the Telecommunication Payload Oscillators in the UK T-SAT," *18th European Microwave Conference*, Microwave Exhibitions and Publishers Ltd., pp. 851-857 (Sep. 12-15, 1988).

Auston, D.H., "Picosecond optoelectronic switching and gating in silicon," *Applied Physics Letters*, American Institute of Physics, vol. 26, No. 3, pp. 101-103 (Feb. 1, 1975).

Baher, H., "Transfer Functions for Switched-Capacitor and Wave Digital Filters," *IEEE Transactions on Circuits and Systems*, IEEE Circuits and Systems Society, vol. CAS-33, No. 11, pp. 1138-1142 (Nov. 1986).

Baines, R., "The DSP Bottleneck," *IEEE Communications Magazine*, IEEE Communications Society, pp. 46-54 (May 1995).

Banjo, O.P. and Vilar, E., "Binary Error Probabilities on Earth-Space Links Subject to Scintillation Fading," *Electronics Letters*, IEE, vol. 21, No. 7, pp. 296-297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277-280 (Mar. 30-Apr. 2, 1987).

Banjo, O.P. and Vilar, E. "Measurement and Modeling of Amplitude Scintillations on Low-Elevation Earth-Space Paths and Impact on Communication Systems," *IEEE Transactions on Communications*, IEEE Communications Society, vol. COM-34, No. 8, pp. 774-780 (Aug. 1986).

Banjo, O.P. et al., "Tropospheric Amplitude Spectra Due to Absorption and Scattering in Earth-Space Paths," *Fourth International Conference on Antennas and Propagation (ICAP 85)*, IEE, pp. 77-82 (Apr. 16-19, 1985).

Basili,P. et al., "Case Study of Intense Scintillation Events on the OTS Path," *IEEE Transactions on Antennas and Propagation*, IEEE, vol. 38, No. 1, pp. 107-113 (Jan. 1990).

Basili, P. et al., "Observation of High $C^2$ and Turbulent Path Length on OTS Space-Earth Link," *Electronics Letters*, IEE, vol. 24, No. 17, pp. 1114-1116 (Aug. 18, 1988).

Blakey, J.R. et al., "Measurement of Atmospheric Millimetre-Wave Phase Scintillations in an Absorption Region," *Electronics Letters*, IEE, vol. 21, No. 11, pp. 486-487 (May 23, 1985).

Burgueño, A. et al., "Influence of rain gauge integration time on the rain rate statistics used in microwave communications," *annales des télècommunications*, International Union of Radio Science, pp. 522-527 (Sep./Oct. 1988).

Burgueño, A. et al., "Long-Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198-201 (Mar. 30-Apr. 2, 1987).

Burgueño, A. et al., "Long Term Statistics of Precipitation Rate Return Periods in the Context of Microwave Communications," *Sixth International Conference on Antennas and Propagation (ICAP 89) Part 2: Propagation*, IEE, pp. 297-301 (Apr. 4-7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359-1366 (Sep. 1990).

Catalan, C. and Vilar, E., "Approach for satellite slant path remote sensing," *Electronics Letters*, IEE, vol. 34, No. 12, pp. 1238-1240 (Jun. 11, 1998).

Chan, P. et al., "A Highly Linear 1-GHz CMOS Downconversion Mixer," *European Solid State Circuits Conference*, IEEE Communication Society, pp. 210-213 (Sep. 22-24, 1993).

Declaration of Michael J. Bultman filed in U.S. Appl. No. 09/176,022, which is directed to related subject matter, 2 pages.

Declaration of Robert W. Cook filed in U.S. Appl. No. 09/176,022, which is directed to related subject matter, 2 pages.

Declaration of Alex Holtz filed in U.S. Appl. No. 09/176,022, which is directed to related subject matter, 3 pages.

Declaration of Richard C. Looke filed in U.S. Appl. No. 09/176,022, which is directed to related subject matter, 2 pages.

Declaration of Charley D. Moses, Jr. filed in U.S. Appl. No. 09/176,022, which is directed to related subject matter, 2 pages.

Declaration of Jeffrey L. Parker and David F. Sorrells, with attachment Exhibit 1, filed in U.S. Appl. No. 09/176,022, which is directed to related subject matter, 130 pages.

Dewey, R.J. and Collier, C.J., "Multi-Mode Radio Receiver," *Electronics Division Colloquium on Digitally Implemented Radios*, IEE, pp. 3/1-3/5 (Oct. 18, 1985).

DIALOG File 347 (JAPIO) English Language Patent Abstract for JP 2-276351, 1 page (Nov. 13, 1990—Date of publication of application).

DIALOG File 347 (JAPIO) English Language Patent Abstract for JP 2-131629, 1 page (May 21, 1990—Date of publication of application).

DIALOG File 347 (JAPIO) English Language Patent Abstract for JP 2-39632, 1 page (Feb. 8, 1990—Date of publication of application).

DIALOG File 348 (European Patents) English Language Patent Abstract for EP 0 785 635 A1, 3 pages (Dec. 26, 1996—Date of publication of application).

DIALOG File 348 (European Patents) English Language Patent Abstract for EP 35166 A1, 2 pages (Feb. 18, 1981—Date of publication of application).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET-Less Sample-and-Hold with High Charge-to-Droop Current Ratio," *IEEE Journal of Solid-State Circuits*, IEEE, vol. SC-13, No. 6, pp. 864-873 (Dec. 1978).

Faulkner, N.D. and Vilar, E., "Subharmonic Sampling for the Measurement of Short Term Stability of Microwave Oscillators," *IEEE Transactions on Instrumentation and Measurement*, IEEE, vol. IM-32, No. 1, pp. 208-213 (Mar. 1983).

Faulkner, N.D. et al., "Sub-Harmonic Sampling for the Accurate Measurement of Frequency Stability of Microwave Oscillators," *CPEM 82 Digest: Conference on Precision Electromagnetic Measurements*, IEEE, pp. M-10 and M-11 (1982).

Faulkner, N.D. and Vilar, E., "Time Domain Analysis of Frequency Stability Using Non-Zero Dead-Time Counter Techniques," *CPEM 84 Digest Conference on Precision Electromagnetic Measurements*, IEEE, pp. 81-82 (1984).

Filip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958-1965 (Nov. 1990).

Fukahori, K., "A CMOS Narrow-Band Signaling Filter with Q Reduction," *IEEE Journal of Solid-State Circuits*, IEEE, vol. SC-19, No. 6, pp. 926-932 (Dec. 1984).

Fukuchi, H. and Otsu, Y., "Available time statistics of rain attenuation on earth-space path," *IEE Proceedings-H: Microwaves, Antennas and Propagation*, IEE, vol. 135, Pt. H, No. 6, pp. 387-390 (Dec. 1988).

Gibbins, C.J. and Chadha, R., "Millimetre-wave propagation through hydrocarbon flame," *IEE Proceedings*, IEE, vol. 134, Pt. H, No. 2, pp. 169-173 (Apr. 1987).

Gilchrist, B. et al., "Sampling hikes performance of frequency synthesizers," *Microwaves & RF*, Hayden Publishing, vol. 23, No. 1, pp. 93-94 and 110 (Jan. 1984).

Gossard, E.E., "Clear weather meteorological effects on propagation at frequencies above 1 Ghz," *Radio Science*, American Geophysical Union, vol. 16, No. 5, pp. 589-608 (Sep.-Oct. 1981).

Gregorian, R. et al., "Switched-Capacitor Circuit Design," *Proceedings of the IEEE*, IEEE, vol. 71, No. 8, pp. 941-966 (Aug. 1983).

Groshong et al., "Undersampling Techniques Simplify Digital Radio," *Electronic Design*, Penton Publishing, pp. 67-68, 70, 73-75 and 78 (May 23, 1991).

Grove, W.M., "Sampling for Oscilloscopes and Other RF Systems: Dc through X-Band," *IEEE Transactions on Microwave Theory and Techniques*, IEEE, pp. 629-635 (Dec. 1966).

Haddon, J. et al., "Measurement of Microwave Scintillations on a Satellite Down-Link at X-Band," *Antennas and Propagation*, IEE, pp. 113-117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP-34, No. 5, pp. 646-657 (May 1986).

Hafdallah, H. et al., "2-4 Ghz MESFET Sampler," *Electronics Letters*, IEE, vol. 24, No. 3, pp. 151-153 (Feb. 4, 1988).

Herben, M.H.A.J., "Amplitude and Phase Scintillation Measurements on 8-2 km Line-Of-Sight Path at 30 Ghz," *Electronics Letters*, IEE, vol. 18, No. 7, pp. 287-289 (Apr. 1, 1982).

Hewitt, A. et al., "An 18 Ghz Wideband LOS Multipath Experiment," *International Conference on Measurements for Telecommunication Transmission Systems—MTTS 85*, IEE, pp. 112-116 (Nov. 27-28, 1985).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136-1143 (Nov. 1989).

Hewitt, A. and Vilar, E., "Selective fading on LOS Microwave Links: Classical and Spread-Spectrum Measurement Techniques," *IEEE Transactions on Communications*, IEEE Communications Society, vol. 36, No. 7, pp. 789-796 (Jul. 1988).

Hospitatier, E., "Instruments for Recording and Observing Rapidly Varying Phenomena," *Science Abstracts*, IEE, vol. VII, pp. 22-23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115-121 (Sep. 18-20, 1990).

Hu, X., *A Switched-Current Sample-and-Hold Amplifier for FM Demodulation*, Thesis for Master of Applied Science, Dept. of Electrical and Computer Engineering, University of Toronto, UMI Dissertation Services, pp. 1-64 (1995).

Hung, H-L. A. et al., "Characterization of Microwave Integrated Circuits Using an Optical Phase-Locking and Sampling System," *IEEE MTT-S Digest*, IEEE, pp. 507-510 (1991).

Hurst, P.J., "Shifting the Frequency Response of Switched-Capacitor Filters by Nonuniform Sampling," *IEEE Transactions on Circuits and Systems*, IEEE Circuits and Systems Society, vol. 38, No. 1, pp. 12-19 (Jan. 1991).

Itakura, T., "Effects of the sampling pulse width on the frequency characteristics of a sample-and-hold circuit," *IEE Proceedings Circuits, Devices and Systems*, IEE, vol. 141, No. 4, pp. 328-336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52-59 (Aug. 1950).

Janssen, J.M.L. and Michels, A.J., "An Experimental 'Stroboscopic' Oscilloscope for Frequencies up to about 50 Mc/s: II. Electrical Build-Up," *Philips Technical Review*, Philips Research Laboratories, vol. 12, No. 3, pp. 73-82 (Sep. 1950).

Jondral, V.F. et al., "Doppler Profiles for Communication Satellites," *Frequenz*, Herausberger, pp. 111-116 (May-Jun. 1996).

Kaleh, G.K., "A Frequency Diversity Spread Spectrum System for Communication in the Presence of In-band Interference," *1995 IEEE Globecom*, IEEE Communications Society, pp. 66-70 (1995).

Karasawa, Y. et al., "A New Prediction Method for Tropospheric Scintillation on Earth-Space Paths," *IEEE Transactions on Antennas and Propagation*, IEEE Antennas and Propagation Society, vol. 36, No. 11, pp. 1608-1614 (Nov. 1988).

Kirsten, J. and Fleming, J., "Undersampling reduces data-acquisition costs for select applications," *EDN*, Cahners Publishing, vol. 35, No. 13, pp. 217-222, 224, 226-228 (Jun. 21, 1990).

Lam, W.K. et al., "Measurement of the Phase Noise Characteristics of an Unlocked Communications Channel Identifier," *Proceedings of the 1993 IEEE International Frequency Control Symposium*, IEEE, pp. 283-288 (Jun. 2-4, 1993).

Lam, W.K. et al., "Wideband sounding of 11.6 Ghz transhorizon channel," *Electronics Letters*, IEE, vol. 30, No. 9, pp. 738-739 (Apr. 28, 1994).

Larkin, K.G., "Efficient demodulator for bandpass sampled AM signals," *Electronics Letters*, IEE, vol. 32, No. 2, pp. 101-102 (Jan. 18, 1996).

Lau, W.H. et al., "Analysis of the Time Variant Structure of Microwave Line-of-sight Multipath Phenomena," *IEEE Global Telecommunications Conference & Exhibition*, IEEE, pp. 1707-1711 (Nov. 28-Dec. 1, 1988).

Lau, W.H. et al., "Improved Prony Algorithm to Identify Multipath Components," *Electronics Letters*, IEE, vol. 23, No. 20, pp. 1059-1060 (Sep. 24, 1987).

Lesage, P. and Audoin, C., "Effect of Dead-Time on the Estimation of the Two-Sample Variance," *IEEE Transactions on Instrumentation and Measurement*, IEEE Instrumentation and Measurement Society, vol. IM-28, No. 1, pp. 6-10 (Mar. 1979).

Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, vol. MTT-23, No. 6, pp. 461-469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS-26, No. 4, pp. 4443-4449 (Aug. 1979).

Liou, M.L., "A Tutorial on Computer-Aided Analysis of Switched-Capacitor Circuits," *Proceedings of the IEEE*, IEEE, vol. 71, No. 8, pp. 987-1005 (Aug. 1983).

Lo, P. et al., "Coherent Automatic Gain Control," *IEE Colloquium on Phase Locked Techniques*, IEE, pp. 2/1-2/6 (Mar. 26, 1980).

Lo, P. et al., "Computation of Rain Induced Scintillations on Satellite Down-Links at Microwave Frequencies," *Third International Conference on Antennas and Propagation (ICAP 83)*, pp. 127-131 (Apr. 12-15, 1983).

Lo, P.S.L.O. et al., "Observations of Amplitude Scintillations on a Low-Elevation Earth-Space Path," *Electronics Letters*, IEE, vol. 20, No. 7, pp. 307-308 (Mar. 29, 1984).

Madani, K. and Aithison, C.S., "A 20 Ghz Microwave Sampler," *IEEE Transactions on Microwave Theory and Techniques*, IEEE Microwave Theory and Techniques Society, vol. 40, No. 10, pp. 1960-1963 (Oct. 1992).

Marsland, R.A. et al., "130 Ghz GaAs monolithic integrated circuit sampling head," *Appl. Phys. Lett.*, American Institute of Physics, vol. 55, No. 6, pp. 592-594 (Aug. 7, 1989).

Martin, K. K and Sedra, A.S., "Switched-Capacitor Building Blocks for Adaptive Systems," *IEEE Transactions on Circuits and Systems*, IEEE Circuits and Systems Society, vol. CAS-28, No. 6, pp. 576-584 (Jun. 1981).

Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, vol. 46, No. 10, pp. 1506-1518 (Oct. 1998).

Matricciani, E., "Prediction of fade durations due to rain in satellite communication systems," *Radio Science*, American Geophysical Union, vol. 32, No. 3, pp. 935-941 (May-Jun. 1997).

McQueen, J.G., "The Monitoring of High-Speed Waveforms," *Electronic Engineering*, Morgan Brothers • Limited, vol. XXIV, No. 296, pp. 436-441 (Oct. 1952).

Merkelo, J. and Hall, R.D., "Broad-Band Thin-Film Signal Sampler," *IEEE Journal of Solid-State Circuits*, IEEE, vol. SC-7, No. 1, pp. 50-54 (Feb. 1972).

Merlo, U. et al., "Amplitude Scintillation Cycles in a Sirio Satellite-Earth Link," *Electronics Letters*, IEE, vol. 21, No. 23, pp. 1094-1096 (Nov. 7, 1985).

Morris, D., "Radio-holographic reflector measurement of the 30-m millimeter radio telescope at 22 Ghz with a cosmic signal source," *Astronomy and Astrophysics*, Springer-Verlag, vol. 203, No. 2, pp. 399-406 (Sep. (II) 1988).

Moulsley, T.J. et al., "The efficient acquisition and processing of propagation statistics," *Journal of the Institution of Electronic and Radio Engineers*, IERE, vol. 55, No. 3, pp. 97-103 (Mar. 1985).

Ndzi, D. et al., "Wide-Band Statistical Characterization of an Over-the-Sea Experimental Transhorizon Link," *IEE Colloquium on Radio Communications at Microwave and Millimetre Wave Frequencies*, IEE, pp. 1/1-1/6 (Dec. 16, 1996).

Ndzi, D. et al., "Wideband Statistics of Signal Levels and Doppler Spread on an Over-The-Sea Transhorizon Link," *IEE Colloquium on Propagation Characteristics and Related System Techniques for Beyond Line-of-Sight Radio*, IEE, pp. 9/1-9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130-135 (Apr. 12, 1979).

Oppenheim, A.V. et al., *Signals and Systems*, Prentice-Hall, pp. 527-531 and 561-562 (1983).

Ortgies, G., "Experimental Parameters Affecting Amplitude Scintillation Measurements on Satellite Links," *Electronics Letters*, IEE, vol. 21, No. 17, pp. 771-772 (Aug. 15, 1985).

Pärssinen et al., "A 2-GHz Subharmonic Sampler for Signal Downconversion," *IEEE Transactions on Microwave Theory and Techniques*, IEEE, vol. 45, No. 12, 7 pages (Dec. 1997).

Peeters, G. et al., "Evaluation of Statistical Models for Clear-Air Scintillation Prediction Using Olympus Satellite Measurements," *International Journal of Satellite Communications*, John Wiley and Sons, vol. 15, No. 2, pp. 73-88 (Mar.-Apr. 1997).

Perrey, A.G. and Schoenwetter, H.K., *NBS Technical Note 1121: A Schottky Diode Bridge Sampling Gate*, U.S. Dept. of Commerce, pp. 1-14 (May 1980).

Poulton, K. et al., "A 1-Ghz 6-bit ADC System," *IEEE Journal of Solid-State Circuits*, IEEE, vol. SC-22, No. 6, pp. 962-969 (Dec. 1987).

Press Release, "Parkervision, Inc. Announces Fiscal 1993 Results," Lippert/Heilshorn and Associates, 2 Pages (Apr. 6, 1994).

Press Release, "Parkervision, Inc. Announces the Appointment of Michael Baker to the New Position of National Sales Manager," Lippert/Heilshorn and Associates, 1 Page (Apr. 7, 1994).

Press Release, "Parkervision's Cameraman Well-Received by Distance Learning Market," LipperVHeilshorn and Associates, 2 Pages (Apr. 8, 1994).

Press Release, "Parkervision, Inc. Announces First Quarter Financial Results," Lippert/Heilshorn and Associates, 2 Pages (Apr. 26, 1994).

Press Release, "Parkervision, Inc. Announces the Retirement of William H. Fletcher, Chief Financial Officer," Lippert/Heilshorn and Associates, 1 Page (May 11, 1994).

Press Release, "Parkervision, Inc. Announces New Cameraman System II™ At Infocomm Trade Show," Lippert/Heilshorn and Associates, 3 Pages (Jun. 9, 1994).

Press Release, "Parkervision, Inc. Announces Appointments to its National Sales Force," Lippert/Heilshorn and Associates, 2 Pages (Jun. 17, 1994).

Press Release, "Parkervision, Inc. Announces Second Quarter and Six Months Financial Results," Lippert/Heilshorn and Associates, 3 Pages (Aug. 9, 1994).

Press Release, "Parkervision, Inc. Announces Third Quarter and Nine Months Financial Results," Lippert/Heilshorn and Associates, 3 Pages (Oct. 28, 1994).

Press Release, "Parkervision, Inc. Announces First Significant Dealer Sale of Its *Cameraman®* System II," Lippert/Heilshorn and Associates, 2 Pages (Nov. 7, 1994).

Press Release, "Parkervision, Inc. Announces Fourth Quarter and Year End Results," Lippert/Heilshorn and Associates, 2 Pages (Mar. 1, 1995).

Press Release, "Parkervision, Inc. Announces Joint Product Developments With VTEL," Lippert/Heilshorn and Associates, 2 Pages (Mar. 21, 1995).

Press Release, "Parkervision, Inc. Announces First Quarter Financial Results," Lippert/Heilshorn and Associates, 3 Pages (Apr. 28, 1995).

Press Release, "Parkervision Wins Top 100 Product Districts' Choice Award," Parkervision Marketing and Manufacturing Headquarters, 1 Page (Jun. 29, 1995).

Press Release, "Parkervision National Sales Manager Next President of USDLA," Parkervision Marketing and Manufacturing Headquarters, 1 Page (Jul. 6, 1995).

Press Release, "Parkervision Granted New Patent," Parkervision Marketing and Manufacturing Headquarters, 1 Page (Jul. 21, 1995).

Press Release, "Parkervision, Inc. Announces Second Quarter and Six Months Financial Results," Parkervision Marketing and Manufacturing Headquarters, 2 Pages (Jul. 31, 1995).

Press Release, "Parkervision, Inc. Expands Its Cameraman System II Product Line," Parkervision Marketing and Manufacturing Headquarters, 2 Pages (Sep. 22, 1995).

Press Release, "Parkervision Announces New Camera Control Technology," Parkervision Marketing and Manufacturing Headquarters, 2 Pages (Oct. 25, 1995).

Press Release, "Parkervision, Inc. Announces Completion of VTEL/Parkervision Joint Product Line," Parkervision Marketing and Manufacturing Headquarters, 2 Pages (Oct. 30, 1995).

Press Release, "Parkervision, Inc. Announces Third Quarter and Nine Months Financial Results," Parkervision Marketing and Manufacturing Headquarters, 2 Pages (Oct. 30, 1995).

Press Release, "Parkervision's Cameraman Personal Locator Camera System Wins Telecon XV Award," Parkervision Marketing and Manufacturing Headquarters, 2 Pages (Nov. 1, 1995).

Press Release, "Parkervision, Inc. Announces Purchase Commitment From VTEL Corporation," Parkervision Marketing and Manufacturing Headquarters, 1 Page (Feb. 26, 1996).

Press Release, "ParkerVision, Inc. Announces Fourth Quarter and Year End Results," Parkervision Marketing and Manufacturing Headquarters, 2 Pages (Feb. 27, 1996).

Press Release, "ParkerVision, Inc. Expands its Product Line," Parkervision Marketing and Manufacturing Headquarters, 2 Pages (Mar. 7, 1996).

Press Release, "ParkerVision Files Patents for its Research of Wireless Technology," Parkervision Marketing and Manufacturing Headquarters, 1 Page (Mar. 28, 1996).

Press Release, "Parkervision, Inc. Announces First Significant Sale of Its Cameraman® Three-Chip System," Parkervision Marketing and Manufacturing Headquarters, 2 pages (Apr. 12, 1996).

Press Release, "Parkervision, Inc. Introduces New Product Line for Studio Production Market," Parkervision Marketing and Manufacturing Headquarters, 2 Pages (Apr. 15, 1996).

Press Release, "Parkervision, Inc. Announces Private Placement of 800,000 Shares," Parkervision Marketing and Manufacturing Headquarters, 1 Page (Apr. 15, 1996).

Press Release, "Parkervision, Inc. Announces First Quarter Financial Results," Parkervision Marketing and Manufacturing Headquarters, 3 Pages (Apr. 30, 1996).

Press Release, "ParkerVision's New Studio Product Wins Award," Parkervision Marketing and Manufacturing Headquarters, 2 Pages (Jun. 5, 1996).

Press Release, "Parkervision, Inc. Announces Second Quarter and Six Months Financial Results," Parkervision Marketing and Manufacturing Headquarters, 3 Pages (Aug. 1, 1996).

Press Release, "Parkervision, Inc. Announces Third Quarter and Nine Months Financial Results," Parkervision Marketing and Manufacturing Headquarters, 2 Pages (Oct. 29, 1996).

Press Release, "PictureTel and ParkerVision Sign Reseller Agreement," Parkervision Marketing and Manufacturing Headquarters, 2 Pages (Oct. 30, 1996).

Press Release, "CLI and ParkerVision Bring Enhanced Ease-of-Use to Videoconferencing," CLI/Parkervision, 2 Pages (Jan. 20, 1997).

Press Release, "Parkervision, Inc. Announces Fourth Quarter and Year End Results," Parkervision Marketing and Manufacturing Headquarters, 3 Pages (Feb. 27, 1997).

Press Release, "Parkervision, Inc. Announces First Quarter Financial Results," Parkervision Marketing and Manufacturing Headquarters, 3 Pages (Apr. 29, 1997).

Press Release, "NEC and Parkervision Make Distance Learning Closer," NEC America, 2 Pages (Jun. 18, 1997).

Press Release, "Parkervision Supplies JPL with Robotic Cameras, Cameraman Shot Director for Mars Mission," Parkervision Marketing and Manufacturing Headquarters, 2 pages (Jul. 8, 1997).

Press Release, "ParkerVision and IBM Join Forces to Create Wireless Computer Peripherals," Parkervision Marketing and Manufacturing Headquarters, 2 Pages (Jul. 23, 1997).

Press Release, "ParkerVision, Inc. Announces Second Quarter and Six Months Financial Results," Parkervision Marketing and Manufacturing Headquarters, 3 Pages (Jul. 31, 1997).

Press Release, "Parkervision, Inc. Announces Private Placement of 990,000 Shares," Parkervision Marketing and Manufacturing Headquarters, 2 Pages (Sep. 8, 1997).

Press Release, "Wal-Mart Chooses Parkervision for Broadcast Production," Parkervision Marketing and Manufacturing Headquarters, 2 Pages (Oct. 24, 1997).

Press Release, "Parkervision, Inc. Announces Third Quarter Financial Results," Parkervision Marketing and Manufacturing Headquarters, 3 Pages (Oct. 30, 1997).

Press Release, "ParkerVision Announces Breakthrough in Wireless Radio Frequency Technology," Parkervision Marketing and Manufacturing Headquarters, 3 Pages (Dec. 10, 1997).

Press Release, "Parkervision, Inc. Announces the Appointment of Joseph F. Skovron to the Position of Vice President, Licensing—Wireless Technologies," Parkervision Marketing and Manufacturing Headquarters, 2 Pages (Jan. 9, 1998).

Press Release, "Parkervision Announces Existing Agreement with IBM Terminates—Company Continues with Strategic Focus Announced in December" Parkervision Marketing and Manufacturing Headquarters, 2 Pages (Jan. 27, 1998).

Press Release, "Laboratory Tests Verify Parkervision Wireless Technology," Parkervision Marketing and Manufacturing Headquarters, 2 Pages (Mar. 3, 1998).

Press Release, "Parkervision, Inc. Announces Fourth Quarter and Year End Financial Results," Parkervision Marketing and Manufacturing Headquarters, 3 Pages (Mar. 5, 1998).

Press Release, "Parkervision Awarded Editors' Pick of Show for NAB 98," Parkervision Marketing and Manufacturing Headquarters, 2 Pages (Apr. 15, 1998).

Press Release, "Parkervision Announces First Quarter Financial Results," Parkervision Marketing and Manufacturing Headquarters, 3 Pages (May 4, 1998).

Press Release, "Parkervision 'DIRECT2DATA' Introduced in Response to Market Demand," Parkervision Marketing and Manufacturing Headquarters, 3 Pages (Jul. 9, 1998).

Press Release, "Parkervision Expands Senior Management Team," Parkervision Marketing and Manufacturing Headquarters, 2 Pages (Jul. 29, 1998).

Press Release, "Parkervision Announces Second Quarter and Six Month Financial Results," Parkervision Marketing and Manufacturing Headquarters, 4 Pages (Jul. 30, 1998).

Press Release, "Parkervision Announces Third Quarter and Nine Month Financial Results," Parkervision Marketing and Manufacturing Headquarters, 3 Pages (Oct. 30, 1998).

Press Release, "Questar Infocomm, Inc. Invests $5 Million in Parkervision Common Stock," Parkervision Marketing and Manufacturing Headquarters, 3 Pages (Dec. 2, 1998).

Press Release, "Parkervision Adds Two New Directors," Parkervision Marketing and Manufacturing Headquarters, 2 Pages (Mar. 5, 1999).

Press Release, "Parkervision Announces Fourth Quarter and Year End Financial Results," Parkervision Marketing and Manufacturing Headquarters, 3 Pages (Mar. 5, 1999).

Press Release, "Joint Marketing Agreement Offers New Automated Production Solution," Parkervision Marketing and Manufacturing Headquarters, 2 Pages (Apr. 13, 1999).

"Project COST 205: Scintillations in Earth-satellite links," *Alta Frequenza: Scientific Review in Electronics*, AEI, vol. LIV, No. 3, pp. 209-211 (May-Jun. 1985).

Razavi, B., *RF Microelectronics*, Prentice-Hall, pp. 147-149 (1998).

Reeves, R.J.D., "The Recording and Collocation of Waveforms (Part 1)," *Electronic Engineering*, Morgan Brothers Limited, vol. 31, No. 373, pp. 130-137 (Mar. 1959).

Reeves, R.J.D., "The Recording and Collocation of Waveforms (Part 2)," *Electronic Engineering*, Morgan Brothers Limited, vol. 31, No. 374, pp. 204-212 (Apr. 1959).

Rein, H.M. and Zahn, M., "Subnanosecond-Pulse Generator with Variable Pulsewidth Using Avalanche Transistors," *Electronics Letters*, IEE, vol. 11, No. 1, pp. 21-23 (Jan. 9, 1975).

Riad, S.M. and Nahman, N.S., "Modeling of the Feed-through Wideband (DC to 12.4 Ghz) Sampling-Head," *IEEE MTT-S International Microwave Symposium Digest*, IEEE, pp. 267-269 (Jun. 27-29, 1978).

Rizzoli, V. et al., "Computer-Aided Noise Analysis of MESFET and HEMT Mixers," *IEEE Transactions on Microwave Theory and Techniques*, IEEE, vol. 37, No. 9, pp. 1401-1410 (Sep. 1989).

Rowe, H.E., Signals and Noise in Communication Systems, D. Van Nostrand Company, Inc., Princeton, New Jersey, including, for example, Chapter V, Pulse Modulation Systems (1965).

Rucker, F. and Dintelmann, F. "Effect of Antenna Size on OTS Signal Scintillations and Their Seasonal Dependence," *Electronics Letters*, IEE, vol. 19, No. 24, pp. 1032-1034 (Nov. 24, 1983).

Russell, R. and Hoare, L., "Millimeter Wave Phase Locked Oscillators," *Military Microwaves '78 Conference Proceedings*, Microwave Exhibitions and Publishers, pp. 238-242 (Oct. 25-27, 1978).

Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218-223 (Oct. 16-18, 1990).

Salous, S., "IF digital generation of FMCW waveforms for wideband channel characterization," *IEE Proceedings-I*, IEE, vol. 139, No. 3, pp. 281-288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched-Capacitor Biquad," *Proceedings of the IEEE*, IEEE, vol. 71, No. 8, pp. 1008-1009 (Aug. 1983).

Saul, P.H., "A GaAs MESFET Sample and Hold Switch," *Fifth European Solid State Circuits Conference—ESSCIRC 79*, IEE, pp. 5-7 (1979).

Shen, D.H. et al., "A 900-MHZ RF Front-End with Integrated Discrete-Time Filtering," *IEEE Journal of Solid-State State Circuits*, IEEE Solid-State Circuits Council, vol. 31, No. 12, pp. 1945-1954 (Dec. 1996).

Shen, X.D. and Viler, E., "Anomalous transhorizon propagation and meteorological processes of a multilink path," *Radio Science*, American Geophysical Union, vol. 30, No. 5, pp. 1467-1479 (Sep.-Oct. 1995).

Shen, X. and Tawfik, A.N., "Dynamic Behaviour of Radio Channels Due to Trans-Horizon Propagation Mechanisms," *Electronics Letters*, IEE, vol. 29, No. 17, pp. 1582-1583 (Aug. 19, 1993).

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1-4/7 (Mar. 8, 1996).

Shen, X. and Vilar, E. "Path loss statistics and mechanisms of transhorizon propagation over a sea path," *Electronics Letters*, IEE, vol. 32, No. 3, pp. 259-261 (Feb. 1, 1996).

Shen, D. et al., "A 900 MHZ Integrated Discrete-Time Filtering RF Front-End," *IEEE International Solid State Circuits Conference*, IEEE, vol. 39, pp. 54-55 and 417 (Feb. 1996).

Spillard, C. et al., "X-Band Tropospheric Transhorizon Propagation Under Differing Meteorological Conditions," *Sixth International Conference on Antennas and Propagation (ICAP 89) Part 2: Propagation*, IEE, pp. 451-455 (Apr. 4-7, 1989).

Stafford, K.R. et al., "A Complete Monolithic Sample/Hold Amplifier," *IEEE Journal of Solid-State Circuits*, IEEE, vol. SC-9, No. 6, pp. 381-387 (Dec. 1974).

Staruk, W. Jr. et al., "Pushing HF Data Rates," *Defense Electronics*, EW Communications, vol. 17, No. 5, pp. 211, 213, 215, 217, 220 and 222 (May 1985).

Stephenson, A.G., "Digitizing multiple RF signals requires an optimum sampling rate," *Electronics*, McGraw-Hill, pp. 106-110 (Mar. 27, 1972).

Sugarman, R. "Sampling Oscilloscope for Statistically Varying Pulses," *The Review of Scientific Instruments*, American Institute of Physics, vol. 28, No. 11, pp. 933-938 (Nov. 1957).

Sylvain, M., "Experimental probing of multipath microwave channels," *Radio Science*, American Geophysical Union, vol. 24, No. 2, pp. 160-178 (Mar.-Apr. 1989).

Takano, T., "Novel GaAs Pet Phase Detector Operable to Ka Band," *IEEE MT-S Digest*, IEEE, pp. 381-383 (1984).

Tan, M.A., "Biquadratic Transconductance Switched-Capacitor Filters," *IEEE Transactions on Circuits and Systems—I: Fundamental Theory and Applications*, IEEE Circuits and Systems Society, vol. 40, No. 4, pp. 272-275 (Apr. 1993).

Tanaka, K. et al., "Single Chip Multisystem AM Stereo Decoder IC," *IEEE Transactions on Consumer Electronics*, IEEE Consumer Electronics Society, vol. CE-32, No. 3, pp. 482-496 (Aug. 1986).

Tawfik, A.N., "Amplitude, Duration and Predictability of Long Hop Trans-Horizon X-band Signals Over the Sea," *Electronics Letters*, IEE, vol. 28, No. 6, pp. 571-572 (Mar. 12, 1992).

Tawrik, A.N. and Vilar, E., "Correlation of Transhorizon Signal Level Strength with Localized Surface Meteorological Parameters," *Eighth International Conference on Antennas and Propagation*, Electronics Division of the IEE, pp. 335-339 (Mar. 30-Apr. 2, 1993).

Tawfik, A.N. and Vilar, E., "Dynamic Structure of a Transhorizon Signal at X-band Over a Sea Path," *Sixth International Conference on Antennas and Propagation (ICAP 89) Part 2: Propagation*, IEE, pp. 446-450 (Apr. 4-7, 1989).

Tawfik, A.N. and Vilar, E., "Statistics of Duration and Intensity of Path Loss in a Microwave Transhorizon Sea-Path," *Electronics Letters*, IEE, vol. 26, No. 7, pp. 474-476 (Mar. 29, 1990).

Tawfik, A.N. and Vilar, E., "X-Band Transhorizon Measurements of CW Transmissions Over the Sea—Part 1: Path Loss, Duration of Events, and Their Modeling," *IEEE Transactions on Antennas and Propagation*, IEEE Antennas and Propagation Society, vol. 41, No. 11, pp. 1491-1500 (Nov. 1993).

Temes, G.C. and Tsividis, T., "The Special Section on Switched-Capacitor Circuits," *Proceedings of the IEEE*, IEEE, vol. 71, No. 8, pp. 915-916 (Aug. 1983).

Thomas, G.B., *Calculus and Analytic Geometry*, Third Edition, Addison-Wesley Publishing, pp. 119-133 (1960).

Tomassetti, Q., "An Unusual Microwave Mixer," *16$^{th}$ European Microwave Conference*, Microwave Exhibitions and Publishers, pp. 754-759 (Sep. 8-12, 1986).

Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1-3 (Jan. 1984).

Tsividis, Y. and Antognetti, P. (Ed.), *Design of MOS VLSI Circuits for Telecommunications*, Prentice-Hall, p. 304 (1985).

Tsividis, Y., "Principles of Operation and Analysis of Switched-Capacitor Circuits," *Proceedings of the IEEE*, IEEE, vol. 71, No. 8, pp. 926-940 (Aug. 1983).

Tsurumi, H. and Maeda, T., "Design Study on a Direct Conversion Receiver Front-End for 280 MHZ, 900 MHZ, and 2.6 Ghz Band Radio Communication Systems," *41$^{st}$ IEEE Vehicular Technology Conference*, IEEE Vehicular Technology Society, pp. 457-462 (May 19-22, 1991).

Valdmanis, J.A. et al., "Picosecond and Subpicosend Optoelectronics for Measurements of Future High Speed Electronic Devices," *IEDM Technical Digest*, IEEE, pp. 597-600 (Dec. 5-7, 1983).

van de Kamp, M.M.J.L., "Asymmetric signal level distribution due to tropospheric scintillation," *Electronics Letters*, IEE, vol. 34, No. 11, pp. 1145-1146 (May 28, 1998).

Vasseur, H. and Vanhoenacker, D., "Characterization of tropospheric turbulent layers from radiosonde data," *Electronics Letters*, IEE, vol. 34, No. 4, pp. 318-319 (Feb. 19, 1998).

Verdone, R., "Outage Probability Analysis for Short-Range Communication Systems at 60 Ghz in ATT Urban Environments," *IEEE Transactions on Vehicular Technology*, IEEE Vehicular Technology Society, vol. 46, No. 4, pp. 1027-1039 (Nov. 1997).

Vierira-Ribeiro, S.A., *Single-IF DECT Receiver Architecture using a Quadrature Sub-Sampling Band-Pass Sigma-Delta Modulator*, Thesis for Degree of Master's of Engineering, Carleton University, UMI Dissertation Services, pp. 1-180 (Apr. 1995).

Vilar, E. et al., "A Comprehensive/Selective MM-Wave Satellite Downlink Experiment on Fade Dynamics," *Tenth International Conference on Antennas and Propagation*, Electronics Division of the IEE, pp. 2.98-2.101 (Apr. 14-17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8-1-8-16 (Oct. 4-7, 1983).

Vilar, E. and Smith, H., "A Theoretical and Experimental Study of Angular Scintillations in Earth Space Paths," *IEEE Transactions on Antennas and Propagation*, IEEE, vol. AP-34, No. 1, pp. 2-10 (Jan. 1986).

Vilar, E. et al., "A Wide Band Transhorizon Experiment at 11.6 Ghz," *Eighth International Conference on Antennas and Propagation*, Electronics Division of the IEE, pp. 441-445 (Mar. 30-Apr. 2, 1993).

Vilar, E. and Matthews, P.A. "Amplitude Dependence of Frequency in Oscillators," *Electronics Letters*, IEE, vol. 8, No. 20, pp. 509-511 (Oct. 5, 1972).

Vilar, E. et al., "An experimental mm-wave receiver system for measuring phase noise due to atmospheric turbulence" *Proceedings of the 25th European Microwave Conference*, Nexus House, pp. 114-119 (1995).

Vilar, E. and Burgueño, A., "Analysis and Modeling of Time Intervals Between Rain Rate Exceedances in the Context of Fade Dynamics," *IEEE Transactions on Communications*, IEEE Communications Society, vol. 39, No. 9, pp. 1306-1312 (Sep. 1991).

Vilar, E. et al., "Angle of Arrival Fluctuations in High and Low Elevation Earth Space Paths," *Fourth International Conference on Antennas and Propagation (ICAP 85)*, Electronics Division of the IEE, pp. 83-88 (Apr. 16-19, 1985).

Vilar, E., "Antennas and Propagation: A Telecommunications Systems Subject," *Electronics Division Colloquium on Teaching Antennas and Propagation to Undergraduates*, IEE, pp. 7/1-7/6 (Mar. 8, 1988).

Vilar, E. et al., "CERS*. Millimetre-Wave Beacon Package and Related Payload Doppler Correction Strategies," *Electronics Division Colloquium on CERS—Communications Engineering Research Satellite*, IEE, pp. 10/1-10/10 (Apr. 10, 1984).

Vilar, E. and Moulsley, T.J., "Comment and Reply: Probability Density Function of Amplitude Scintillations," *Electronics Letters*, IEE, vol. 21, No. 14, pp. 620-622 (Jul. 4, 1985).

Vilar, E. et al., "Comparison of Rainfall Rate Duration Distributions for ILE-IFE and Barcelona," *Electronics Letters*, IEE, vol. 28, No. 20, pp. 1922-1924 (Sep. 24, 1992).

Vilar, E., "Depolarization and Field Transmittances in Indoor Communications," *Electronics Letters*, IEE, vol. 27, No. 9, pp. 732-733 (Apr. 25, 1991).

Vilar, E. and Larsen, J.R., "Elevation Dependence of Amplitude Scintillations on Low Elevation Earth Space Paths," *Sixth International Conference on Antennas and Propagation (ICAP 89) Part 2: Propagation*, IEE, pp. 150-154 (Apr. 4-7, 1989).

Vilar, E. et al., "Experimental System and Measurements of Transhorizon Signal Levels at 11 Ghz," *18th European Microwave Conference*, Microwave Exhibitions and Publishers Ltd., pp. 429-435 (Sep. 12-15, 1988).

Viler, E. and Matthews, P.A., "Importance of Amplitude Scintillations in Millimetric Radio Links," *Proceedings of the 4th European Microwave Conference*, Microwave Exhibitions and Publishers, pp. 202-206 (Sep. 10-13, 1974).

Vilar, E. and Haddon, J., "Measurement and Modeling of Scintillation Intensity to Estimate Turbulence Parameters in an Earth-Space Path," *IEEE Transactions on Antennas and Propagation*, IEEE Antennas and Propagation Society, vol. AP-32, No. 4, pp. 340-346 (Apr. 1984).

Vilar, E. and Matthews, P.A., "Measurement of Phase Fluctuations on Millimetric Radiowave Propagation," *Electronics Letters*, IEE, vol. 7, No. 18, pp. 566-568 (Sep. 9, 1971).

Vilar, E. and Wan, K.W., "Narrow and Wide Band Estimates of Field Strength for Indoor Communications in the Millimetre Band," *Electronics Division Colloquium on Radiocommunications in the Range 30-60 Ghz*, IEE, pp. 5/1-5/8 (Jan. 17, 1991).

Vilar, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).

Vilar, E. and Senin, S., "Propagation phase noise identified using 40 Ghz satellite downlink," *Electronics Letters*, IEE, vol. 33, No. 22, pp. 1901-1902 (Oct. 23, 1997).

Vilar, E. et al., "Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230-2.233 (Apr. 14-17, 1997).

Vilar, E. and Haddon, J., "Scintillation Modeling and Measurement—A Tool for Remote-Sensing Slant Paths," *AGARD Conference Proceedings No. 332: Propagation Aspects of Frequency Sharing, Interference and System Diversity*, AGARD, pp. 27-1-27-13 (Oct. 18-22, 1982).

Vilar, E., "Some Limitations on Digital Transmission Through Turbulent Atmosphere," *International Conference on Satellite Communication Systems Technology*, Electronics Division of the IEE, pp. 169-187 (Apr. 7-10, 1975).

Vilar, E. and Matthews, P.A. "Summary of Scintillation Observations in a 36 Ghz Link Across London," *International Conference on Antennas and Propagation Part 2: Propagation*, IEE, pp. 36-40 (Nov. 28-30, 1978).

Vilar, E. et al., "Wideband Characterization of Scattering Channels," *Tenth International Conference on Antennas and Propagation*, Electronics Division of the IEE, pp. 2.353-2.358 (Apr. 14-17, 1997).

Vollmer, A., "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1-11 (Nov. 1986).

Wan, K.W. et al., "A Novel Approach to the Simultaneous Measurement of Phase and Amplitude Noises in Oscillator," *Proceedings of the 19th Microwave Conference*, Microwave Exhibitions and Publishers Ltd., pp. 809-813 (Sep. 4-7, 1989).

Wan, K.W. et al., "Extended Variances and Autoregressive/Moving Average Algorithm for the Measurement and Synthesis of Oscillator Phase Noise," *Proceedings of the 43rd Annual Symposium on Frequency Control*, IEEE, pp. 331-335 (1989).

Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1-3/5 (Dec. 3, 1993).

Wang, H., "A 1-V Multigigahertz RF Mixer Core in 0.5-μm CMOS," *IEEE Journal of Solid-State Circuits*, IEEE Solid-State Circuits Society, vol. 33, No. 12, pp. 2265-2267 (Dec. 1998).

Watson, A.W.D. et al., "Digital Conversion and Signal Processing for High Performance Communications Receivers," *Digital Processing of Signals in Communications*, Institution of Electronic and Radio Engineers, pp. 367-373 (Apr. 22-26, 1985).

Weast, R.C. et al. (Ed.), *Handbook of Mathematical Tables*, Second Edition, The Chemical Rubber Co., pp. 480-485 (1964).

Wiley, R.G., "Approximate FM Demodulation Using Zero Crossings," *IEEE Transactions on Communications*, IEEE, vol. COM-29, No. 7, pp. 1061-1065 (Jul. 1981).

Worthman, W., "Convergence . . . Again," *RF Design*, Primedia, p. 102 (Mar. 1999).

Young, I.A. and Hodges, D.A., "MOS Switched-Capacitor Analog Sampled-Data Direct-Form Recursive Filters," *IEEE Journal of Solid-State Circuits*, IEEE, vol. SC-14, No. 6, pp. 1020-1033 (Dec. 1979).

Translation of Specification and Claims of FR Patent No. 2245130, 3 pages (Apr. 18, 1975—Date of publication of application).

Fest, Jean-Pierre, "Le Convertisseur A/N Revolutionne Le Recepteur Radio," *Electronique*, JMJ (Publisher), No. 54, pp. 40-42 (Dec. 1995).

Translation of DE Patent No. 35 41 031 A1, 22 pages (May 22, 1986—Date of publication of application).

Translation of EP Patent No. 0 732 803 A1, 9 pages (Sep. 18, 1996—Date of publication of application).

Fest, Jean-Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages (Jul. 16, 1998—Date of publication of application).

Miki, S. and Nagahama, R., *Modulation System II*, Common Edition 7, Kyoritsu Publishing Co., Ltd., pp. 146-154 (Apr. 30, 1956).

Miki, S. and Nagahama, R., *Modulation System II*, Common Edition 7, Kyoritsu Publishing Co., Ltd., pp. 146-149 (Apr. 30, 1956). (Partial Translation of Doc. AQ51).

Rabiner, L.R. and Gold, B., *Theory and Application of Digital Signal Processing*, Prentice-Hall, Inc., pp. v-xii and 40-46 (1975).

English-language Abstract of Japanese Patent Publication No. 08-032556, from http://www1.ipdl.jpo.go.jp, 2 Pages (Feb. 2, 1996—Date of publication of application).

English-language Abstract of Japanese Patent Publication No. 08-139524, from http://www1.ipdl.jpo.go.jp, 2 Pages (May 31, 1996—Date of publication of application).
English-language Abstract of Japanese Patent Publication No. 59-144249, from http://www1.ipdl.jpo.go.jp, 2 Pages (Aug. 18, 1984—Date of publication of application).
English-language Abstract of Japanese Patent Publication No. 63-054002, from http://www1.ipdl.jpo.go.jp, 2 Pages (Mar. 8, 1988—Date of publication of application).
English-language Abstract of Japanese Patent Publication No. 06-237276, from http://www1.ipdl.jpo.go.jp, 2 Pages (Aug. 23, 1994—Date of publication of application).
English-language Abstract of Japanese Patent Publication No. 08-023359, from http://www1.ipdl.jpo.go.jp, 2 Pages (Jan. 23, 1996—Date of publication of application).
Translation of Japanese Patent Publication No. 47-2314, 7 pages (Feb. 4, 1972—Date of publication of application).
Partial Translation of Japanese Patent Publication No. 58/7903, 3 pages (Jan. 17, 1983—Date of publication of application).
English-language Abstract of Japanese Patent Publication No. 58-133004, from http://www1.ipdl.jpo.go.jp, 2 Pages (Aug. 8, 1993—Date of publication of application).
English-language Abstract of Japanese Patent Publication No. 60-058705, from http://www1.ipdl.jpo.go.jp, 2 Pages (Apr. 4, 1985—Date of publication of application).
English-language Abstract of Japanese Patent Publication No. 04-123614, from http://www1.ipdl.jpo.go.jp, 2 Pages (Apr. 23, 1992—Date of publication of application).
English-language Abstract of Japanese Patent Publication No. 04-127601, from http://www1.ipdl.jpo.go.jp, 2 Pages (Apr. 28, 1992—Date of publication of application).
English-language Abstract of Japanese Patent Publication No. 05-175730, from http://www1.ipdl.jpo.go.jp, 2 Pages (Jul. 13, 1993—Date of publication of application).
English-language Abstract of Japanese Patent Publication No. 05-175734, from http://www1.ipdl.jpo.go.jp, 2 Pages (Jul. 13, 1993—Date of publication of application).
English-language Abstract of Japanese Patent Publication No. 07-154344, from http://www1.ipdl.jpo.go.jp, 2 Pages (Jun. 16, 1995—Date of publication of application).
English-language Abstract of Japanese Patent Publication No. 07-307620, from http://www1.ipdl.jpo.go.jp, 2 Pages (Nov. 21, 1995—Date of publication of application).
Oppenheim, A.V. and Schafer, R.W., *Digital Signal Processing*, Prentice-Hall, pp. vii-x, 6-35, 45-78, 87-121 and 136-165 (1975).
English-language Abstract of Japanese Patent Publication No. 55-066057, from http://www1.ipdl.jpo.go.jp, 2 Pages (May 19, 1980—Date of publication of application).
English-language Abstract of Japanese Patent Publication No. 63-065587, from http://www1.ipdl.jpo.go.jp, 2 Pages (Mar. 24, 1988—Date of publication of application).
English-language Abstract of Japanese Patent Publication No. 63-153691, from http://www1.ipdl.jpo.go.jp, 2 Pages (Jun. 27, 1988—Date of publication of application).
Translation of Japanese Patent Publication No. 60-130203, 3 pages (Jul. 11, 1985—Date of publication of application).
Razavi, B., "A 900-MHz/1.8-Ghz CMOS Transmitter for Dual-Band Applications," *Symposium on VLSI Circuits Digest of Technical Papers*, IEEE, pp. 128-131 (1998).
Ritter, G.M., "SDA, A New Solution for Transceivers," *16 th European Microwave Conference*, Microwave Exhibitions and Publishers, pp. 729-733 (Sep. 8, 1986).
DIALOG File 351 (Derwent WPI) English Language Patent Abstract for FR 2 669 787, 1 page (May 29, 1992—Date of publication of application).
Akos, D.M. et al., "Direct Bandpass Sampling of Multiple Distinct RF Signals," *IEEE Transactions on Communications*, IEEE, vol. 47, No. 7, pp. 983-988 (Jul. 1999).
Patel, M. et al., "Bandpass Sampling for Software Radio Receivers, and the Effect of Oversampling on Aperture Jitter," *VTC 2002*, IEEE, pp. 1901-1905 (2002).

English-language Abstract of Japanese Patent Publication No. 61-030821, from http://www1.ipdl.jpo.go.jp, 2 Pages (Feb. 13, 1986—Date of publication of application).
English-language Abstract of Japanese Patent Publication No. 05-327356, from http://www1.ipdl.jpo.go.jp, 2 Pages (Dec. 10, 1993—Date of publication of application).
Tayloe, D. "A Low-noise, High-performance Zero IF Quadrature Detector/Preamplifier," *RF Design*, Primedia Business Magazines & Media, Inc., pp. 58, 60, 62 and 69 (Mar. 2003).
Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117-120 (Apr. 1996).
Simoni, A. et al., "A Digital Camera for Machine Vision," *20th International Conference on Industrial Electronics, Control and Instrumentation*, IEEE, pp. 879-883 (Sep. 1994).
Stewart, R.W. and Pfann, E., "Oversampling and sigma-delta strategies for data conversion," *Electronics & Communication Engineering Journal*, IEEE, pp. 37-47 (Feb. 1998).
Rudell, J.C. et al., "A 1.9-Ghz Wide-Band IF Double Conversion CMOS Receiver for Cordless Telephone Applications," *IEEE Journal of Solid-State Circuits*, IEEE, vol. 32, No. 12, pp. 2071-2088 (Dec. 1997).
English-language Abstract of Japanese Patent Publication No. 09-036664, from http://www1.ipdl.jpo.go.jp, 2 Pages (Feb. 7, 1997—Date of publication of application).
Simoni, A. et al., "A Single-Chip Optical Sensor with Analog Memory for Motion Detection," *IEEE Journal of Solid-State Circtuits*, IEEE, vol. 30, No. 7, pp. 800-806 (Jul. 1995).
English Translation of German Patent Publication No. DE 196 48 915 A1, 10 pages.
Deboo, Gordon J., *Integrated Circuits and Semiconductor Devices*, 2nd Edition, McGraw-Hill, Inc., pp. 41-45 (1977).
Hellwarth, G.A. and Jones, G.D, "Automatic Conditioning of Speech Signals," *IEEE Transactions on Audio and Electroacoustics*, vol. AU-16, No. 2, pp. 169-179 (Jun. 1968).
English Abstract for German Patent No. DE 692 21 098 T2, 1 page, data supplied from the espacenet.
Gaudiosi, J., "Retailers will bundle Microsoft's Xbox with games and peripherals," *Video Store Magazine*, vol. 23, Issue 36, p. 8, 2 pages (Sep. 2-8, 2001).
English-language Translation of German Patent Publication No. DT 1936252, translation provided by Transperfect Translations, 12 pages (Jan. 28, 1971—Date of publication of application).
English-language Abstract of Japanese Patent Publication No. JP 62-12381, data supplied by the espacenet, 1 page (Jan. 21, 1987—Date of publication of application).
English-language Abstract of Japanese Patent Publication No. JP 4-154227, data supplied by the espacenet, 1 page (May 27, 1992—Date of publication of application).
English-language Abstract of Japanese Patent Publication No. JP 6-284038, data supplied by the espacenet, 1 page (Oct. 7, 1994—Date of publication of application).
English-language Abstract of Japanese Patent Publication No. JP 10-96778, data supplied by the espacenet, 1 page (Apr. 14, 1998—Date of publication of application).
English-language Abstract of Japanese Patent Publication No. JP 11-98205, data supplied by the espacenet, 1 page (Apr. 9, 1999—Date of publication of application).
English-language Abstract of Japanese Patent Publication No. JP 61-232706, data supplied by the espacenet, 1 page (Oct. 17, 1986—Date of publication of application).
English-language Abstract of Japanese Patent Publication No. JP 9-171399, data supplied by the espacenet, 1 page (Jun. 30, 1997—Date of publication of application).
English-language Abstract of Japanese Patent Publication No. JP 10-41860, data supplied by the espacenet, 1 page (Feb. 13, 1998—Date of publication of application).
English-language Computer Translation of Japanese Patent Publication No. JP 10-41860, provided by the JPO (Jun. 26, 1998—Date of publication of application) and cited in U.S. Appl. No. 10/305,299, directed to related subject matter.

*What is I/Q Data?*, printed Sep. 16, 2006, from http://zone.ni.com, 8 pages (Copyright 2003).
English-language Abstract of Japanese Patent Publication No. JP 58-031622, data supplied by ep.espacenet.com, 1 page (Feb. 24, 1983—Date of publication of application).
English-language Abstract of Japanese Patent Publication No. JP 61-245749, data supplied by ep.espacenet.com, 1 page (Nov. 1, 1986—Date of publication of application).
English-language Abstract of Japanese Patent Publication No. JP 64-048557, data supplied by ep.espacenet.com, 1 page (Feb. 23, 1989—Date of publication of application).
English-language Abstract of Japanese Patent Publication No. JP 59-022438, data supplied by ep.espacenet.com, 1 page (Feb. 4, 1984—Date of publication of application).
English-language Abstract of Japanese Patent Publication No. JP 59-123318, data supplied by ep.espacenet.com, 1 page (Jul. 17, 1984—Date of publication of application).
English-language Abstract of Japanese Patent Publication No. JP 61-193521, data supplied by ep.espacenet.com, 1 page (Aug. 28, 1986—Date of publication of application).
English-language Abstract of Japanese Patent Publication No. JP 62-047214, data supplied by ep.espacenet.com, 1 page (Feb. 28, 1987—Date of publication of application).
English-language Abstract of Japanese Patent Publication No. JP 63-274214, data supplied by ep.espacenet.com, 1 page (Nov. 11, 19886—Date of publication of application).
English-language Abstract of Japanese Patent Publication No. JP 7-169292, data supplied by ep.espacenet.com, 1 page (Jul. 4, 1995—Date of publication of application).
English-language Abstract of Japanese Patent Publication No. JP 10-22804, data supplied by ep.espacenet.com, 1 page (Jan. 23, 1998—Date of publication of application).
English-language Abstract of Japanese Patent Publication No. JP 8-288882, data supplied by ep.espacenet.com, 1 page (Nov. 1, 1996—Date of publication of application).

Office Communication, dated Jun. 3, 2008, for U.S. Appl. No. 10/972,133, filed Oct. 25, 2004, 7 pages.
Office action dated Jan. 13, 2012 cited in U.S. Appl. No. 12/615,326, filed Nov. 10, 2009.
Office Action dated Dec. 14, 2011 cited in U.S. Appl. No. 12/634,233, filed Dec. 9, 2009.
Notice of Allowance dated Dec. 20, 2012 cited in U.S. Appl. No. 11/589,921, filed Oct. 31, 2006.
Office Action dated May 26, 2011 cited in U.S. Appl. No. 11/589,921, filed Oct. 31, 2006.
Office Action dated Oct. 6, 2011 cited in U.S. Appl. No. 12/118,111, filed May 9, 2008.
Notice of Allowance dated Jan. 20, 2012 cited in U.S. Appl. No. 12/881,912 filed Sep. 4, 2010.
Notice of Allowance dated Feb. 29, 2012 cited in U.S. Appl. No. 11/589,921, filed Oct. 31, 2006.
Notice of Allowanced dated Mar. 6, 2012 cited in U.S. Appl. No. 13/040,570, filed Mar. 4, 2011.
Notice of Allowanced dated Mar. 21, 2012 cited in U.S. Appl. No. 13/093,887, filed Apr. 26, 2011.
Office Action dated Mar. 29, 2012 cited in U.S. Appl. No. 13/090,031, filed Apr. 19, 2011.
Notice of Allowanced dated Apr. 10, 2012 cited in U.S. Appl. No. 12/776,173, filed May 7, 2010.
Notice of Allowanced dated Apr. 20, 2012 U.S. Appl. No. 09/569,045, filed May 10, 2000.
Notice of Allowanced dated Apr. 20, 2012 cited in U.S. Appl. No. 12/976,477, filed Dec. 22, 2010.
U.S. Appl. No. 13/090,031, filed Jun. 7, 2012, Notice of Allowance.
U.S. Appl. No. 12/615,326, filed Jun. 8, 2012, Notice of Allowance.
Notice of Allowance dated Feb. 16, 2012 cited in U.S. Appl. No. 12/881,912, filed Sep. 14, 2010.

* cited by examiner

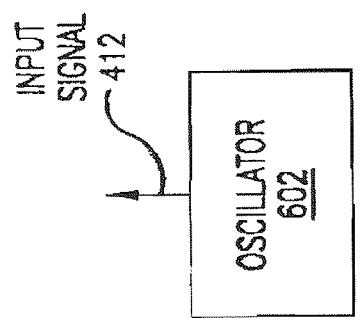
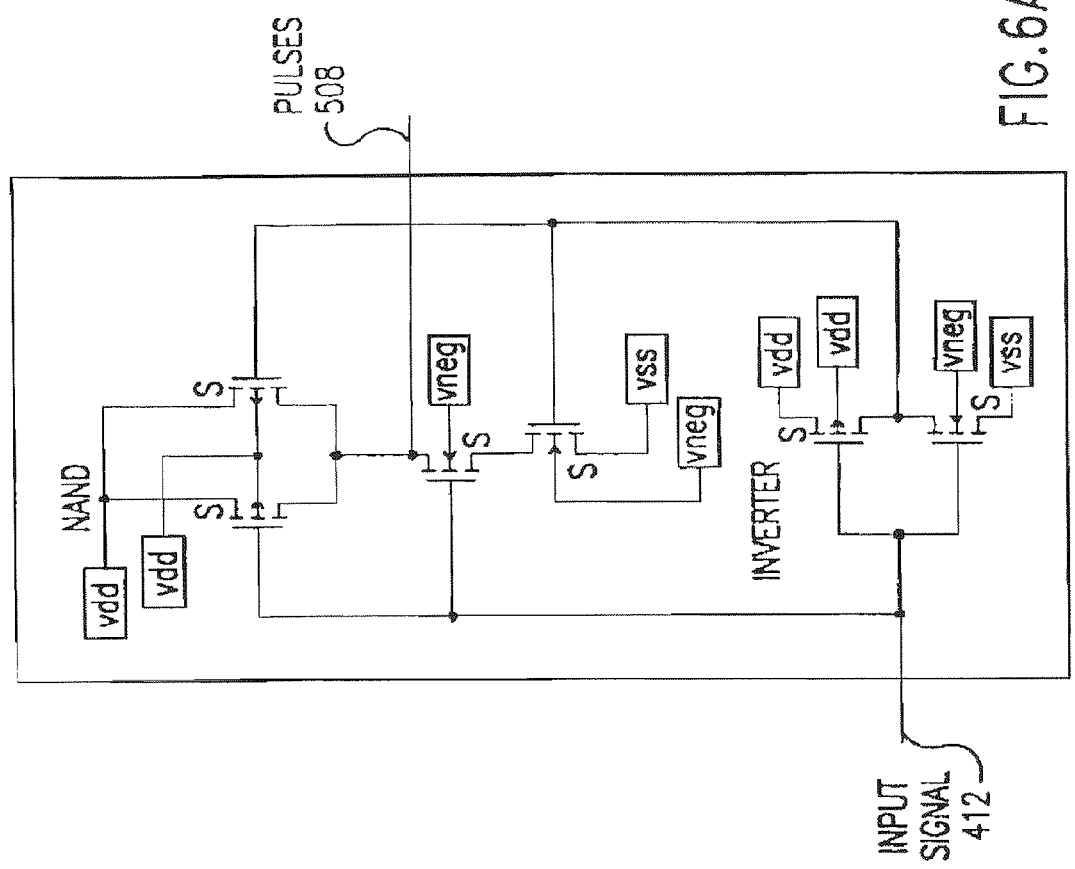
FIG.6B
FIG.6A

IMPEDANCE MATCHED ALIASING MODULE

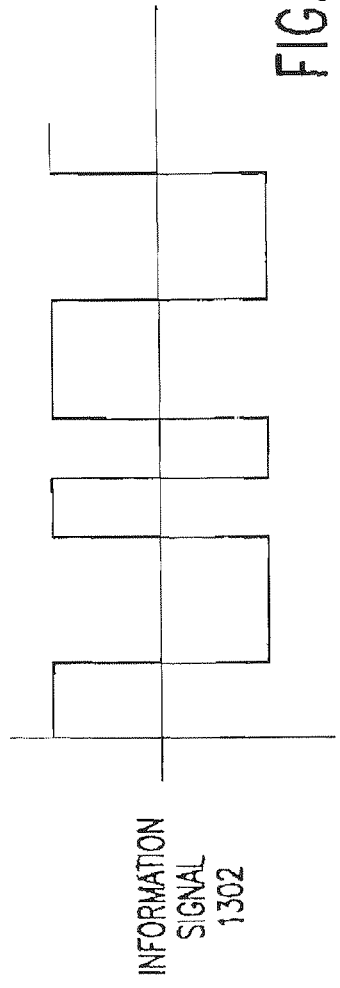
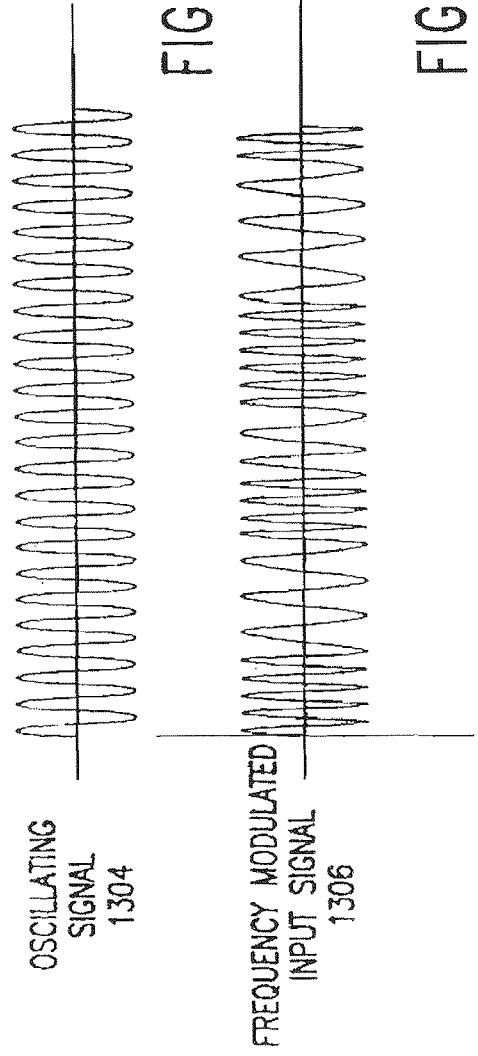
FIG.13A
FIG.13B
FIG.13C
FIG.13D
INFORMATION SIGNAL 1302
OSCILLATING SIGNAL 1304
FREQUENCY MODULATED INPUT SIGNAL 1306
HARMONICALLY RICH SIGNAL (SHOWN AS SQUARE WAVE) 1308
SEE FIG.13E

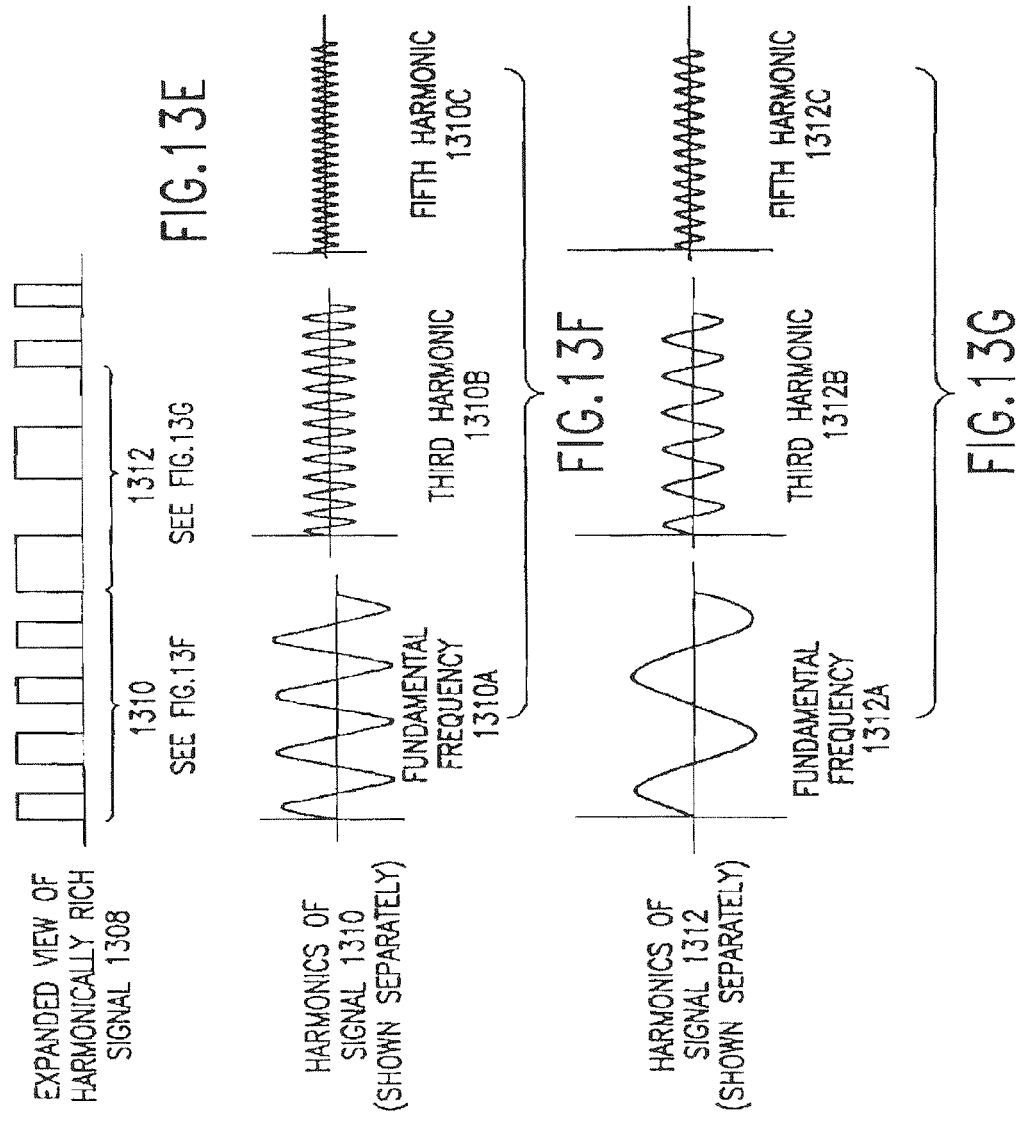

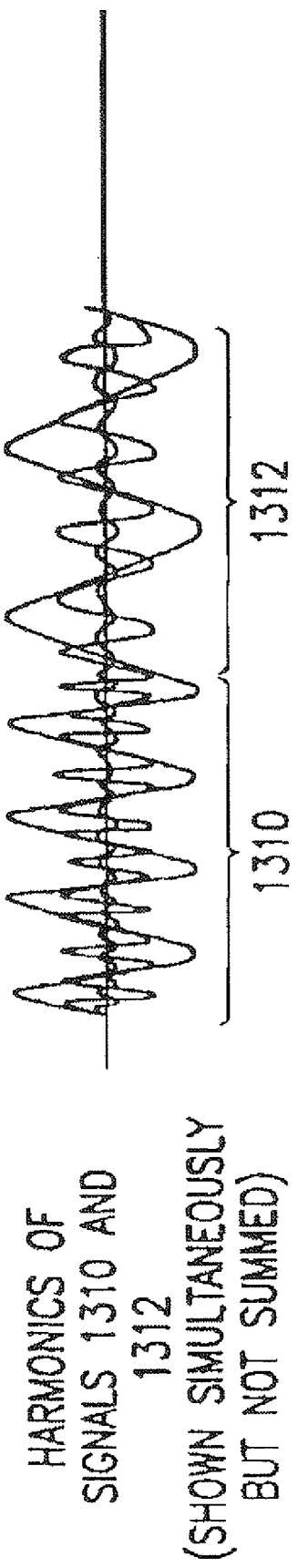
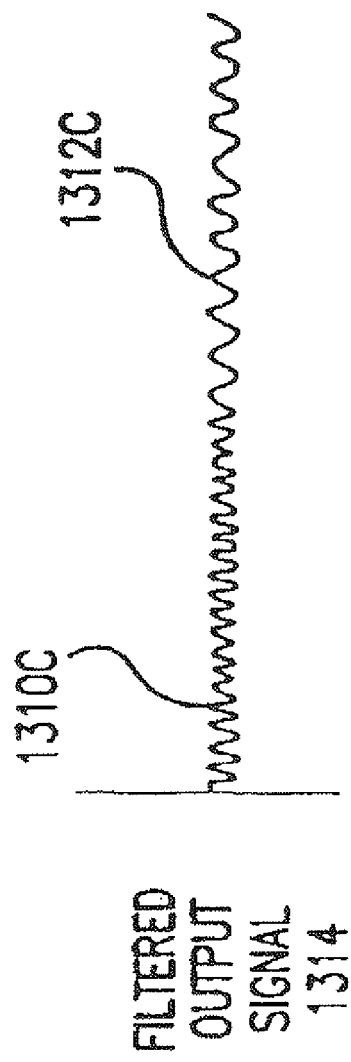

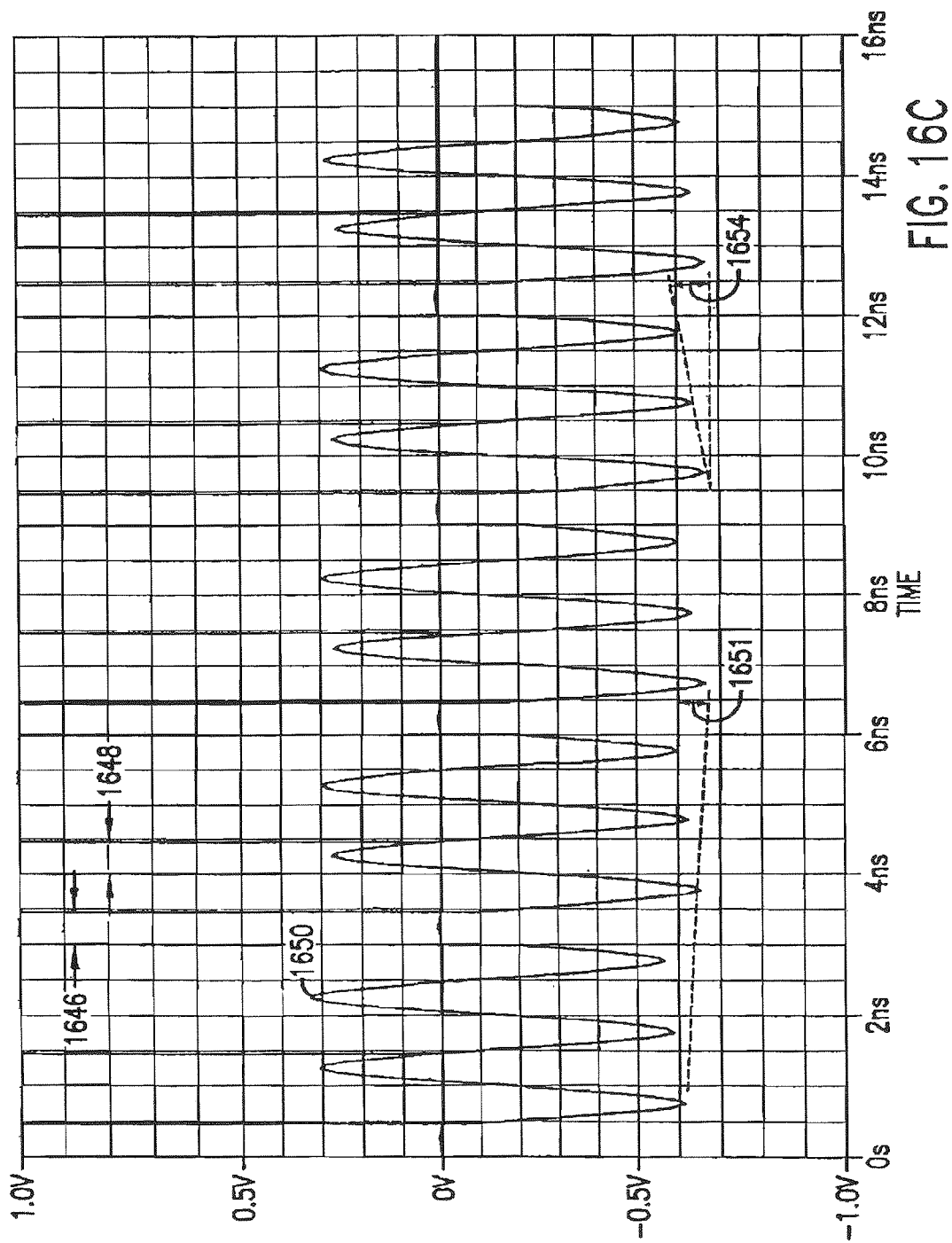

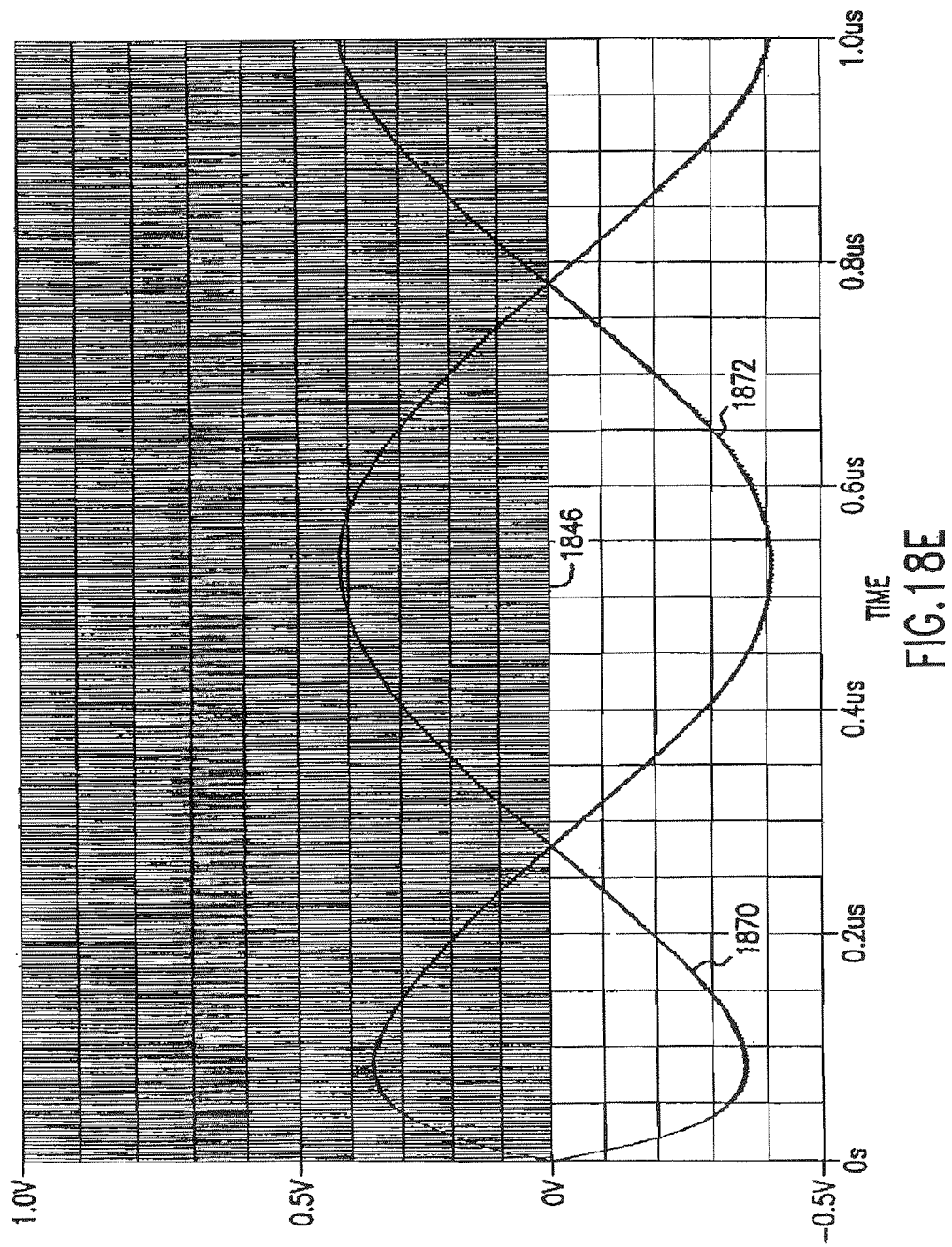

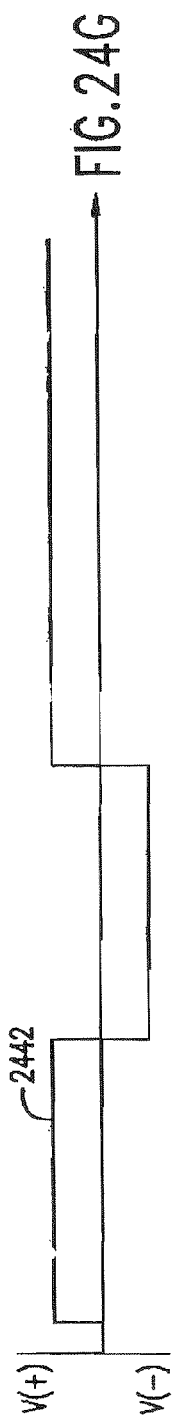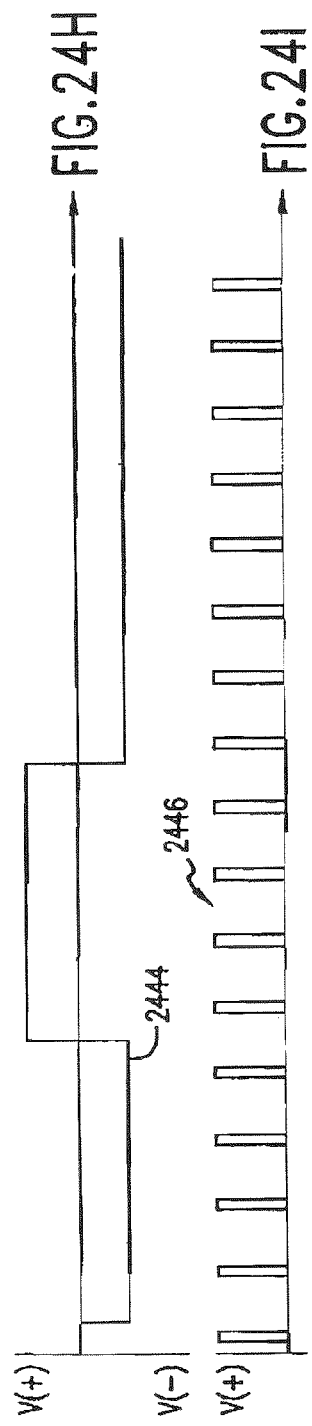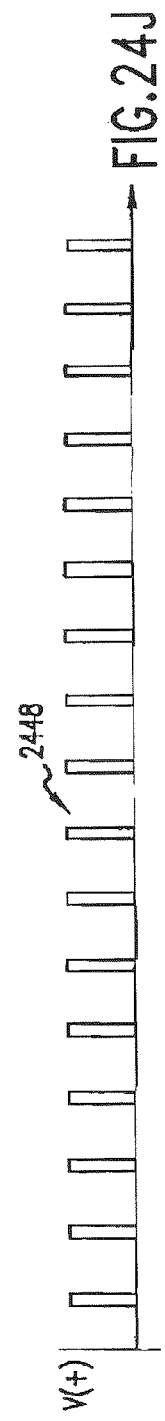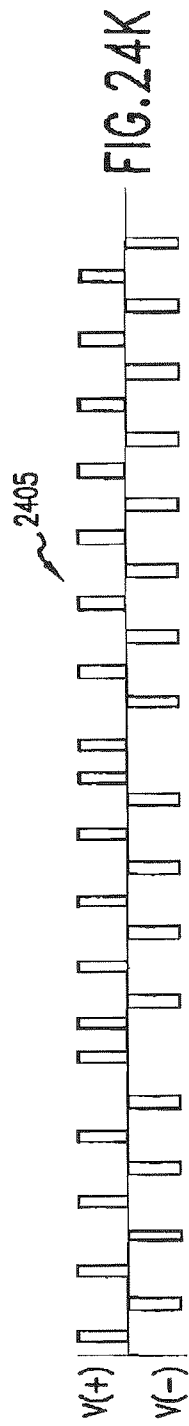

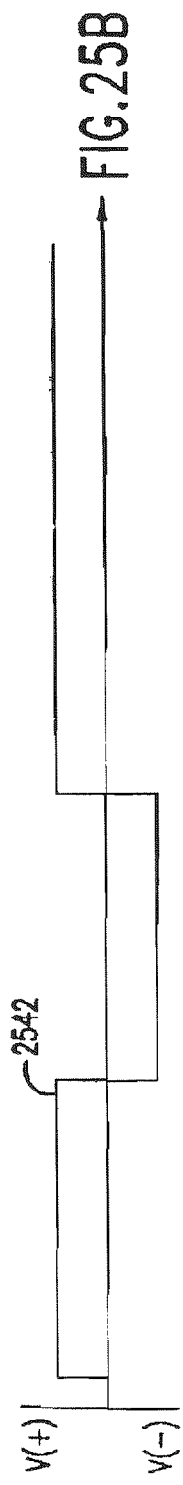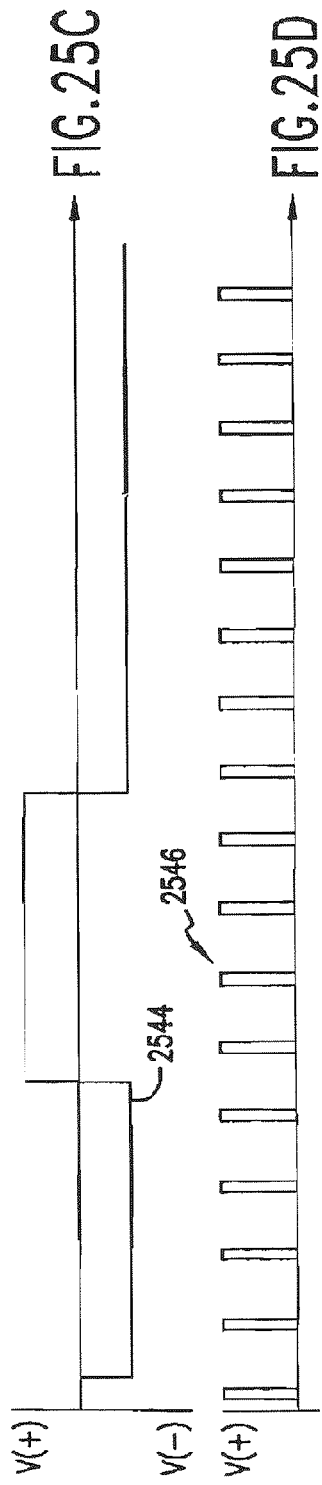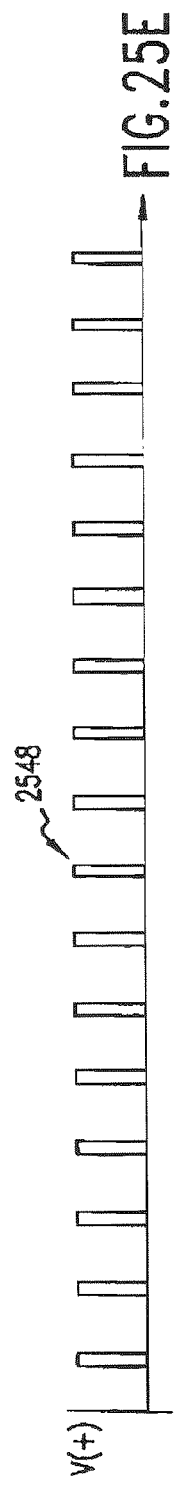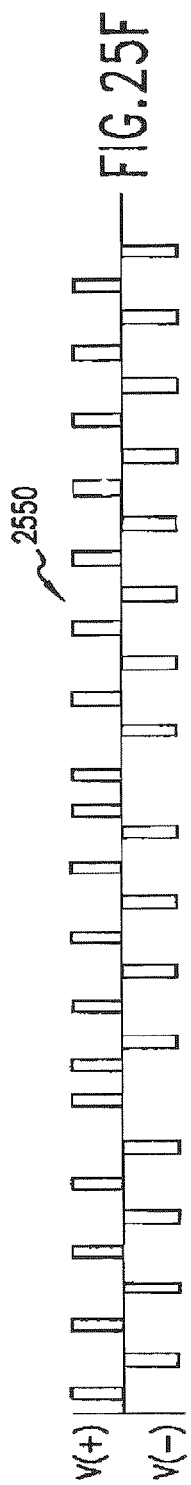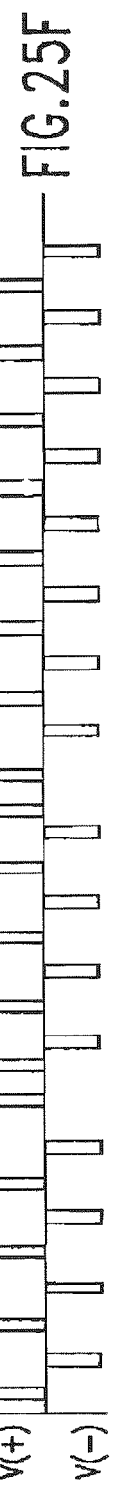

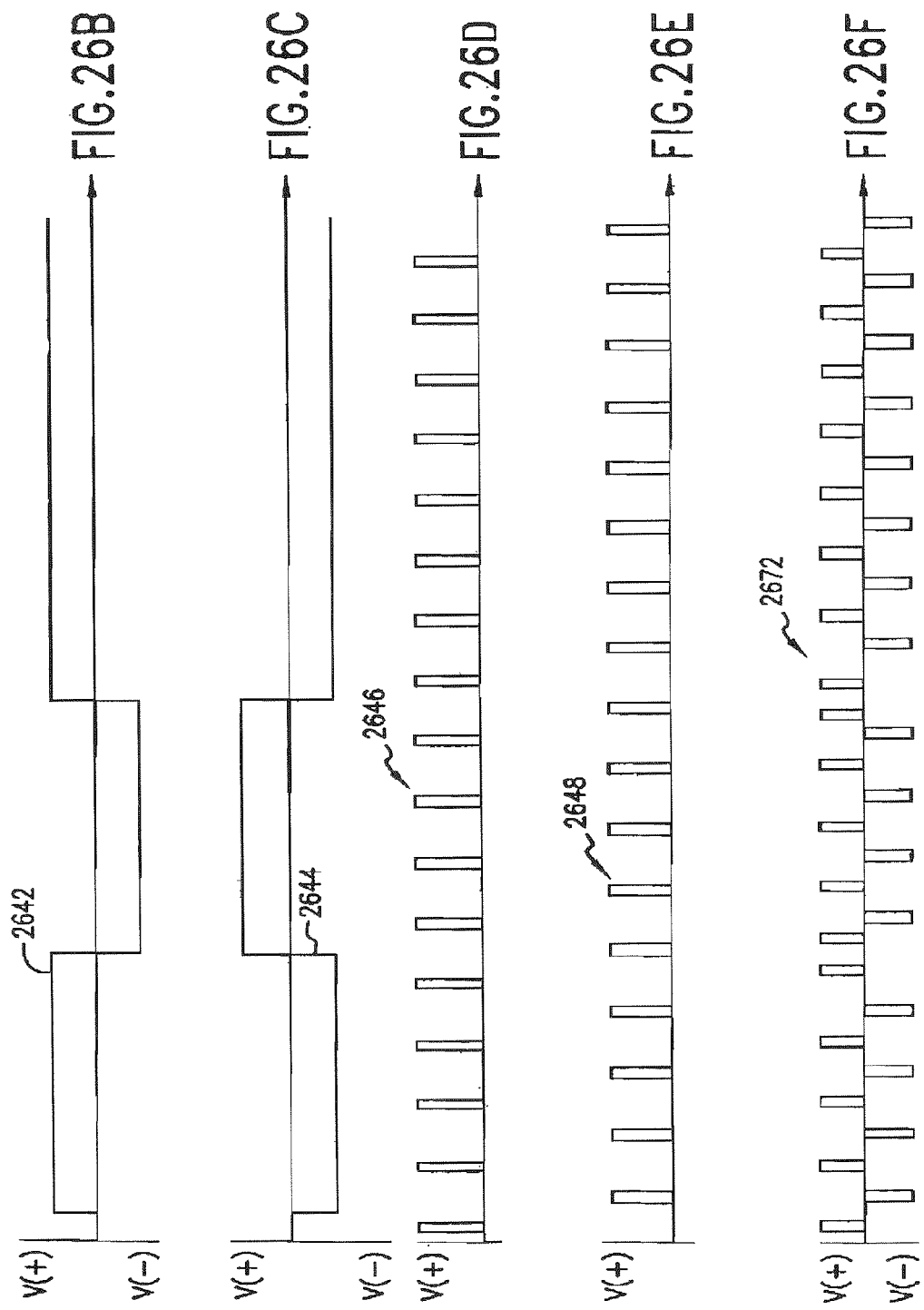

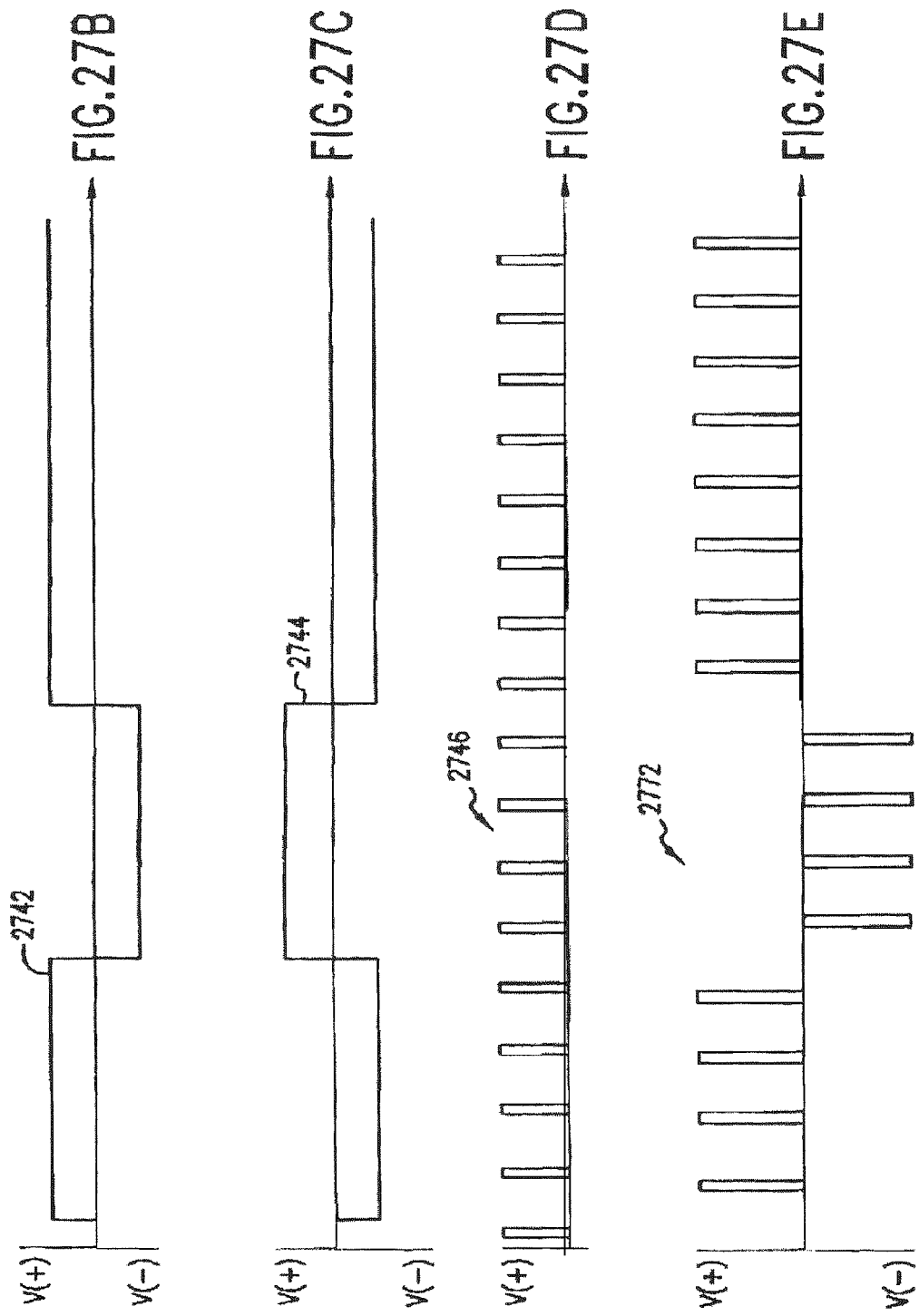

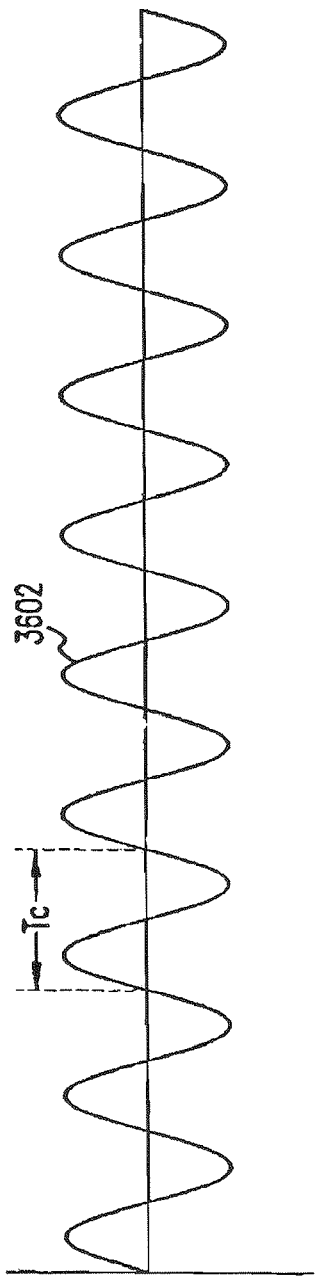
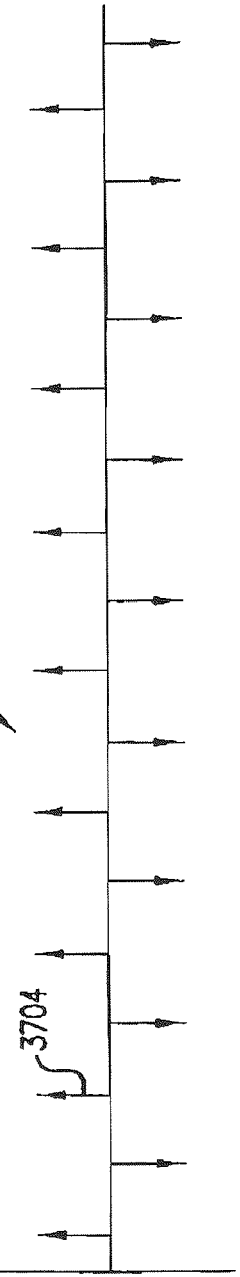
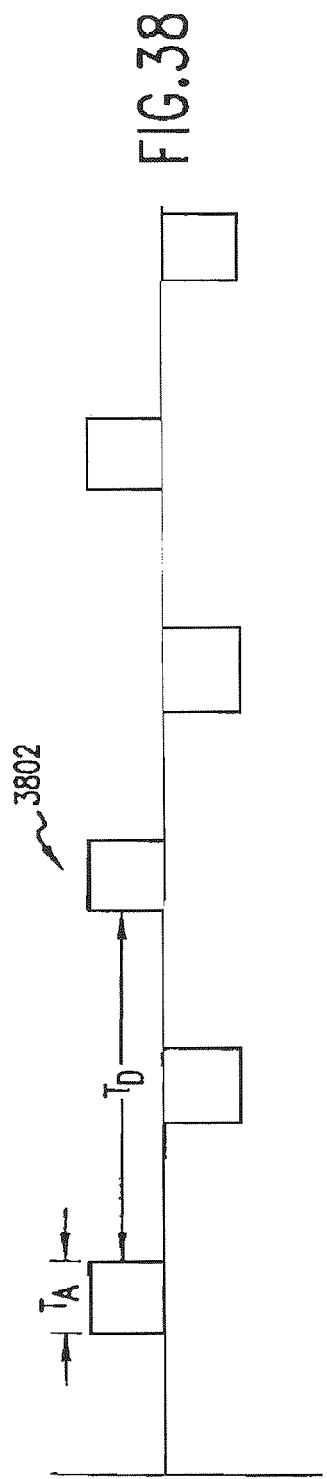
FIG. 36
FIG. 37
FIG. 38

APPARATUS AND METHOD FOR DOWN-CONVERTING ELECTROMAGNETIC SIGNALS BY CONTROLLED CHARGING AND DISCHARGING OF A CAPACITOR

CROSS-REFERENCE TO RELATED APPLICATIONS

This application is a continuation of U.S. patent application Ser. No. 10/961,342, filed Oct. 12, 2004, (now U.S. Pat. No. 7,822,401, which is a divisional of U.S. patent Ser. No. 09/855,851, filed on May 16, 2001 (now U.S. Pat. No. 7,010,286, which is a continuation-in-part of U.S. patent application Ser. No. 09/550,644, filed Apr. 14, 2000 (now U.S. Pat. No. 7,515,896, which are each herein incorporated by reference in their entireties, and U.S. patent application Ser. No. 09/855,851 claims the benefit of U.S. Provisional Application No. 60/204,796, filed May 16, 2000, U.S. Provisional Application No. 60/213,363, filed Jun. 21, 2000, and U.S. Provisional Application No. 60/272,043, filed Mar. 1, 2001, all of which and are herein incorporated by reference in their entireties.

The following patents and patent applications of common assignee are related to the present application, and are herein incorporated by reference in their entireties:

U.S. Pat. No. 6,061,551, entitled "Method and System for Down-Converting Electromagnetic Signals," filed Oct. 21, 1998 and issued May 9, 2000.

U.S. Pat. No. 6,091,940, entitled "Method and System for Frequency Up-Conversion," filed Oct. 21, 1998 and issued Jul. 18, 2000.

U.S. Pat. No. 6,061,555, entitled "Method and System for Ensuring Reception of a Communications Signal," filed Oct. 21, 1998 and issued May 9, 2000.

U.S. Pat. No. 6,049,706, entitled "Integrated Frequency Translation And Selectivity," filed Oct. 21, 1998 and issued Apr. 11, 2000.

"Applications of Universal Frequency Translation," Ser. No. 09/261,129, filed Mar. 3, 1999.

"Method, System, and Apparatus for Balanced Frequency Up-Conversion of a Baseband Signal," Ser. No. 09/525,615, filed Mar. 14, 2000.

BACKGROUND OF THE INVENTION

1. Field of the Invention

The present invention relates generally to the down-conversion and up-conversion of an electromagnetic signal using a universal frequency translation module.

2. Related Art

Various communication components exist for performing frequency down-conversion, frequency up-conversion, and filtering. Also, schemes exist for signal reception in the face of potential jamming signals.

SUMMARY OF THE INVENTION

Briefly stated, the present invention is directed to methods, systems, and apparatuses for down-converting and/or up-converting an electromagnetic signal, and applications thereof.

In an embodiment, the invention down-converts the electromagnetic signal to an intermediate frequency signal.

In another embodiment, the invention down-converts the electromagnetic signal to a demodulated baseband information signal.

In another embodiment, the electromagnetic signal is a frequency modulated (FM) signal, which is down-converted to a non-FM signal, such as a phase modulated (PM) signal or an amplitude modulated (AM) signal.

In one embodiment, the invention uses a stable, low frequency signal to generate a higher frequency signal with a frequency and phase that can be used as stable references.

In another embodiment, the present invention is used as a transmitter. In this embodiment, the invention accepts an information signal at a baseband frequency and transmits a modulated signal at a frequency higher than the baseband frequency.

In an embodiment, the invention operates by receiving an electromagnetic signal and recursively operating on approximate half cycles of a carrier signal. The recursive operations are typically performed at a sub-harmonic rate of the carrier signal. The invention accumulates the results of the recursive operations and uses the accumulated results to form a down-converted signal.

The methods and systems of transmitting vary slightly depending on the modulation scheme being used. For some embodiments using frequency modulation (FM) or phase modulation (PM), the information signal is used to modulate an oscillating signal to create a modulated intermediate signal. If needed, this modulated intermediate signal is "shaped" to provide a substantially optimum pulse-width-to-period ratio. This shaped signal is then used to control a switch that opens and closes as a function of the frequency and pulse width of the shaped signal. As a result of this opening and closing, a signal that is harmonically rich is produced with each harmonic of the harmonically rich signal being modulated substantially the same as the modulated intermediate signal. Through proper filtering, the desired harmonic (or harmonics) is selected and transmitted.

For some embodiments using amplitude modulation (AM), the switch is controlled by an unmodulated oscillating signal (which may, if needed, be shaped). As the switch opens and closes, it gates a reference signal, which is the information signal. In an alternate implementation, the information signal is combined with a bias signal to create the reference signal, which is then gated. The result of the gating is a harmonically rich signal having a fundamental frequency substantially proportional to the oscillating signal and an amplitude substantially proportional to the amplitude of the reference signal. Each of the harmonics of the harmonically rich signal also has amplitudes proportional to the reference signal, and is thus considered to be amplitude modulated. Just as with the FM/PM embodiments described above, through proper filtering, the desired harmonic (or harmonics) is selected and transmitted.

The invention is applicable to any type of electromagnetic signal, including but not limited to, modulated carrier signals (the invention is applicable to any modulation scheme or combination thereof) and unmodulated carrier signals.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE FIGURES

The invention shall be described with reference to the accompanying figures, wherein:

FIG. 6A illustrates an example aperture generator.

FIG. 6B illustrates an oscillator according to an embodiment of the present invention.

FIGS. 13A-13I illustrate example waveforms used to describe the operation of the UFU module.

FIGS. 16B-16G are example waveforms used to describe the operation of the example two-switch receiver of FIG. 16A.

FIGS. 16I-16N are example waveforms used to describe the operation of the example two-switch receiver of FIG. 16H.

FIG. 16O is a two-switch receiver and optional amplifier according to an embodiment of the invention.

FIGS. 18B-18E are example waveforms used to describe the operation of the example one-switch receiver of FIG. 18A.

FIGS. 24B-24K are example waveforms used to describe the operation of the example two-switch transmitter of FIG. 24A.

FIGS. 25B-25F are example waveforms used to describe the operation of the example two-switch transmitter of FIG. 25A.

FIGS. 26B-26F are example waveforms used to describe the operation of the example two-switch transmitter of FIG. 26A.

FIGS. 27B-27E are example waveforms used to describe the operation of the example one-switch transmitter of FIG. 27A.

FIG. 36 is an example modulated carrier signal.

FIG. 37 is an example control signal for a conventional receiver.

FIG. 38 is an example control signal according to the invention.

DETAILED DESCRIPTION OF THE INVENTION

Table of Contents
1. Introduction
2. Universal Frequency Translation
　2.1 Frequency Down-Conversion
　2.2 Optional Energy Transfer Signal Module
　2.3 Impedance Matching
　2.4 Frequency Up-Conversion
　2.5 Enhanced Signal Reception
　2.6 Unified Down-Conversion and Filtering
3. Example Embodiments of the Invention
　3.1 Receiver Embodiments
　　3.1.1 In-Phase/Quadrature-Phase (I/Q) Modulation Mode Receiver Embodiments
　　3.1.2 Receiver Embodiments Having Two Aliasing Modules
　　3.1.3 Enhanced Single-Switch Receiver Embodiments
　　3.1.4 Other Receiver Embodiments
　3.2 Transmitter Embodiments
　　3.2.1 In-Phase/Quadrature-Phase (I/Q) Modulation Mode Transmitter Embodiments
　　3.2.2 Enhanced Multi-Switch Transmitter Embodiments
　　3.2.3 Enhanced One-Switch Transmitter Embodiments
　　3.2.4 Other Transmitter Embodiments
　3.3 Transceiver Embodiments
　　3.3.1 Example Half-Duplex Mode Transceiver
　　3.3.2 Example Full-Duplex Mode Transceiver
　　3.3.3 Enhanced Single Switch Transceiver Embodiment
　　3.3.4 Other Embodiments
4. Enhanced Operating Features of the Invention
　4.1 Enhanced Power and Information Extraction Features
　4.2 Charge Transfer and Correlation
　4.3 Load Resistor Consideration
　4.4 Enhancing the Linear Operating Features of Embodiments of the Invention
5. Example Method Embodiment of the Invention
6. Conclusion

1. INTRODUCTION

The present invention is directed to the down-conversion and up-conversion of an electromagnetic signal using a universal frequency translation (UFT) module, transforms for same, and applications thereof. The systems described herein each may include one or more receivers, transmitters, and/or transceivers. According to embodiments of the invention, at least some of these receivers, transmitters, and/or transceivers are implemented using universal frequency translation (UFT) modules. The UFT modules perform frequency translation operations. Embodiments of the present invention are described below.

Systems that transmit and receive EM signals using UFT modules exhibit multiple advantages. These advantages include, but are not limited to, lower power consumption, longer power source life, fewer parts, lower cost, less tuning, and more effective signal transmission and reception. These systems can receive and transmit signals across a broad frequency range. The structure and operation of embodiments of the UFT module, and various applications of the same are described in detail in the following sections, and in the referenced documents.

2. UNIVERSAL FREQUENCY TRANSLATION

The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
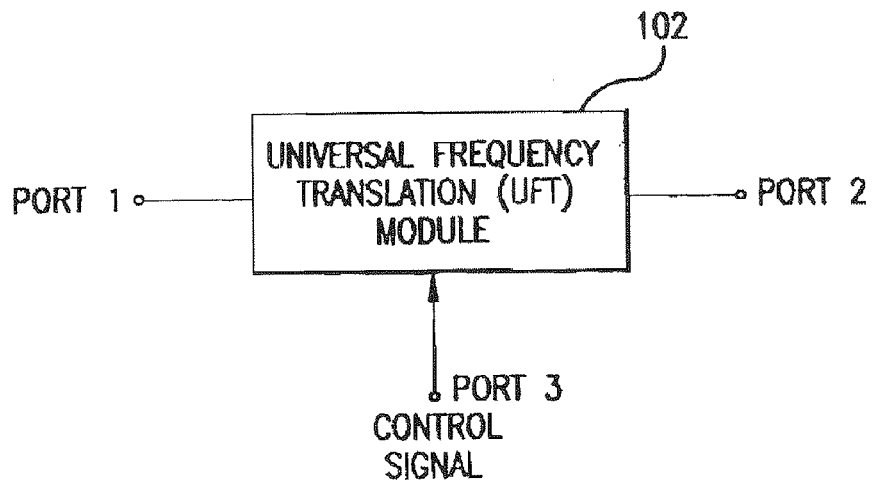
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
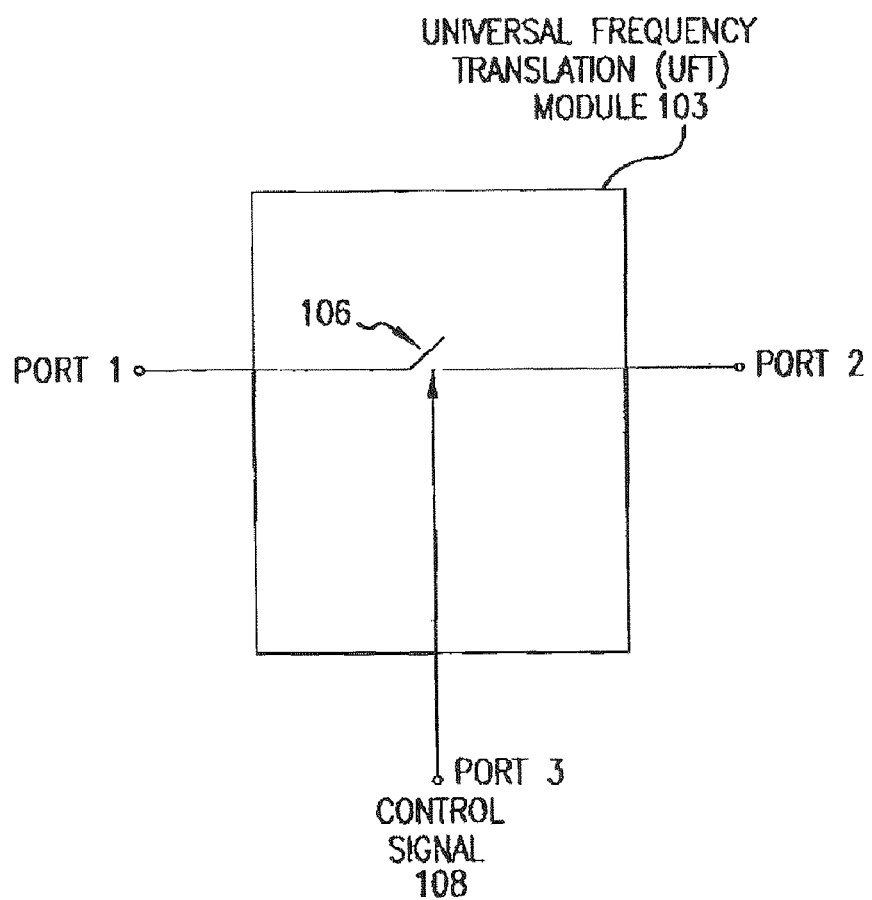
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2:
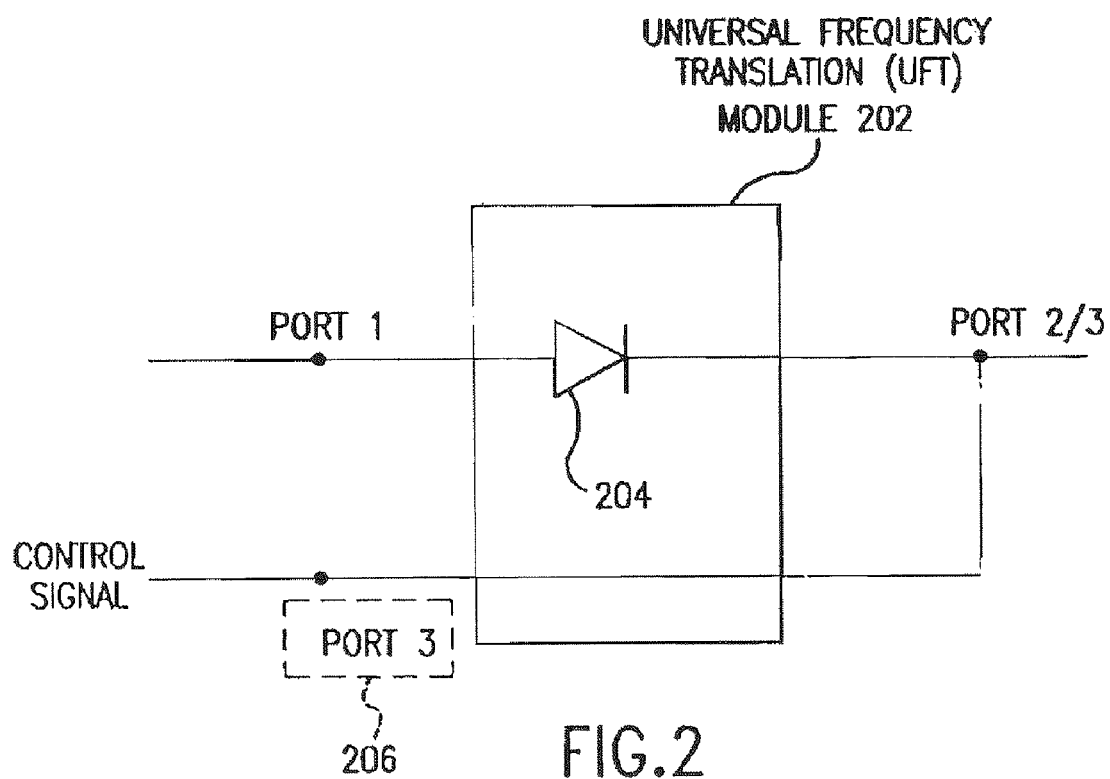
FIG. 2 is a block diagram of a universal frequency translation (UFT) module according to an alternative embodiment of the invention.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label. Other embodiments, as described herein, have more than three ports.

The UFT module is a very powerful and flexible device. Its flexibility is illustrated, in part, by the wide range of applications in which it can be used. Its power is illustrated, in part, by the usefulness and performance of such applications.

Figure 1C:
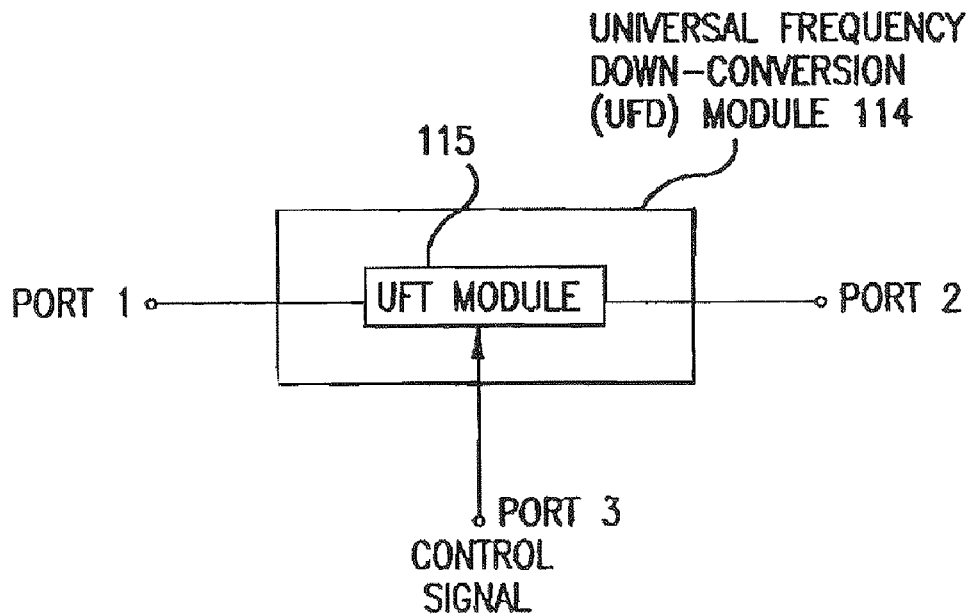
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
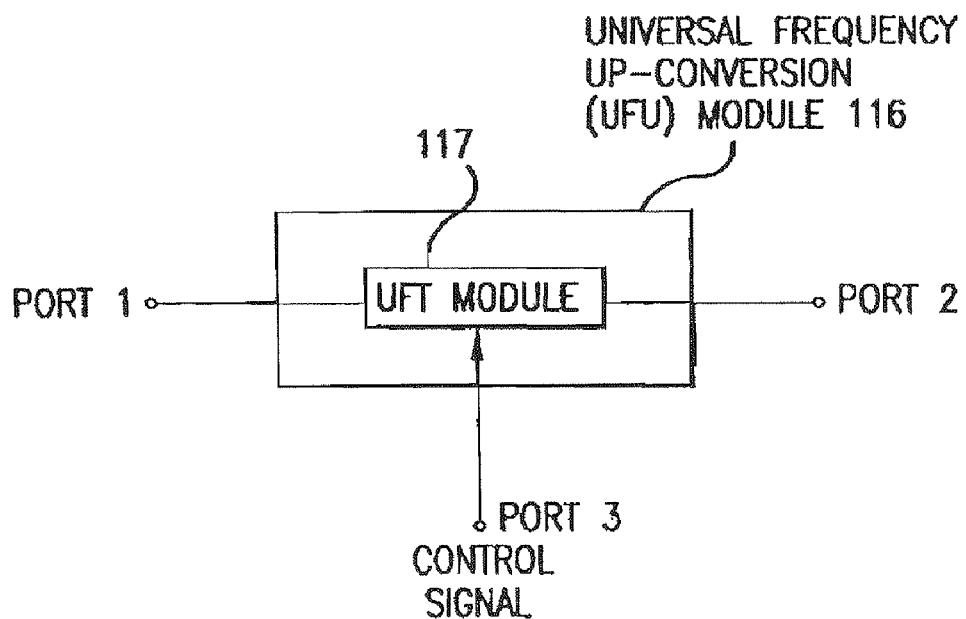
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2.1 Frequency Down-Conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in U.S. Pat. No. 6,061,551 entitled "Method and System for Down-Converting. Electromagnetic Signals," the full disclosure of which is incorporated herein by reference. A relevant portion of the above-mentioned patent is summarized below to describe down-converting an input signal to produce a down-converted signal that exists at a lower frequency or a baseband signal. The frequency translation aspects of the invention are further described in other documents referenced above, such as application Ser. No. 09/550,644, entitled "Method and System for Down-converting an Electromagnetic Signal, and Transforms for Same, and Aperture Relationships."

Figure 3A:
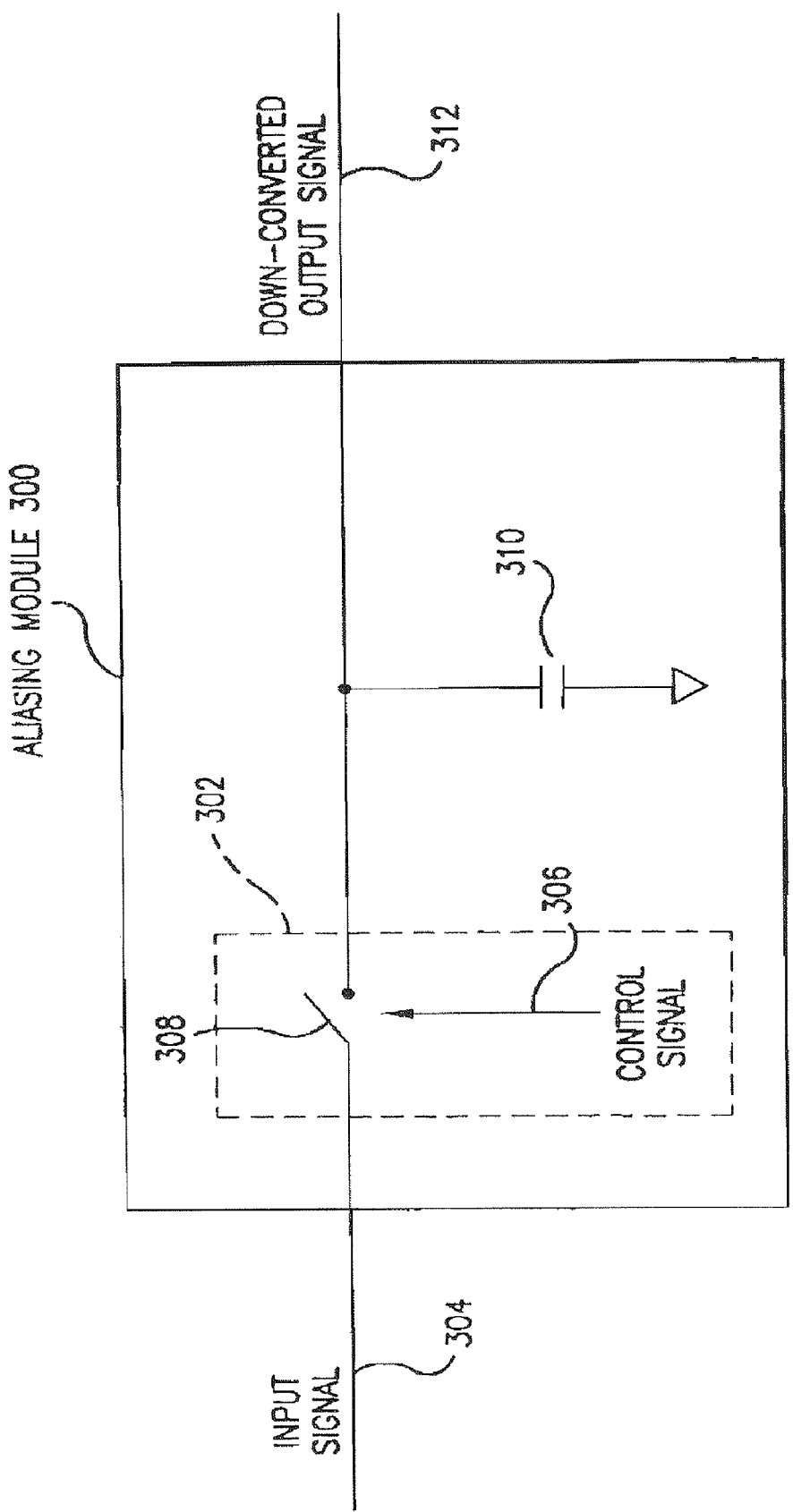
FIGS. 3A and 3G are example aliasing modules according to embodiments of the invention.

FIG. 3A illustrates an aliasing module 300 for down-conversion using a universal frequency translation (UFT) module 302 which down-converts an EM input signal 304. In particular embodiments, aliasing module 300 includes a switch 308 and a capacitor 310 (or integrator). (In embodiments, the UFT module is considered to include the switch and integrator.) The electronic alignment of the circuit components is flexible. That is, in one implementation, the switch 308 is in series with input signal 304 and capacitor 310 is shunted to ground (although it may be other than ground in configurations such as differential mode). In a second implementation (see FIG. 3G), the capacitor 310 is in series with the input signal 304 and the switch 308 is shunted to ground (although it may be other than ground in configurations such as differential mode). Aliasing module 300 with UFT module 302 can be tailored to down-convert a wide variety of electromagnetic signals using aliasing frequencies that are well below the frequencies of the EM input signal 304.

In one implementation, aliasing module 300 down-converts the input signal 304 to an intermediate frequency (IF) signal. In another implementation, the aliasing module 300 down-converts the input signal 304 to a demodulated baseband signal. In yet another implementation, the input signal 304 is a frequency modulated (FM) signal, and the aliasing module 300 down-converts it to a non-FM signal, such as a phase modulated (PM) signal or an amplitude modulated (AM) signal. Each of the above implementations is described below.

In an embodiment, the control signal 306 includes a train of pulses that repeat at an aliasing rate that is equal to, or less than, twice the frequency of the input signal 304. In this embodiment, the control signal 306 is referred to herein as an aliasing signal because it is below the Nyquist rate for the frequency of the input signal 304. Preferably, the frequency of control signal 306 is much less than the input signal 304.

Figure 3B:
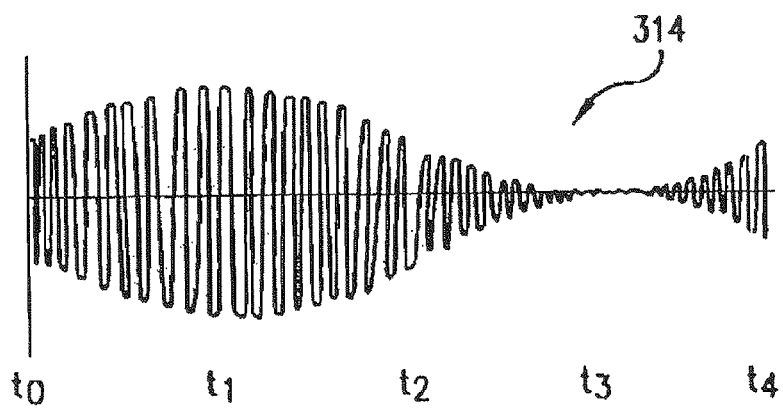
FIGS. 3B-3F are example waveforms used to describe the operation of the aliasing modules of FIGS. 3A and 3G.
Figure 3C:
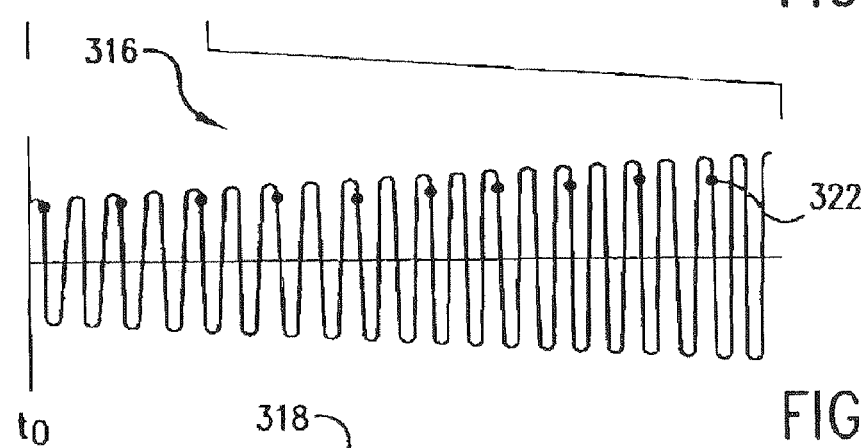
Figure 3D:
Figure 3E:
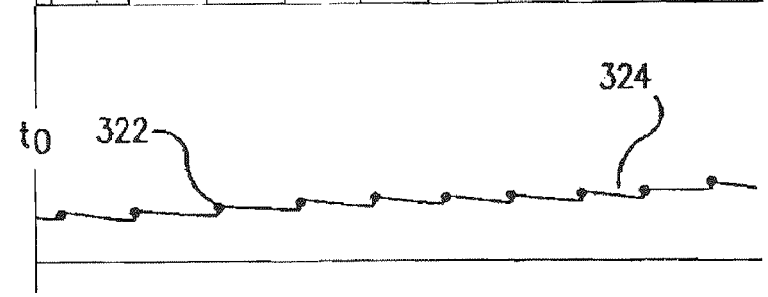

A train of pulses 318 as shown in FIG. 3D controls the switch 308 to alias the input signal 304 with the control signal 306 to generate a down-converted output signal 312. More specifically, in an embodiment, switch 308 closes on a first edge of each pulse 320 of FIG. 3D and opens on a second edge of each pulse. When the switch 308 is closed, the input signal 304 is coupled to the capacitor 310, and charge is transferred from the input signal to the capacitor 310. The charge stored during successive pulses forms down-converted output signal 312.

Exemplary waveforms are shown in FIGS. 3B-3F.

FIG. 3B illustrates an analog amplitude modulated (AM) carrier signal 314 that is an example of input signal 304. For illustrative purposes, in FIG. 3C, an analog AM carrier signal portion 316 illustrates a portion of the analog AM carrier signal 314 on an expanded time scale. The analog AM carrier signal portion 316 illustrates the analog AM carrier signal 314 from time $t_0$ to time $t_1$.

FIG. 3D illustrates an exemplary aliasing signal 318 that is an example of control signal 306. Aliasing signal 318 is on approximately the same time scale as the analog AM carrier signal portion 316. In the example shown in FIG. 3D, the aliasing signal 318 includes a train of pulses 320 having negligible apertures that tend towards zero (the invention is not limited to this embodiment, as discussed below). The pulse aperture may also be referred to as the pulse width as will be understood by those skilled in the art(s). The pulses 320 repeat at an aliasing rate, or pulse repetition rate of aliasing signal 318. The aliasing rate is determined as described below.

Figure 3F:
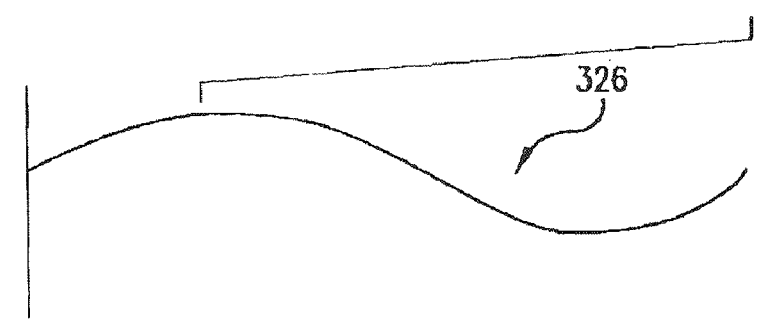

As noted above, the train of pulses 320 (i.e., control signal 306) control the switch 308 to alias the analog AM carrier signal 316 (i.e., input signal 304) at the aliasing rate of the aliasing signal 318. Specifically, in this embodiment, the switch 308 closes on a first edge of each pulse and opens on a second edge of each pulse. When the switch 308 is closed, input signal 304 is coupled to the capacitor 310, and charge is transferred from the input signal 304 to the capacitor 310. The charge transferred during a pulse is referred to herein as an under-sample. Exemplary under-samples 322 form down-converted signal portion 324 (FIG. 3E) that corresponds to the analog AM carrier signal portion 316 (FIG. 3C) and the train of pulses 320 (FIG. 3D). The charge stored during successive under-samples of AM carrier signal 314 form the down-converted signal 324 (FIG. 3E) that is an example of down-converted output signal 312 (FIG. 3A). In FIG. 3F, a demodulated baseband signal 326 represents the demodulated baseband signal 324 after filtering on a compressed time scale. As illustrated, down-converted signal 326 has substantially the same "amplitude envelope" as AM carrier signal 314. Therefore, FIGS. 3B-3F illustrate down-conversion of AM carrier signal 314.

The waveforms shown in FIGS. 3B-3F are discussed herein for illustrative purposes only, and are not limiting.

The aliasing rate of control signal 306 determines whether the input signal 304 is down-converted to an IF signal, down-converted to a demodulated baseband signal, or down-converted from an FM signal to a PM or an AM signal. Generally, relationships between the input signal 304, the aliasing rate of the control signal 306, and the down-converted output signal 312 are illustrated below:

(Freq. of input signal 304)=$n$·(Freq. of control signal 306)±(Freq. of down-converted output signal 312)

For the examples contained herein, only the "+" condition will be discussed. Example values of n include, but are not limited to, n={0.5, 1, 2, 3, 4, . . . }.

When the aliasing rate of control signal 306 is off-set from the frequency of input signal 304, or off-set from a harmonic or sub-harmonic thereof, input signal 304 is down-converted to an IF signal. This is because the under-sampling pulses occur at different phases of subsequent cycles of input signal 304. As a result, the under-samples form a lower frequency oscillating pattern. If the input signal 304 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 306 would be calculated as follows:

(Freq$_{input}$−Freq$_{IF}$)/$n$=Freq$_{control}$ (901 MHZ−1 MHZ)/$n$=900/$n$

For n={0.5, 1, 2, 3, 4, . . . }, the frequency of the control signal 306 would be substantially equal to 1.8 GHz, 900 MHZ, 450 MHZ, 300 MHZ, 225 MHZ, etc.

Alternatively, when the aliasing rate of the control signal 306 is substantially equal to the frequency of the input signal 304, or substantially equal to a harmonic or sub-harmonic thereof, input signal 304 is directly down-converted to a demodulated baseband signal. This is because, without modulation, the under-sampling pulses occur at the same point of subsequent cycles of the input signal 304. As a result, the under-samples form a constant output baseband signal. If the input signal 304 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 306 would be calculated as follows:

(Freq$_{input}$−Freq$_{IF}$)/$n$=Freq$_{control}$ (900 MHZ−0 MHZ)/$n$=900 MHZ/$n$ For n={0.5, 1, 2, 3, 4, . . . }, the frequency of the control signal 306 should be substantially equal to 1.8 GHz, 900 MHZ, 450 MHZ, 300 MHZ, 225 MHZ, etc.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 306 would be calculated as follows:

Frequency of the input = $(F_1 + F_2) \div 2$

= (899 MHZ + 901 MHZ) ÷ 2

= 900 MHZ

Frequency of the down-converted signal=0 (i.e., base-band)

(Freq$_{input}$−Freq$_{IF}$)/$n$=Freq$_{control}$ (900 MHZ−0 MHZ)/$n$=900 MHZ/$n$ For n={0.5, 1, 2, 3, 4 . . . }, the frequency of the control signal 306 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 306 should be substantially equal to:

(900 MHZ−0 MHZ)/$n$=900 MHZ/$n$, or (901 MHZ−0 MHZ)/$n$=901 MHZ/$n$.

For the former case of 900 MHZ/n, and for n={0.5, 1, 2, 3, 4, . . . }, the frequency of the control signal 306 should be substantially equal to 1.8 GHz, 900 MHZ, 450 MHZ, 300 MHZ, 225 MHZ, etc. For the latter case of 901 MHZ/n, and for n={0.5, 1, 2, 3, 4, . . . }, the frequency of the control signal 306 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

In an embodiment, the pulses of the control signal 306 have negligible apertures that tend towards zero. This makes the UFT module 302 a high input impedance device. This configuration is useful for situations where minimal disturbance of the input signal may be desired.

In another embodiment, the pulses of the control signal 306 have non-negligible apertures that tend away from zero. This makes the UFT module 302 a lower input impedance device. This allows the lower input impedance of the UFT module 302 to be substantially matched with a source impedance of the input signal 304. This also improves the energy transfer from the input signal 304 to the down-converted output signal 312, and hence the efficiency and signal to noise (s/n) ratio of UFT module 302.

Exemplary systems and methods for generating and optimizing the control signal 306, and for otherwise improving energy transfer and s/n ratio, are disclosed in U.S. Pat. No. 6,061,551 entitled "Method and System for Down-Converting Electromagnetic Signals."

When the pulses of the control signal 306 have non-negligible apertures, the aliasing module 300 is referred to interchangeably herein as an energy transfer module or a gated transfer module, and the control signal 306 is referred to as an energy transfer signal. Exemplary systems and methods for generating and optimizing the control signal 306 and for otherwise improving energy transfer and/or signal to noise ratio in an energy transfer module are described below.

2.2 Optional Energy Transfer Signal Module

Figure 4:
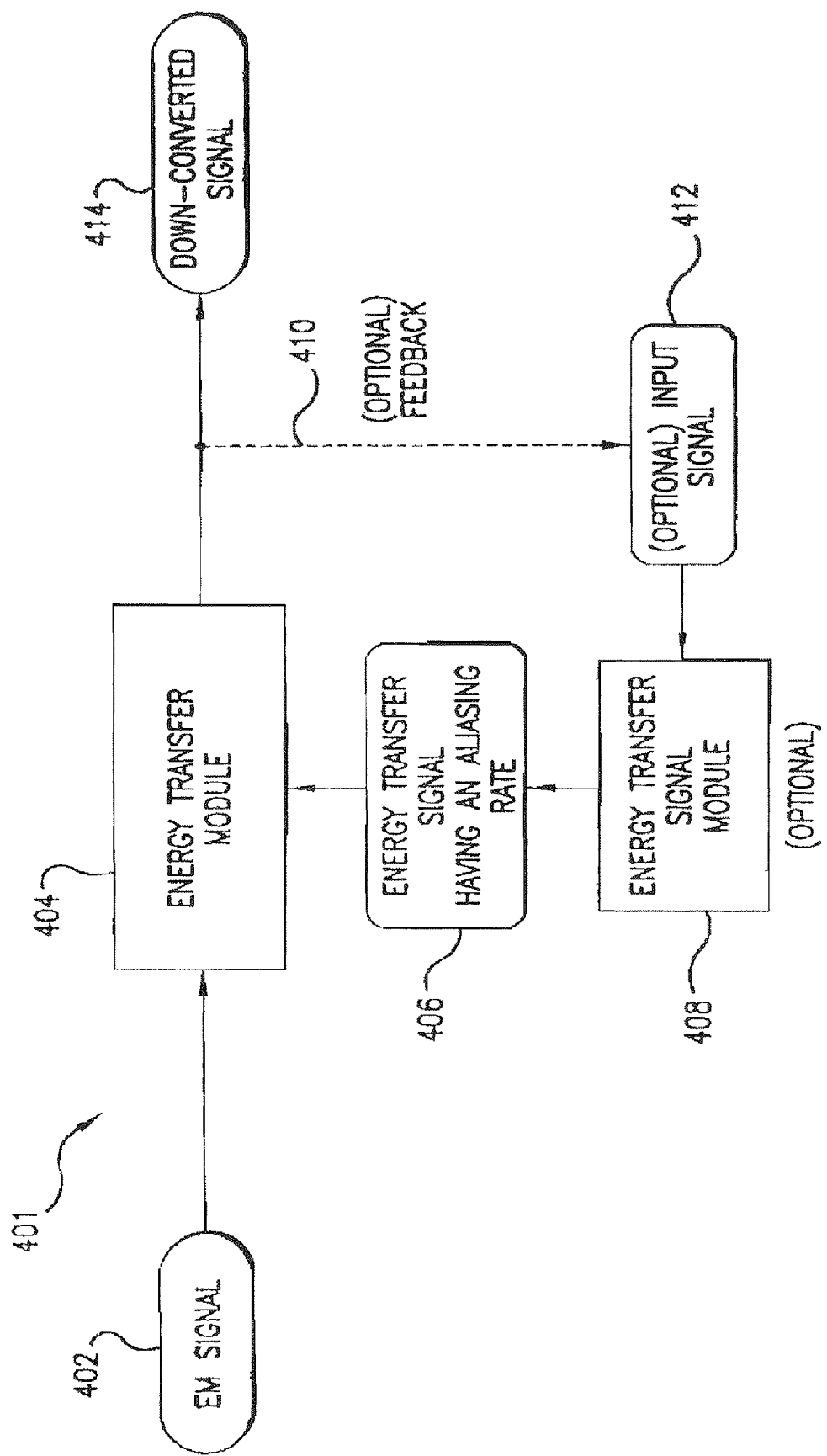
FIG. 4 illustrates an energy transfer system with an optional energy transfer signal module according to an embodiment of the invention.

FIG. 4 illustrates an energy transfer system 401 that includes an optional energy transfer signal module 408, which can perform any of a variety of functions or combinations of functions including, but not limited to, generating the energy transfer signal 406.

Figure 5:
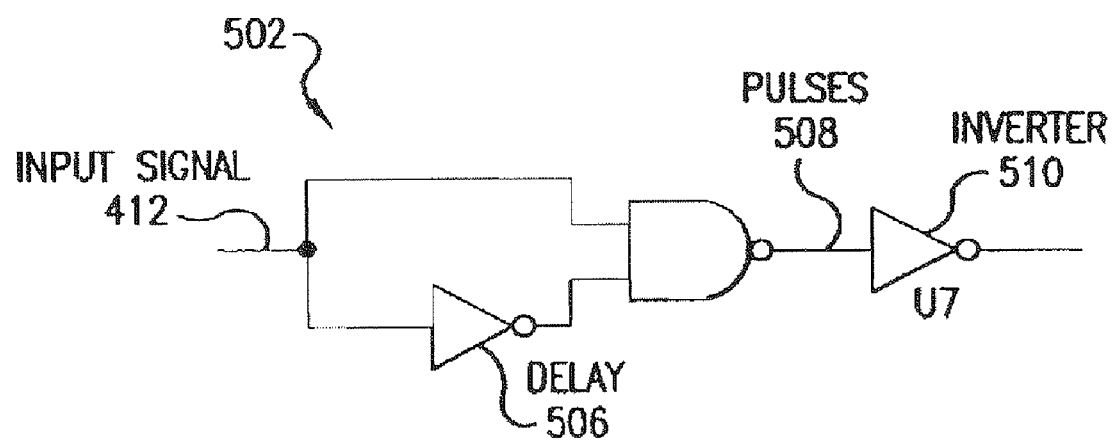
FIG. 5 illustrates an example aperture generator.

In an embodiment, the optional energy transfer signal module 408 includes an aperture generator, an example of which is illustrated in FIG. 5 as an aperture generator 502. The aperture generator 502 generates non-negligible aperture pulses 508 from an input signal 412. The input signal 412 can be any type of periodic signal, including, but not limited to, a sinusoid, a square wave, a saw-tooth wave, etc. Systems for generating the input signal 412 are described below.

The width or aperture of the pulses 508 is determined by delay through the branch 506 of the aperture generator 502. Generally, as the desired pulse width increases, the difficulty in meeting the requirements of the aperture generator 502 decrease (i.e., the aperture generator is easier to implement). In other words, to generate non-negligible aperture pulses for a given EM input frequency, the components utilized in the example aperture generator 502 do not require reaction times as fast as those that are required in an under-sampling system operating with the same EM input frequency.

The example logic and implementation shown in the aperture generator 502 are provided for illustrative purposes only, and are not limiting. The actual logic employed can take many forms. The example aperture generator 502 includes an optional inverter 510, which is shown for polarity consistency with other examples provided herein.

Figure 7A:
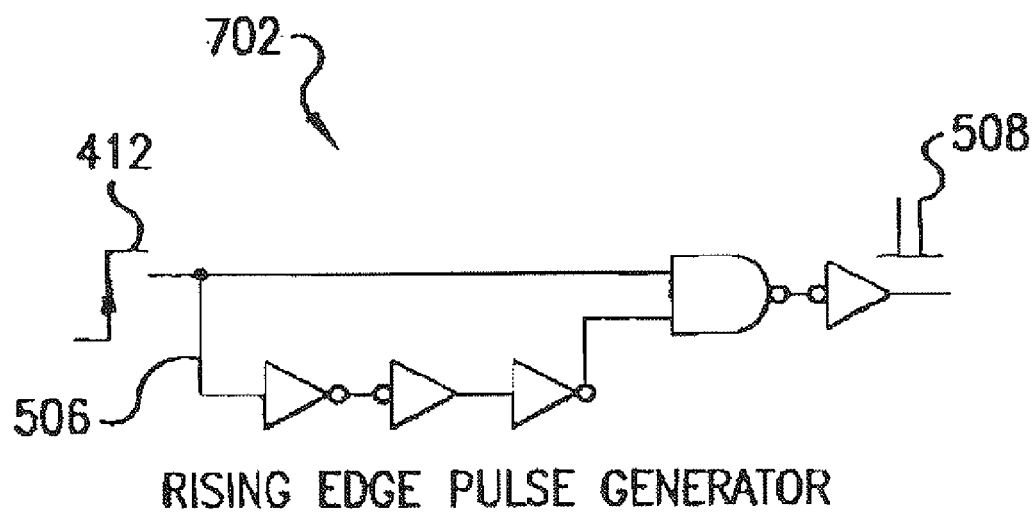
FIGS. 7A-B illustrate example aperture generators.
Figure 7B:
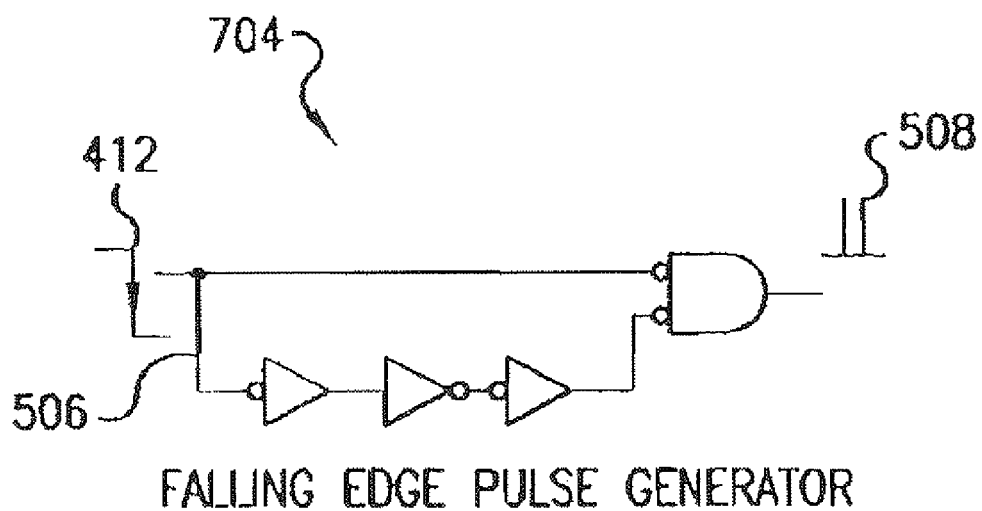

An example implementation of the aperture generator 502 is illustrated in FIG. 6A. Additional examples of aperture generation logic are provided in FIGS. 7A and 7B. FIG. 7A illustrates a rising edge pulse generator 702, which generates pulses 508 on rising edges of the input signal 412. FIG. 7B illustrates a falling edge pulse generator 704, which generates pulses 508 on falling edges of the input signal 412. These circuits are provided for example only, and do not limit the invention.

In an embodiment, the input signal 412 is generated externally of the energy transfer signal module 408, as illustrated in FIG. 4. Alternatively, the input signal 412 is generated internally by the energy transfer signal module 408. The input signal 412 can be generated by an oscillator, as illustrated in FIG. 6B by an oscillator 602. The oscillator 602 can be internal to the energy transfer signal module 408 or external to the energy transfer signal module 408. The oscillator 602 can be external to the energy transfer system 401. The output of the oscillator 602 may be any periodic waveform.

The type of down-conversion performed by the energy transfer system 401 depends upon the aliasing rate of the energy transfer signal 406, which is determined by the frequency of the pulses 508. The frequency of the pulses 508 is determined by the frequency of the input signal 412.

The optional energy transfer signal module 408 can be implemented in hardware, software, firmware, or any combination thereof.

2.3 Impedance Matching

The example energy transfer module 300 described in reference to FIG. 3A, above, has input and output impedances generally defined by (1) the duty cycle of the switch module (i.e., UFT 302), and (2) the impedance of the storage module (e.g., capacitor 310), at the frequencies of interest (e.g. at the EM input, and intermediate/baseband frequencies).

Starting with an aperture width of approximately ½ the period of the EM signal being down-converted as an example embodiment, this aperture width (e.g. the "closed time") can be decreased (or increased). As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Figure 8:
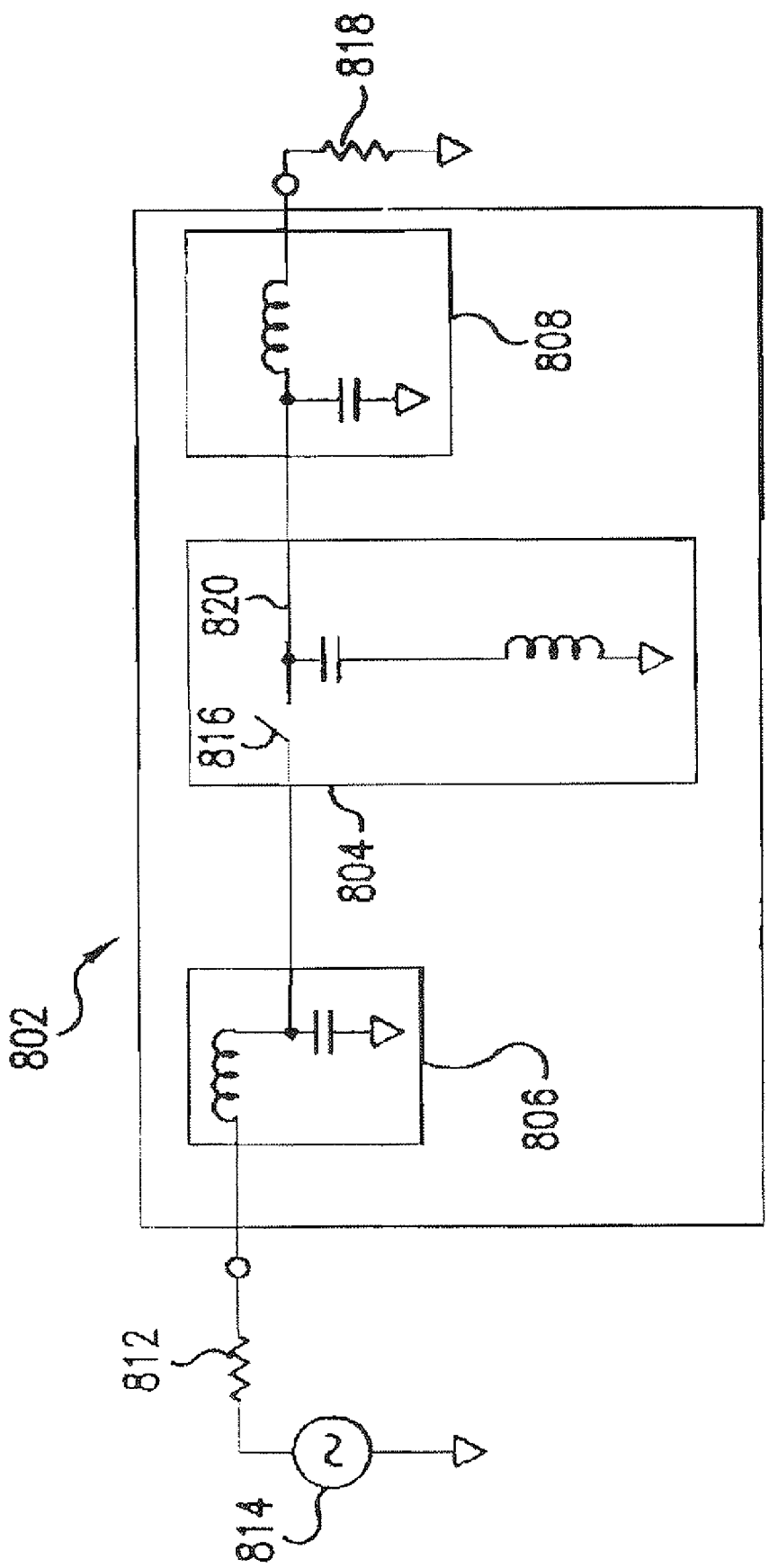
FIG. 8 illustrates an aliasing module with input and output impedance match according to an embodiment of the invention.
Figure 9:
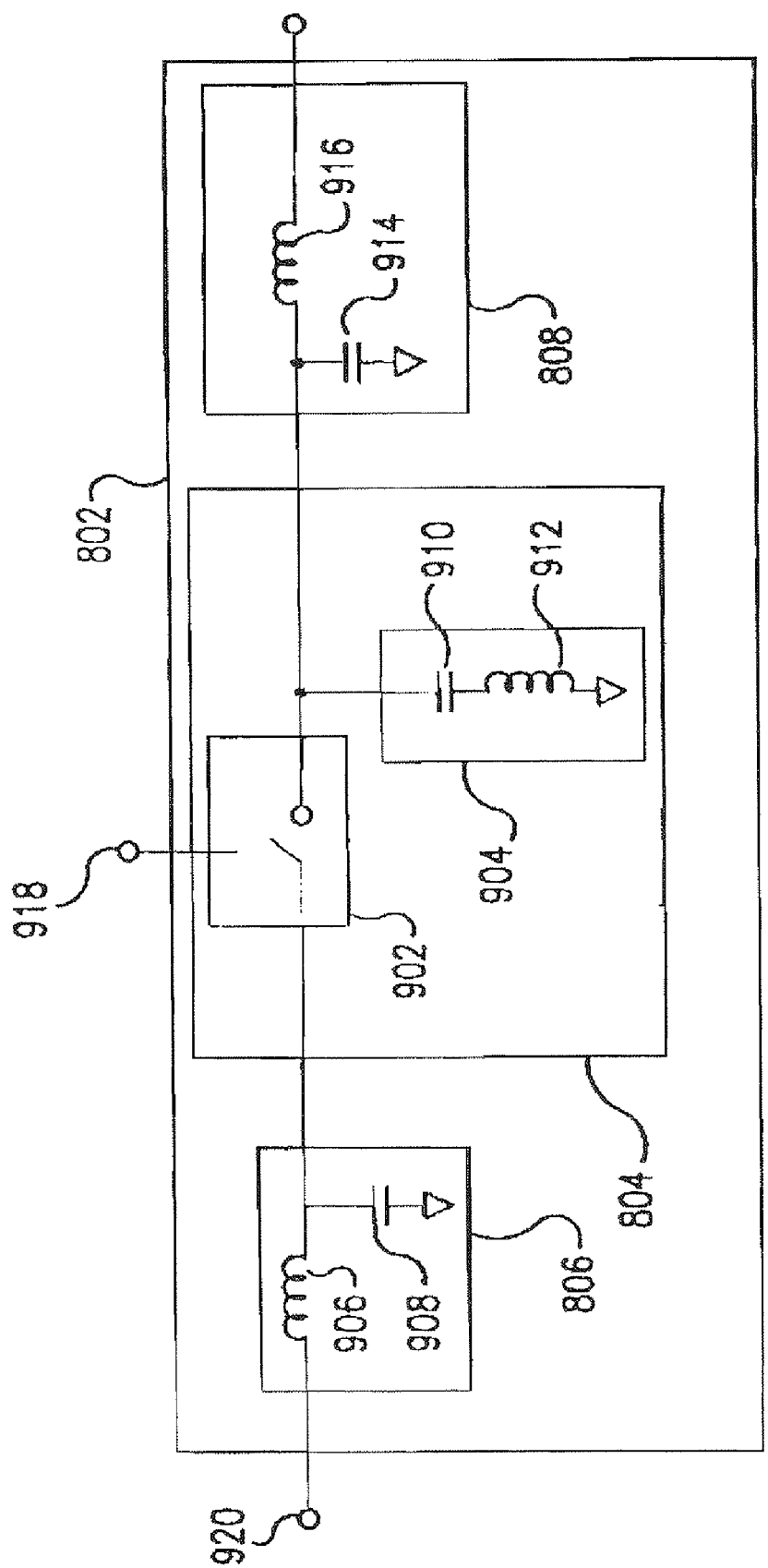
FIG. 9 illustrates an example energy transfer module with a switch module and a reactive storage module according to an embodiment of the invention.

Referring to FIG. 8, a specific example embodiment using an RF signal as an input, assuming that the impedance 812 is a relatively low impedance of approximately 50 Ohms, for example, and the input impedance 816 is approximately 300 Ohms, an initial configuration for the input impedance match module 806 can include an inductor 906 and a capacitor 908, configured as shown in FIG. 9. The configuration of the inductor 906 and the capacitor 908 is a possible configuration when going from a low impedance to a high impedance. Inductor 906 and the capacitor 908 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 914 and an inductor 916 can be configured as shown in FIG. 9. The capacitor 914 and the inductor 916 constitute an L match, the calculation of the component values being well known to those skilled in the relevant arts.

The configuration of the input impedance match module 806 and the output impedance match module 808 are considered in embodiments to be initial starting points for impedance matching, in accordance with embodiments of the present invention. In some situations, the initial designs may be suitable without further optimization. In other situations, the initial designs can be enhanced in accordance with other various design criteria and considerations.

As other optional optimizing structures and/or components are utilized, their affect on the characteristic impedance of the energy transfer module should be taken into account in the match along with their own original criteria.

2.4 Frequency Up-Conversion

The present invention is directed to systems and methods of frequency up-conversion, and applications of same.

Figure 10:
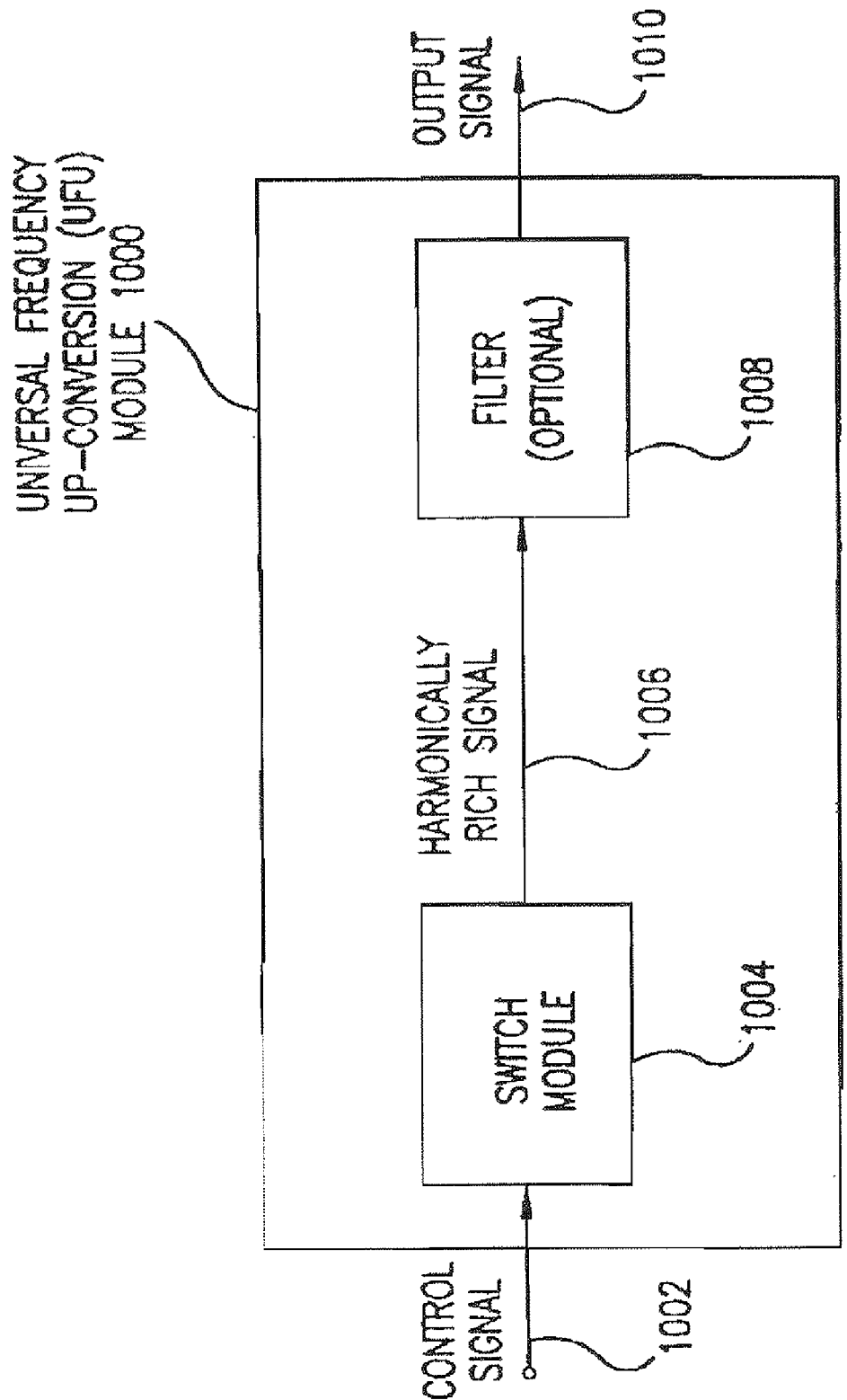
FIG. 10 is a block diagram of a universal frequency up-conversion (UFU) module according to an embodiment of the invention.

An example frequency up-conversion system 1000 is illustrated in FIG. 10. The frequency up-conversion system 1000 is now described.

An input signal 1002 (designated as "Control Signal" in FIG. 10) is accepted by a switch module 1004. For purposes of example only, assume that the input signal 1002 is a FM input signal 1306, an example of which is shown in FIG. 13C. FM input signal 1306 may have been generated by modulating information signal 1302 onto oscillating signal 1304 (FIGS. 13A and 13B). It should be understood that the invention is not limited to this embodiment. The information signal 1302 can be analog, digital, or any combination thereof, and any modulation scheme can be used.

The output of switch module 1004 is a harmonically rich signal 1006, shown for example in FIG. 13D as a harmonically rich signal 1308. The harmonically rich signal 1308 has a continuous and periodic waveform.

FIG. 13E is an expanded view of two sections of harmonically rich signal 1308, section 1310 and section 1312. The harmonically rich signal 1308 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Harmonically rich signal 1308 is comprised of a plurality of sinusoidal waves whose frequencies are integer multiples of the fundamental frequency of the waveform of the harmonically rich signal 1308. These sinusoidal waves are referred to as the harmonics of the underlying waveform, and the fundamental frequency is referred to as the first harmonic. FIG. 13F and FIG. 13G show separately the sinusoidal components making up the first, third, and fifth harmonics of section 1310 and section 1312. (Note that in theory there may be an infinite number of harmonics; in this example, because harmonically rich signal 1308 is shown as a square wave, there are only odd harmonics). Three harmonics are shown simultaneously (but not summed) in FIG. 13H.

The relative amplitudes of the harmonics are generally a function of the relative widths of the pulses of harmonically rich signal 1006 and the period of the fundamental frequency, and can be determined by doing a Fourier analysis of harmonically rich signal 1006. According to an embodiment of the invention, the input signal 1306 may be shaped to ensure that the amplitude of the desired harmonic is sufficient for its intended use (e.g., transmission).

An optional filter 1008 filters out any undesired frequencies (harmonics), and outputs an electromagnetic (EM) signal at the desired harmonic frequency or frequencies as an output signal 1010, shown for example as a filtered output signal 1314 in FIG. 13I.

Figure 11:
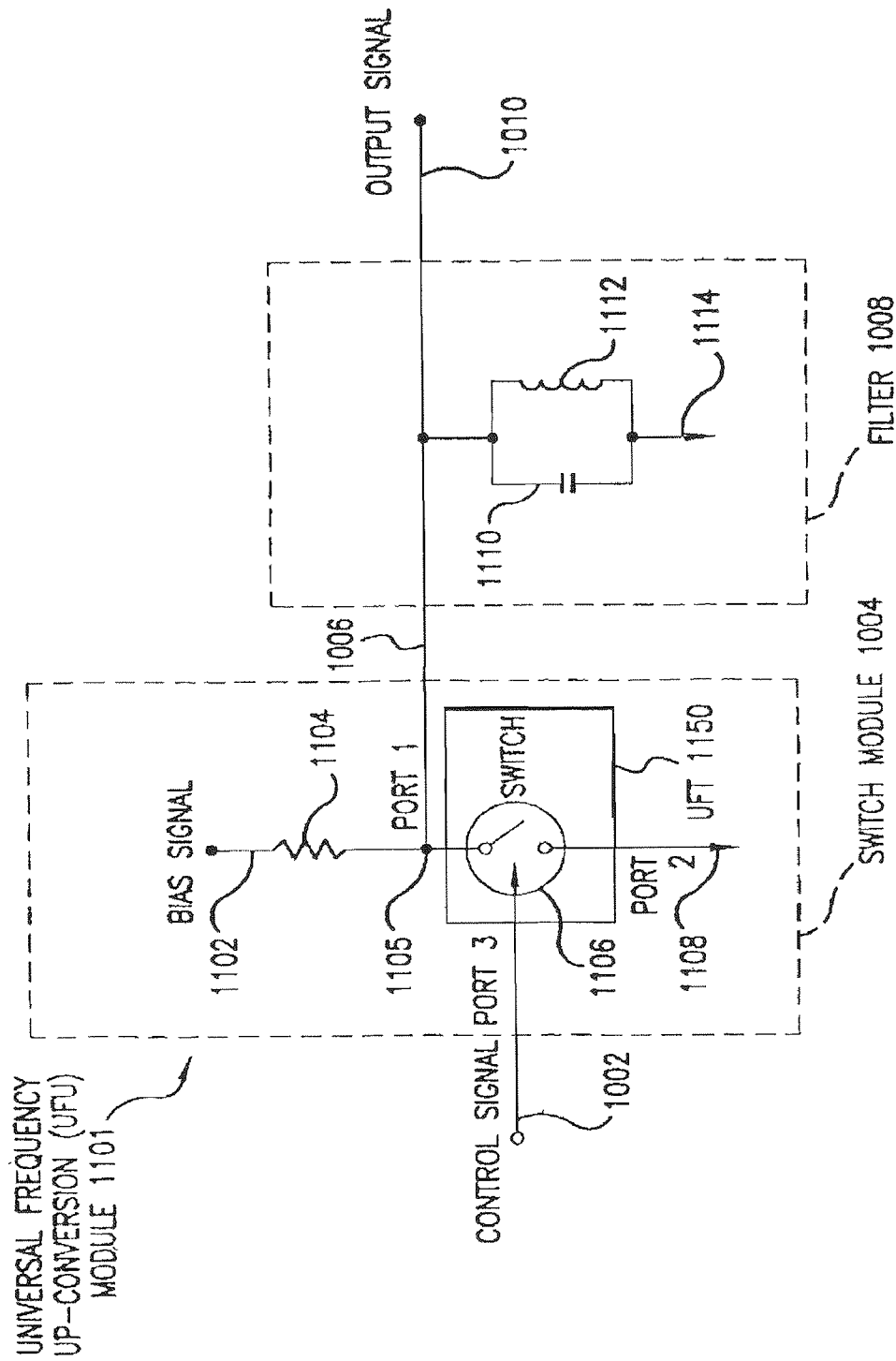
FIG. 11 is a more detailed diagram of a universal frequency up-conversion (UFU) module according to an embodiment of the invention.

FIG. 11 illustrates an example universal frequency up-conversion (UFU) module 1101. The UFU module 1101 includes an example switch module 1004, which comprises a bias signal 1102, a resistor or impedance 1104, a universal frequency translator (UFT) 1150, and a ground 1108. The UFT 1150 includes a switch 1106. The input signal 1002 (designated as "Control Signal" in FIG. 11) controls the switch 1106 in the UFT 1150, and causes it to close and open. Harmonically rich signal 1006 is generated at a node 1105 located between the resistor or impedance 1104 and the switch 1106.

Also in FIG. 11, it can be seen that an example optional filter 1008 is comprised of a capacitor 1110 and an inductor 1112 shunted to a ground 1114. The filter is designed to filter out the undesired harmonics of harmonically rich signal 1006.

The invention is not limited to the UFU embodiment shown in FIG. 11.

Figure 12:
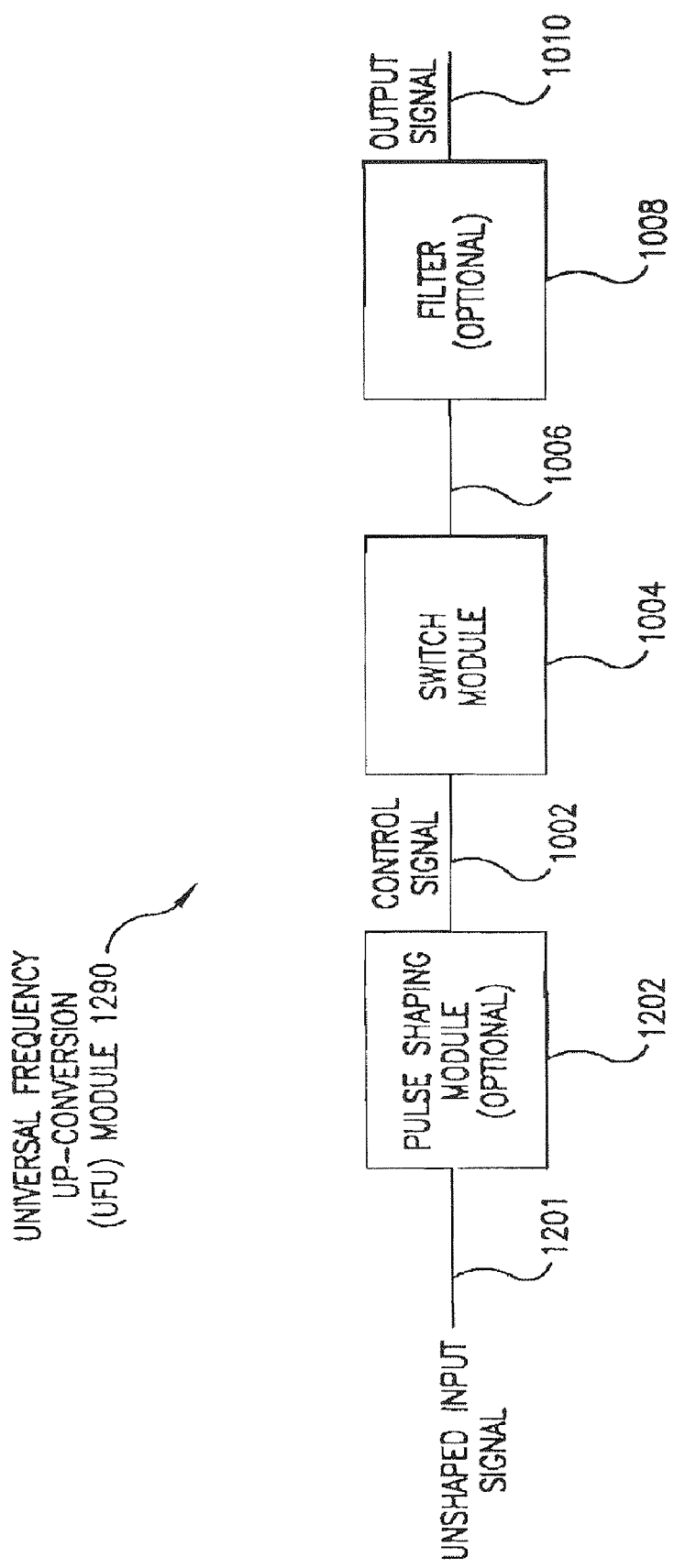
FIG. 12 is a block diagram of a universal frequency up-conversion (UFU) module according to an alternative embodiment of the invention.

For example, in an alternate embodiment shown in FIG. 12, an unshaped input signal 1201 is routed to a pulse shaping module 1202. The pulse shaping module 1202 modifies the unshaped input signal 1201 to generate a (modified) input signal 1002 (designated as the "Control Signal" in FIG. 12). The input signal 1002 is routed to the switch module 1004, which operates in the manner described above. Also, the filter 1008 of FIG. 12 operates in the manner described above.

The purpose of the pulse shaping module 1202 is to define the pulse width of the input signal 1002. Recall that the input signal 1002 controls the opening and closing of the switch 1106 in switch module 1004. During such operation, the pulse width of the input signal 1002 establishes the pulse width of the harmonically rich signal 1006. As stated above, the relative amplitudes of the harmonics of the harmonically rich signal 1006 are a function of at least the pulse width of the harmonically rich signal 1006. As such, the pulse width of the input signal 1002 contributes to setting the relative amplitudes of the harmonics of harmonically rich signal 1006.

Further details of up-conversion as described in this section are presented in U.S. Pat. No. 6,091,940, entitled "Method and System for Frequency Up-Conversion," incorporated herein by reference in its entirety.

2.5 Enhanced Signal Reception

The present invention is directed to systems and methods of enhanced signal reception (ESR), and applications of same, which are described in the above-referenced U.S. Pat. No. 6,061,555, entitled "Method and System for Ensuring Reception of a Communications Signal," incorporated herein by reference in its entirety.

2.6 Unified Down-Conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 14:
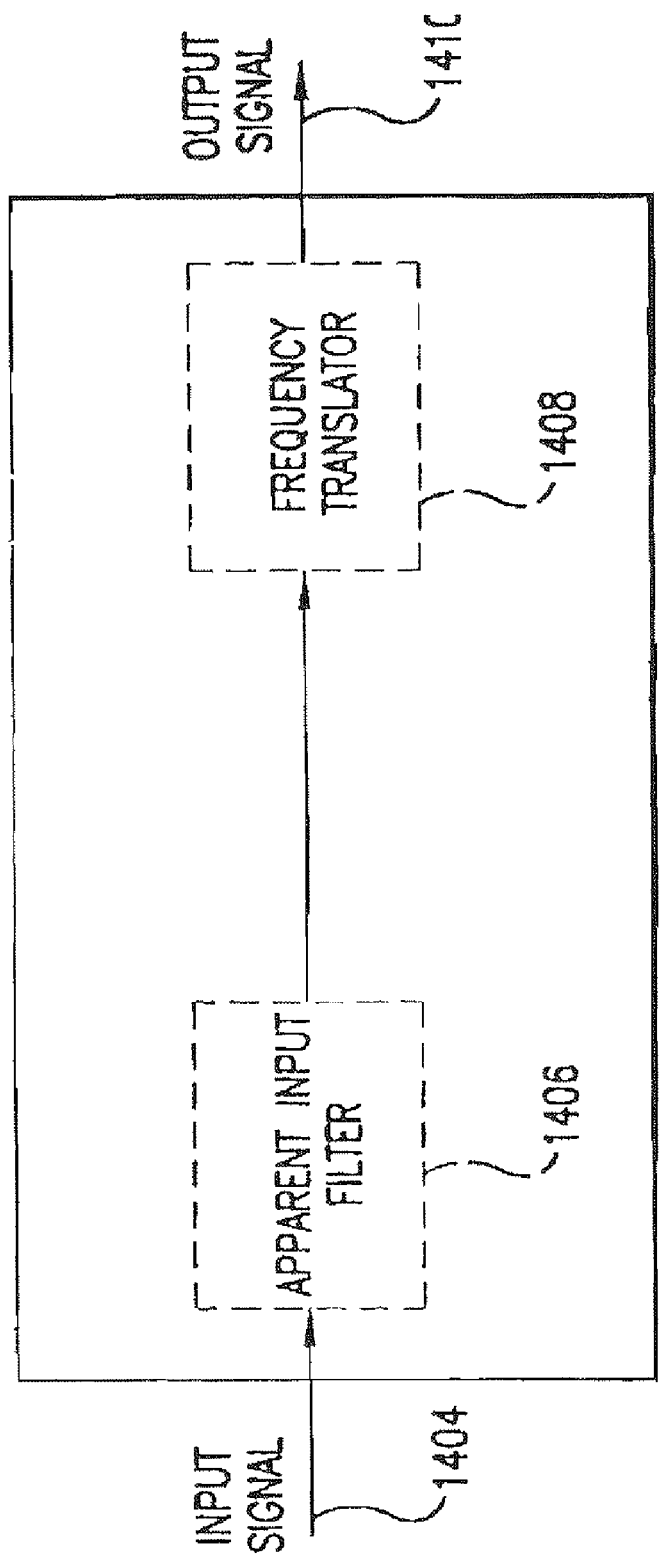
FIG. 14 illustrates a unified down-converting and filtering (UDF) module according to an embodiment of the invention.

FIG. 14 is a conceptual block diagram of a UDF module 1402 according to an embodiment of the present invention. The UDF module 1402 performs at least frequency translation and frequency selectivity.

The effect achieved by the UDF module 1402 is to perform the frequency selectivity operation prior to the performance of the frequency translation operation. Thus, the UDF module 1402 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1404 received by the UDF module 1402 are at radio frequencies. The UDF module 1402 effectively operates to input filter these RF input signals 1404. Specifically, in these embodiments, the UDF module 1402 effectively performs input, channel select filtering of the RF input signal 1404. Accordingly, the invention achieves high selectivity at high frequencies.

The UDF module 1402 effectively performs various types of filtering, including but not limited to bandpass filtering, low pass filtering, high pass filtering, notch filtering, all pass filtering, band stop filtering, etc., and combinations thereof.

Conceptually, the UDF module 1402 includes a frequency translator 1408. The frequency translator 1408 conceptually represents that portion of the UDF module 1402 that performs frequency translation (down conversion).

The UDF module 1402 also conceptually includes an apparent input filter 1406 (also sometimes called an input filtering emulator). Conceptually, the apparent input filter 1406 represents that portion of the UDF module 1402 that performs input filtering.

In practice, the input filtering operation performed by the UDF module 1402 is integrated with the frequency translation operation. The input filtering operation can be viewed as being performed concurrently with the frequency translation operation. This is a reason why the input filter 1406 is herein referred to as an "apparent" input filter 1406.

The UDF module 1402 of the present invention includes a number of advantages. For example, high selectivity at high frequencies is realizable using the UDF module 1402. This feature of the invention is evident by the high Q factors that are attainable. For example, and without limitation, the UDF module 1402 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 1402 can be electrically adjusted, either statically or dynamically.

Also, the UDF module 1402 can be designed to amplify input signals.

Further, the UDF module 1402 can be implemented without large resistors, capacitors, or inductors. Also, the UDF module 1402 does not require that tight tolerances be maintained on the values of its individual components, i.e., its resistors, capacitors, inductors, etc. As a result, the architecture of the UDF module 1402 is friendly to integrated circuit design techniques and processes.

The features and advantages exhibited by the UDF module 1402 are achieved at least in part by adopting a new technological paradigm with respect to frequency selectivity and translation. Specifically, according to the present invention, the UDF module 1402 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and/or samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module 1402 preferably performs input filtering and frequency down-conversion in a unified manner.

Further details of unified down-conversion and filtering as described in this section are presented in U.S. Pat. No. 6,049,706, entitled "Integrated Frequency Translation And Selectivity," filed Oct. 21, 1998, and incorporated herein by reference in its entirety.

3. EXAMPLE EMBODIMENTS OF THE INVENTION

As noted above, the UFT module of the present invention is a very powerful and flexible device. Its flexibility is illustrated, in part, by the wide range of applications and combinations in which it can be used. Its power is illustrated, in part, by the usefulness and performance of such applications and combinations.

Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals. Example receiver, transmitter, and transceiver embodiments implemented using the UFT module of the present invention are set forth below.

3.1 Receiver Embodiments

In embodiments, a receiver according to the invention includes an aliasing module for down-conversion that uses a universal frequency translation (UFT) module to down-convert an EM input signal. For example, in embodiments, the receiver includes the aliasing module 300 described above, in reference to FIG. 3A or FIG. 3G. As described in more detail above, the aliasing module 300 may be used to down-convert an EM input signal to an intermediate frequency (IF) signal or a demodulated baseband signal.

In alternate embodiments, the receiver may include the energy transfer system 401, including energy transfer module 404, described above, in reference to FIG. 4. As described in more detail above, the energy transfer system 401 may be used to down-convert an EM signal to an intermediate frequency (IF) signal or a demodulated baseband signal. As also described above, the aliasing module 300 or the energy transfer system 401 may include an optional energy transfer signal module 408, which can perform any of a variety of functions or combinations of functions including, but not limited to, generating the energy transfer signal 406 of various aperture widths.

In further embodiments of the present invention, the receiver may include the impedance matching circuits and/or techniques described herein for enhancing the energy transfer system of the receiver.

3.1.1 In-Phase/Quadrature-Phase (I/Q) Modulation Mode Receiver Embodiments

Figure 15:
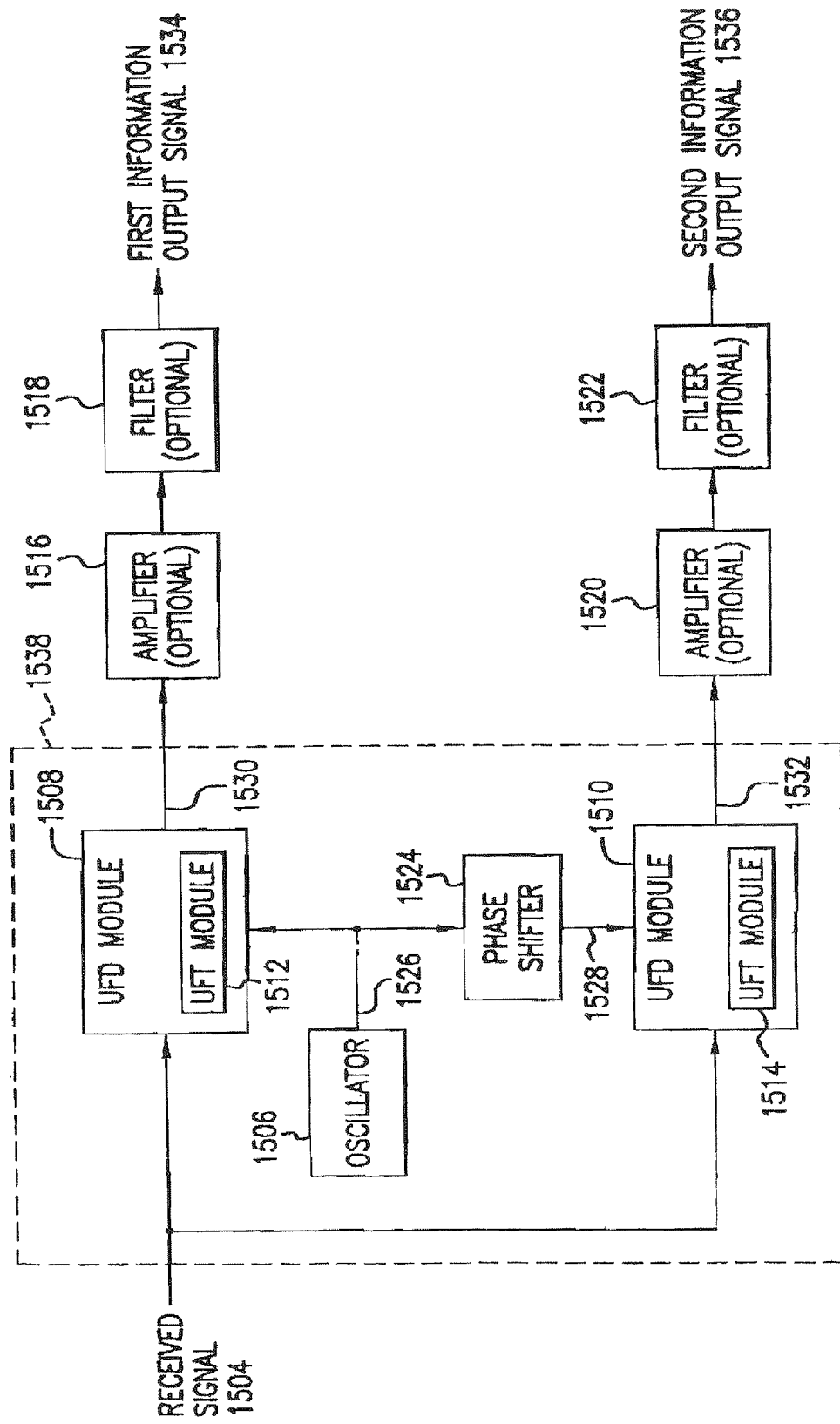
FIG. 15 illustrates an exemplary I/Q modulation embodiment of a receiver according to the invention.

FIG. 15 illustrates an exemplary I/Q modulation mode embodiment of a receiver 1502, according to an embodiment of the present invention. This I/Q modulation mode embodiment is described herein for purposes of illustration, and not limitation. Alternate I/Q modulation mode embodiments (including equivalents, extensions, variations, deviations, etc., of the embodiments described herein), as well as embodiments of other modulation modes, will be apparent to persons skilled in the relevant art(s) based on the teachings contained herein. The invention is intended and adapted to include such alternate embodiments.

Receiver 1502 comprises an I/Q modulation mode receiver 1538, a first optional amplifier 1516, a first optional filter 1518, a second optional amplifier 1520, and a second optional filter 1522.

I/Q modulation mode receiver 1538 comprises an oscillator 1506, a first UFD module 1508, a second UFD module 1510, a first UFT module 1512, a second UFT module 1514, and a phase shifter 1524.

Oscillator 1506 provides an oscillating signal used by both first UFD module 1508 and second UFD module 1510 via the phase shifter 1524. Oscillator 1506 generates an "I" oscillating signal 1526.

"I" oscillating signal 1526 is input to first UFD module 1508. First UFD module 1508 comprises at least one UFT module 1512. First UFD module 1508 frequency down-converts and demodulates received signal 1504 to down-converted "I" signal 1530 according to "I" oscillating signal 1526.

Phase shifter 1524 receives "I" oscillating signal 1526, and outputs "Q" oscillating signal 1528, which is a replica of "I" oscillating signal 1526 shifted preferably by 90 degrees.

Second UFD module 1510 inputs "Q" oscillating signal 1528. Second UFD module 1510 comprises at least one UFT module 1514. Second UFD module 1510 frequency down-converts and demodulates received signal 1504 to down-converted "Q" signal 1532 according to "Q" oscillating signal 1528.

Down-converted "I" signal 1530 is optionally amplified by first optional amplifier 1516 and optionally filtered by first optional filter 1518, and a first information output signal 1534 is output.

Down-converted "Q" signal 1532 is optionally amplified by second optional amplifier 1520 and optionally filtered by second optional filter 1522, and a second information output signal 1536 is output.

In the embodiment depicted in FIG. 15, first information output signal 1534 and second information output signal 1536 comprise a down-converted baseband signal. In embodiments, first information output signal 1534 and second information output signal 1536 are individually received and processed by related system components. Alternatively, first information output signal 1534 and second information output signal 1536 are recombined into a single signal before being received and processed by related system components.

Alternate configurations for I/Q modulation mode receiver 1538 will be apparent to persons skilled in the relevant art(s) from the teachings herein. For instance, an alternate embodiment exists wherein phase shifter 1524 is coupled between received signal 1504 and UFD module 1510, instead of the configuration described above. This and other such I/Q modulation mode receiver embodiments will be apparent to persons skilled in the relevant art(s) based upon the teachings herein, and are within the scope of the present invention.

3.1.2 Receiver Embodiments Having Two Aliasing Modules

As described herein, certain receiver embodiments of the present invention are implemented using two or more aliasing modules 300. These embodiments are described herein for purposes of illustration, and not limitation. Alternate embodiments (including equivalents, extensions, variations, deviations, etc., of the embodiments described herein), will be apparent to persons skilled in the relevant art(s) based on the teachings contained herein. The invention is intended and adapted to include such alternate embodiments.

Figure 16A:
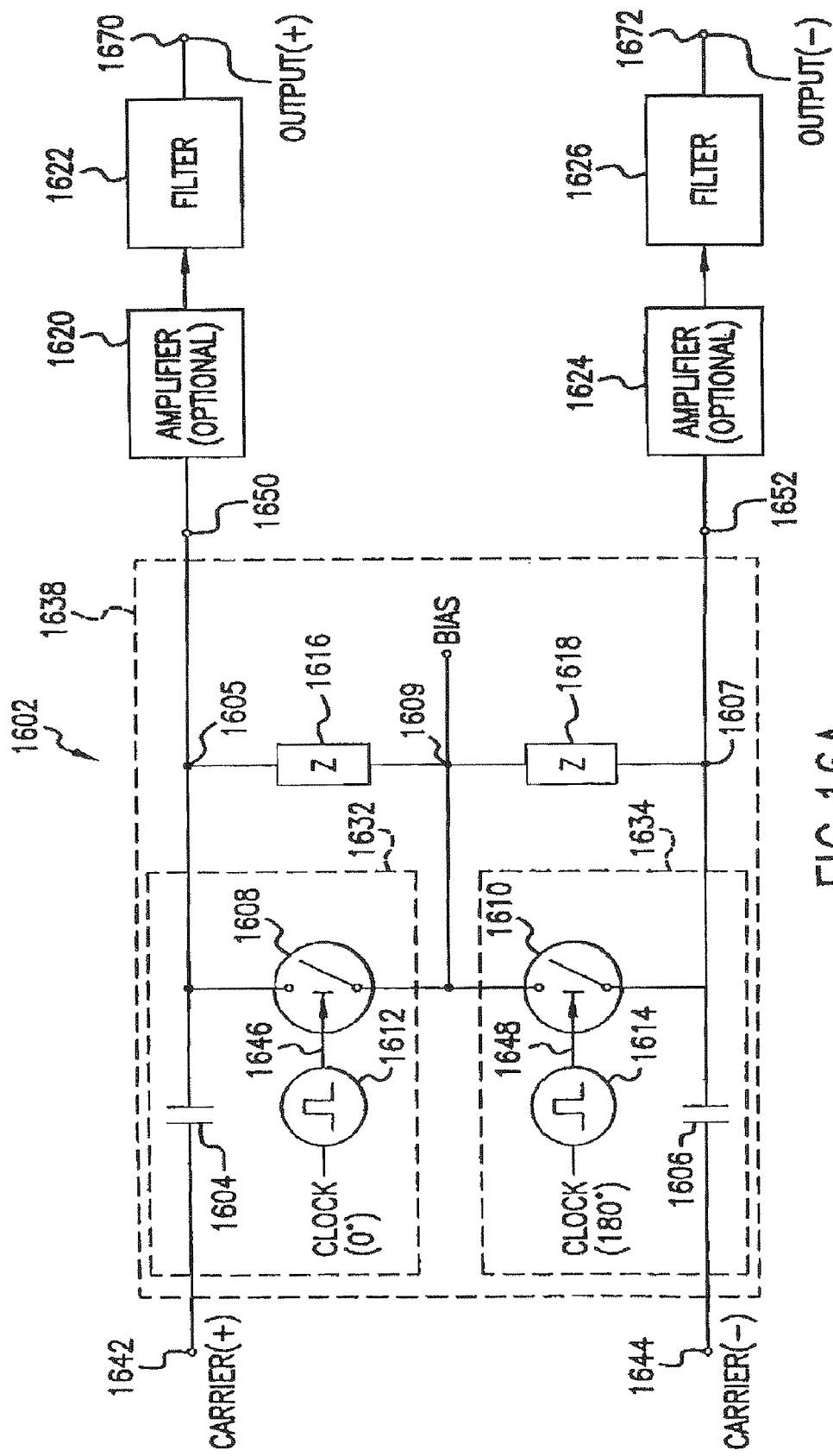
FIG. 16A is an example two-switch receiver according to an embodiment of the invention.

FIG. 16A illustrates an exemplary receiver 1602 having two aliasing modules 300 (or, as generally the case herein, having energy transfer modules 404) according to an embodiment of the present invention. Receiver 1602 comprises an UFD module 1638, a first optional amplifier 1620, a first low-pass filter 1622, a second optional amplifier 1624, and a second low-pass filter 1626.

As illustrated in FIG. 16A, UFD module 1638 comprises two aliasing modules 1632 and 1634 and two impedances 1616 and 1618. Aliasing modules 1632 and 1634 are similar to the aliasing module shown in FIG. 3G, whose operation is described herein. The output of aliasing module 1632 is coupled to impedance 1616 at a node 1605. The output of aliasing module 1634 is coupled to impedance 1618 at a node 1607. In an embodiment, impedances 1616 and 1618 are resistors. Impedances 1616 and 1618 are coupled together at a node 1609. A bias voltage is applied to node 1609.

Impedances 1616 and 1618 are illustrative, and not intended to limit the invention. In some embodiments, impedances 1616 and 1618 are a part of optional amplifiers 1620 and 1624, and thus there are no separate impedance devices 1616 and 1618 (see FIG. 16O). Similarly, in some embodiments, optional amplifiers 1620 and 1624 act as filters to the carrier signal riding on top of the down-converted signals 1650 and 1652, and thus there is no need to include filters 1622 and 1626 (see FIG. 16O), as would be understood by a person skilled in the relevant arts given the description of the invention herein.

Aliasing module 1632 comprises a capacitor 1604 and a switching device 1608 controlled by an aperture generator 1612. One end of switching device 1608 is connected to node 1609, as shown in FIG. 16A.

Figure 16B:
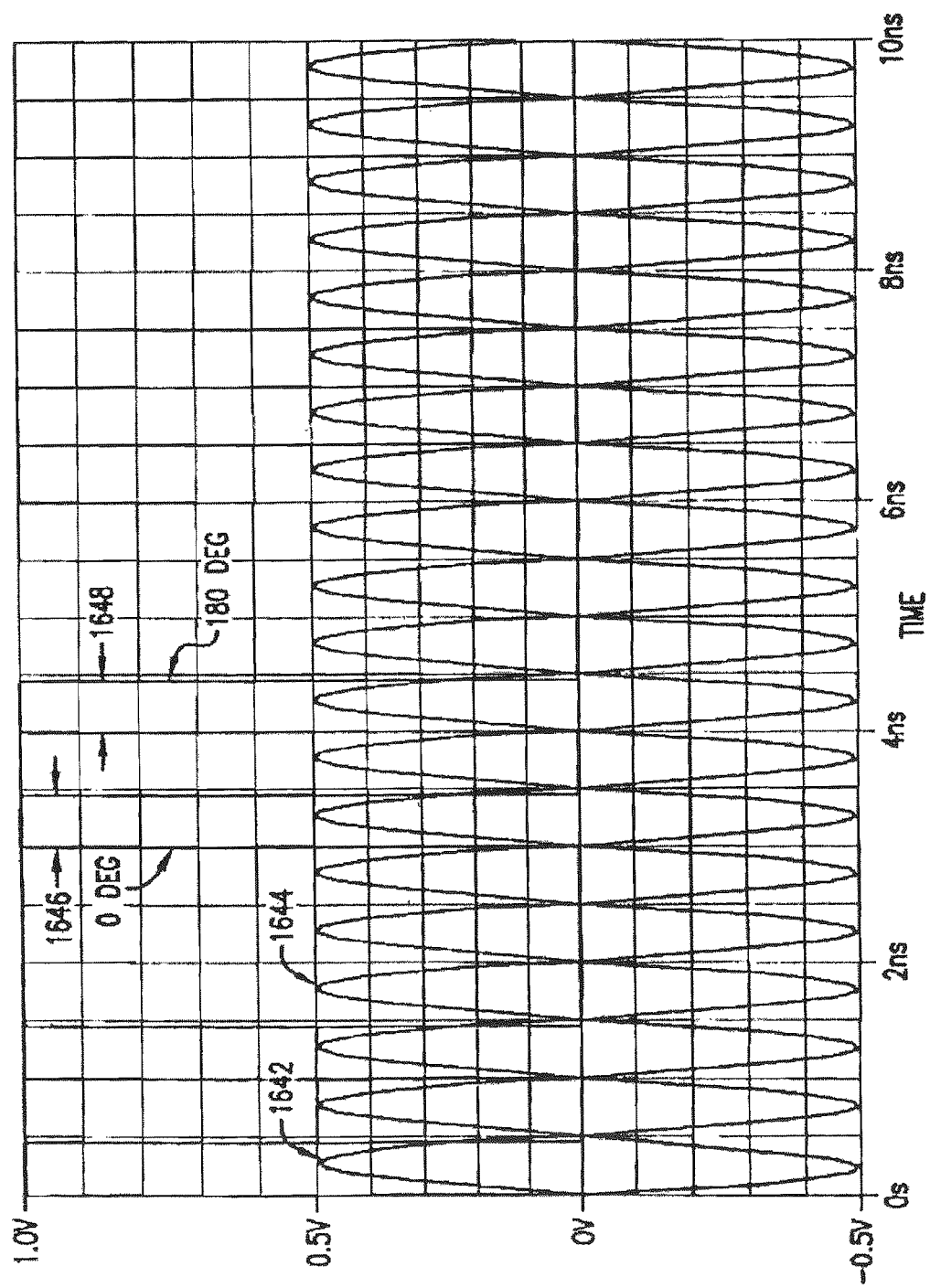
Figure 35:
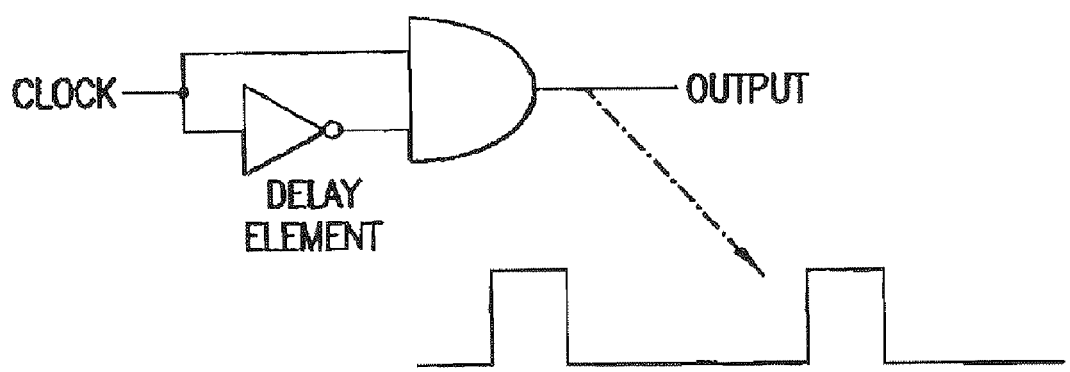
FIG. 35 is an example digital aperture generator circuit according to an embodiment of the invention.

FIG. 35 illustrates one embodiment for aperture generator 1612. In an embodiment, an input signal 1642 is provided to the input of aliasing module 1632. Input signal 1642 and an example control signal 1646 are illustrated in FIG. 16B.

An output signal 1650 of aliasing module 1632, for input signal 1642, is illustrated in FIG. 16C. In FIG. 16C, slope 1651 represents a down-converted signal. Slope 1654 represents the rate of discharge of capacitor 1604 between apertures. In some embodiments of the invention, low-pass filter 1622 is used to remove the carrier signal from the down-converted signal. Similarly, in some embodiments optional amplifier 1620 removes the carrier signal from the down-converted signal.

Aliasing module 1634 comprises a capacitor 1606 and a switching device 1610 controlled by an aperture generator 1614. One end of switching device 1610 is connected to node 1609, as shown in FIG. 16A. FIG. 35 illustrates one embodiment for aperture generator 1612. An input signal 1644 is provided to the input of aliasing module 1634. Input signal 1644 is generated in some embodiments of the invention by inverting signal 1642. Input signal 1644 and an example control signal 1648 are illustrated in FIG. 16B. As shown in FIG. 16B, the apertures of signal 1648 do not overlap the apertures of signal 1646. Note that the apertures of signals 1646 and 1648 are illustrative. Other portions of input signals 1642 and 1644 could be sampled in accordance with the invention to form a down-converted signal, which would involve using apertures other than the apertures shown in FIG. 16B, as will be understood by a person skilled in the relevant arts given the description of the invention herein.

Figure 16D:
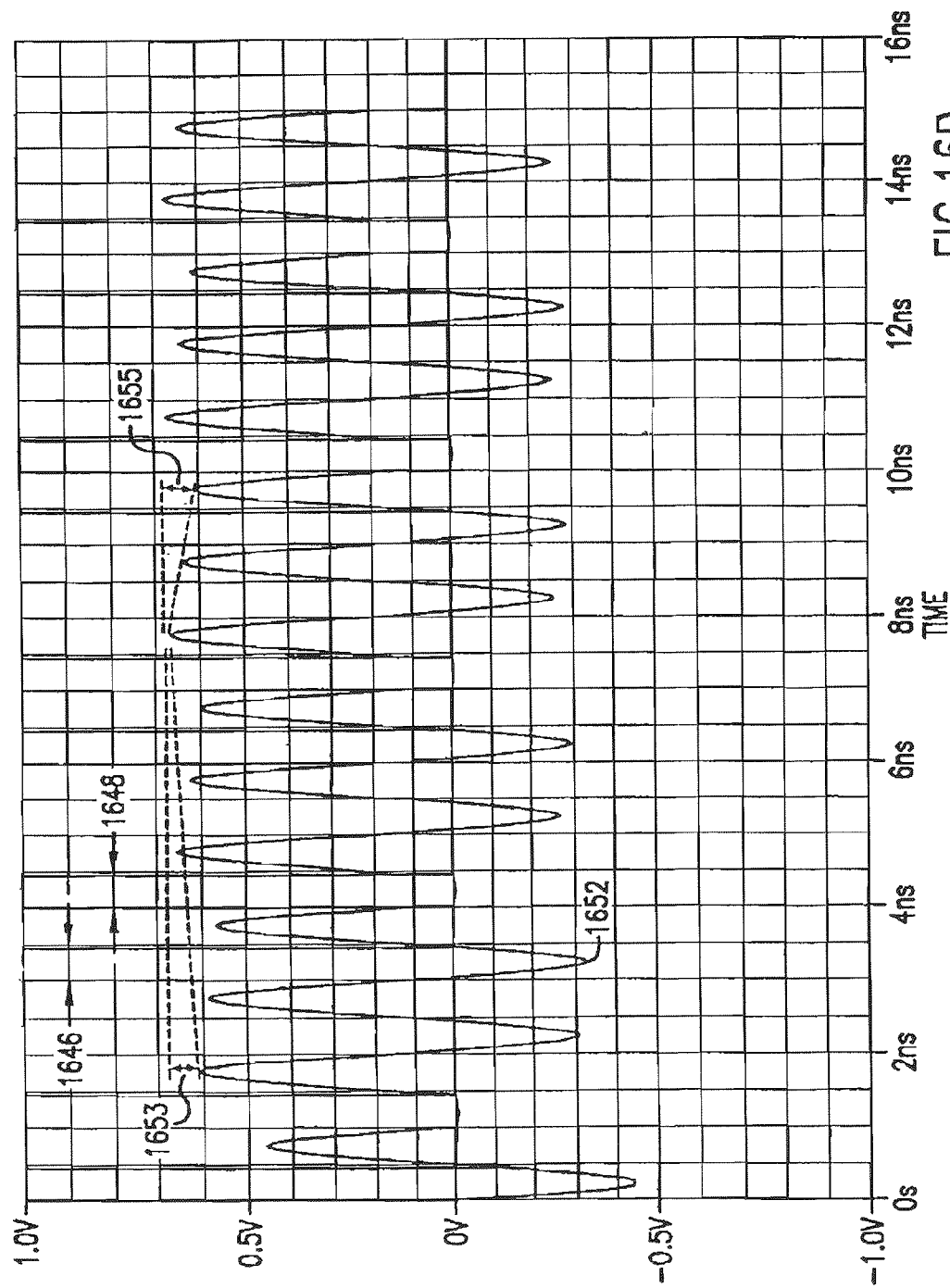

An output signal 1652 of aliasing module 1634, for input signal 1644, is illustrated in FIG. 16D. In FIG. 16D, slope 1653 represents the down-converted signal. Slope 1655 represents the rate of discharge of capacitor 1606 between apertures. As described above, in some embodiments, low-pass filter 1626 is used to remove the carrier signal from the down-converted signal. In some embodiments, optional amplifier 1642 removes the carrier signal.

Figure 16E:
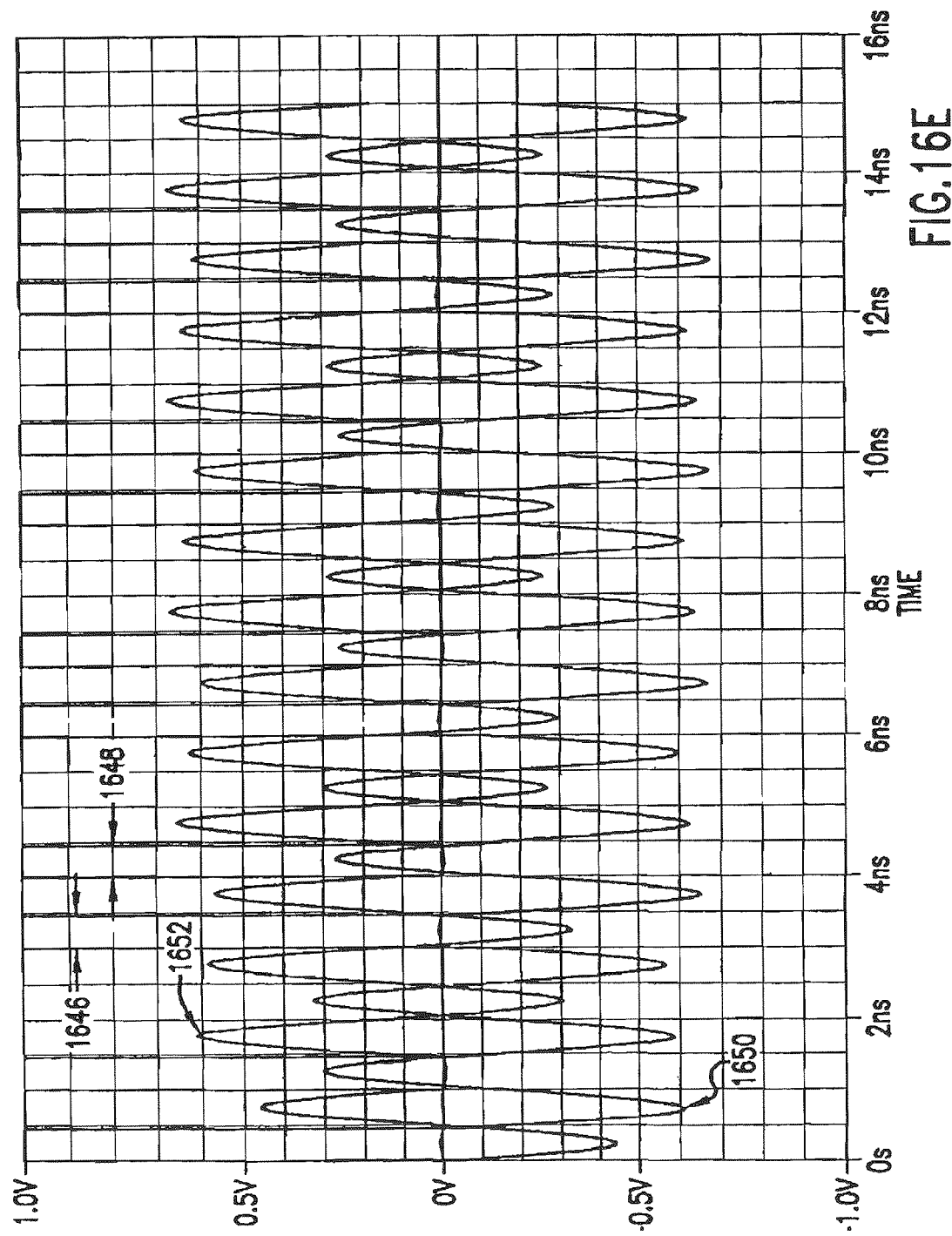
Figure 16F:
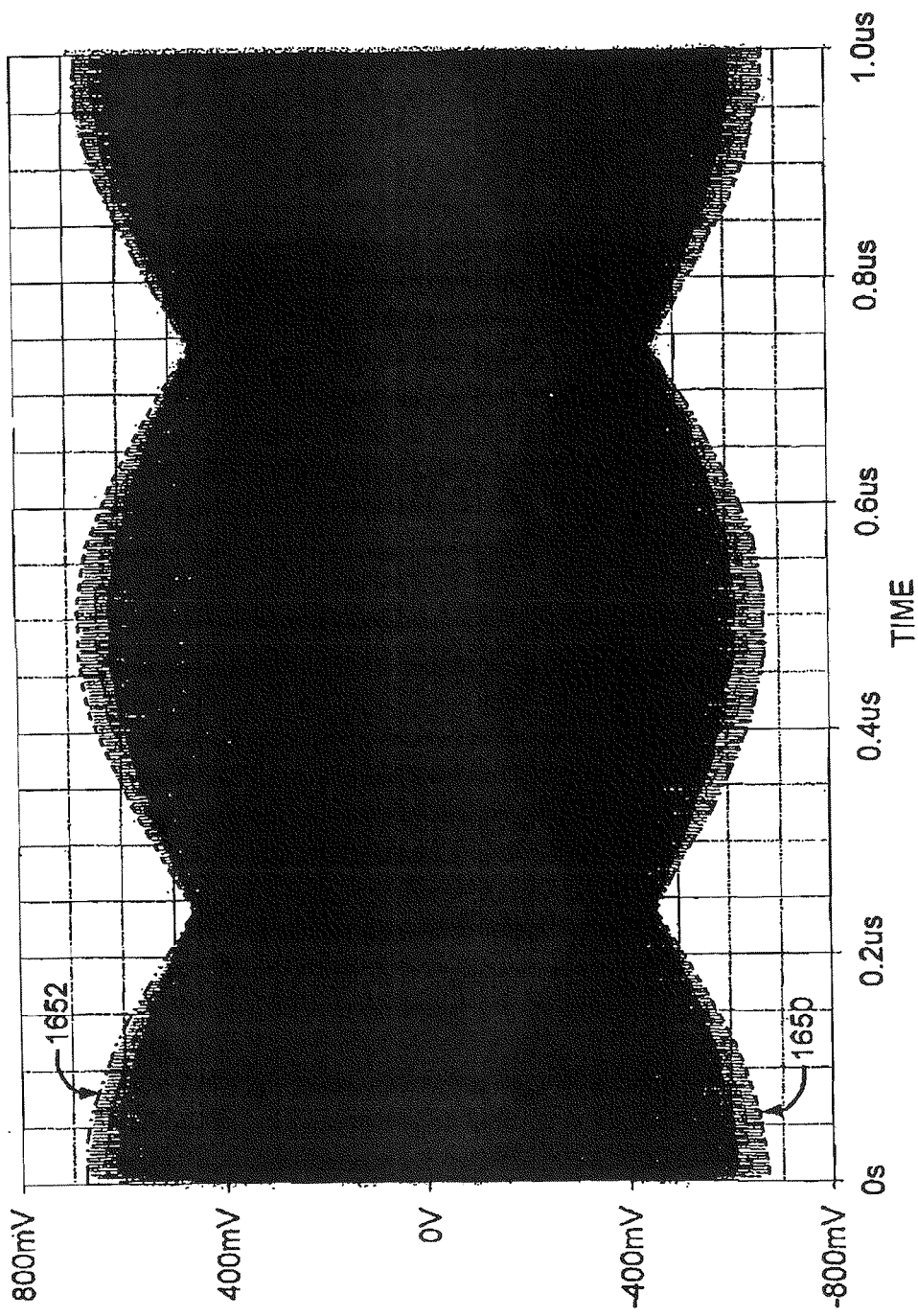
Figure 16G:
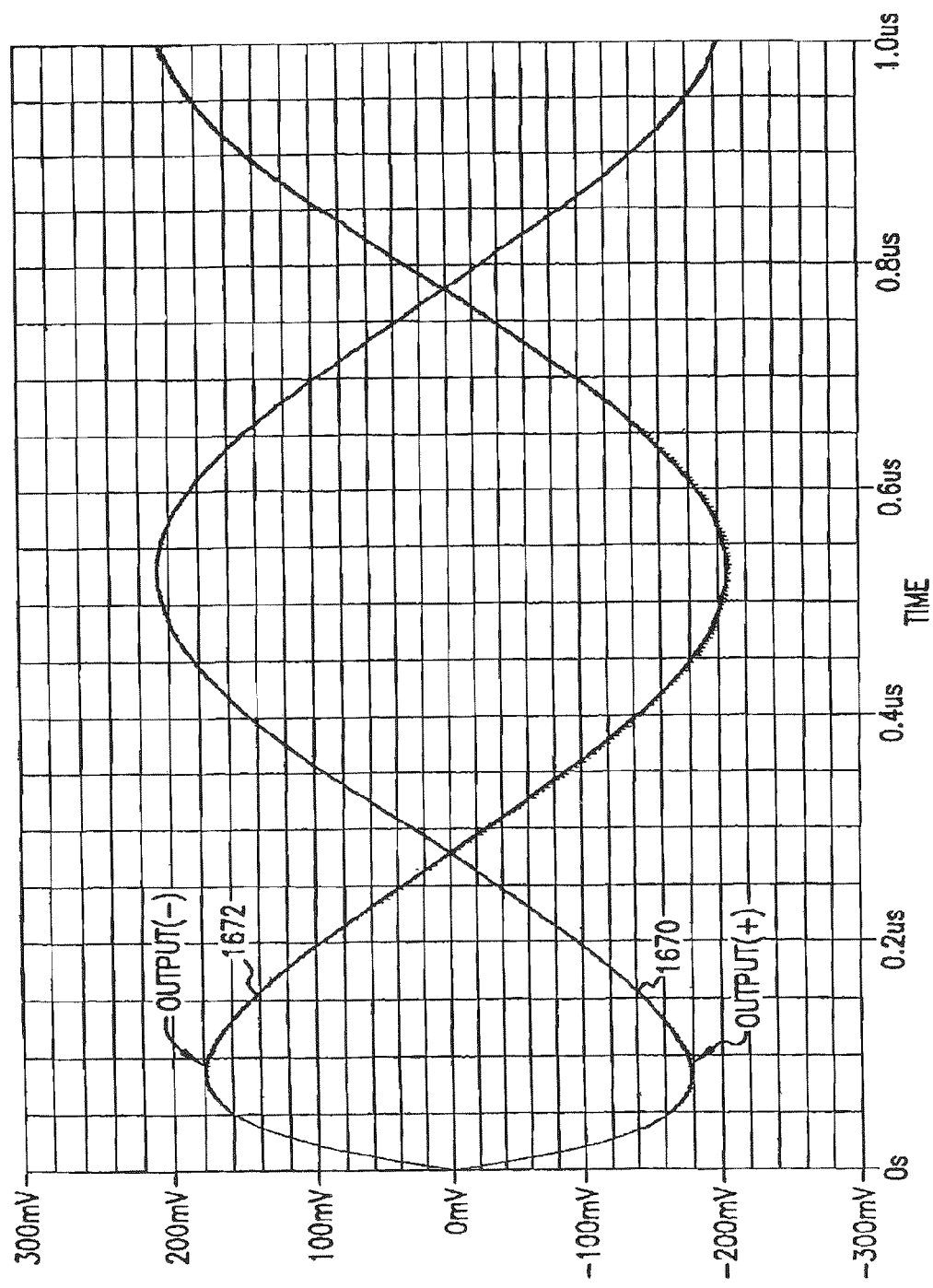

The output signal for UFD module 1638 (receiver 1602) is a differential output signal. FIGS. 16E and 16F illustrate an example differential output signal of UFD module 1638 (i.e., the sum of signals 1650 and 1652). An illustrative differential output signal for receiver 1602 is shown in FIG. 16G (i.e., the sum of signals 1670 and 1672). As illustrated by signals 1670 and 1672, embodiments of receiver 1602 can be used to receive and down-convert any communications signal. Carrier amplitude and phase changes relative to the sample aperture(s) are reflected in the output signals 1670 and 1672 as illustrated in FIG. 16G. FIG. 16G demonstrates the differential output when the input signal and aperture generator(s) are not related by an exact frequency multiple. As will be understood by a person skilled in the relevant arts, the sample aperture(s) roll over the input signal and capture different portions of the input signal. By illustrating that the aperture(s) can capture any amplitude and/or phase of an input signal, it is demonstrated that embodiments of receiver 1602 can be used to receive and down-convert any communications signal.

In an embodiment, the capacitors 1604 and 1606 are selected in accordance with the criteria described in section 4 below. In an embodiment, capacitors 1604 and 1606 are selected so that they discharge at a rate of between six percent to fifty percent between apertures of the control signals. However, different ranges apply to other embodiments, depending on the particular application, requirements, implementation, purpose, etc. The impedances 1616 and 1618 typically have similar values (e.g., impedances 1616 and 1618 may be resistors having the same nominal values but different actual values).

In an embodiment, the period of control signals 1646 and 1648 operate at a third or a fifth harmonic of the input carrier signal (i.e., input signals 1642 and 1644). In an embodiment, switching device 1608 is closed for approximately one-half cycle of the input signal 1642 each period of control signal 1646. Similarly, switching device 1610 is closed for approximately one-half cycle of the input signal 1644 each period of control signal 1648.

In an embodiment, aperture generator 1614 is coupled to a clock signal that is 180 degrees out of phase with respect to the clock signal coupled to aperture generator 1612. In an embodiment, the clock signal coupled to aperture generator 1614 has the same period as the clock signal coupled to aperture generator 1612.

The operation of receiver 1602 will now be described.

A modulated carrier signal 1642 is input to the carrier(+) port of receiver 1602. The modulated carrier signal causes a charge to be stored on capacitor 1604 when switching device 1608 is closed. Switching device 1608 is opened and closed by control signal 1646. Aperture generator 1612 generates control signal 1646.

The modulated carrier signal 1642 is inverted to generate a signal 1644. Signal 1644 is input to the carrier(−) port of receiver 1602. Signal 1644 causes a charge to be stored on capacitor 1606 when switching device 1610 is closed. Switching device 1610 is opened and closed by control signal 1648. Aperture generator 1614 generates control signal 1648.

When switching device 1608 is open, capacitor 1604 discharges. This causes a voltage signal to be generated across impedance 1616. Similarly, when switching device 1610 is open, capacitor 1606 discharges. This causes a voltage signal to be generated across impedance 1618. The opening and closing of switching devices 1608 and 1610 in accordance with the invention causes a down-converted signal 1650 (one-half of the output of receiver 1602) to be formed across impedance 1616 and a down-converted signal 1652 (one-half of the output of receiver 1602) to be formed across impedance 1618. Signals 1650 and 1652 are 180 degrees out of phase. The total output of receiver 1602 is the differential output, or the sum of signals 1650 and 1652. Filters 1622 and 1626 are used to remove the carrier from the down-converted signal. As described herein, in embodiments, optional amplifiers 1620 and 1624 are band limited, and thus act as filters and remover the carrier.

As will be understood by a person skilled in the relevant arts, given the description of the invention herein, UFD module 1638 has several features that make it particularly well adapted for certain applications. It is a feature of UFD module 1638 that it has an impedance in a range of about 50-75 ohms for certain control signals. UFD module 1638 can thus be coupled to other circuit devices that comprise receiver 1602 without using an impedance matching circuit as described herein (although one could optionally be used). This feature of UFD module 1638 allows for a high power or energy transfer, and it minimizes or eliminates interfacing requirements. Another feature of UFD module 1638 is that it may be implemented on a single chip using CMOS technology. This feature of UFD module 1638 is a feature applicable to apparatus embodiments of the invention in general.

Figure 16H:
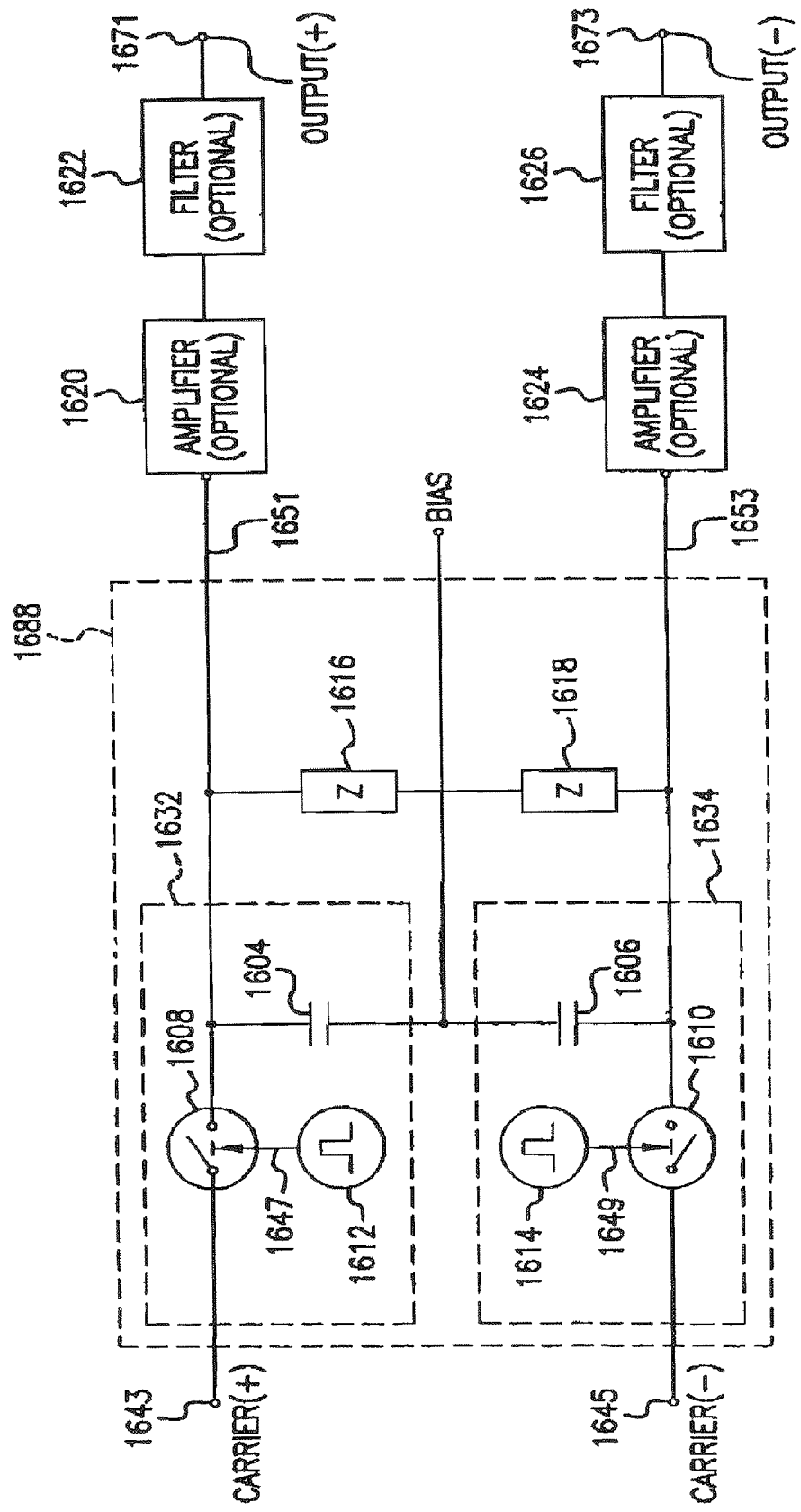
FIG. 16H is an example two-switch receiver according to an embodiment of the invention.
Figure 161:
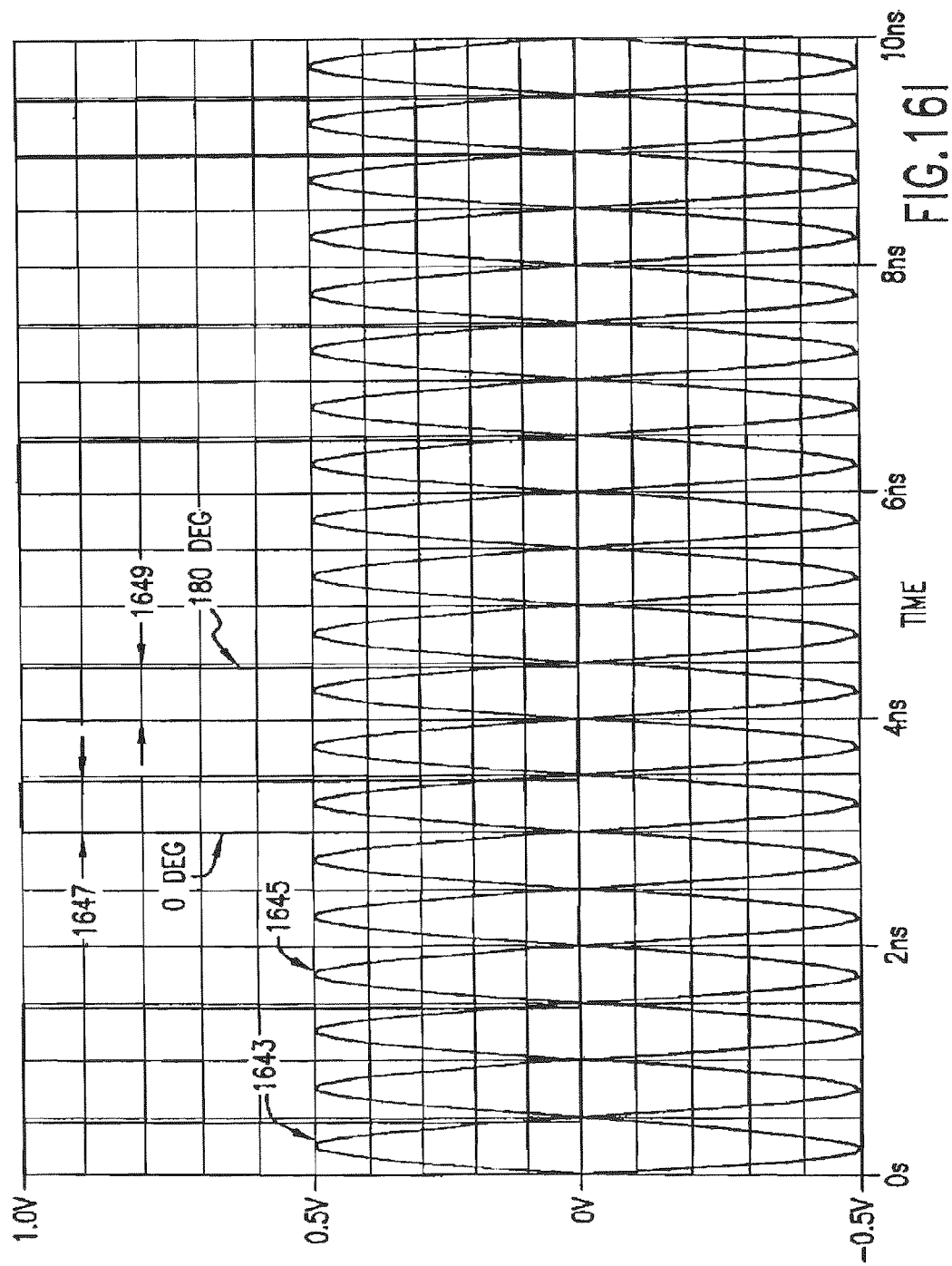

FIG. 16H illustrates another embodiment of a UFD module 1688 according to the invention. In the embodiment of FIG. 16H, aliasing modules of the type shown in FIG. 3A are used. This embodiment of the invention operates similarly to UFD module 1638, except that the carrier signal is removed from the down converted signal by capacitors 1604 and 1606 during down-conversion.

FIG. 16I illustrates one possible relationship between example input signals 1643 and 1645 and example control signals 1647 and 1649. As described about, the apertures of signals 1647 and 1649 are illustrative. Other portions of input signals 1643 and 1644 could be sampled in accordance with the invention to form a down-converted signal, which would involve using apertures other than the apertures shown in FIG. 16I, as will be understood by a person skilled in the relevant arts given the description of the invention herein.

Figure 16J:
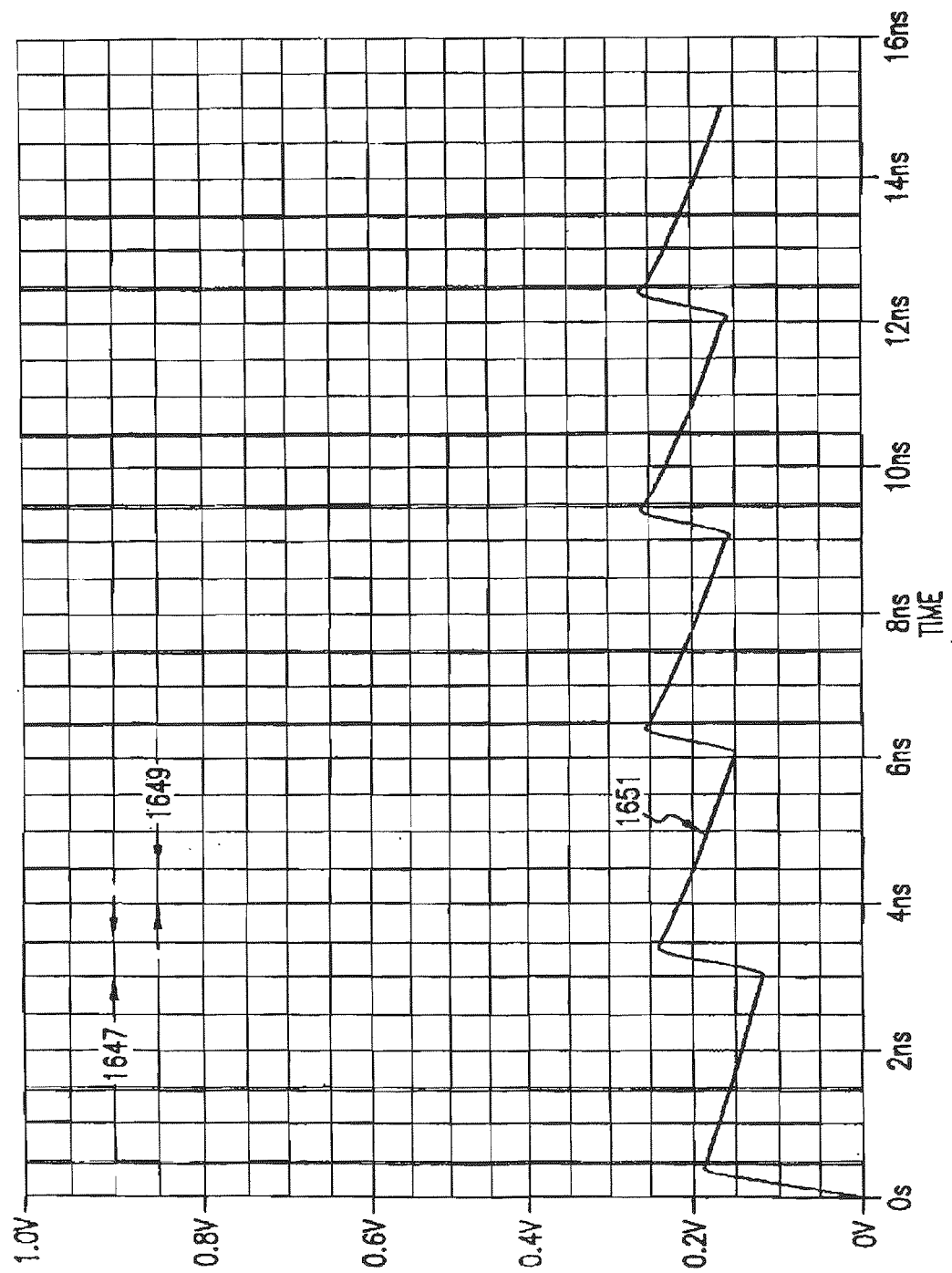
Figure 16K:
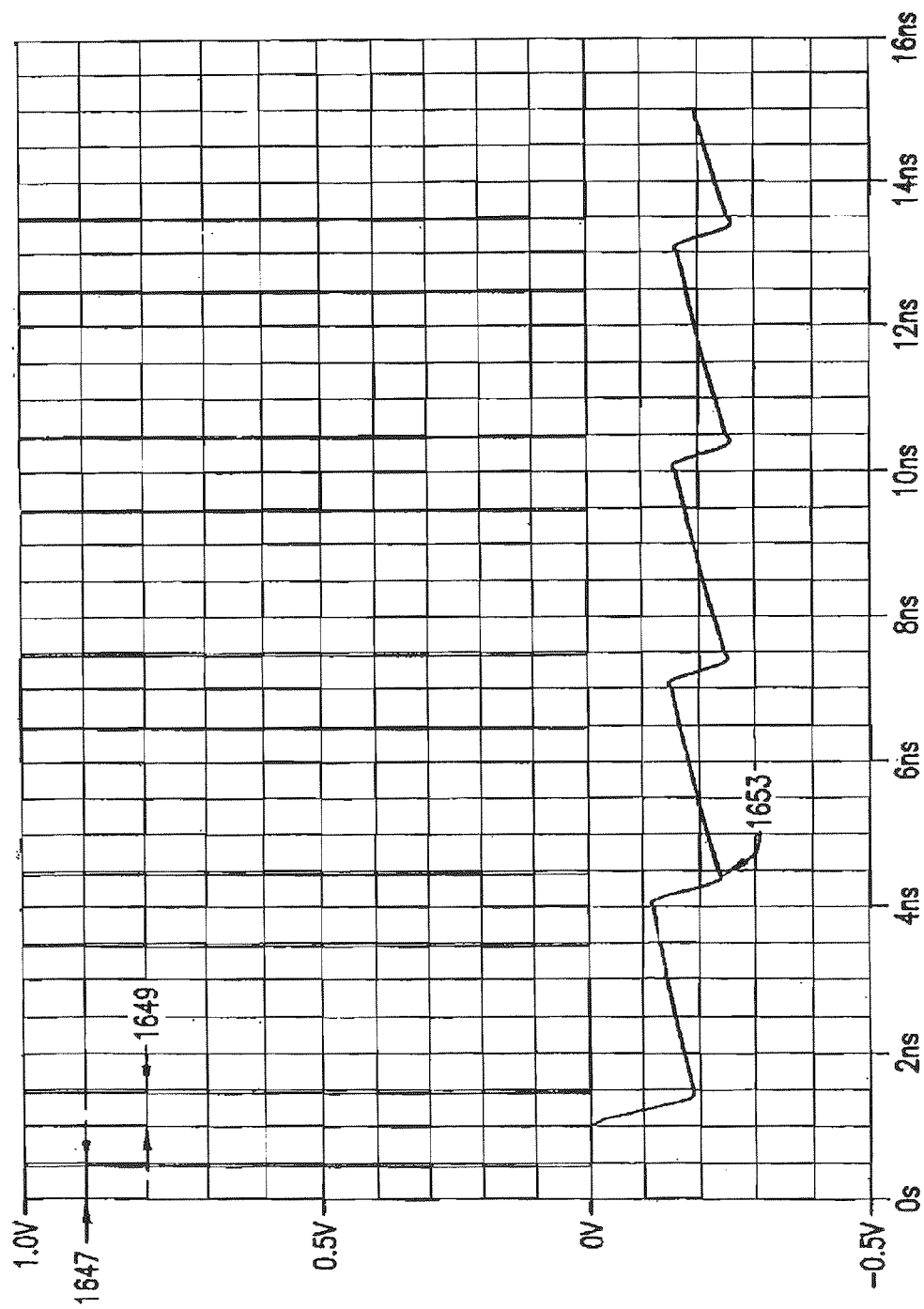
Figure 16L:
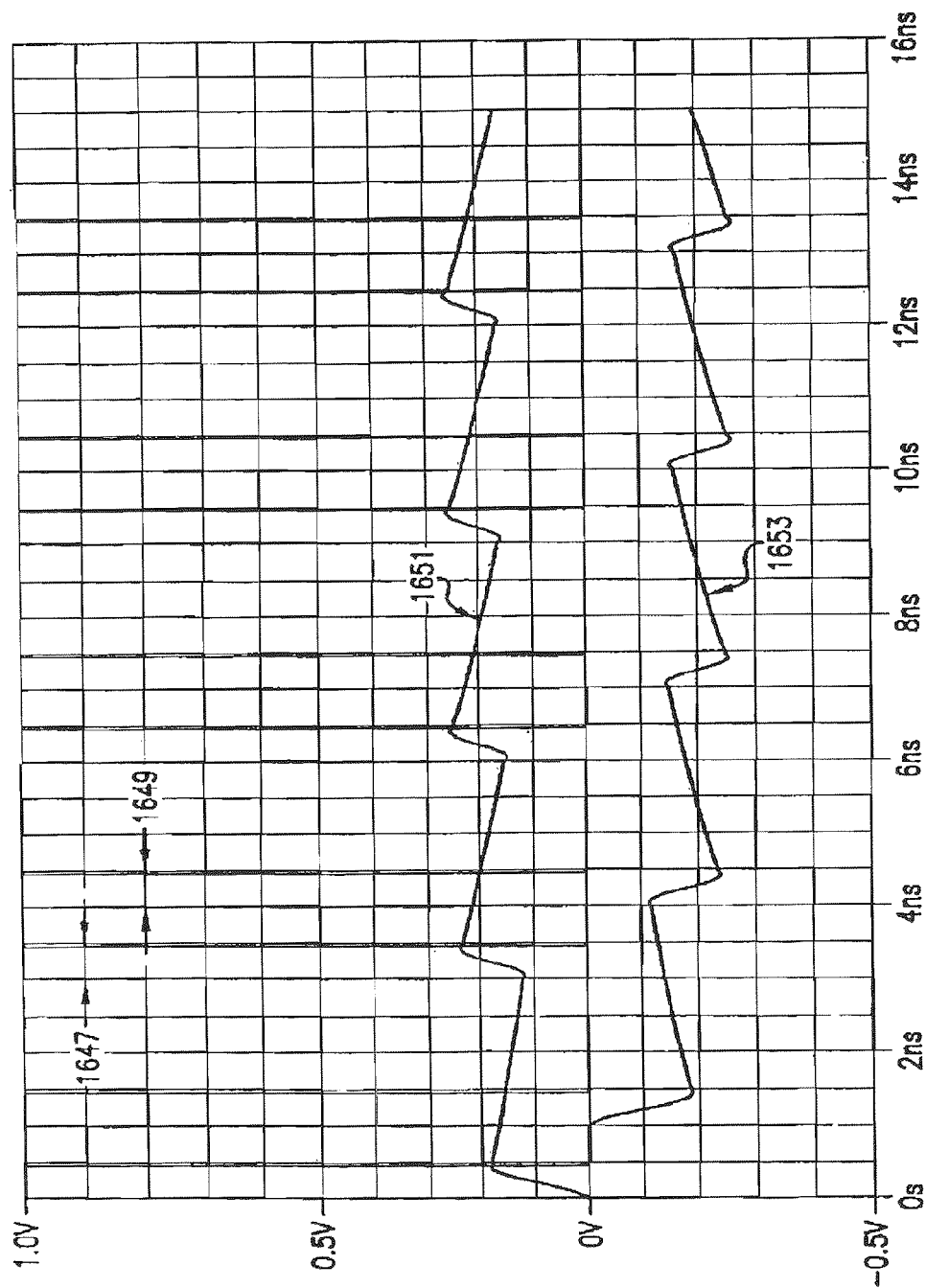

FIGS. 16J-16L illustrate down-converted signals for the receiver of FIG. 16H. FIG. 16J illustrates a down-converted signal 1651, for input signal 1643. As can be seen in FIG. 16J, down-converted signal 1651 is similar to down-converted signal 1652 (note that the carrier has not been removed from signal 1652 and is riding on top of the down-converted signal). Similarly, FIG. 16K illustrates a down-converted signal 1653, for input signal 1645. As can be seen in FIG. 16K, down-converted signal 1653 is similar to down-converted signal 1651 (note that the carrier has not been removed from signal 1651 and is riding on top of the down-converted signal). Signals 1651 and 1653 are plotted together with control signals 1647 and 1649 in FIG. 16L.

Figure 16M:
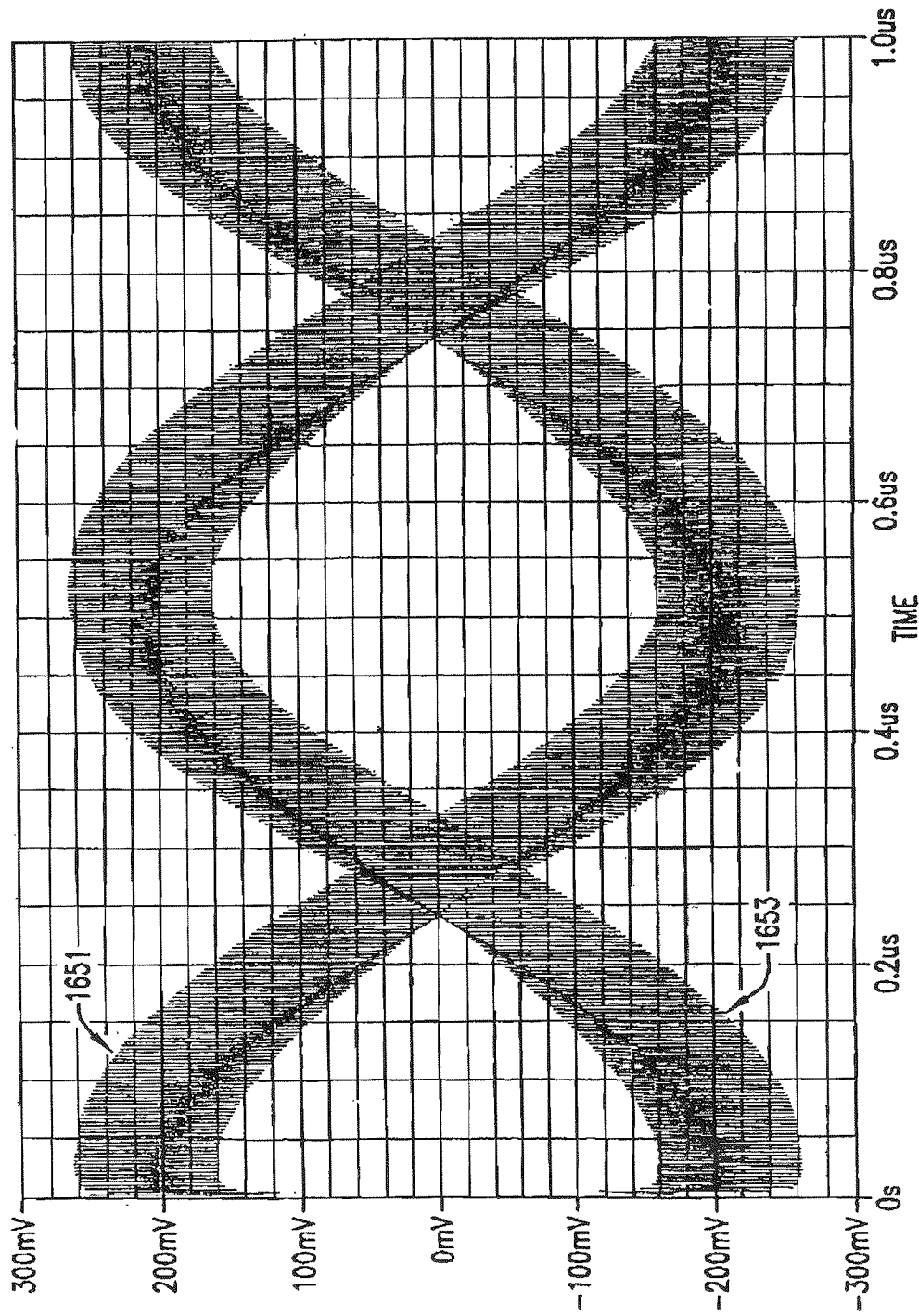

FIG. 16M illustrates the outputs of the UFD module 1688 in FIG. 16H. FIG. 16M is similar to FIG. 16F. One significant difference, however, as can be seen between FIGS. 16M and 16F, however, is that signals 1651 and 1653 do not go to zero during each period of the control signals 1647 and 1649. This is not the case for the UFD module 1638 in FIG. 16A, as can be see by looking at signals 1650 and 1652. When the switching devices 1608 and 1610, as configured in FIG. 16H, are closed, the output of UFD module 1688 is not connected to a bias point (AC ground).

Figure 16N:
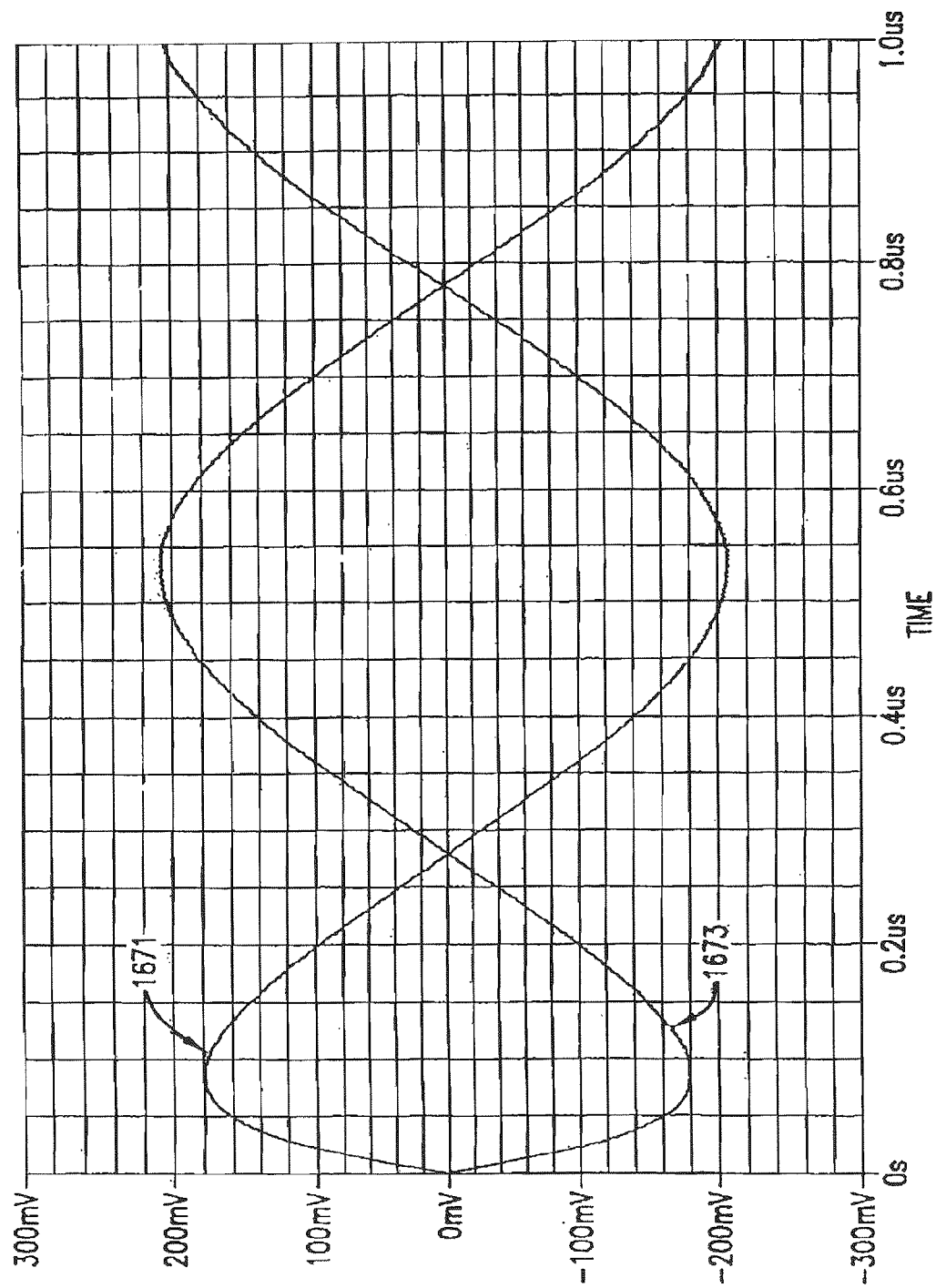
Figure 160:
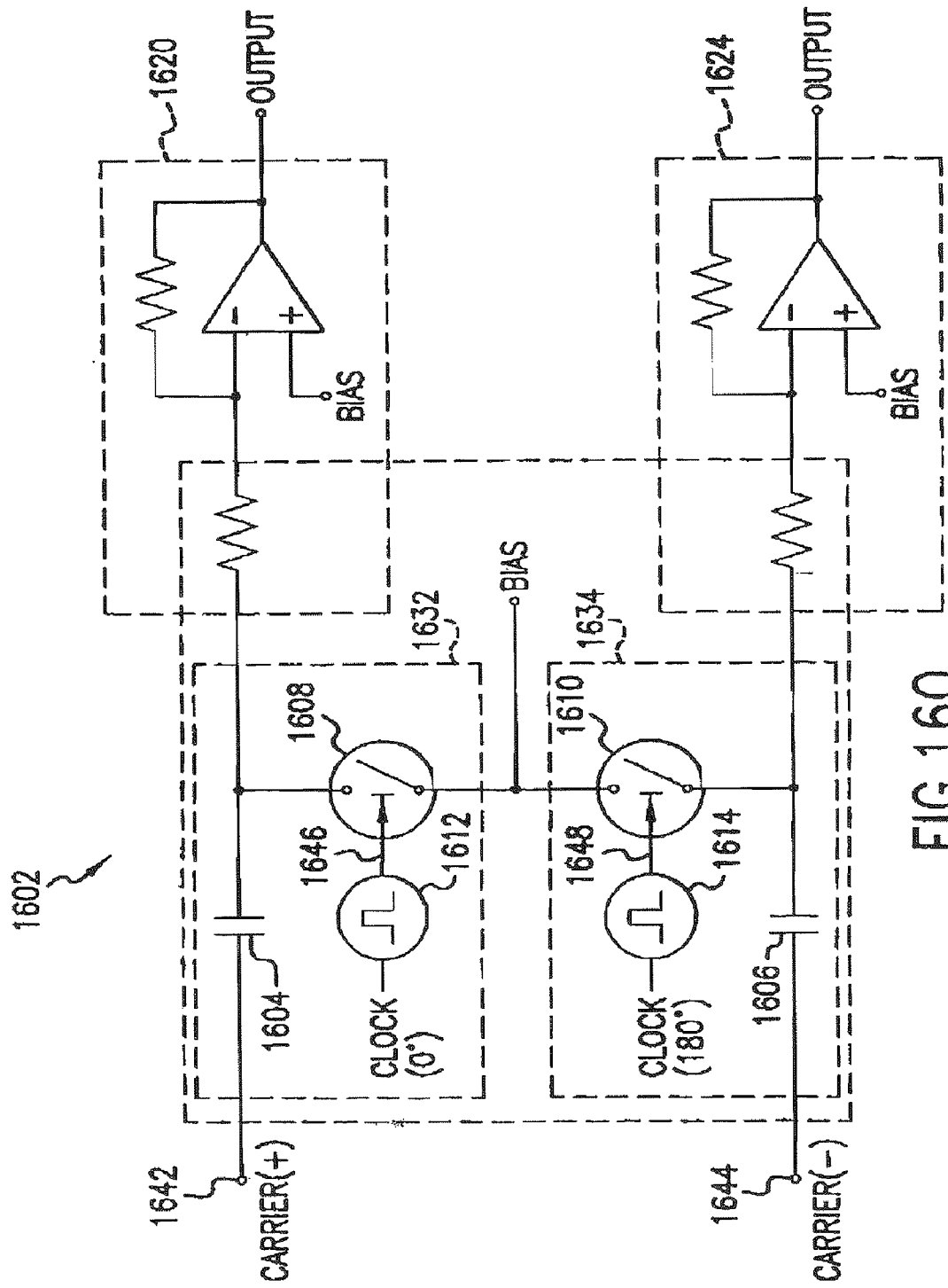

FIG. 16N illustrates the filtered output of the receiver of FIG. 16H. As can be seen by comparing FIGS. 16G and 16N, the filtered outputs of the receiver embodiments shown in FIGS. 16A and 16H are the same, thereby demonstrating the interchangeability of embodiments of aliasing modules and/or energy transfer modules according to the invention in embodiments of the invention.

As illustrated by signals 1671 and 1673, in FIG. 16N, embodiments of the receiver of FIG. 16H can be used to receive and down-convert any communications signal. Carrier amplitude and phase changes relative to the sample aperture(s) are reflected in the output signals 1671 and 1673 as illustrated in FIG. 16N. FIG. 16N demonstrates the differential output when the input signal and aperture generator(s) are not related by an exact frequency multiple. As will be understood by a person skilled in the relevant arts, the sample aperture(s) roll over the input signal and capture different portions of the input signal. By illustrating that the aperture(s) can capture any amplitude and/or phase of an input signal, it is demonstrated that embodiments of the receiver of FIG. 16H can be used to receive and down-convert any communications signal.

The operation of the receiver of FIG. 16H is similar to that of receiver 1602, and thus is not repeated here. A person skilled in the relevant art will understand how the receiver of FIG. 16H operates given the description of the invention herein.

Figure 17:
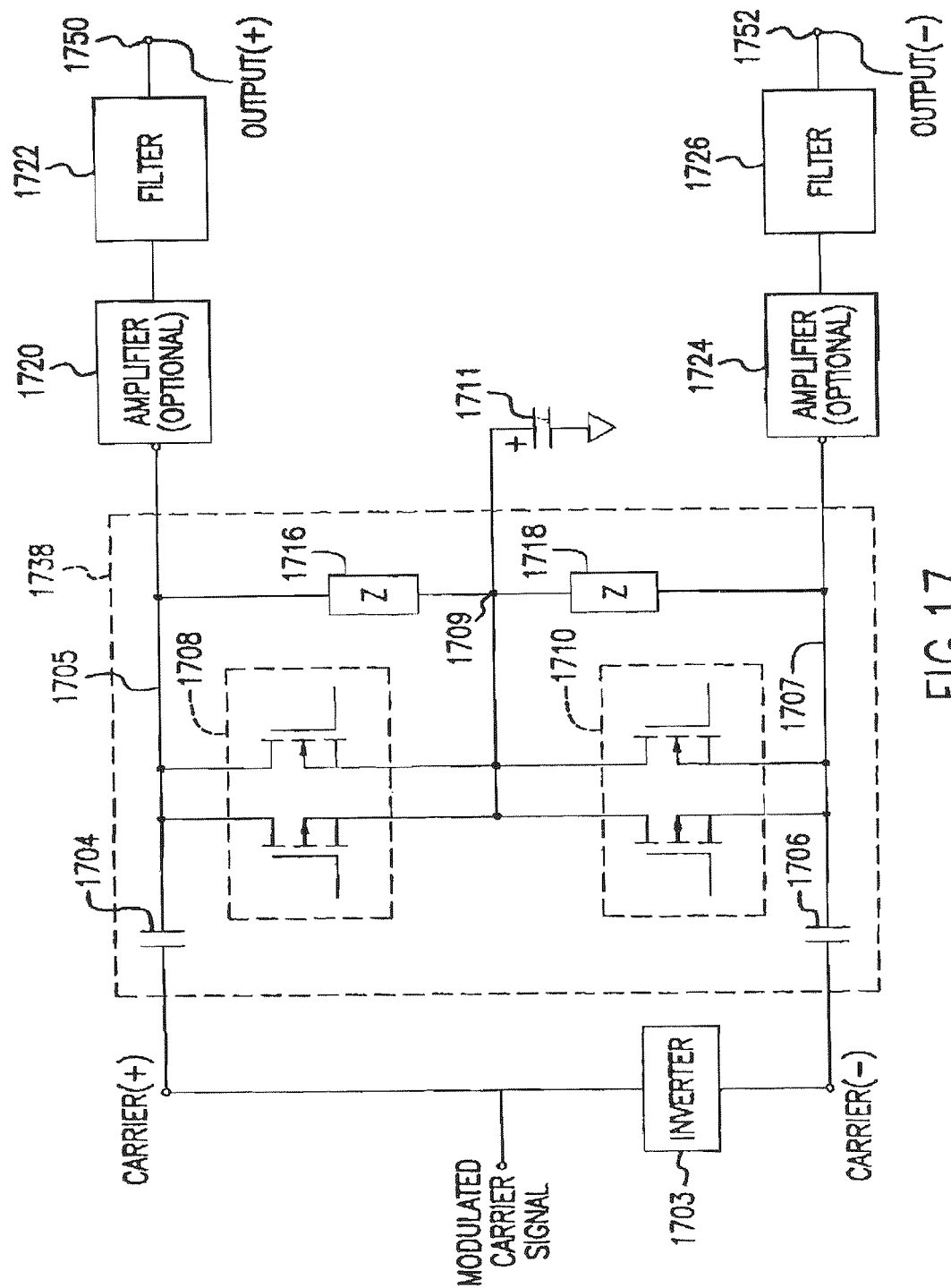
FIG. 17 is an example two-switch receiver according to an embodiment of the invention.

FIG. 17 illustrates a receiver 1702 according to an embodiment of the invention having two aliasing modules. Receiver 1702 is similar to receiver 1602. Like receiver 1602, example receiver 1702 is implemented using aliasing modules similar to the embodiment shown in FIG. 3G.

Receiver 1702 comprises a UFD 1738, an inverter 1703, two optional amplifiers 1720 and 1724, and two low-pass filters 1722 and 1726. The aliasing modules of UFD 1738 are implemented using switches 1708 and 1710. In the embodiment of FIG. 17, switches 1708 and 1710 are formed using complementary enhancement type MOSFETs. A bias voltage 1711 is coupled to a node 1709 of UFD 1738.

A modulated carrier signal is supplied to one of the input ports of UFD module 1738. An inverter 1703 is used to invert the modulated carrier signal and thereby produce a carrier(−) signal. An uninverted modulated carrier signal is referred to herein as a carrier(+) signal. The output of inverter 1703 is supplied to a second input port of UFD module 1738, as shown in FIG. 17.

As will be understood by a person skilled in the relevant arts, UFD module 1738 operates in a manner similar to that described herein, for example, for UFD module 1638. The various signals of receiver 1702 are similar to the signals illustrated in FIGS. 16B-G.

The operation of receiver 1702 is also similar to that of receiver 1602, and thus is not repeated here. A person skilled in the relevant art will understand how receiver 1702 operates given the description of the invention herein.

3.1.3 Enhanced Single-Switch Receiver Embodiments

As described herein, single-switch receiver embodiments of the present invention are enhanced to maximize both power transfer and information extraction. These embodiments are described herein for purposes of illustration, and not limitation. Alternate embodiments (including equivalents, extensions, variations, deviations, etc., of the embodiments described herein), will be apparent to persons skilled in the relevant art(s) based on the teachings contained herein. The invention is intended and adapted to include such alternate embodiments.

Figure 18A:
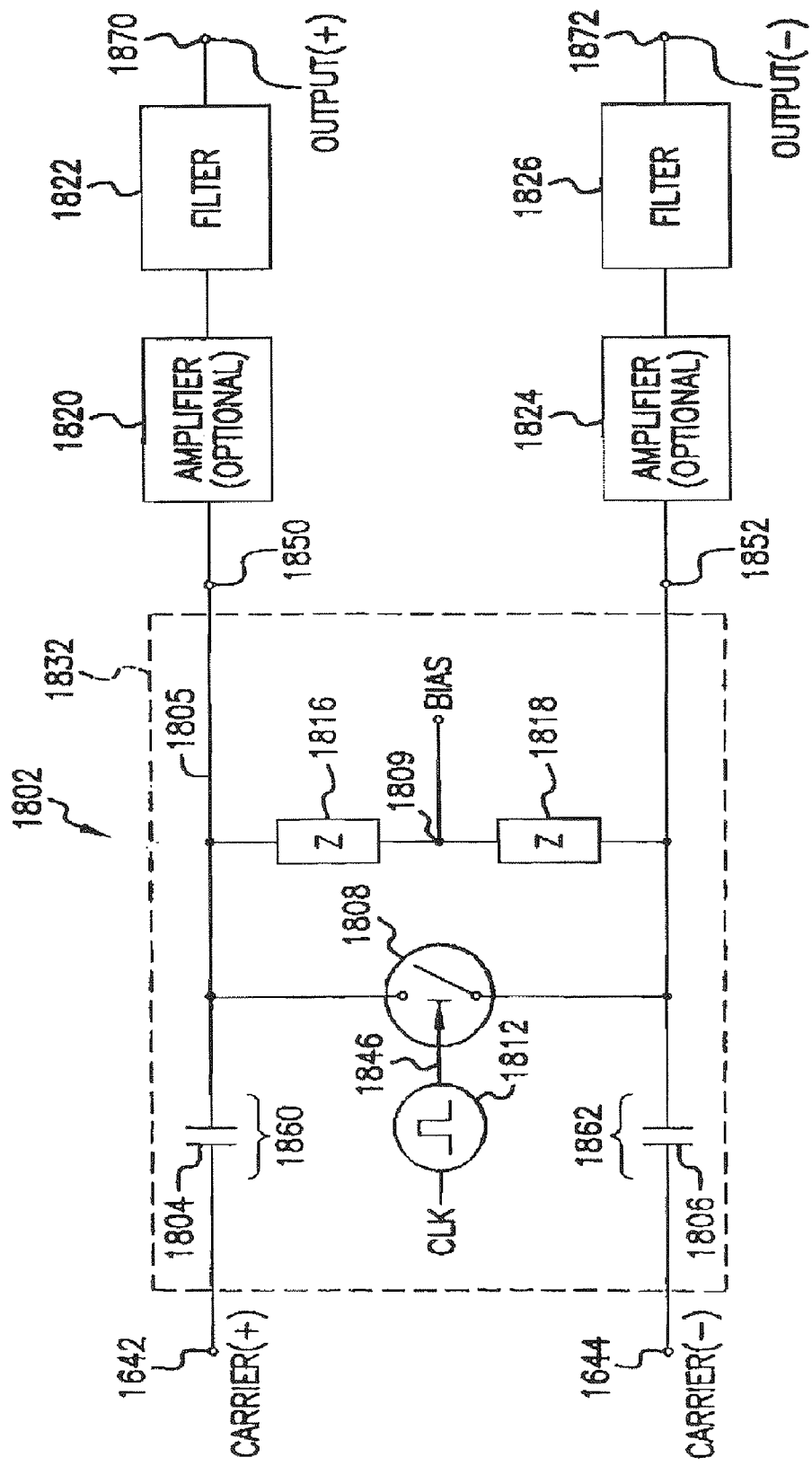
FIG. 18A is an example one-switch receiver according to an embodiment of the invention.

FIG. 18A illustrates an exemplary one-switch receiver 1802 according to an embodiment of the invention. Receiver 1802 comprises a UFD module 1832, a first optional amplifier 1820, a first low-pass filter 1822, a second optional amplifier 1824, and a second low-pass filter 1826.

As illustrated in FIG. 18A, UFD module 1832 comprises two capacitors 1804 and 1806, a switching device 1808, a switching signal generator 1812, and two impedance devices 1816 and 1818. In an embodiment, impedance devices 1816 and 1818 are resistors. Impedance devices 1816 and 1818 are coupled together at a node 1809. A bias voltage is applied to node 1809.

Impedances 1816 and 1818 are illustrative, and not intended to limit the invention. In some embodiment, impedances 1816 and 1818 are a part of optional amplifiers 1820 and 1824, and thus there are no separate impedance devices 1816 and 1818. Similarly, in some embodiments, optional amplifiers 1820 and 1824 act as filters to the carrier signal riding on top of the down-converted signals 1850 and 1852, and thus there is no need to include filters 1822 and 1826, as would be understood by a person skilled in the relevant arts given the description of the invention herein.

Figure 18B:
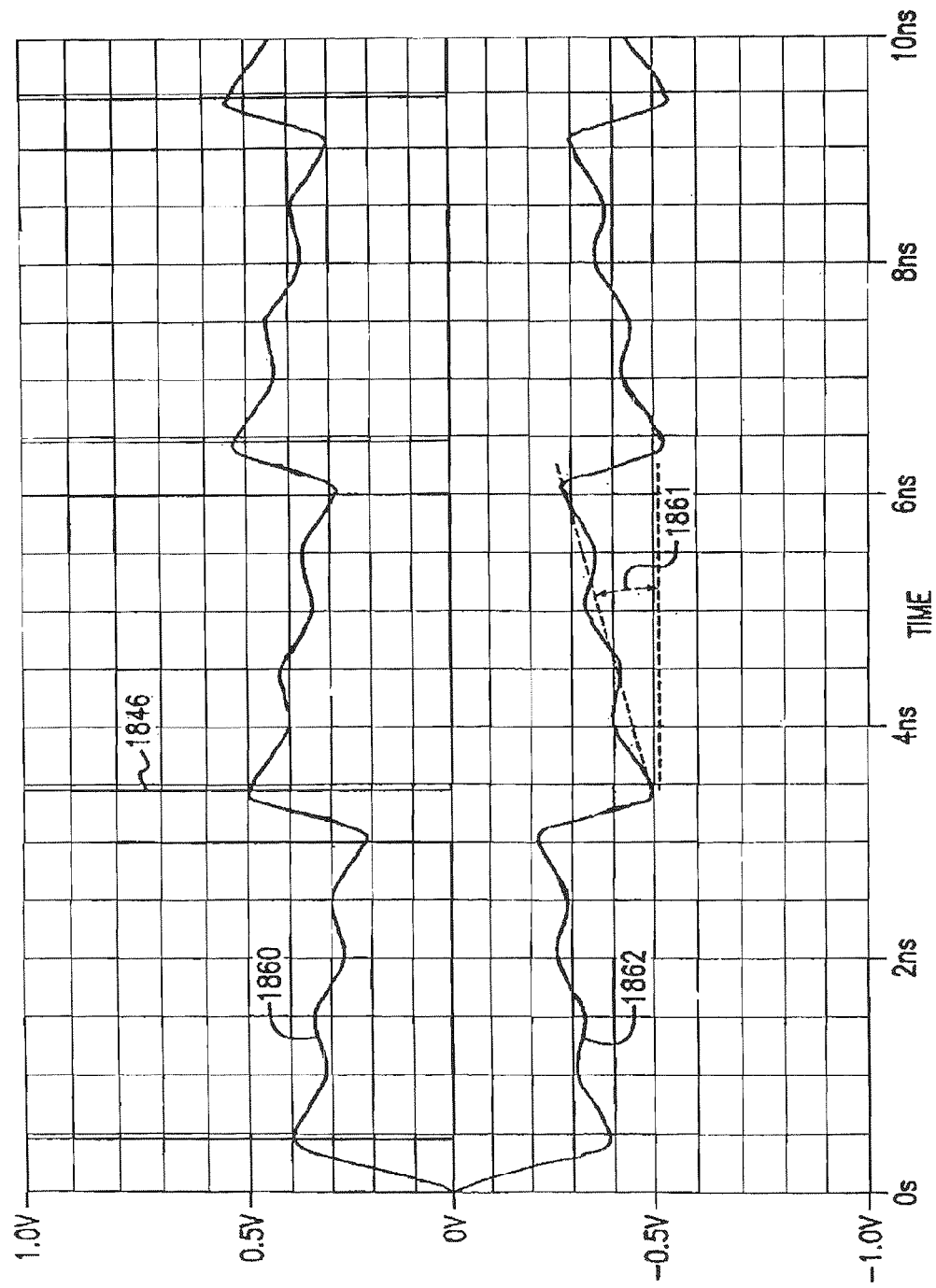

FIG. 35 illustrates one embodiment for switching device (aperture generator) 1812. An example control signal 1846 is illustrated in FIG. 18B.

FIGS. 18B-18E illustrate example waveforms for receiver 1802. The waveforms are for an embodiment of the invention wherein capacitors 1804 and 1806 have a nominal value of 11 pf and impedance devices 1816 and 1818 are resistors having a nominal value of 547 ohms. The waveforms illustrated are for a 1 GHz input carrier signal.

In an embodiment, the capacitors 1804 and 1806 are selected in accordance with the criteria described in section 4 below. Capacitors 1804 and 1806 are selected so that they discharge at a rate of between six percent to fifty percent between apertures of the switching (control) signal.

In an embodiment, the period of control signal 1846 operates at a third or a fifth harmonic of the input carrier signal (i.e., input signals 1842 and 1844). As described herein, the received carrier signal is referred to as a carrier(+) signal, and an inverted version of the received signal is referred to as a carrier(−) signal. Switching device 1808 is closed for approximately one-half cycle of the input signal 1842 each period of control signal 1846.

FIG. 18B illustrates a switching signal (aperture generator signal) 1846. Also shown in FIG. 18B is a voltage signal 1860 across capacitor 1804, and a voltage signal 1862 across capacitor 1806. The voltage across capacitors 1804 and 1806 increases when switch 1808 is closed. The voltage across capacitors 1804 and 1806 decreases when switch 1808 is open. Slope 1861 in FIG. 18B illustrates the discharge of capacitor 1806 between the apertures of switching (control) signal 1846. A similar discharge occurs for capacitor 1804, as can be seen from signal 1860.

Figure 18C:
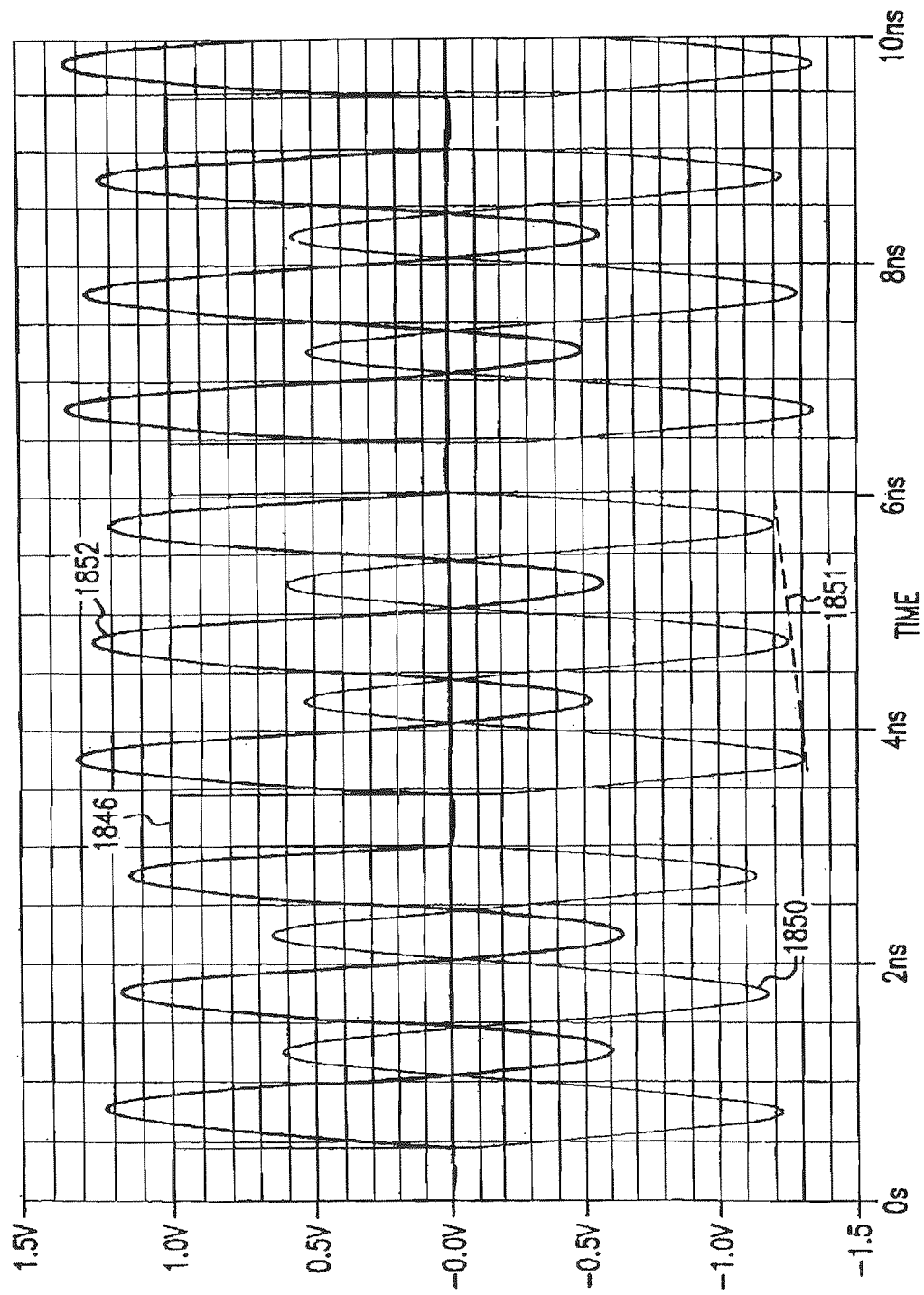

FIG. 18C illustrates the output(+) signal 1850 of UFD module 1832 and the output(−) signal 1852 of UFD module 1832. These signals contain both a down-converted (information) signal and the carrier signal. Switching signal 1842 is also shown as a point of reference. Slope 1851 in FIG. 18C is due to the discharge of capacitor 1804, and illustrates that energy is being transferred in accordance with the invention.

Figure 18D:
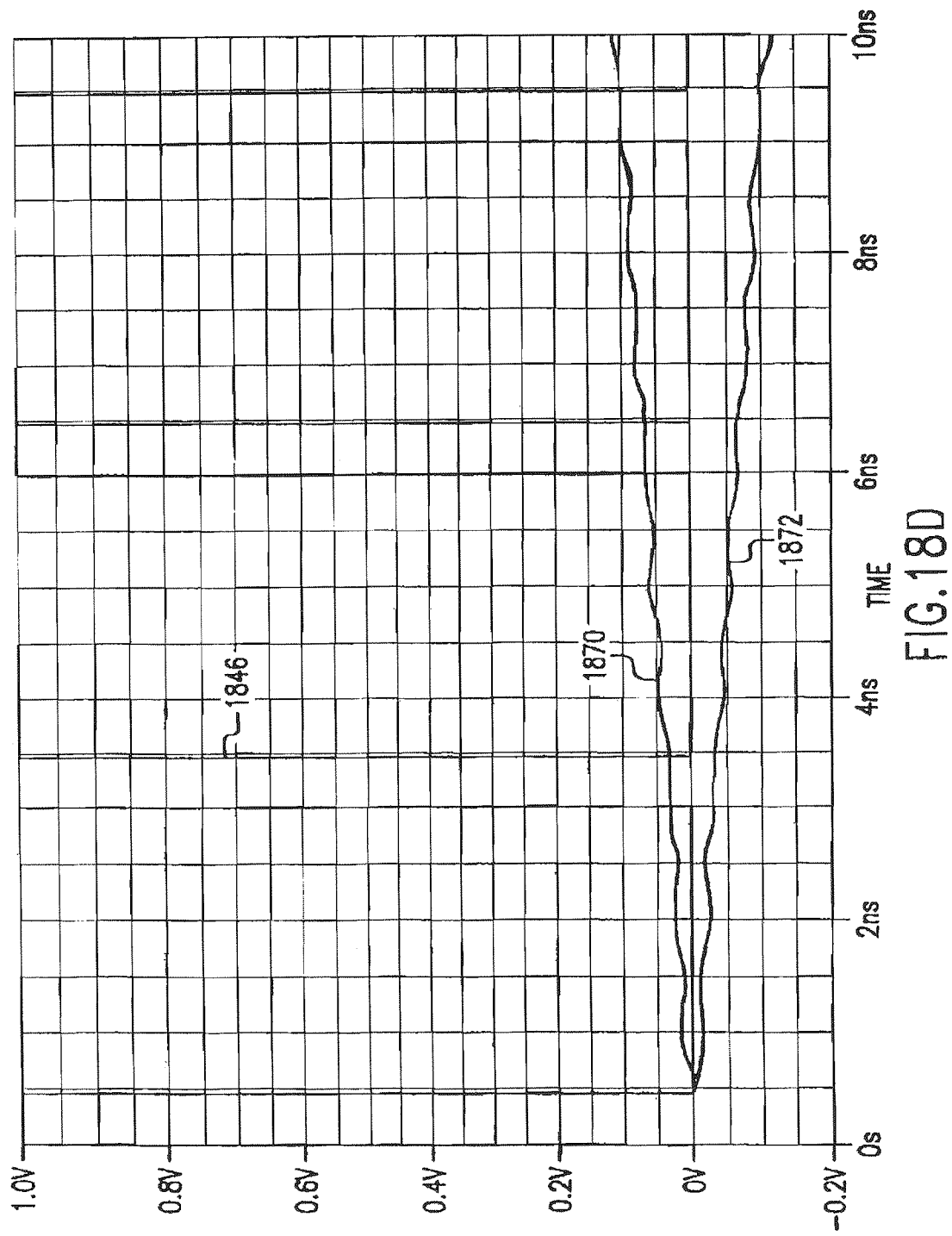

FIG. 18D illustrates the output signal of UFD module 1832 after the carrier signal has been removed using low-pass filters 1822 and 1826. Signal 1870 shows the output of filter 1822. Signal 1872 shows the output of filter 1826. Switching signal 1846 is shown in FIG. 18D for reference.

FIG. 18E shows the output of receiver 1802 for an extended period of time, as illustrated by switching signal 1846. In FIG. 18E, the input carrier signal has a frequency of 1 GHz, but the period of switching signal 1846 has been extended from 3.000 ns (as is the case for the waveforms of FIGS. 18B-D) to 3.003 ns. Thus, the phase of the input carrier signal is slowly varying relative to switching signal 1846. Signal 1870 in FIG. 18E is the output of filter 1822. Signal 1872 is the output of filter 1826.

As illustrated by signals 1870 and 1872, embodiments of receiver 1802 can be used to receive and down-convert any communications signal. Carrier amplitude and phase changes relative to the sample aperture(s) are reflected in the output signals 1870 and 1872 as illustrated in FIG. 18E. FIG. 18E demonstrates the differential output when the input signal and aperture generator are not related by an exact frequency multiple. As will be understood by a person skilled in the relevant arts, the sample aperture(s) roll over the input signal and capture different portions of the input signal. By illustrating that the aperture(s) can capture any amplitude and/or phase of an input signal, it is demonstrated that embodiments of receiver 1802 can be used to receive and down-convert any communications signal.

The operation of receiver 1802 will now be described.

A modulated carrier signal 1642 is input to the carrier(+) port of receiver 1802. The modulated carrier signal causes a charge to be stored on capacitor 1804 when switching device 1808 is closed, thereby generating a voltage signal 1860 across capacitor 1804. Switching device 1808 is opened and closed by control signal 1846. Aperture generator 1812 generates control signal 1846.

The modulated carrier signal 1642 is inverted to generate a signal 1644. Signal 1644 is input to the carrier(−) port of receiver 1802. Signal 1644 causes a charge to be stored on capacitor 1806 when switching device 1808 is closed, thereby generating a voltage signal 1862 across capacitor 1806.

When switching device 1808 is opened, both capacitor 1804 and capacitor 1806 begin to discharge. This causes a voltage signal 1850 to be generated across impedance 1816, and a voltage signal 1852 to be generated across impedance 1818.

The opening and closing of switching device 1808 in accordance with the invention causes a down-converted signal 1850 (one-half of the output of receiver 1802) to be formed across impedance 1816 and a down-converted signal 1852 (one-half of the output of receiver 1802) to be formed across impedance 1818. Signals 1850 and 1852 are 180 degrees out of phase. The total output of receiver 1802 is the differential output, or the sum of signals 1850 and 1852. Filters 1822 and 1826 are used to remove the carrier from the down-converted signal. In embodiments, optional amplifiers 1820 and 1824 are band limited, and thus act as filters and remover the carrier.

As will be understood by a person skilled in the relevant arts, given the description of the invention herein, UFD module 1832 has several features that make it particularly well adapted for certain applications. It is a feature of UFD module 1832 that it provides exceptional linearity per milliwatt. For example, rail to rail dynamic range is possible with minimal increase in power. In an example integrated circuit embodiment, UFD module 1832 provides +55 dmb IP2, +15 dbm IP3, at 3.3V, 4.4 ma, −15 dmb LO. GSM system requirements are +22 dbm IP2, −10.5 dmb IP3. CDMA system requirements are +50 dmb IP2, +10 dbm IP3. Accordingly, the invention satisfies these standards. Another feature of UFD module 1832 is that it only requires one switching device 1808 and one aperture generator 1812. A further feature of UFD module 1832 is that it may be implemented on a single chip using CMOS technology. As described herein, this feature of UFD module 1832 is a feature applicable to apparatus embodiments of the invention in general. Additional features of UFD module 1832 are described elsewhere herein.

Figure 19:
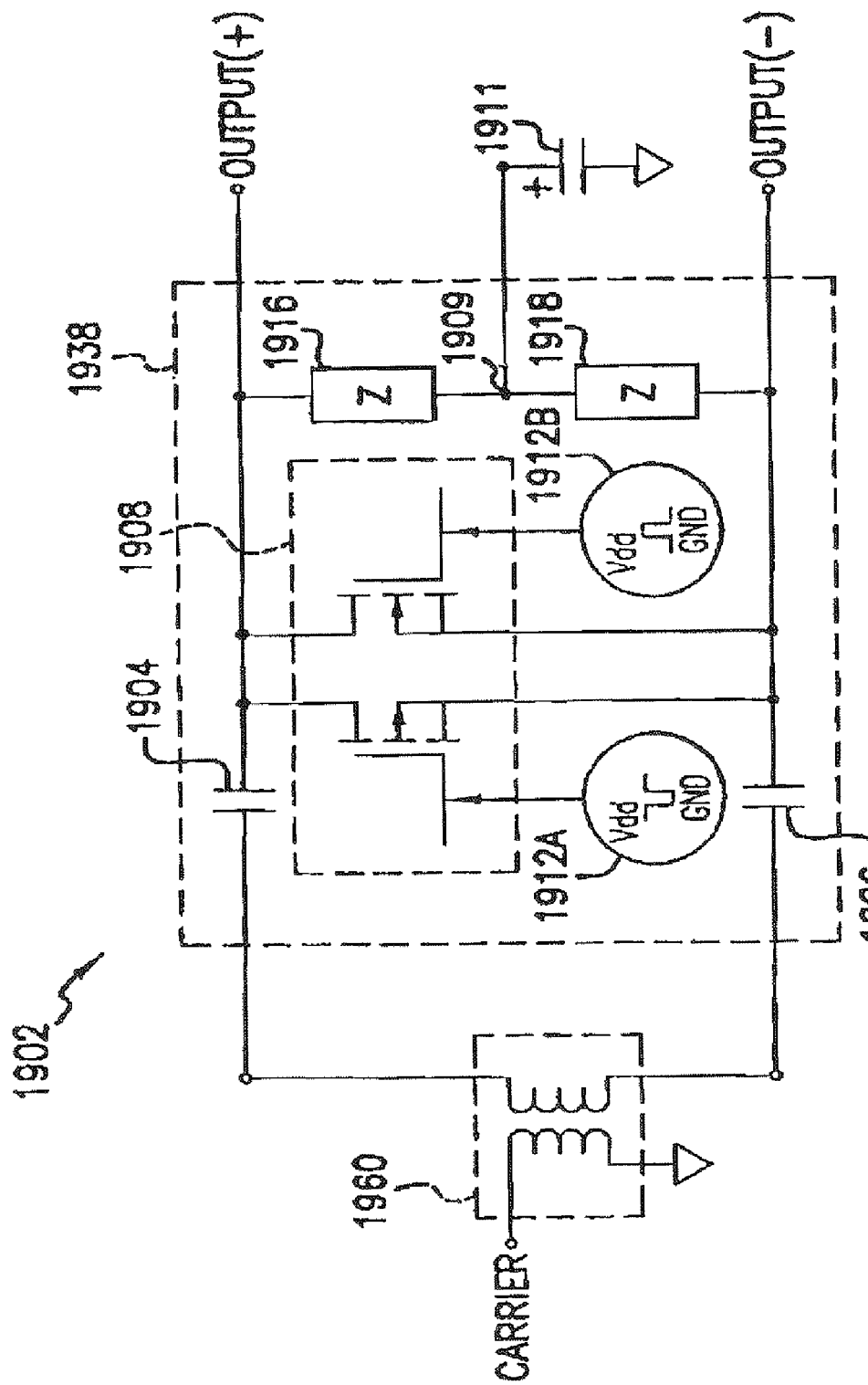
FIG. 19 is an example one-switch receiver according to an embodiment of the invention.

FIG. 19 is another example of a one-switch receiver 1902 having a UFD module 1938 according to an embodiment of the invention. As illustrated in FIG. 19, UFD module 1938 comprises two capacitors 1904 and 1906, a CMOS switching device 1908, two switching signal generators 1912A and 1912B, and two impedance devices 1916 and 1918. In an embodiment, impedance devices 1916 and 1918 are resistors. Impedance devices 1916 and 1918 are coupled together at a node 1909. A bias voltage 1911 (AC Ground) having a nominal value of one-half Vdd is applied to node 1909. As illustrated in FIG. 19, in an embodiment, a transformer 1960 is used to couple an input signal to UFD module 1938.

As already described herein, impedances 1916 and 1918 are illustrative, and not intended to limit the invention. In some embodiment, impedances 1916 and 1918 are a part of optional amplifiers (not shown), and thus there are no separate impedance devices 1916 and 1918. Similarly, in some embodiments, optional amplifiers (not shown) act as filters to the carrier signal riding on top of the down-converted signals, and thus there is no need to include filters with receiver 1902.

As will be understood by a person skilled in the relevant arts, UFD module 1938 operates in a manner similar to that described herein, for example, for UFD module 1832. Features of UFD module 1938 are also described below in section 4. In particular, the enhanced linear features of UFD module 1938 are described in detail below.

The operation of receiver 1902 is similar to that of receiver 1802, and thus is not repeated here. A person skilled in the relevant art will understand how receiver 1902 operates given the description of the invention herein.

Figure 20A:
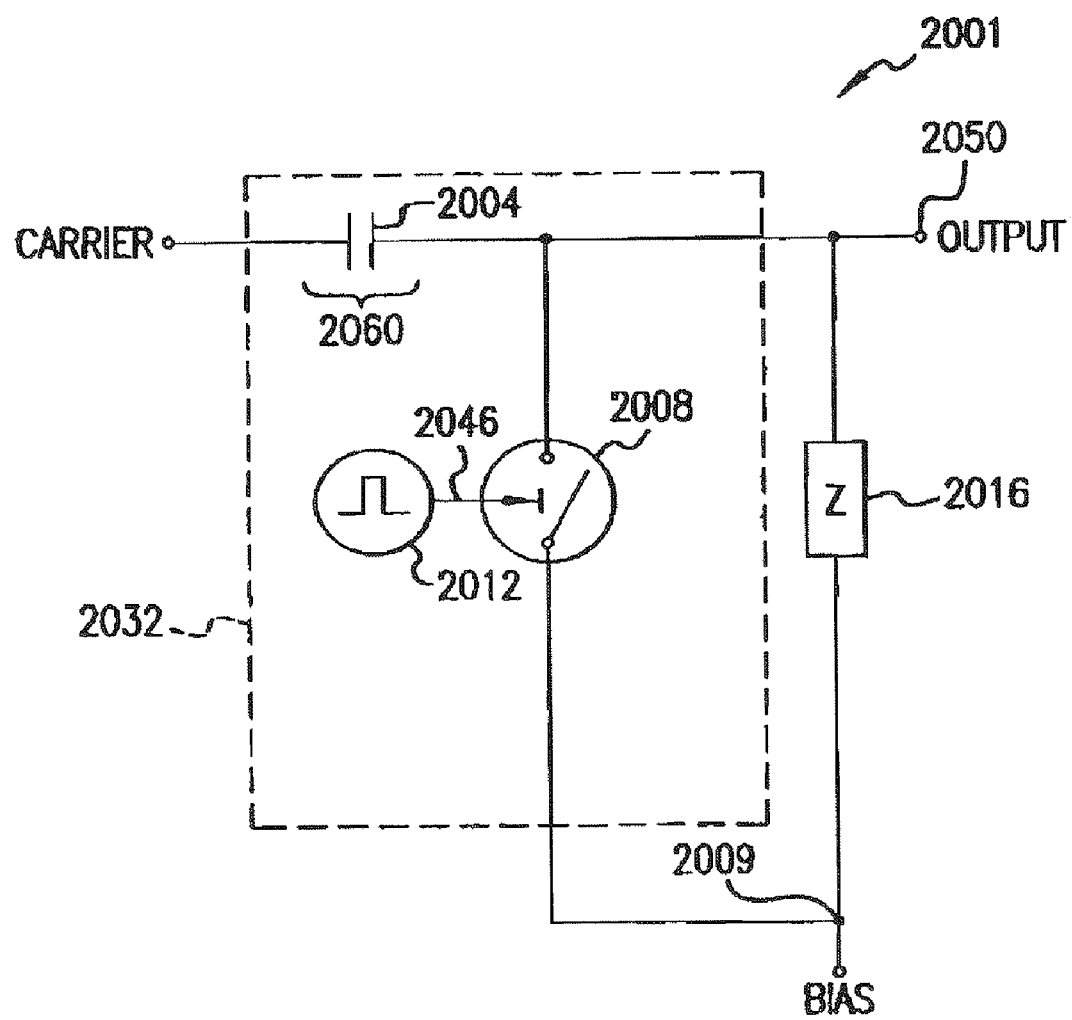
FIG. 20A is an example one-switch receiver according to an embodiment of the invention.

FIG. 20A is an example one-switch receiver 2001 having an aliasing module 2032 according to an embodiment of the invention and an impedance device 2016. Aliasing module 2032 is of the type illustrated in FIG. 3G. Impedance 2016 is illustrative, and not intended to limit the invention. In some embodiment, impedance 2016 is a part of an optional amplifier (not shown), and thus there is no separate impedance device 2016.

As illustrated in FIG. 20A, UFD module 2032 comprises a capacitor 2004, a switching device 2008 and an aperture generator 2012. Impedance device 2016 is coupled to switching device 2008, as shown in FIG. 20A. A bias voltage (AC ground) is applied to a node 2009. As will be apparent to a person skilled in the relevant arts, generally speaking, receiver 2001 comprises one-half of receiver 1602.

In an embodiment, capacitor 2004 is selected in accordance with the criteria described in section 4 below. Capacitor 2004 is selected so that it discharges at a rate of between six percent to fifty percent between apertures of switching (control) signal 2046. The period of control signal 2046 operates at a third or a fifth harmonic of the input carrier signal. Switching device 2008 is closed for approximately one-half cycle of the input signal during each period of control signal 2046.

Figure 20B:
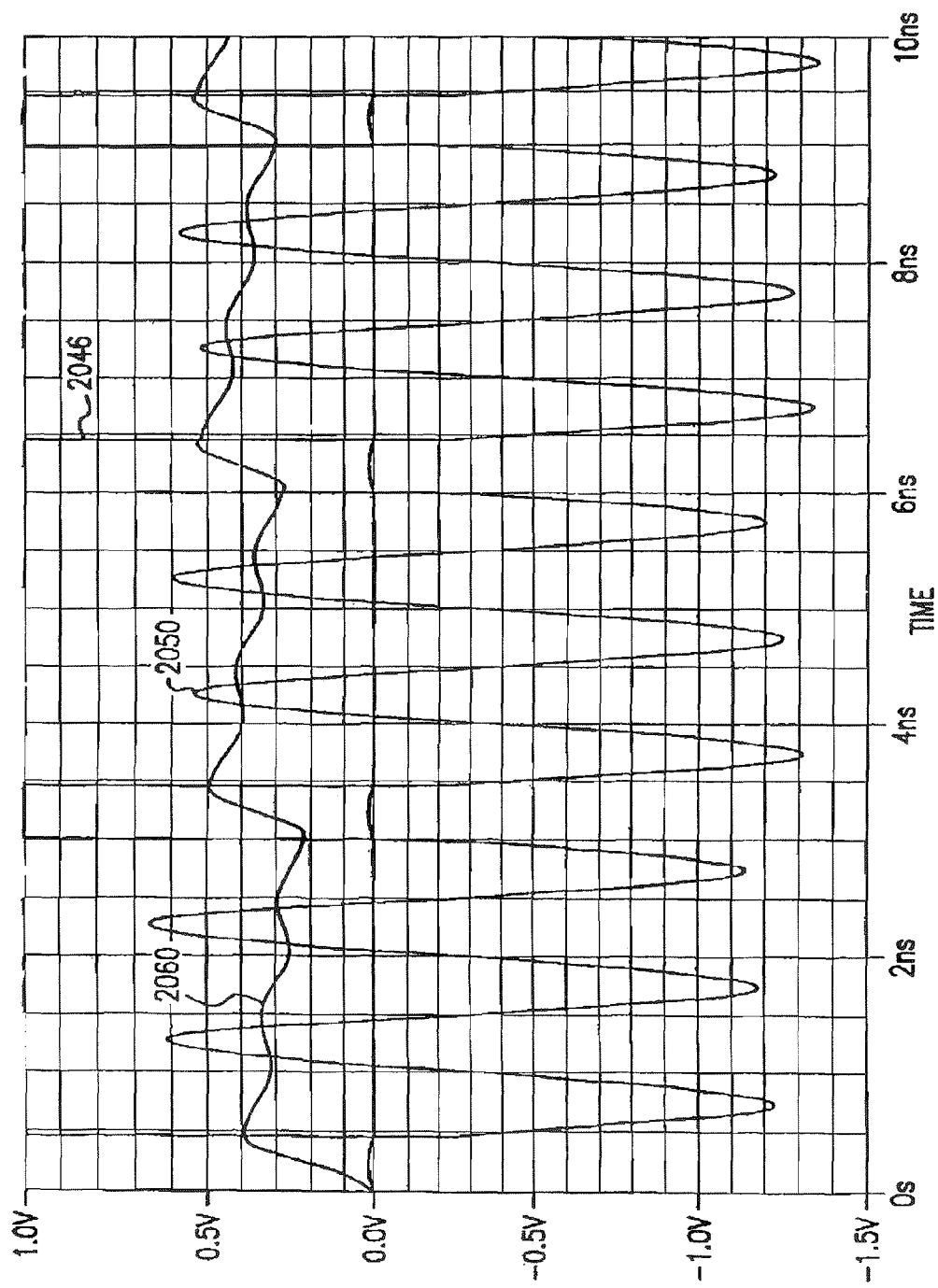
FIGS. 20B-20D are example waveforms used to describe the operation of the example one-switch receiver of FIG. 20A.
Figure 20C:
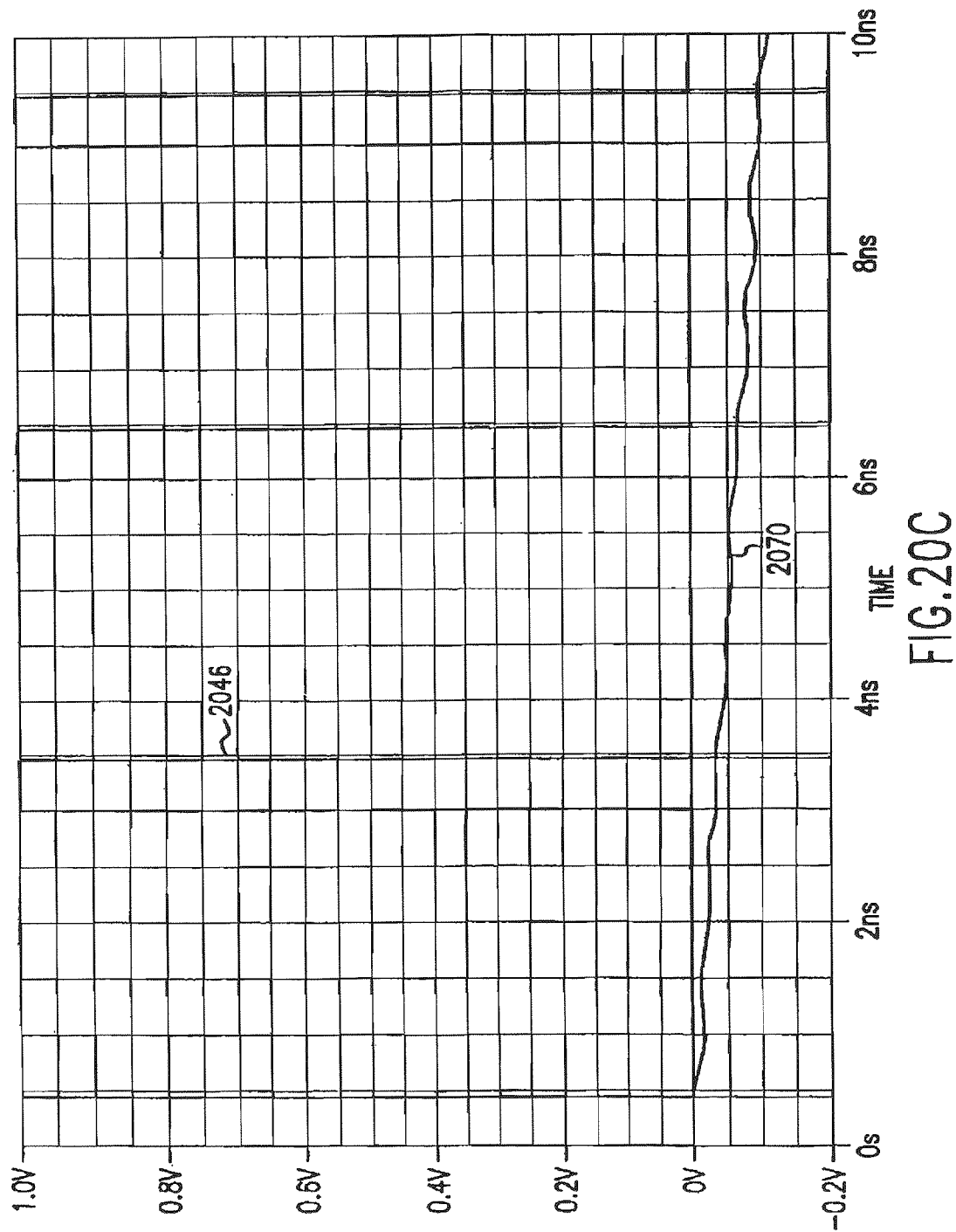
Figure 20D:
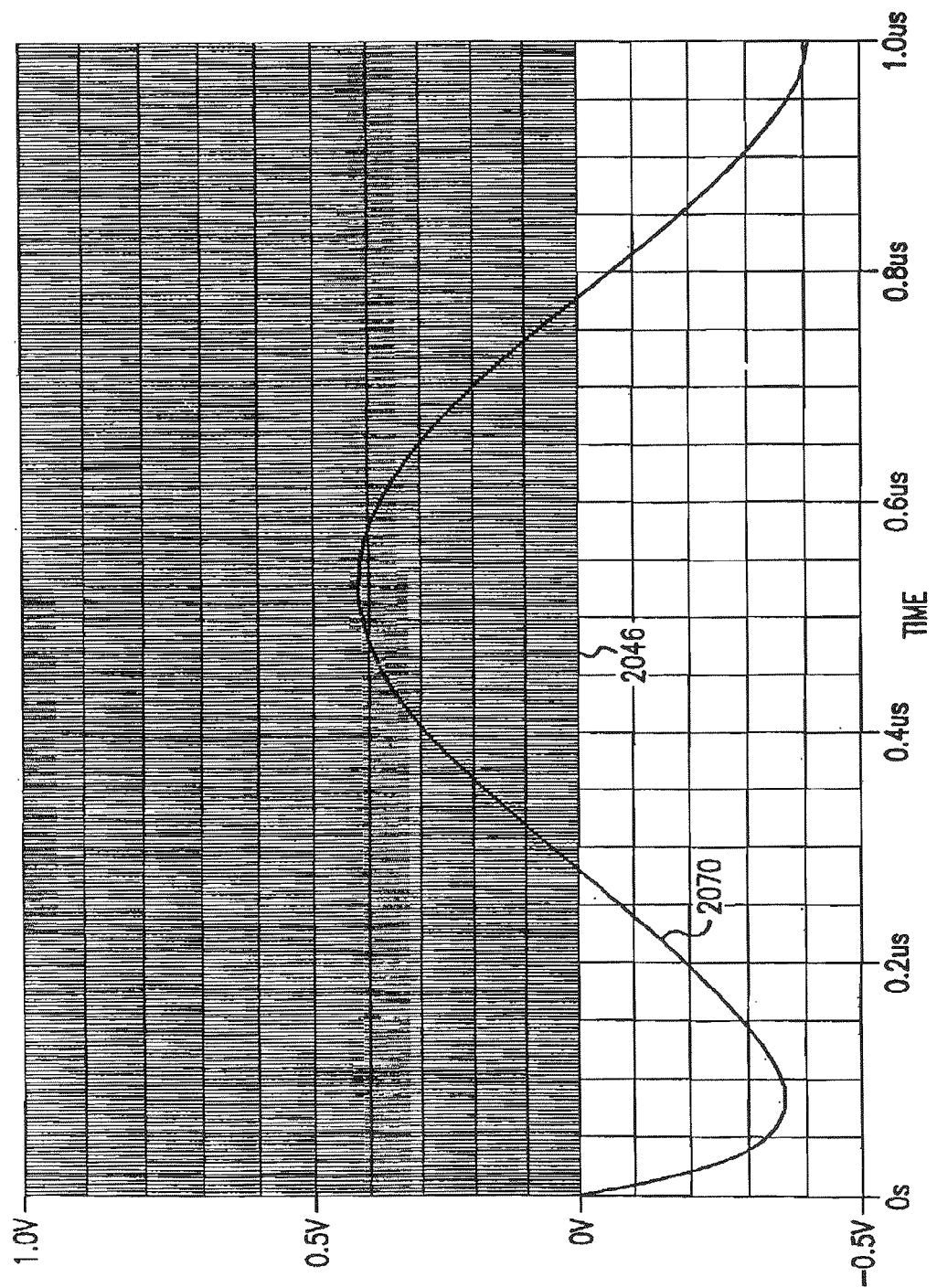

FIGS. 20B-20D illustrate example waveforms for receiver 2001. The waveforms are for an embodiment of the invention, wherein capacitor 2004 has a nominal value of 11 pf and impedance device 2016 is resistor having a nominal value of 547 ohms. The waveforms illustrated are for a 1 GHz input carrier signal.

FIG. 20B illustrates a switching signal (aperture generator signal) 2046. Also shown in FIG. 208B is a voltage signal 2060 across capacitor 2004. The voltage across capacitor 2004 increases when switch 2008 is closed. The voltage across capacitor 2004 decreases when switch 2008 is open. A periodic slope in signal 2060 illustrates the discharge of capacitor 2004 between the apertures of switching (control) signal 2046. Signal 2050 illustrates the output of receiver 2001. As can be seen, the output comprises both a down-converter signal and the carrier. The carrier can be removed using a filter (not shown).

FIG. 20C illustrates the output signal 2070 of UFD module 2032 after the carrier signal has been removed. Switching signal 2046 is shown in FIG. 20C for reference.

FIG. 20D shows the output of receiver 2001 for an extended period of time, as illustrated by switching signal 2046. In FIG. 20D, the input carrier signal has a frequency of 1 GHz, but the period of switching signal 2046 has been extended from 3.000 ns (as is the case for the waveforms of FIGS. 20B-20C) to 3.003 ns. Thus, the phase of the input carrier signal is slowly varying relative to switching signal 2046. Signal 2070 in FIG. 20D is the output of UFD module 2032 after the carrier has been removed by low-pass filtering.

As illustrated by signal 1870, in FIG. 29D, embodiments of receiver 2001 can be used to receive and down-convert any communications signal. Carrier amplitude and phase changes relative to the sample aperture(s) are reflected in the output signal 2070 as illustrated in FIG. 20D. FIG. 20D demonstrates the output when the input signal and aperture generator are not related by an exact frequency multiple. As will be understood by a person skilled in the relevant arts, the sample aperture(s) roll over the input signal and capture different portions of the input signal. By illustrating that the aperture(s) can capture any amplitude and/or phase of an input signal, it is demonstrated that embodiments of receiver 2001 can be used to receive and down-convert any communications signal.

The operation of receiver 2001 is similar to that of other receiver embodiments already described herein. A modulated carrier signal is input to the carrier port of receiver 2101. The modulated carrier signal causes a charge to be stored on capacitor 2104 and capacitor 2106 when switching device 2108 is closed, thereby generating a voltage signal across capacitors 2104 and 2106. Switching device 2108 is opened and closed by control signal having apertures similar to other control signals illustrated herein. Aperture generator 2112 generates the control signal.

Figure 21:
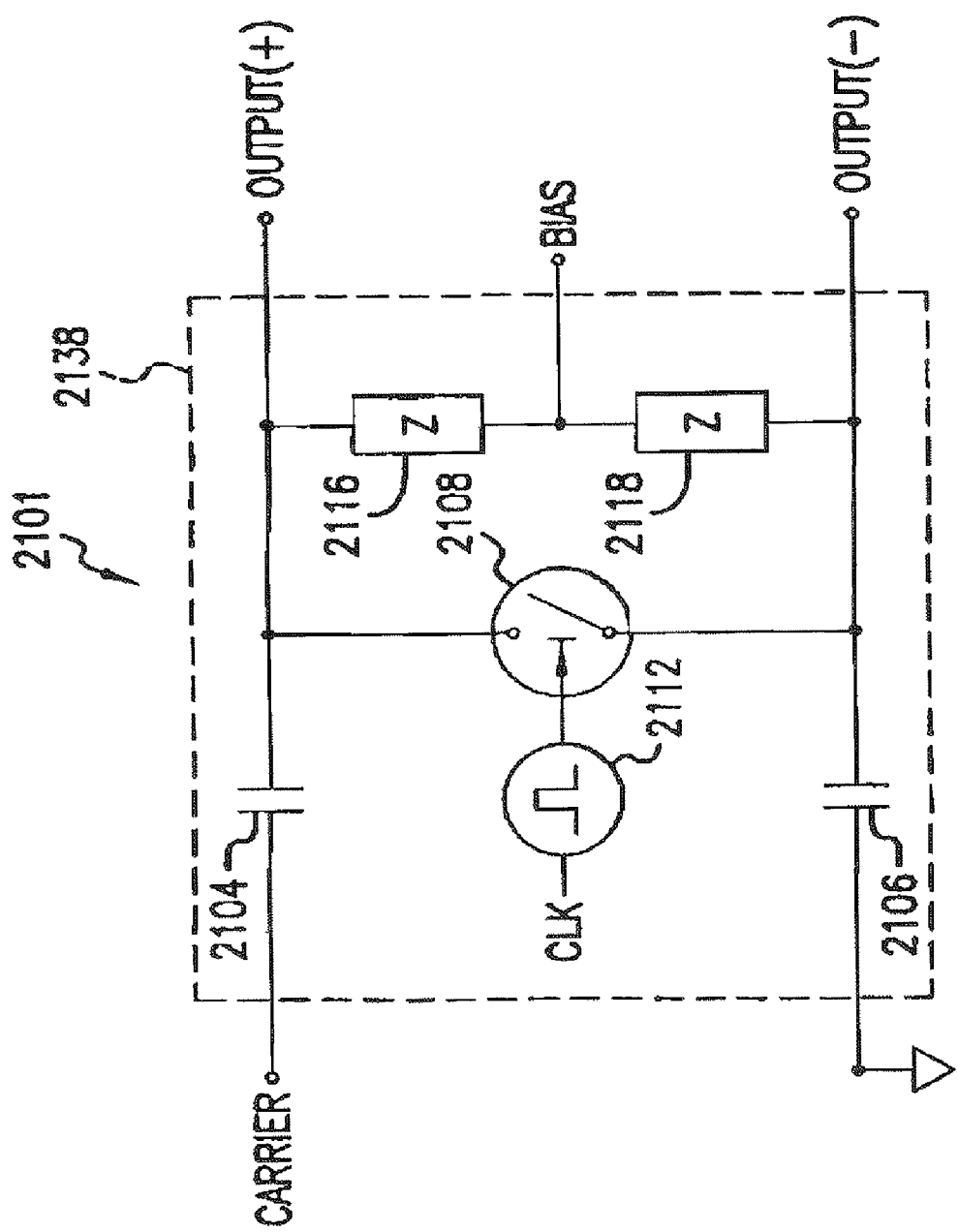
FIG. 21 is an example one-switch receiver according to an embodiment of the invention.

A difference between receiver 2101 and receiver 1802, for example, is that the modulated carrier signal is not inverted to input to a carrier(−) port. As can be seen in FIG. 21, the second input port of receiver 2101 is coupled to a ground.

When switching device 2108 is opened, both capacitor 2104 and capacitor 2106 begin to discharge. This causes a voltage to be generated across impedance 2116, and a voltage to be generated across impedance 2118.

The opening and closing of switching device 2108 in accordance with the invention causes a down-converted signal (one-half of the output of receiver 2101) to be formed across impedance 2116 and a down-converted signal (one-half of the output of receiver 2101) to be formed across impedance 2118. The total output of receiver 2101 is the differential output, or the sum of signals. Filters (not shown) are used to remove the carrier from the down-converted signal. In embodiments, optional amplifiers (not shown) are band limited, and thus act as filters and remover the carrier.

As will be understood by a person skilled in the relevant arts, given the description of the invention herein, receiver 2001 has several features that make it particularly well adapted for certain applications. For example, it is a feature of receiver 2001 that it may be implemented using fewer devices than other embodiments and that it may be implemented on a single chip using CMOS technology.

Figure 20E:
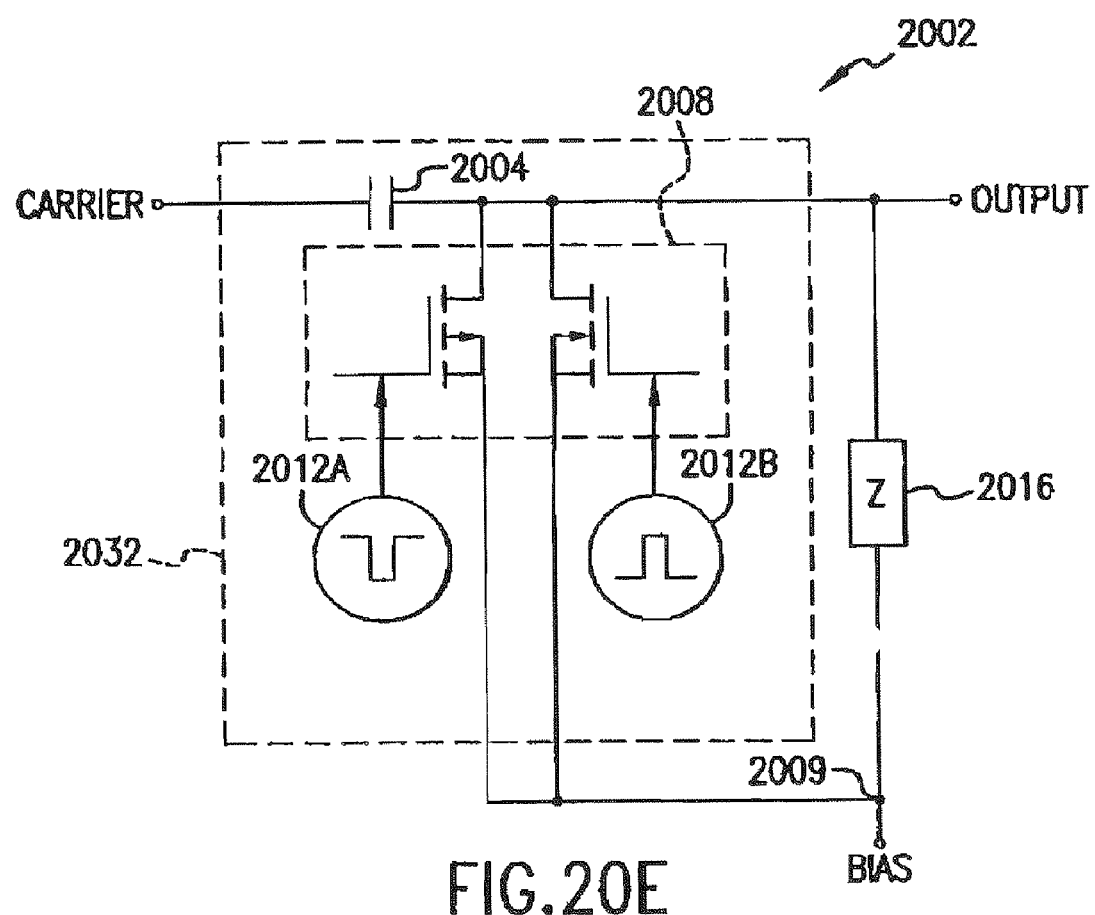
FIG. 20E is an example one-switch receiver according to an embodiment of the invention.

FIG. 20E illustrates a signal switch receiver 2002 having an aliasing module 2032 according to an embodiment of the invention and an impedance device 2016. Aliasing module 2032 is of the type illustrated in FIG. 3G.

As illustrated in FIG. 20E, UFD module 2032 comprises a capacitor 2004, a switching device 2008 and two aperture generators 2012A and 2012B. Impedance device 2016 is coupled to switching device 2008, as shown in FIG. 20A. A bias voltage (AC ground) is applied to a node 2009. Receiver 2002 is similar to receiver 2001.

The operation of receiver 2002 is similar to that of other receiver embodiments already described herein, and thus is not repeated here. A person skilled in the relevant art will understand how receiver 2001 operates given the description of the invention herein.

Figure 20F:
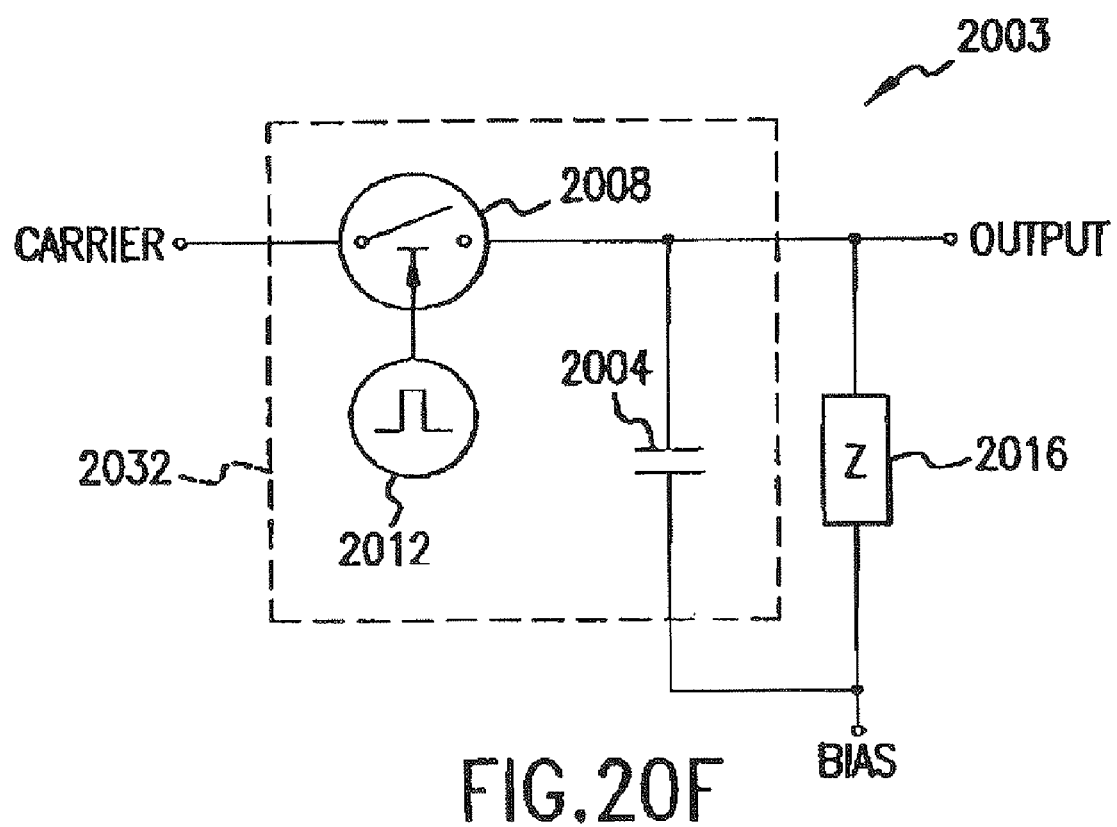
FIG. 20F is an example one-switch receiver according to an embodiment of the invention.

FIG. 20F illustrates another embodiment of a single switch receiver 2003 having an aliasing module 2032 according to the invention. In the embodiment of FIG. 20F, an aliasing module of the type shown in FIG. 3A is used. This embodiment of the invention operates similarly to receiver 2001, except that the carrier signal is removed from the down converted signal by capacitor 2004 during down-conversion.

Since the operation of receiver 2003 is similar to that of other receiver embodiments already described herein, it is not repeated here. A person skilled in the relevant art will understand how receiver 2003 operates given the description of the invention herein.

FIG. 21 is another example one-switch receiver 2101 according to an embodiment of the invention. Receiver 2101 comprises a UFD module 2138, similar to UFD module 1832, described above. As seen in FIG. 21, one of the input ports of UFD module 2138 is coupled to ground. It is a feature of receiver 2101 that no carrier(−) input signal is required. The operation of receiver 2101 is similar to that of other receiver embodiments already described herein, and thus is not repeated here. A person skilled in the relevant art will understand how receiver 2101 operates given the description of the invention herein.

3.1.4 Other Receiver Embodiments

The receiver embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, down-converting different combinations of modulation techniques in an "I/Q" mode. Other embodiments include those shown in the documents referenced above, including but not limited to U.S. patent application Ser. Nos. 09/525,615 and 09/550,644. Such alternate embodiments fall within the scope and spirit of the present invention.

For example, other receiver embodiments may down-convert signals that have been modulated with other modulation techniques. These would be apparent to one skilled in the relevant art(s) based on the teachings disclosed herein, and include, but are not limited to, amplitude modulation (AM), frequency modulation (FM), pulse width modulation, quadrature amplitude modulation (QAM), quadrature phase-shift keying (QPSK), time division multiple access (TDMA), frequency division multiple access (FDMA), code division multiple access (CDMA), down-converting a signal with two forms of modulation embedding thereon, and combinations thereof.

3.2 Transmitter Embodiments

The following discussion describes frequency up-converting signals transmitted according to the present invention, using a Universal Frequency Up-conversion Module. Frequency up-conversion of an EM signal is described above, and is more fully described in U.S. Pat. No. 6,091,940 entitled "Method and System for Frequency Up-Conversion," filed Oct. 21, 1998 and issued Jul. 18, 2000, the full disclosure of which is incorporated herein by reference in its entirety, as well as in the other documents referenced above (see, for example, U.S. patent application Ser. No. 09/525,615).

Exemplary embodiments of a transmitter according to the invention are described below. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

In embodiments, the transmitter includes a universal frequency up-conversion (UFU) module for frequency up-converting an input signal. For example, in embodiments, the system transmitter includes the UFU module 1000, the UFU module 1101, or the UFU module 1290 as described, above, in reference to FIGS. 10, 11 and 12, respectively. In further embodiments, the UFU module is used to both modulate and up-convert an input signal.

3.2.1 In-Phase/Quadrature-Phase (I/Q) Modulation Mode Transmitter Embodiments

Figure 22:
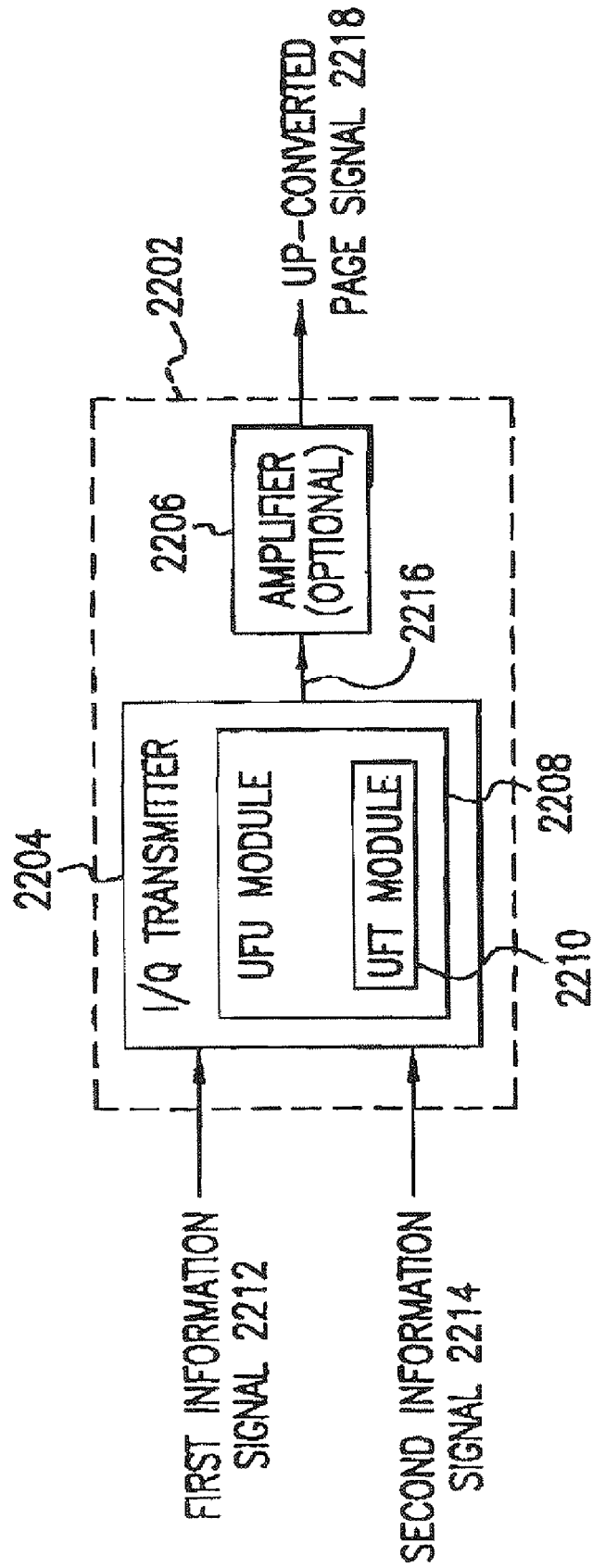
FIGS. 22-23 illustrate exemplary block diagrams of a transmitter operating in an I/Q modulation mode, according to embodiments of the invention.

In FIG. 22, an I/Q modulation mode transmitter embodiment is presented. In this embodiment, two information signals are accepted. An in-phase signal ("I") is modulated such that its phase varies as a function of one of the information signals, and a quadrature-phase signal ("Q") is modulated such that its phase varies as a function of the other information signal. The two modulated signals are combined to form an "I/Q" modulated signal and transmitted. In this manner, for instance, two separate information signals could be transmitted in a single signal simultaneously. Other uses for this type of modulation would be apparent to persons skilled in the relevant art(s).

FIG. 22 illustrates an exemplary block diagram of a transmitter 2202 in an I/Q modulation mode. In FIG. 22, a baseband signal comprises two signals, first information signal 2212 and second information signal 2214. Transmitter 2202 comprises an I/Q transmitter 2204 and an optional amplifier 2206. I/Q transmitter 2204 comprises at least one UFT module 2210. I/Q transmitter 2204 provides I/Q modulation to first information signal 2212 and second information signal 2214, outputting I/Q output signal 2216. Optional amplifier 2206 optionally amplifies I/Q output signal 2216, outputting up-converted signal 2218.

Figure 23:
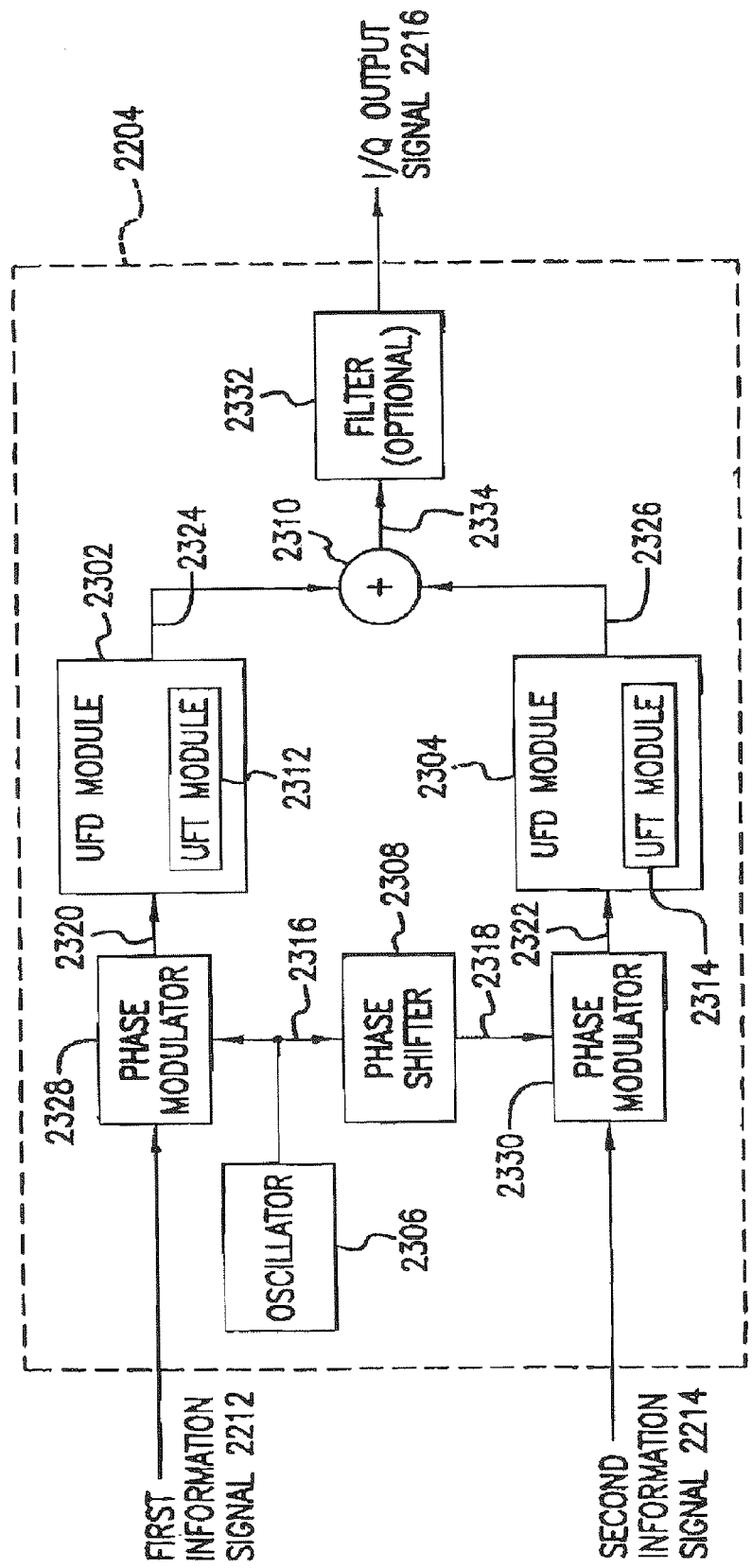

FIG. 23 illustrates a more detailed circuit block diagram for I/Q transmitter 2204. I/Q transmitter 2204 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

I/Q transmitter 2204 comprises a first UFU module 2302, a second UFU module 2304, an oscillator 2306, a phase shifter 2308, a summer 2310, a first UFT module 2312, a second UFT module 2314, a first phase modulator 2328, and a second phase modulator 2330.

Oscillator 2306 generates an "I"-oscillating signal 2316.

A first information signal 2212 is input to first phase modulator 2328. The "I"-oscillating signal 2316 is modulated by first information signal 2212 in the first phase modulator 2328, thereby producing an "I"-modulated signal 2320.

First UFU module 2302 inputs "I"-modulated signal 2320, and generates a harmonically rich "I" signal 2324 with a continuous and periodic wave form.

The phase of "I"-oscillating signal 2316 is shifted by phase shifter 2308 to create "Q"-oscillating signal 2318. Phase shifter 2308 preferably shifts the phase of "I"-oscillating signal 2316 by 90 degrees.

A second information signal 2214 is input to second phase modulator 2330. "Q"-oscillating signal 2318 is modulated by second information signal 2214 in second phase modulator 2330, thereby producing a "Q" modulated signal 2322.

Second UFU module 2304 inputs "Q" modulated signal 2322, and generates a harmonically rich "Q" signal 2326, with a continuous and periodic waveform.

Harmonically rich "I" signal 2324 and harmonically rich "Q" signal 2326 are preferably rectangular waves, such as square waves or pulses (although the invention is not limited to this embodiment), and are comprised of pluralities of sinusoidal waves whose frequencies are integer multiples of the fundamental frequency of the waveforms. These sinusoidal waves are referred to as the harmonics of the underlying waveforms, and a Fourier analysis will determine the amplitude of each harmonic.

Harmonically rich "I" signal 2324 and harmonically rich "Q" signal 2326 are combined by summer 2310 to create harmonically rich "I/Q" signal 2334. Summers are well known to persons skilled in the relevant art(s).

Optional filter 2332 filters out the undesired harmonic frequencies, and outputs an I/Q output signal 2216 at the desired harmonic frequency or frequencies.

It will be apparent to persons skilled in the relevant art(s) that an alternative embodiment exists wherein the harmonically rich "I" signal 2324 and the harmonically rich "Q" signal 2326 may be filtered before they are summed, and further, another alternative embodiment exists wherein "I"-modulated signal 2320 and "Q"-modulated signal 2322 may be summed to create an "I/Q"-modulated signal before being routed to a switch module. Other "I/Q"-modulation embodiments will be apparent to persons skilled in the relevant art(s) based upon the teachings herein, and are within the scope of the present invention. Further details pertaining to an I/Q modulation mode transmitter are provided in co-pending U.S. Pat. No. 6,091,940 entitled "Method and System for Frequency Up-Conversion," filed Oct. 21, 1998 and issued Jul. 18, 2000, which is incorporated herein by reference in its entirety.

3.2.2 Enhanced Multi-Switch Transmitter Embodiments

As described herein, multi-switch transmitter embodiments of the present invention are enhanced to maximize both power transfer and information transmission. These embodiments are described herein for purposes of illustration, and not limitation. Alternate embodiments (including equivalents, extensions, variations, deviations, etc., of the embodiments described herein), will be apparent to persons skilled in the relevant art(s) based on the teachings contained herein. The invention is intended and adapted to include such alternate embodiments.

Figure 24A:
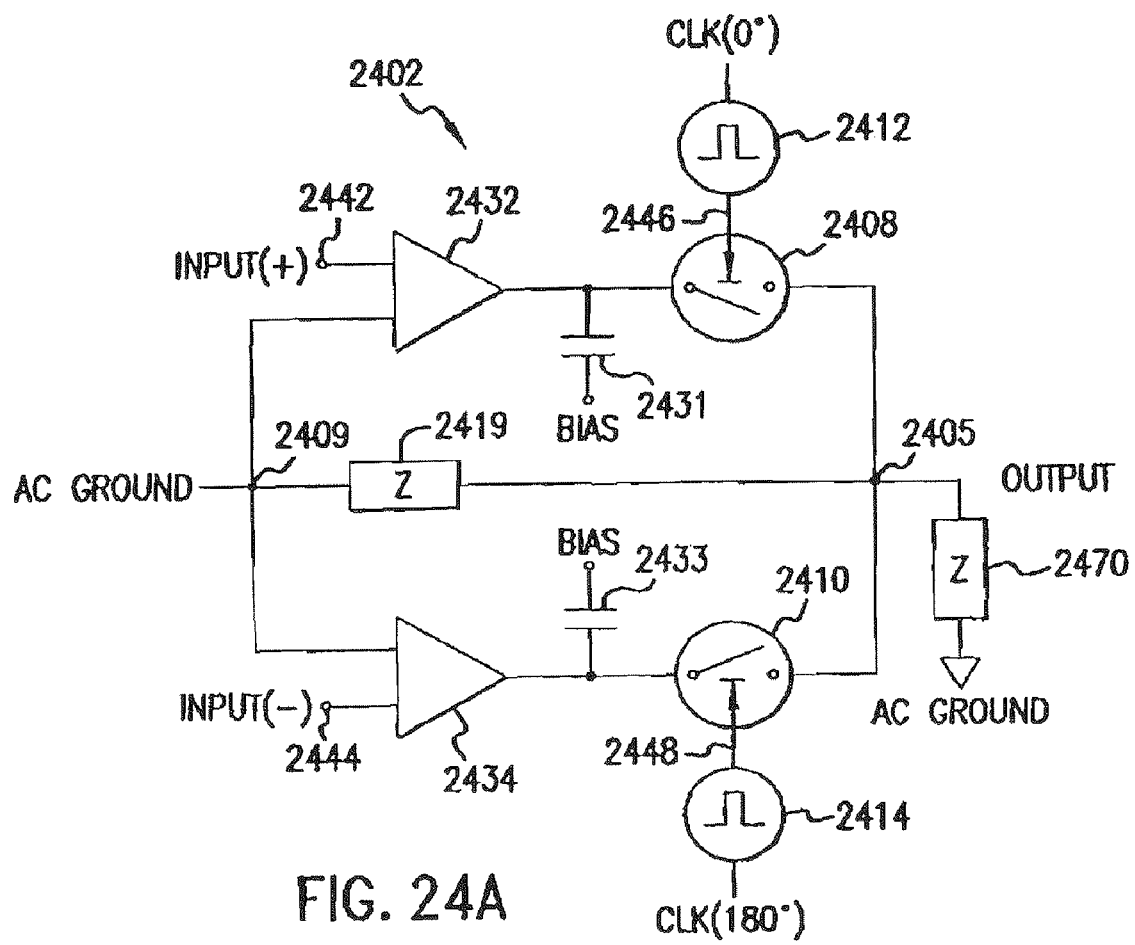
FIG. 24A is an example two-switch transmitter according to an embodiment of the invention.

FIG. 24A is an example two-switch transmitter 2402 according to an embodiment of the invention. Transmitter 2402 comprises two switching devices 2408 and 2410, two aperture generators 2412 and 2414, an impedance device 2419, and two amplifiers 2432 and 2434.

As shown in FIG. 24A, amplifiers 2432 and 2434, and impedance device 2419 are coupled together to form a node 2409. Node 2409 is an AC ground. In an embodiment, impedance device 2419 is an inductor. Impedance device 2419 comprises a feedback path that passes DC signals to the inputs of amplifiers 2432 and 2434, thereby removing the DC signals from the output of transmitter 2402. The output ports of amplifiers 2432 and 2434 are coupled to switching devices 2408 and 2410. Switching devices 2408 and 2410, and impedance device 2419 are coupled together to form a node 2405. The output of transmitter 2402 is generated at node 2405, across a load impedance 2470. Load impedance 2470 is illustrative, and not intended to limit the invention.

In an embodiment, optional energy storage devices (capacitors) 2431 and 2433 are coupled to transmitter 2402, as shown in FIG. 24A, in order to increase the efficiency of transmitter 2402. These devices store energy when switches 2408 and 2410 are open, thereby enhancing the energy transmitted when switches 2408 and 2410 close. Energy storage devices 2431 and 2433 can be coupled to any bias (AC ground).

It is a feature of example transmitter 2402, as well as a feature of other embodiments of the invention, that no power summer is needed at node 2405 so long as the apertures of switching devices 2408 and 2410 do not overlap. A simple wire can be used to couple transmitter 2402 to load impedance 2470. Other approaches may also be used.

The operation of transmitter 2402 will now be described with reference to the waveforms illustrated in FIGS. 24B-24F.

Figure 24B:
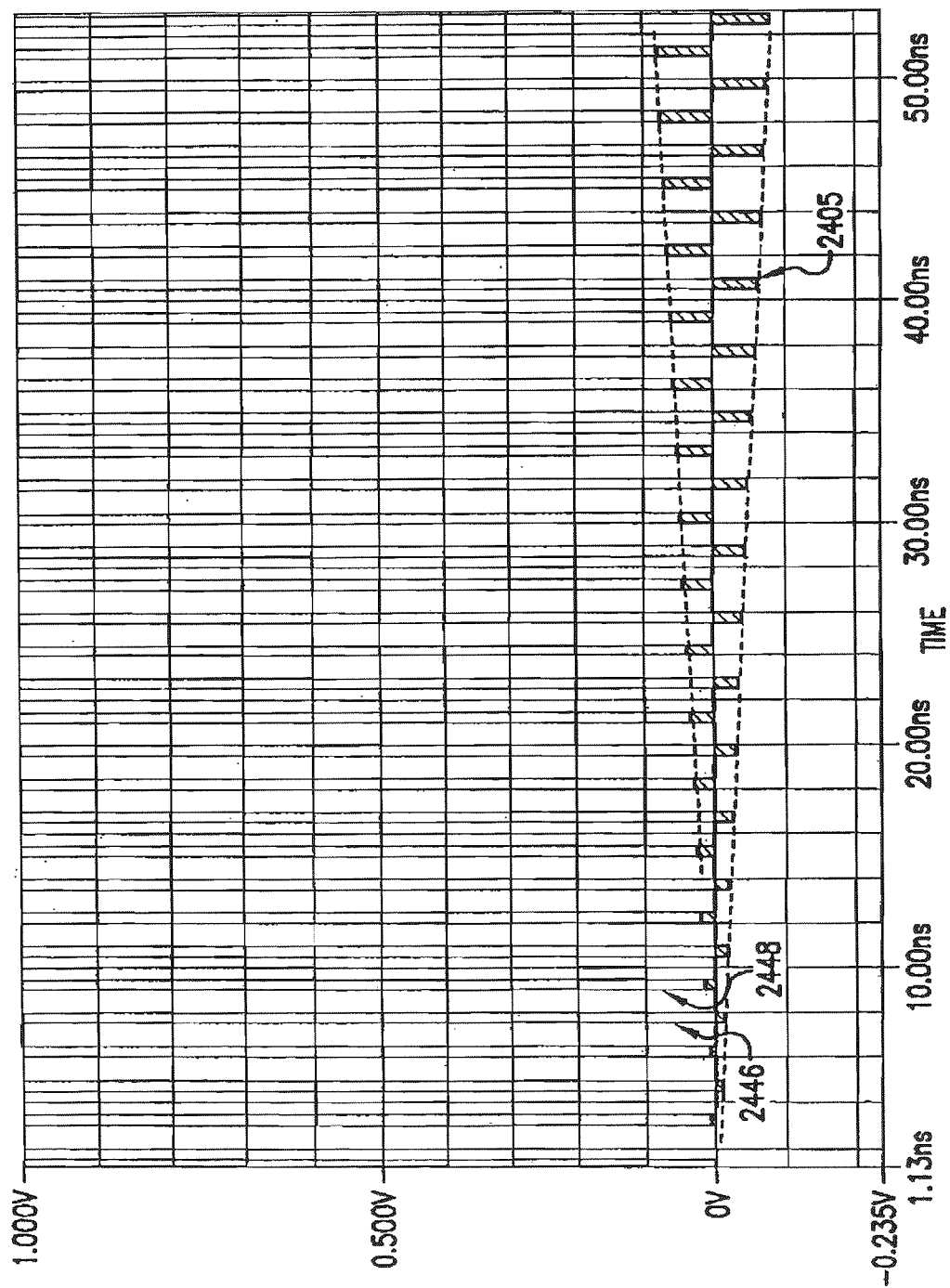
Figure 24C:
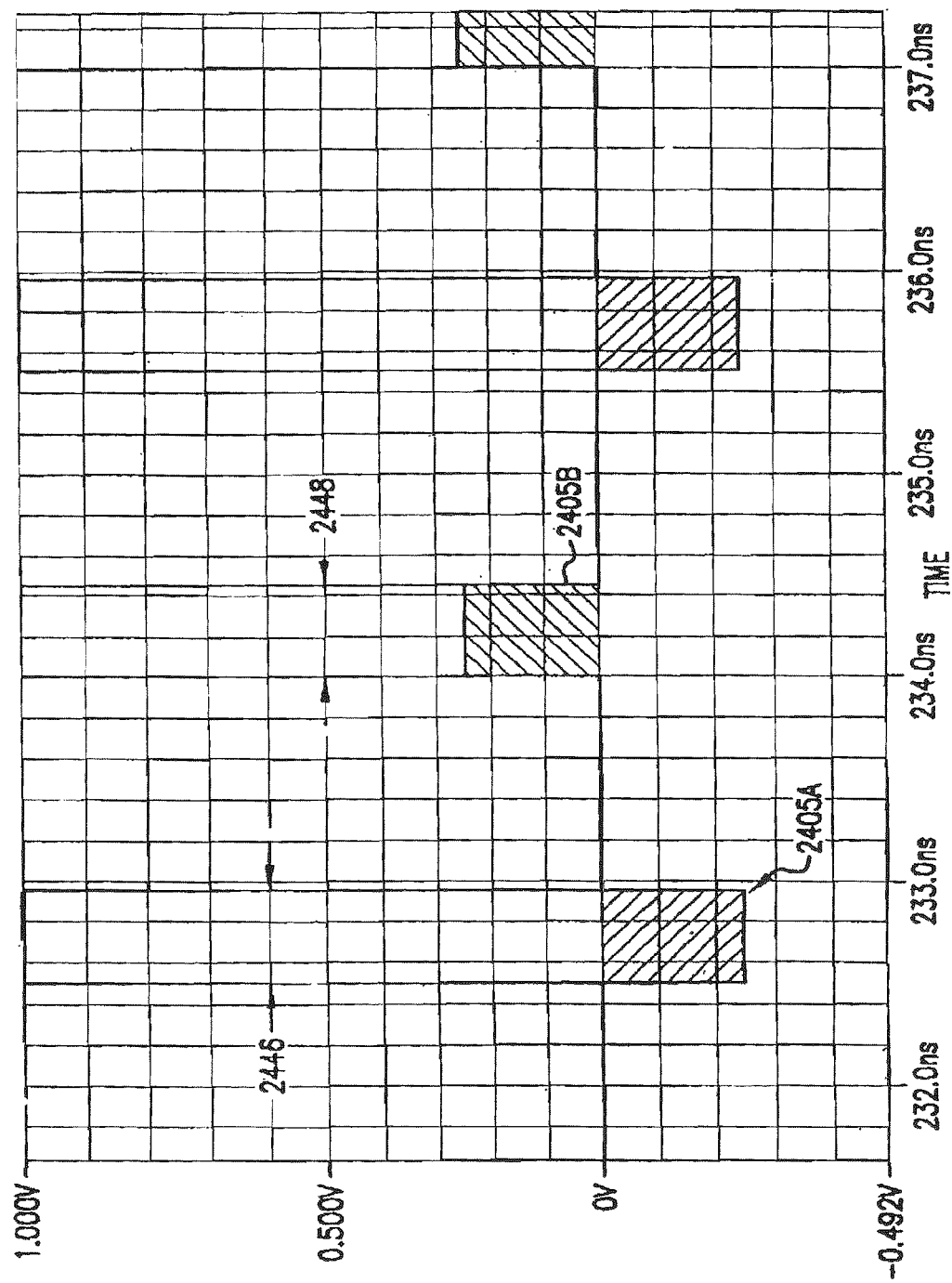
Figure 24D:
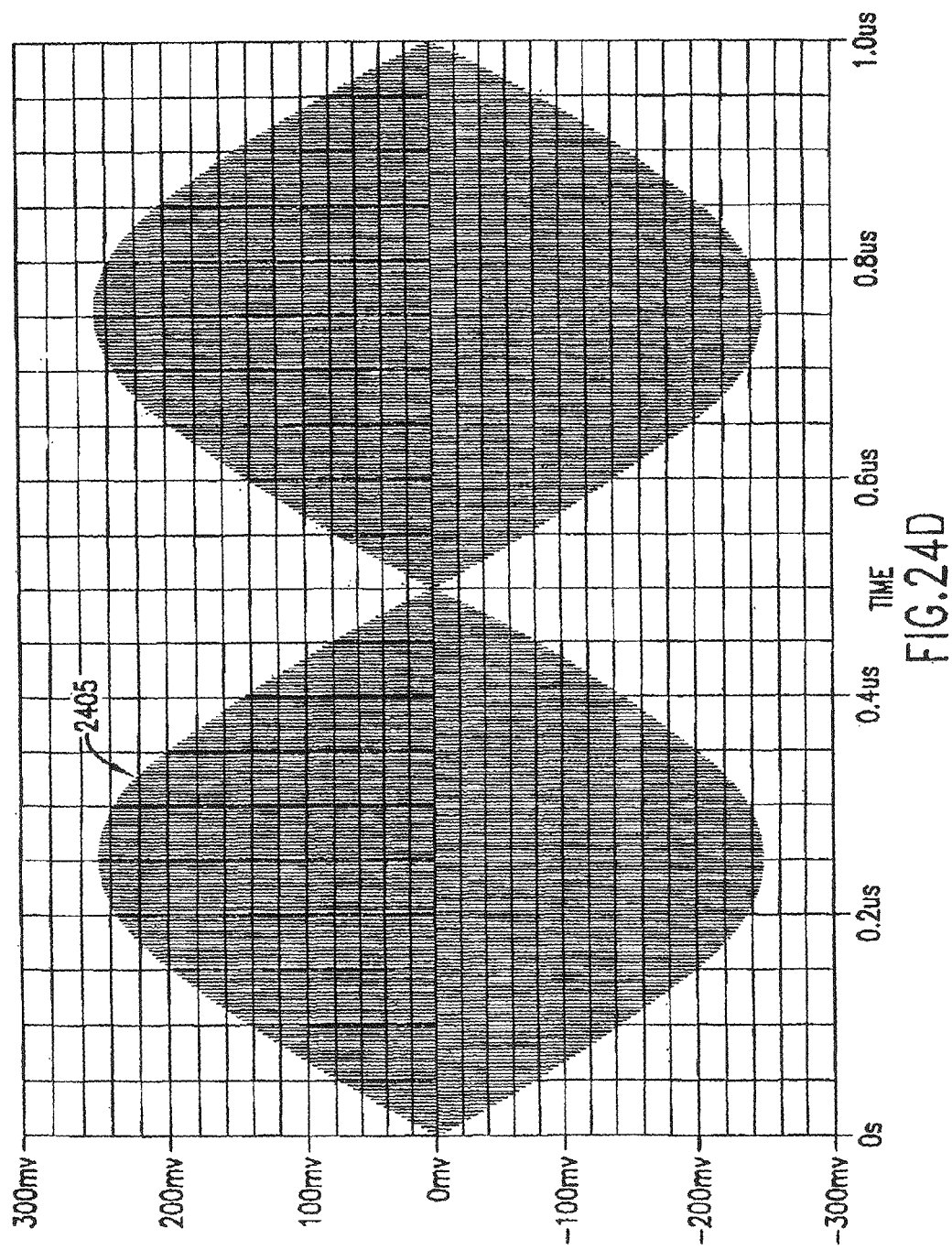
Figure 24E:
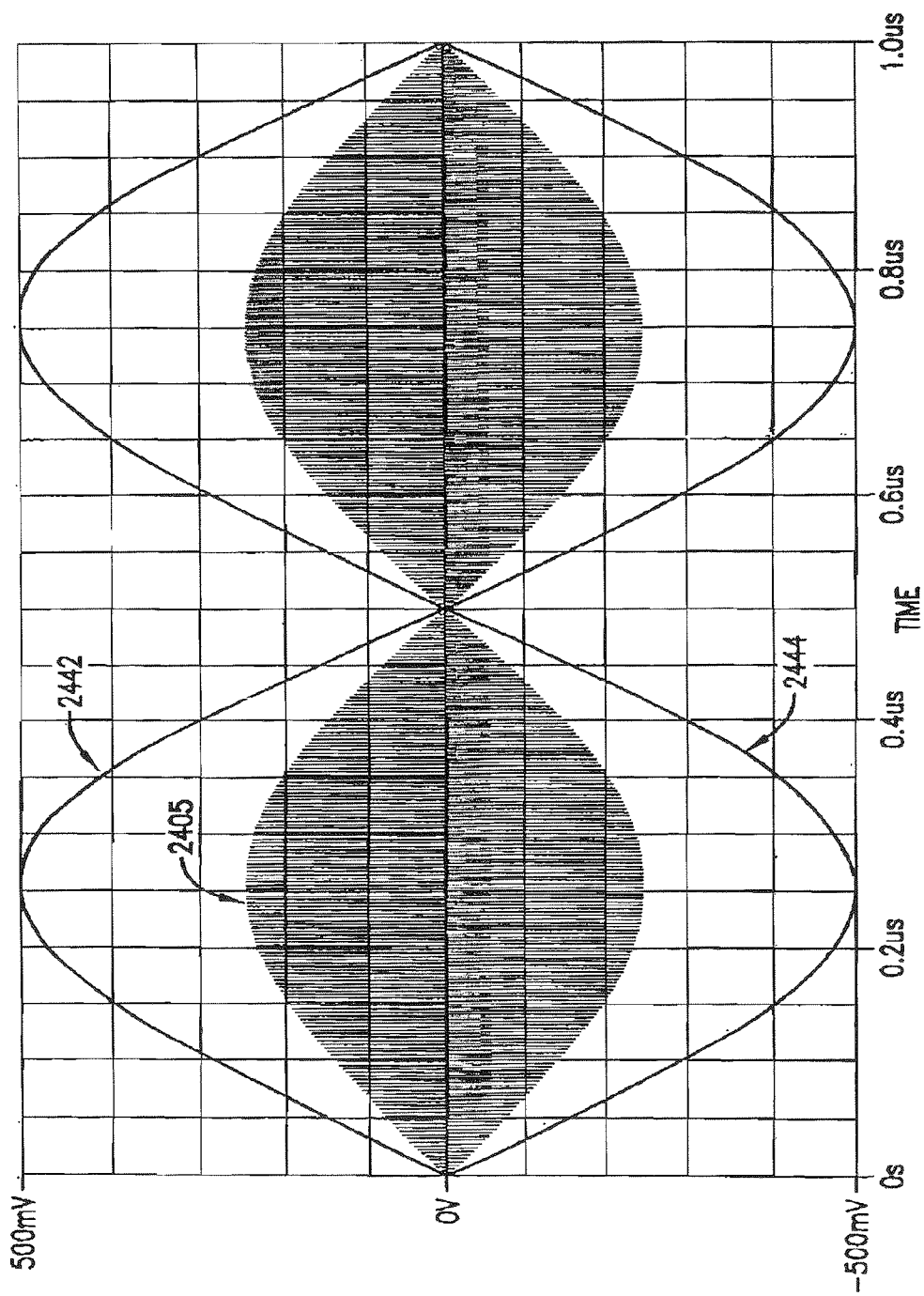

An information signal 2442 to be up-converted is provided to the input(+) port of amplifier 2432 (see FIG. 24A). As shown in FIG. 24E, information signal 2442 is a sine wave. An inverted version of information signal 2442 (i.e., signal 2444) is provided to the input(−) port of amplifier 2434. Signal 2444 is shown in FIG. 24E.

Input signals 2442 and 2444 are operated on by amplifiers 2432 and 2434 in a manner that would be known to a person skilled in the relevant art to produce signals at the outputs of amplifiers 2432 and 2434 that are a function of (i.e., proportional to) the input signals 2442 and 2444. When switch 2408 is closed, the output signal of amplifier 2432 is coupled to load impedance 2470, and thereby produces a positive voltage at the input of impedance 2470 such as, for example, voltage 2405B shown in FIG. 24C. Similarly, when switch 2410 is closed, the output signal of amplifier 2434 is coupled to load impedance 2470, and thereby produces a negative voltage at the input of impedance 2470 such as, for example, voltage 2405A shown in FIG. 24C. The operation of switching devices 2408 and 2410 are controlled by control signals 2446 and 2448. These signals are illustrated in FIGS. 24B and 24C. Control signal 2446 controls the switching of switching device 2408. Control signal 2448 controls the switching of switching device 2410.

As can be seen in FIG. 24B, the opening and closing of switching devices 2408 and 2410 produce a harmonically rich up-converted signal 2405. Up-converted signal 2405 is also illustrated in FIGS. 24D and 24E. In particular, FIG. 24E illustrates the relationship between input signals 2442 and 2444 and up-converted signal 2405.

Figure 24F:
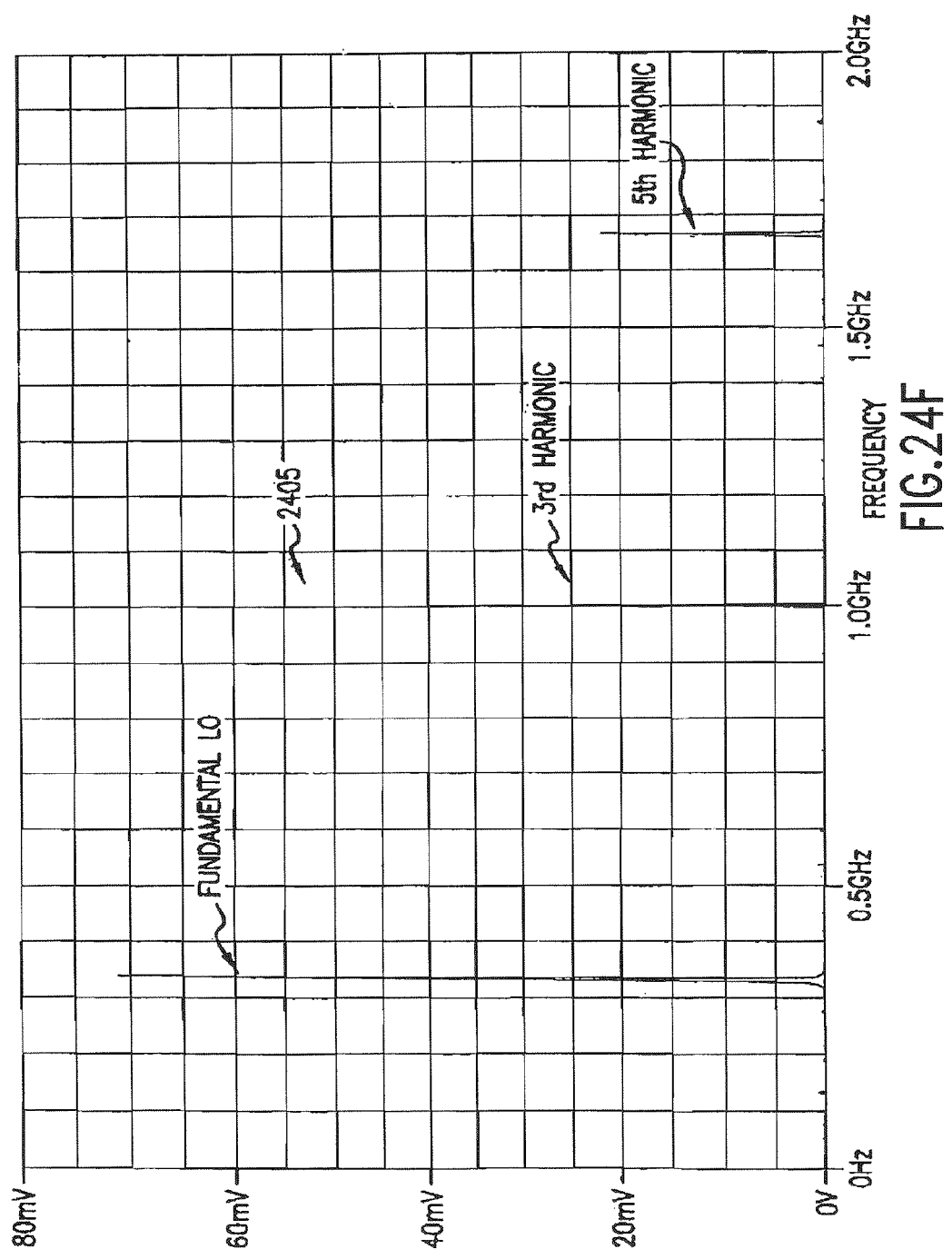

FIG. 24F illustrates a portion of Fourier transform of up-converted signal 2405. As illustrated in FIG. 24F, signal 2405 of transmitter 2402 is a harmonically rich signal. The particular portion of signal 2405 that is to be transmitted can be selected using a filter. For example, a high Q filter centered at 1.0 GHz can be used to select the $3^{rd}$ harmonic portion of signal 2405 for transmission. A person skilled in the relevant arts will understand how to do this given the description of the invention herein. In embodiments, the output signal 2405 is routed to a filter (not shown) to remove the unwanted frequencies that exist as harmonic components of the harmonically rich signal. A desired frequency is optionally amplified by an amplifier module (not shown) and then optionally routed to a transmission module (not shown) for transmission.

As described herein, optional energy storage devices 2431 and 2433 as well as impedance matching techniques can be used to improve the efficiency of transmitter 2402.

FIGS. 24G-24K further illustrate the operation of transmitter 2402 when transmitter 2402 is used, for example, to transmit digital information represented by the input signals shown in FIGS. 24G and 24H. FIG. 24G illustrates an example digital signal 2442 that represents a bit sequence of "1011." The inverse of signal 2442 (i.e., 2444) is illustrated in FIG. 24H. Input signals 2442 and 2444 are input to amplifiers 2432 and 2434, as described above. FIG. 24I illustrates an example control 2446. FIG. 24J illustrates an example control signal 2448. A harmonically rich up-converted signal 2405, for the input signals 2442 and 2444 (shown in FIGS. 24G and 24H), is shown in FIG. 24K. Signal 2405 of FIG. 24K s obtain in the manner described above.

The example waveforms of FIGS. 24B-24K are illustrative, and not intended to limit the invention. Waveforms other than those illustrated in FIGS. 24B-24K are intended to be used with the architecture that comprises transmitter 2402.

Figure 25A:
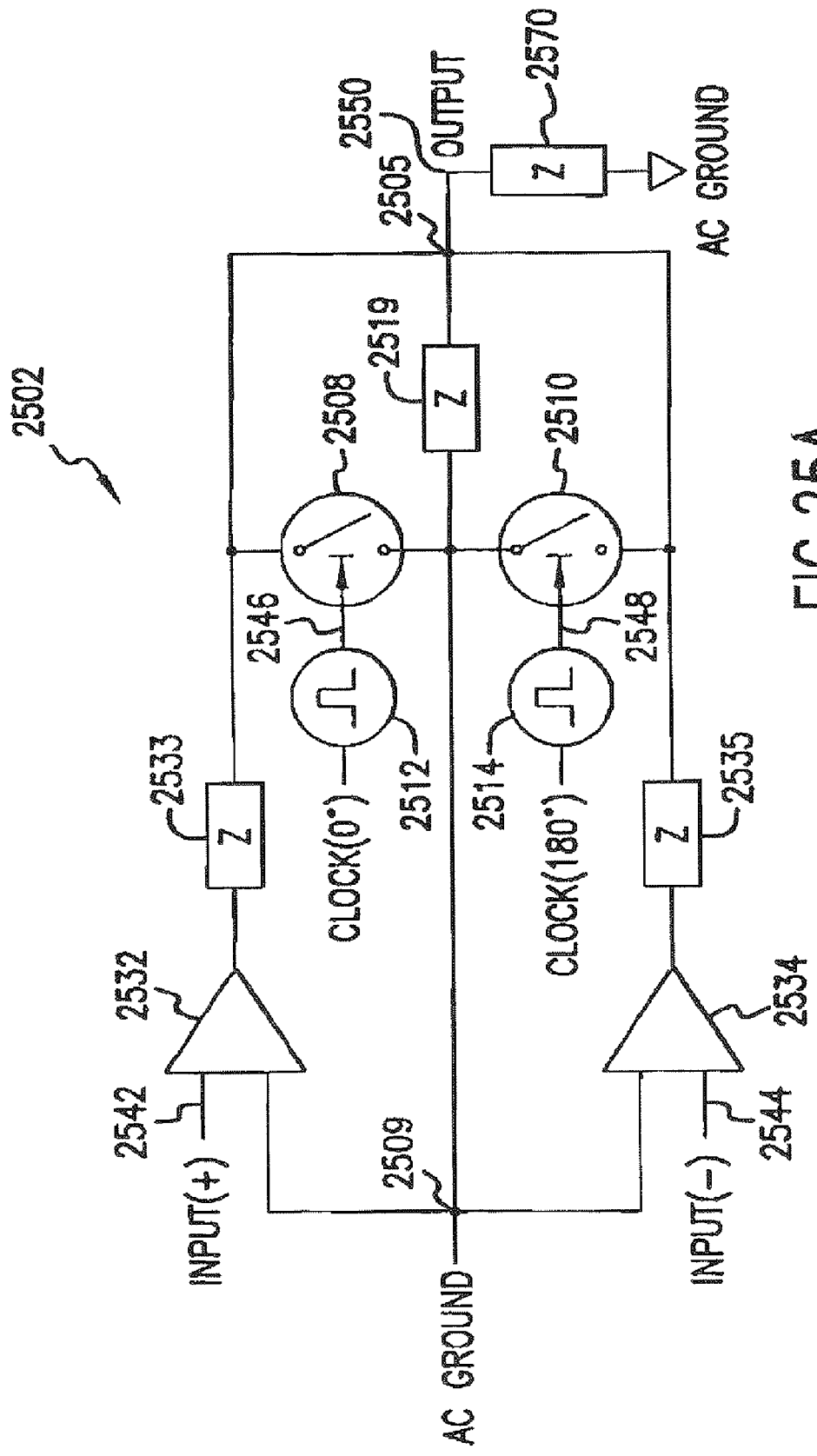
FIG. 25A is an example two-switch transmitter according to an embodiment of the invention.

FIG. 25A is an example two-switch transmitter 2502 according to an embodiment of the invention. Transmitter 2502 comprises two switching devices 2508 and 2510, two aperture generators 2512 and 2514, three impedance devices 2519, 2533, and 2535, and two amplifiers 2532 and 2534.

As shown in FIG. 25A, amplifiers 2532, 2534, switching devices 2508, 2510, and impedance device 2519 are coupled together to form a node 2509. Node 2509 is an AC ground. In an embodiment, impedance device 2519 is an inductor. Impedance device 2519 comprises a feedback path that passes DC signals to the inputs of amplifiers 2532 and 2534, thereby removing the DC signals from the output of transmitter 2502. The output ports of amplifiers 2532 and 2534 are coupled to impedance devices 2533 and 2535. Impedance devices 2533 and 2535 represent one or more impedance devices that act as an AC choke (low pass filter). Impedance devices 2533, 2535, switching devices 2508, 2510, and impedance device 2519 are also coupled together to form a node 2505. The output of transmitter 2502 is generated at node 2505, across a load impedance 2570.

The operation of switching devices 2508 and 2510 is controlled by control signals 2546 and 2548. Example control signals are illustrated in FIGS. 25D and 25E. Control signal 2546 controls the switching of switching device 2508. Control signal 2548 controls the switching of switching device 2510.

The operation of transmitter 2502 is similar to that of transmitter 2402, and thus is not repeated here. A person skilled in the relevant art will understand how transmitter 2502 operates given the description of the invention herein.

FIGS. 25B-25F illustrate the operation of transmitter 2502 when transmitter 2502 is used, for example, to transmit digital information represented by the input signals shown in FIGS. 25B and 25C. The example waveforms of FIGS. 25B-25F are illustrative, and not intended to limit the invention. Waveforms other than those illustrated in FIGS. 25B-25F are intended to be used with the architecture that comprises transmitter 2502.

FIG. 25B illustrates an example digital signal 2542 that represents a bit sequence of "1011." The inverse of signal 2542 (i.e., 2544) is illustrated in FIG. 25C. Input signals 2542 and 2544 are input to amplifiers 2532 and 2534. FIG. 25D illustrates an example control 2546. FIG. 25E illustrates an example control signal 2548. A harmonically rich up-converted signal 2550, for the input signals 2542 and 2544 is shown in FIG. 25F.

As described herein for transmitter 2402, optional energy storage devices (not shown) as well as impedance matching techniques can be used to improve the efficiency of transmitter 2502. How this is achieved in accordance with will be understood by a person skilled in the relevant arts given the description herein.

Figure 26A:
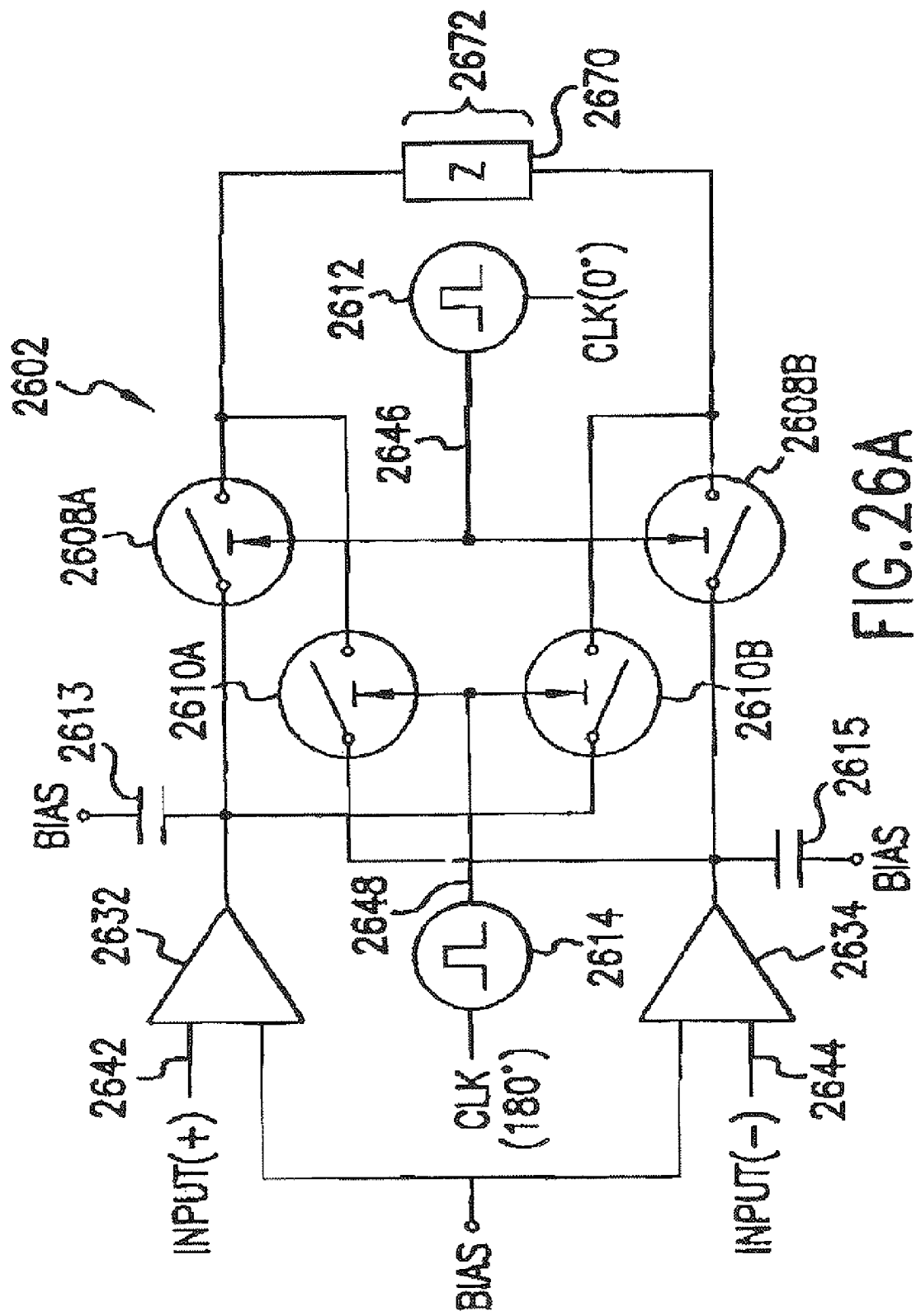
FIG. 26A is an example two-switch transmitter according to an embodiment of the invention.

FIG. 26A is example of a multi-switch transmitter 2602 according to an embodiment of the invention. Transmitter 2602 comprises four switching devices 2608A, 2608B, 2610A, and 2610B, two aperture generators 2612 and 2614, and two amplifiers 2632 and 2634. Transmitter 2602 is shown having two optional energy storage devices 2613 and 2615.

The operation of transmitter 2602 is similar to that of transmitter 2402. An information signal 2642 to be up-converted is provided to the input(+) port of amplifier 2632. An inverted version of information signal 2642 (i.e., signal 2644) is provided to the input(−) port of amplifier 2634.

Input signals 2642 and 2644 are operated on by amplifiers 2632 and 2634 in a manner that would be known to a person skilled in the relevant art to produce signals at the outputs of amplifiers 2632 and 2634 that are a function of (i.e., proportional to) the input signals 2642 and 2644. When switches 2608A or 2610B are closed, the output signal of amplifier 2632 is coupled to load impedance 2670, and thereby produces a voltage across load impedance 2670. Similarly, when switches 2608B or 2610A are closed, the output signal of amplifier 2634 is coupled to load impedance 2670, and thereby produces a voltage across load impedance 2670. The operation of switching devices 2608A, 2608B, 2610A and 2610B are controlled by control signals 2646 and 2648, as shown in FIG. 26A. Control signal 2646 controls the switching of switching devices 2408A and 2608B. Control signal 2648 controls the switching of switching devices 2610A and 2610B.

As described herein, the opening and closing of switching devices 2608A, 2608B, 2610A and 2610B produce a harmonically rich, up-converted signal. In embodiments, the up-converted signal is routed to a filter (not shown) to remove the unwanted frequencies that exist as harmonic components of the harmonically rich signal. A desired frequency is optionally amplified by an amplifier module (not shown) and then optionally routed to a transmission module (not shown) for transmission.

As described herein, optional energy storage devices 2613 and 2615 as well as impedance matching techniques can be used to improve the efficiency of transmitter 2602.

As seen in FIG. 26A, the architecture of transmitter 2602 enhances the amount of energy transferred to the load by using four switches and differential load configurations. Thus, there is about a 3 db gain in the output of transmitter 2602 over that of transmitter 2402. A person skilled in the relevant art will understand how transmitter 2602 operates given the description of the invention herein.

FIGS. 26B-26F are example waveforms that illustrate the operation of transmitter 2602. An information signal 2642 to be up-converted is provided to the input(+) port of amplifier 2632. As shown in FIG. 26B, information signal 2642 is a series of digital bits (1011). An inverted version of information signal 2642 (i.e., signal 2644) is provided to the input(−) port of amplifier 2634. Signal 2644 is shown in FIG. 26C.

The operation of switching devices 2608A, 2608B, 2610A and 2610B are controlled by control signals 2646 and 2648. These signals are illustrated in FIGS. 26D and 26E. Control signal 2646 controls the switching of switching devices 2608A and 2608B. Control signal 2648 controls the switching of switching devices 2610A and 2610B.

FIG. 26F illustrates the output signal 2672 of transmitter 2602 for input signals 2642 and 2644. The up-converted signal is obtained from the output signal of transmitter 2602 in a manner similar to that described herein, for example, for a harmonically rich signal.

3.2.3 Enhanced One-Switch Transmitter Embodiments

Figure 27A:
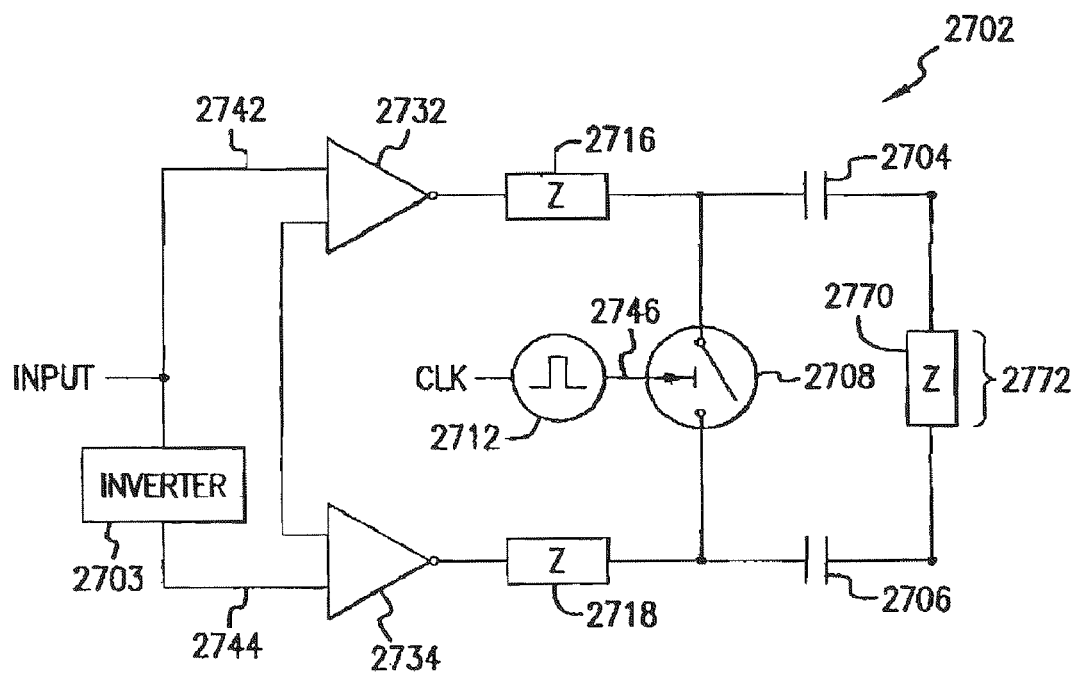
FIG. 27A is an example one-switch transmitter according to an embodiment of the invention.

As described herein, one-switch transmitter embodiments of the present invention are enhanced to maximize both power transfer and information transmission. These embodiments are described herein for purposes of illustration, and not limitation. Alternate embodiments (including equivalents, extensions, variations, deviations, etc., of the embodiments described herein), will be apparent to persons skilled in the relevant art(s) based on the teachings contained herein. The invention is intended and adapted to include such alternate embodiments. FIG. 27A is an example one-switch transmitter 2702 according to an embodiment of the invention. Transmitter 2702 comprises one switching device 2708, an aperture generator 2712, two capacitors 2704 and 2706, two impedance devices 2716 and 2718, and two amplifiers 2732 and 2734.

The operation of transmitter 2702 is similar to that of the other transmitters described above. An input signal 2742 is supplied to amplifier 2732. Input signal 2732 is inverted by an inverter 2703 and the output of inverter 2703 is supplied to the input of amplifier 2734. Amplifiers 2732 and 2734 operate on input signals 2742 and 2744 in a manner that would be known to a person skilled in the relevant arts to produce signals at the outputs of amplifiers 2732 and 2734. When switching device 2708 is open, energy is transferred from the outputs of amplifiers 2732 and 2734 to energy storage devices (capacitors) 2704 and 2706. When switching device 2708 is closed, energy storage devices 2704 and 2706 discharge, thereby transferring energy to load impedance 2770. This causes an output signal 2772 (e.g., as shown in FIG. 27E) to be generated across load impedance 2770. Impedance devices 2716 and 2718 operate as AC chokes (filters).

FIGS. 27B-27E are example waveforms that illustrate the operation of transmitter 2702. An information signal 2742 to be up-converted shown in FIG. 27B. As shown in FIG. 27B, information signal 2742 is a series of digital bits (1011). An inverted version of information signal 2742 (i.e., signal 2744) is shown in FIG. 27C.

The operation of switching device 2708 is controlled by control signal 2746. This signal is illustrated in FIG. 27D.

FIG. 27E illustrates the output signal 2772 of transmitter 2702, which is generated across load impedance 2770. The up-converted signal is obtained from the output signal of transmitter 2702 in a manner similar to that described elsewhere herein for a harmonically rich signal.

3.2.4 Other Transmitter Embodiments

The transmitter embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, combinations of modulation techniques in an "I/Q" mode. Such embodiments also include those described in the documents referenced above, such as U.S. patent application Ser. Nos. 09/525,615 and 09/550,644. Such alternate embodiments fall within the scope and spirit of the present invention.

For example, other transmitter embodiments may utilize other modulation techniques. These would be apparent to one skilled in the relevant art(s) based on the teachings disclosed herein, and include, but are not limited to, amplitude modulation (AM), frequency modulation (FM), pulse width modulation, quadrature amplitude modulation (QAM), quadrature phase-shift keying (QPSK), time division multiple access (TDMA), frequency division multiple access (FDMA), code division multiple access (CDMA), embedding two forms of modulation onto a signal for up-conversion, etc., and combinations thereof.

3.3 Transceiver Embodiments

Figure 28:
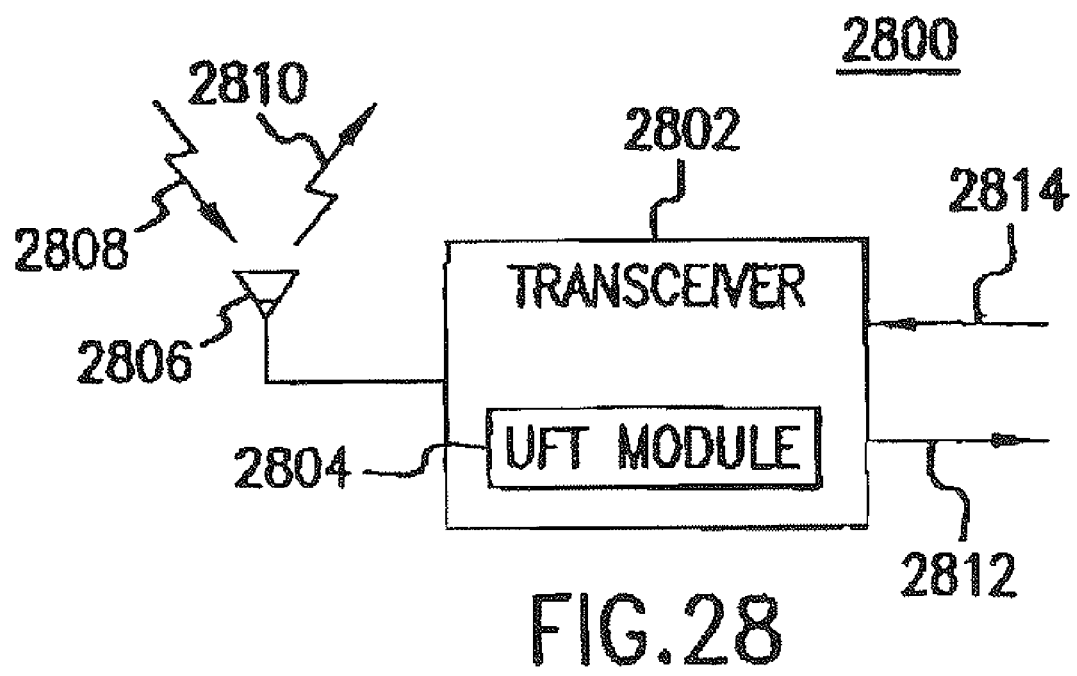
FIG. 28 illustrates a block diagram of a transceiver implementation according to an embodiment of the present invention.

An exemplary embodiment of a transceiver system 2800 of the present invention is illustrated in FIG. 28. Transceiver 2802 frequency down-converts first EM signal 2808 received by antenna 2806, and outputs down-converted baseband signal 2812. Transceiver 2802 comprises at least one UFT module 2804 at least for frequency down-conversion.

Transceiver 2802 inputs baseband signal 2814. Transceiver 2802 frequency up-converts baseband signal 2814. UFT module 2804 provides at least for frequency up-conversion. In alternate embodiments, UFT module 2804 only supports frequency down-conversion, and at least one additional UFT module provides for frequency up-conversion. The up-converted signal is output by transceiver 2802, and transmitted by antenna 2806 as second EM signal 2810.

First and second EM signals 2808 and 2810 may be of substantially the same frequency, or of different frequencies. First and second EM signals 2808 and 2810 may have been modulated using the same technique, or may have been modulated by different techniques.

Further example embodiments of receiver/transmitter systems applicable to the present invention may be found in U.S. Pat. No. 6,091,940 entitled "Method and System for Frequency Up-Conversion," incorporated by reference in its entirety.

These example embodiments and other alternate embodiments (including equivalents, extensions, variations, deviations, etc., of the example embodiments described herein) will be apparent to persons skilled in the relevant art(s) based on the referenced teachings and the teachings contained herein, and are within the scope and spirit of the present invention. The invention is intended and adapted to include such alternate embodiments.

3.3.1 Example Half-Duplex Mode Transceiver

Figure 29:
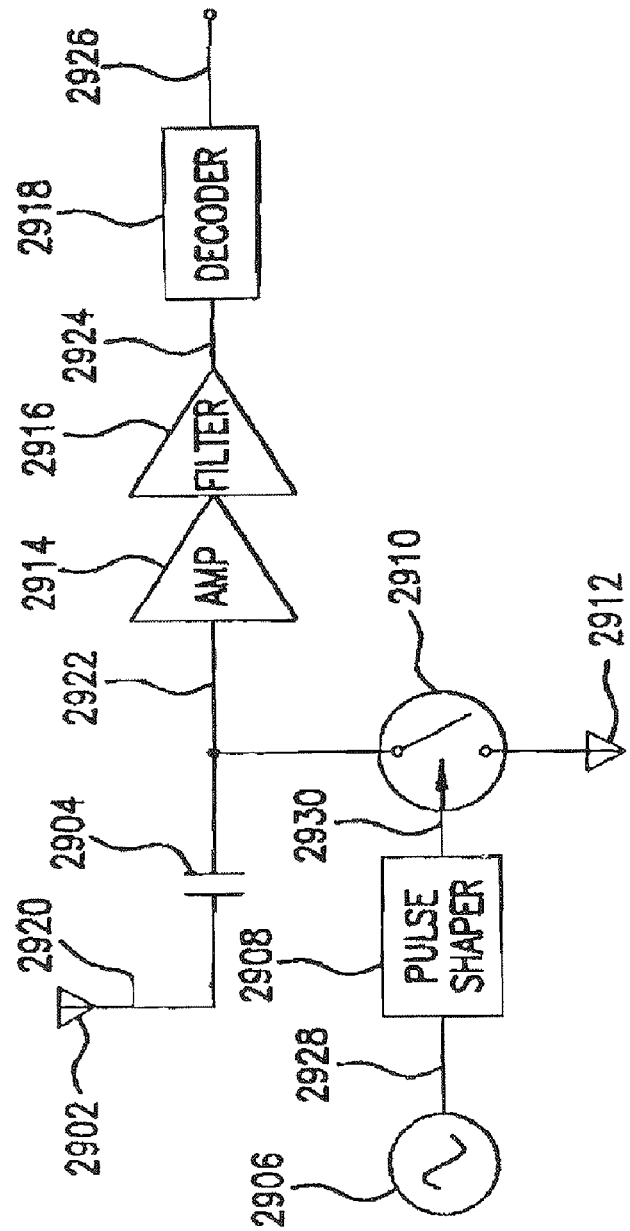
FIG. 29 illustrates an exemplary receiver using UFD conversion techniques according to an embodiment of the present invention.

An exemplary receiver using universal frequency down conversion techniques is shown in FIG. 29 and described below. An antenna 2902 receives an electromagnetic (EM) signal 2920. EM signal 2920 is routed through a capacitor 2904 to a first terminal of a switch 2910. The other terminal of switch 2910 is connected to ground 2912 in this exemplary embodiment. A local oscillator 2906 generates an oscillating signal 2928, which is routed through a pulse shaper 2908. The result is a string of pulses 2930. The selection of the oscillator 2906 and the design of the pulse shaper 2908 control the frequency and pulse width of the string of pulses 2930. The string of pulses 2930 control the opening and closing of switch 2910. As a result of the opening and closing of switch 2910, a down converted signal 2922 results. Down converted signal 2922 is routed through an amplifier 2914 and a filter 2916, and a filtered signal 2924 results. In a preferred embodiment, filtered signal 2924 is at baseband, and a decoder 2918 may only be needed to convert digital to analog or to remove encryption before outputting the baseband information signal. This then is a universal frequency down conversion receiver operating in a direct down conversion mode, in that it receives the EM signal 2920 and down converts it to baseband signal 2926 without requiring an IF or a demodulator. In an alternate embodiment, the filtered signal 2924 may be at an "offset" frequency. That is, it is at an intermediate frequency, similar to that described above for the second IF signal in a typical superheterodyne receiver. In this case, the decoder 2918 would be used to demodulate the filtered signal so that it could output a baseband signal 2926.

Figure 30:
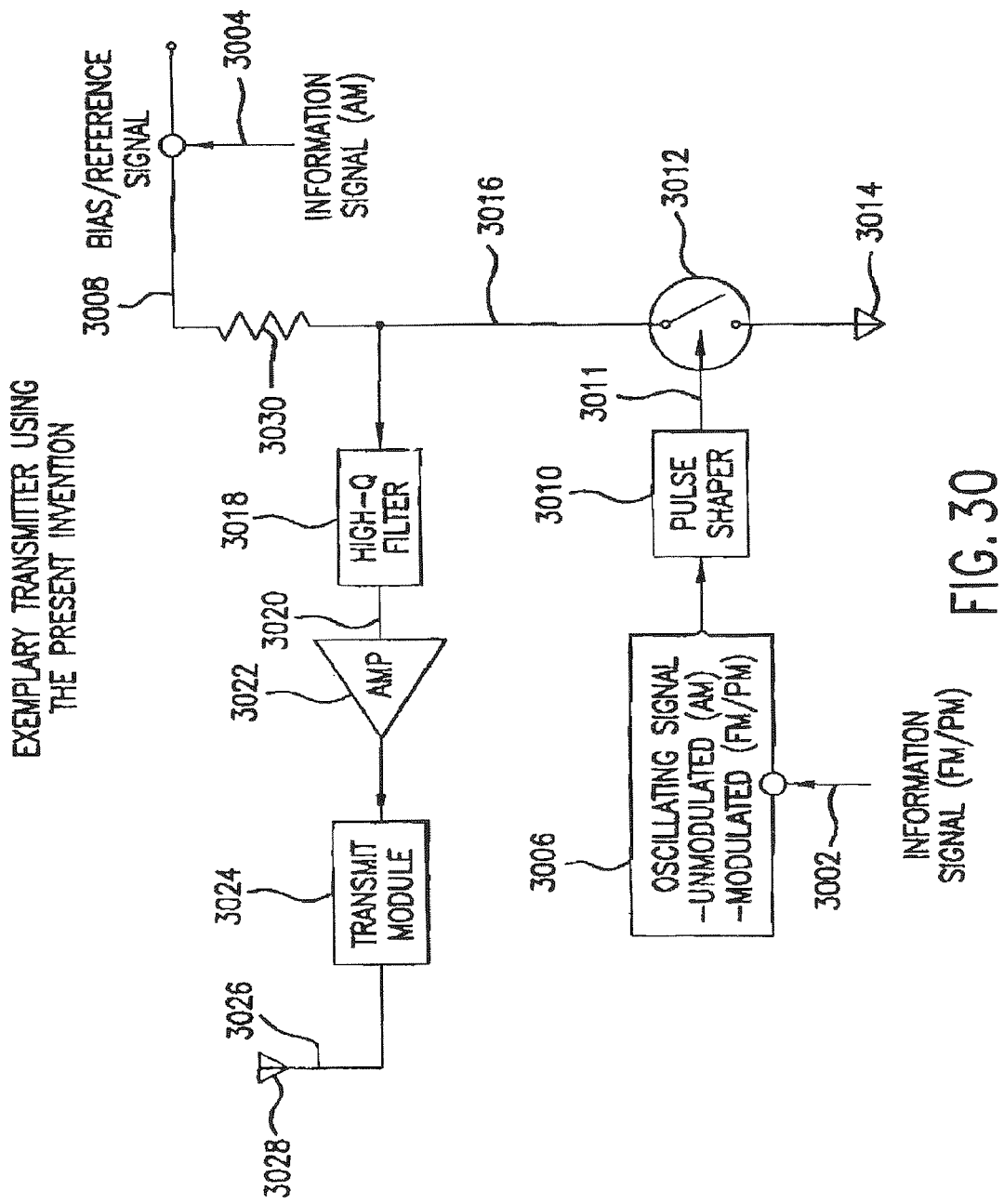
FIG. 30 illustrates an exemplary transmitter according to an embodiment of the present invention.

An exemplary transmitter using the present invention is shown in FIG. 30. In the FM and PM embodiments, an information signal 3002 modulates an oscillating signal 3006 which is routed to a pulse shaping circuit 3010 which outputs a string of pulses 3011. The string of pulses 3011 controls the opening and closing of the switch 3012. One terminal of switch 3012 is connected to ground 3014, and the second terminal of switch 3012 is connected through a resistor 3030 to a bias/reference signal 3008. In some FM and PM modes, bias/reference signal 3008 is preferably a non-varying signal, often referred to simply as the bias signal. In some AM modes, the oscillating signal 3006 is not modulated, and the bias/reference signal 3008 is a function of the information signal 3004. In one embodiment, information signal 3004 is combined with a bias voltage to generate the reference signal 3008. In an alternate embodiment, the information signal 3004 is used without being combined with a bias voltage. Typically, in the AM mode, this bias/reference signal is referred to as the reference signal to distinguish it from the bias signal used in the FM and PM modes. The output of switch 3012 is a harmonically rich signal 3016 which is routed to an optional "high Q" filter which removes the unwanted frequencies that exist as harmonic components of harmonically rich signal 3016. Desired frequency 3020 is optionally amplified by an optional amplifier module 3022 and routed to transmission module 3024, which outputs a transmission signal 3026. Transmission signal is output by antenna 3028 in this embodiment.

Figure 31A:
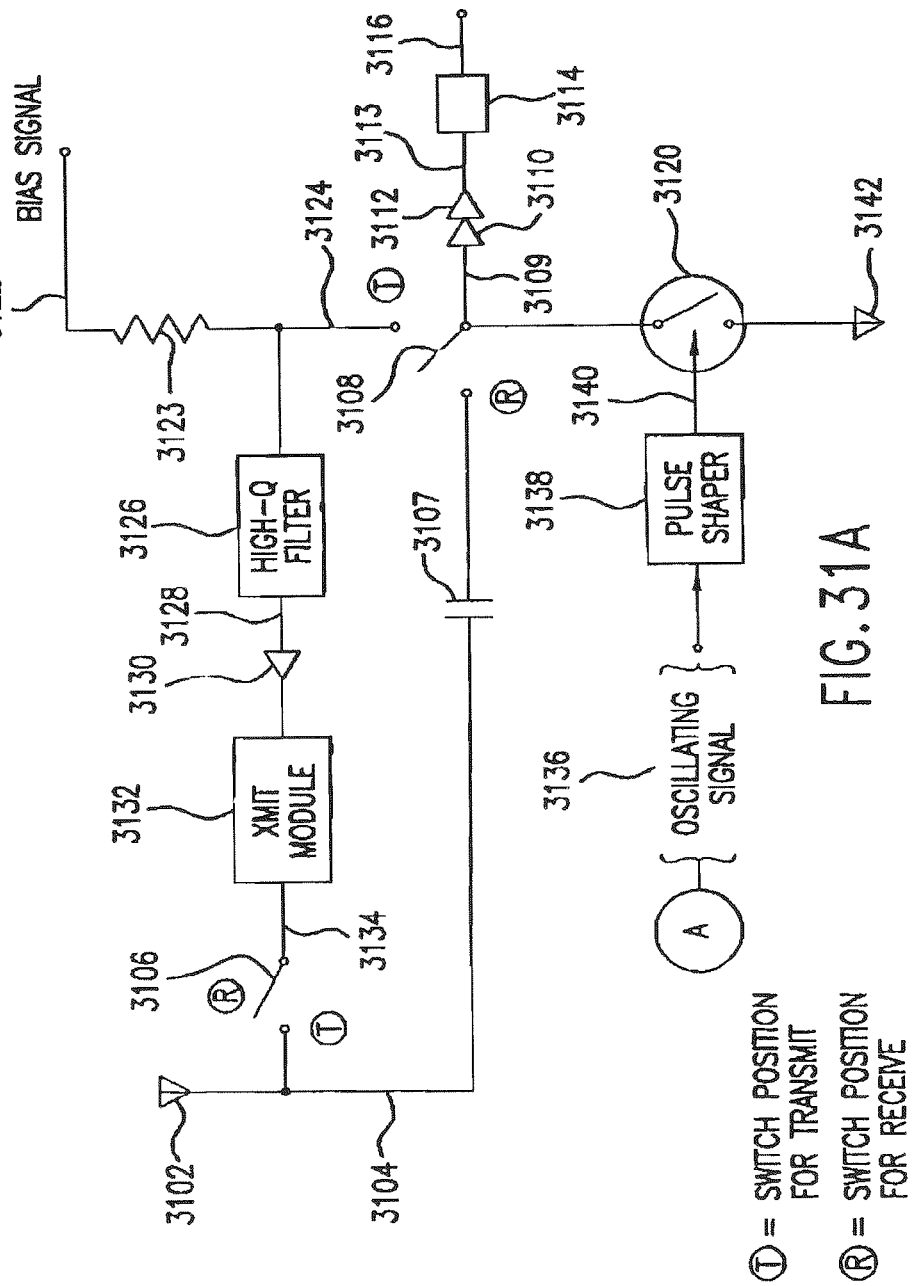
FIGS. 31A, 31B, and 31C illustrate an exemplary transmitter according to an embodiment of the present invention in a transceiver circuit with a universal frequency down conversion receiver operating in a half-duplex mode for an FM and PM modulation embodiment.
Figure 31B:
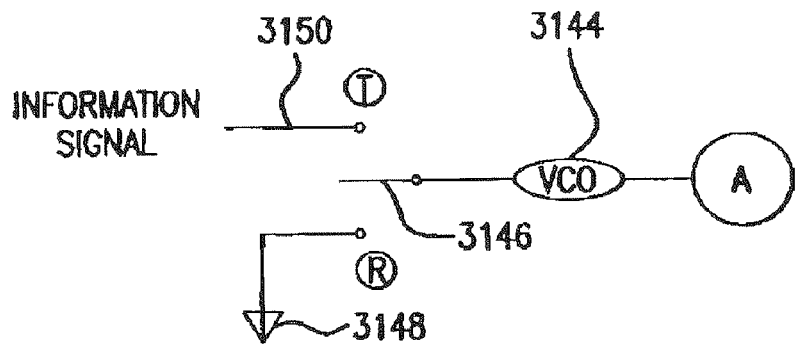
Figure 31C:
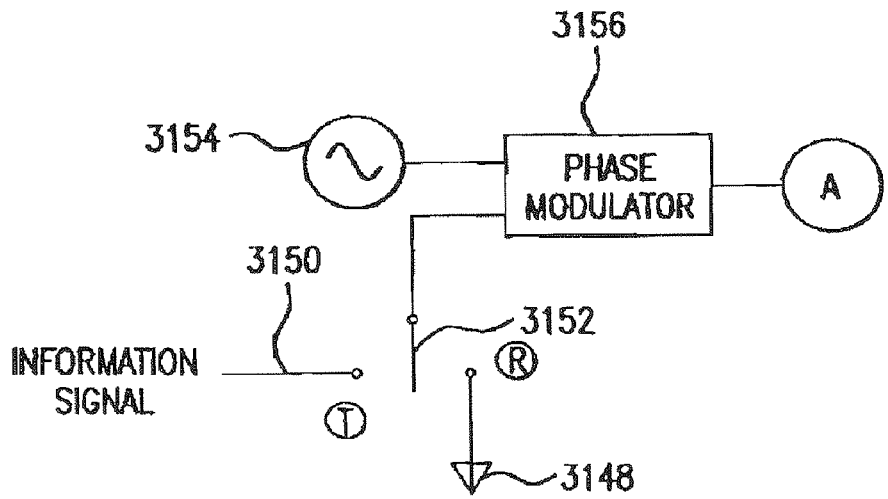

For the FM and PM modulation modes, FIGS. 31A, 31B, and 31C show the combination of the present invention of the transmitter and the universal frequency down-conversion receiver in the half-duplex mode according to an embodiment of the invention. That is, the transceiver can transmit and receive, but it cannot do both simultaneously. It uses a single antenna 3102, a single oscillator 3144/3154 (depending on whether the transmitter is in the FM or PM modulation mode), a single pulse shaper 3138, and a single switch 3120 to transmit and to receive. In the receive function, "Receiver/transmitter" (R/T) switches 3106, 3108, and 3146/3152 (FM or PM) would all be in the receive position, designated by (R). The antenna 3102 receives an EM signal 3104 and routes it through a capacitor 3107. In the FM modulation mode, oscillating signal 3136 is generated by a voltage controlled oscillator (VCO) 3144. Because the transceiver is performing the receive function, switch 3146 connects the input to the VCO 3144 to ground 3148. Thus, VCO 3144 will operate as if it were a simple oscillator. In the PM modulation mode, oscillating signal 3136 is generated by local oscillator 3154, which is routed through phase modulator 3156. Since the transceiver is performing the receive function, switch 3152 is connected to ground 3148, and there is no modulating input to phase modulator. Thus, local oscillator 3154 and phase modulator 3156 operate as if they were a simple oscillator. One skilled in the relevant art(s) will recognize based on the discussion contained herein that there are numerous embodiments wherein an oscillating signal 3136 can be generated to control the switch 3120.

Oscillating signal 3136 is shaped by pulse shaper 3138 to produce a string of pulses 3140. The string of pulses 3140 cause the switch 3120 to open and close. As a result of the switch opening and closing, a down converted signal 3109 is generated. The down converted signal 3109 is optionally amplified and filtered to create a filtered signal 3113. In an embodiment, filtered signal 3113 is at baseband and, as a result of the down conversion, is demodulated. Thus, a decoder 3114 may not be required except to convert digital to analog or to decrypt the filtered signal 3113. In an alternate embodiment, the filtered signal 3113 is at an "offset" frequency, so that the decoder 3114 is needed to demodulate the filtered signal and create a demodulated baseband signal.

When the transceiver is performing the transmit function, the R/T switches 3106, 3108, and 3146/3152 (FM or PM) are in the (T) position. In the FM modulation mode, an information signal 3150 is connected by switch 3146 to VCO 3144 to create a frequency modulated oscillating signal 3136. In the PM modulation mode switch 3152 connects information signal 3150 to the phase modulator 3156 to create a phase modulated oscillating signal 3136. Oscillation signal 3136 is routed through pulse shaper 3138 to create a string of pulses 3140, which in turn cause switch 3120 to open and close. One terminal of switch 3120 is connected to ground 3142 and the other is connected through switch R/T 3108 and resistor 3123 to a bias signal 3122. The result is a harmonically rich signal 3124 which is routed to an optional "high Q" filter 3126 which removes the unwanted frequencies that exist as harmonic components of harmonically rich signal 3124. Desired frequency 3128 is optionally amplified by amplifier module 3130 and routed to transmission module 3132, which outputs a transmission signal 3134. Again, because the transceiver is performing the transmit function, R/T switch 3106 connects the transmission signal to the antenna 3102.

Figure 32:
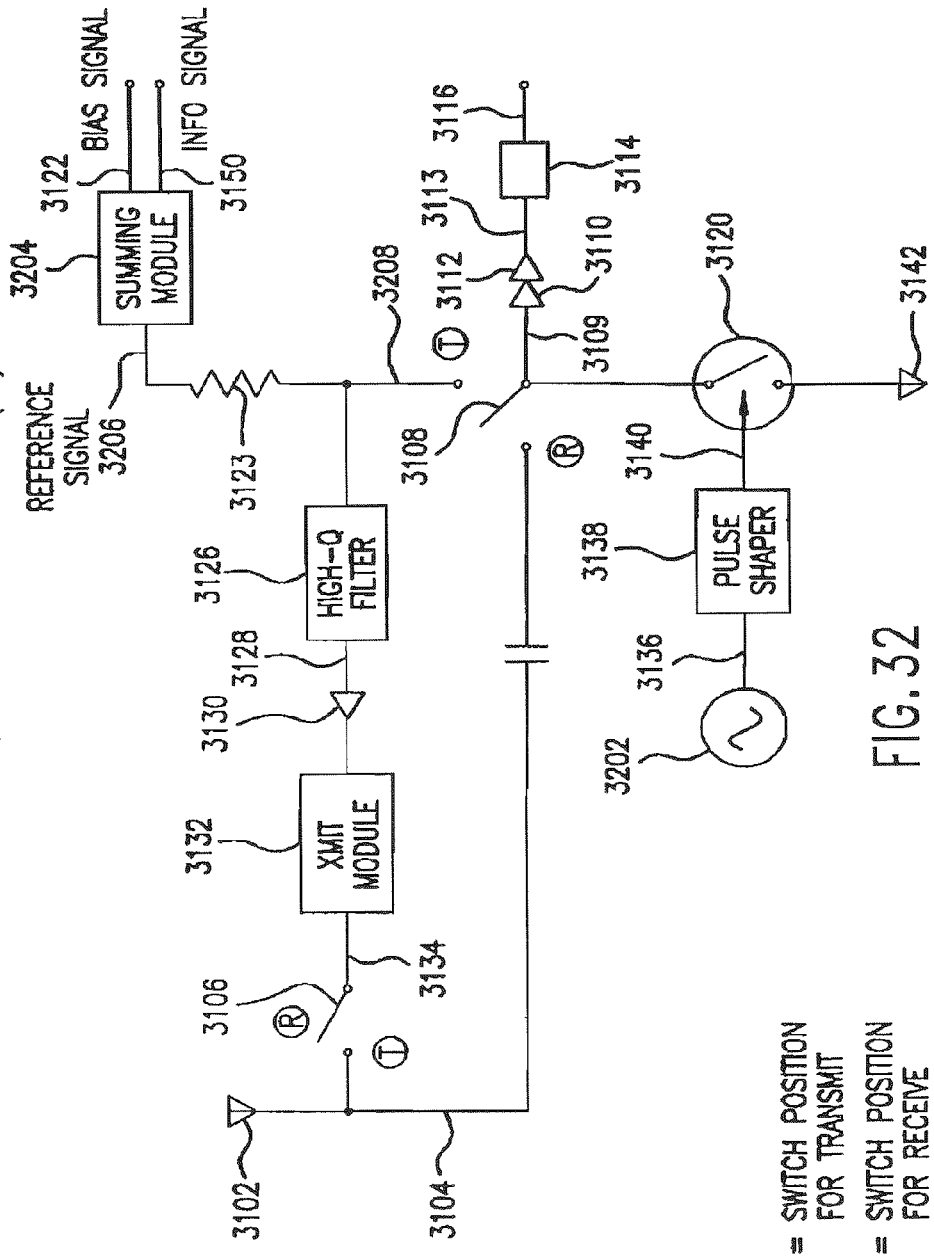
FIG. 32 illustrates an exemplary half-duplex mode transceiver implementation according to an embodiment of the present invention.

In the AM modulation mode, the transceiver operates in the half duplex mode as shown in FIG. 32. The only distinction between this modulation mode and the FM and PM modulation modes described above, is that the oscillating signal 3136 is generated by a local oscillator 3202, and the switch 3120 is connected through the R/T switch 3108 and resistor 3123 to a reference signal 3206. Reference signal 3206 is generated when information signal 3150 and bias signal 3122 are combined by a summing module 3204. It is well known to those skilled in the relevant art(s) that the information signal 3150 may be used as the reference signal 3206 without being combined with the bias signal 3122, and may be connected directly (through resistor 3123 and R/T switch 3108) to the switch 3120.

3.3.2 Example Full-Duplex Mode Transceiver

Figure 33:
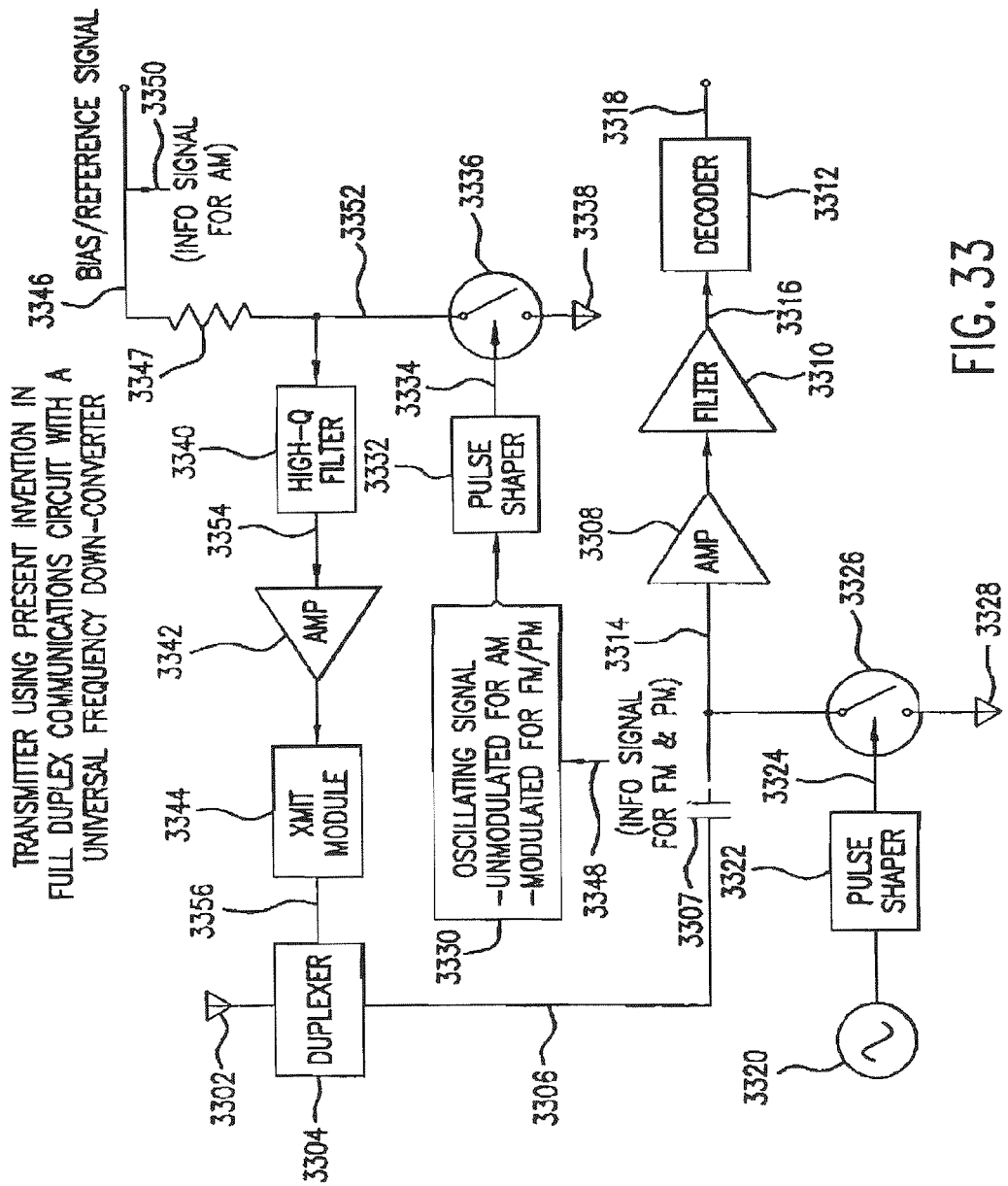
FIG. 33 illustrates an exemplary full-duplex mode transceiver implementation according to an embodiment of the present invention.

The full-duplex mode differs from the half-duplex mode in that the transceiver can transmit and receive simultaneously. Referring to FIG. 33, to achieve this, the transceiver preferably uses a separate circuit for each function. A duplexer 3304 is used in the transceiver to permit the sharing of an antenna 3302 for both the transmit and receive functions.

The receiver function performs as follows. The antenna 3302 receives an EM signal 3306 and routes it through a capacitor 3307 to one terminal of a switch 3326. The other terminal of switch 3326 is connected to ground 3328, and the switch is driven as a result of a string of pulses 3324 created by local oscillator 3320 and pulse shaper 3322. The opening and closing of switch 3326 generates a down converted signal 3314. Down converted signal 3314 is routed through a amplifier 3308 and a filter 3310 to generate filtered signal 3316. Filtered signal 3316 may be at baseband and be demodulated or it may be at an "offset" frequency. If filtered signal 3316 is at an offset frequency, decoder 3312 will demodulate it to create the demodulated baseband signal 3318. In a preferred embodiment, however, the filtered signal 3316 will be a demodulated baseband signal, and decoder 3312 may not be required except to convert digital to analog or to decrypt filtered signal 3316. This receiver portion of the transceiver can operate independently from the transmitter portion of the transceiver.

The transmitter function is performed as follows. In the FM and PM modulation modes, an information signal 3348 modulates an oscillating signal 3330. In the AM modulation mode, the oscillating signal 3330 is not modulated. The oscillating signal is shaped by pulse shaper 3332 and a string of pulses 3334 is created. This string of pulses 3334 causes a switch 3336 to open and close. One terminal of switch 3336 is connected to ground 3338, and the other terminal is connected through a resistor 3347 to a bias/reference signal 3346. In the FM and PM modulation modes, bias/reference signal 3346 is referred to as a bias signal 3346, and it is substantially non-varying. In the AM modulation mode, an information signal 3350 may be combined with the bias signal to create what is referred to as the reference signal 3346. The reference signal 3346 is a function of the information signal 3350. It is well known to those skilled in the relevant art(s) that the information signal 3350 may be used as the bias/reference signal 3346 directly without being summed with a bias signal. A harmonically rich signal 3352 is generated and is filtered by a "high Q" filter 3340, thereby producing a desired signal 3354. The desired signal 3354 is amplified by amplifier 3342 and routed to transmission module 3344. The output of transmission module 3344 is transmission signal 3356. Transmission signal 3356 is routed to duplexer 3304 and then transmitted by antenna 3302. This transmitter portion of the transceiver can operate independently from the receiver portion of the transceiver.

Thus, as described above, the transceiver embodiment the present invention as shown in FIG. 33 can perform full-duplex communications in all modulation modes.

3.3.3 Enhanced Single Switch Transceiver Embodiment

As described herein, one-switch transceiver embodiments of the present invention are enhanced to maximize power transfer and information extraction and transmission. These embodiments are described herein for purposes of illustration, and not limitation. Alternate embodiments (including equivalents, extensions, variations, deviations, etc., of the embodiments described herein), will be apparent to persons skilled in the relevant art(s) based on the teachings contained herein. The invention is intended and adapted to include such alternate embodiments.

Figure 34:
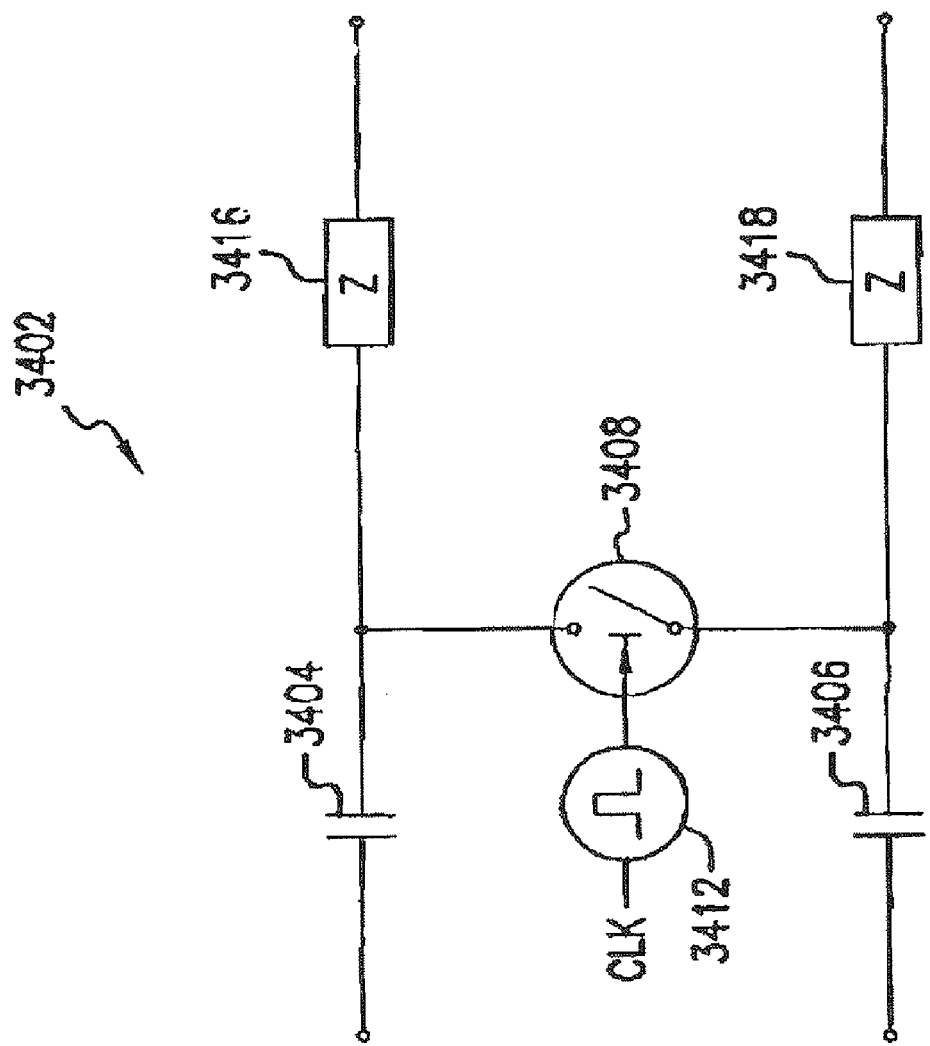
FIG. 34 is an example one-switch transceiver according to an embodiment of the invention.

FIG. 34 is an example one-switch transceiver 3402 according to an embodiment of the invention The operation of this embodiment as a receiver is described above with regard to FIGS. 18A-E. The operation of this embodiment as a transmitter is described above with regard to FIGS. 27A-E. Also described above is a means for coupling receiver and transmitter embodiments of the invention to an antenna. Thus, given the description herein, a person skilled in the relevant arts will understand the operation of transceiver 3402.

3.3.4 Other Embodiments

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention.

4. ENHANCED OPERATING FEATURES OF THE INVENTION

As described herein, embodiments of the present invention have enhanced operating features. These enhanced features enable receivers and transceivers according to the invention to down-convert a modulated carrier signal while extracting power from the carrier signal. This is in contrast to conventional receivers and transceivers, which ideally extract zero power from a received carrier signal (i.e., conventional receivers are typically designed to operate as impulse samplers). These enhanced features of the present invention also enable the linear operating ranges for embodiments of the invention to be extended.

4.1 Enhanced Power and Information Extraction Features

Enhanced features of the invention enable the invention to down-convert a modulated carrier signal while extracting power from the signal. These features are not found in conventional receivers.

Figure 3G:
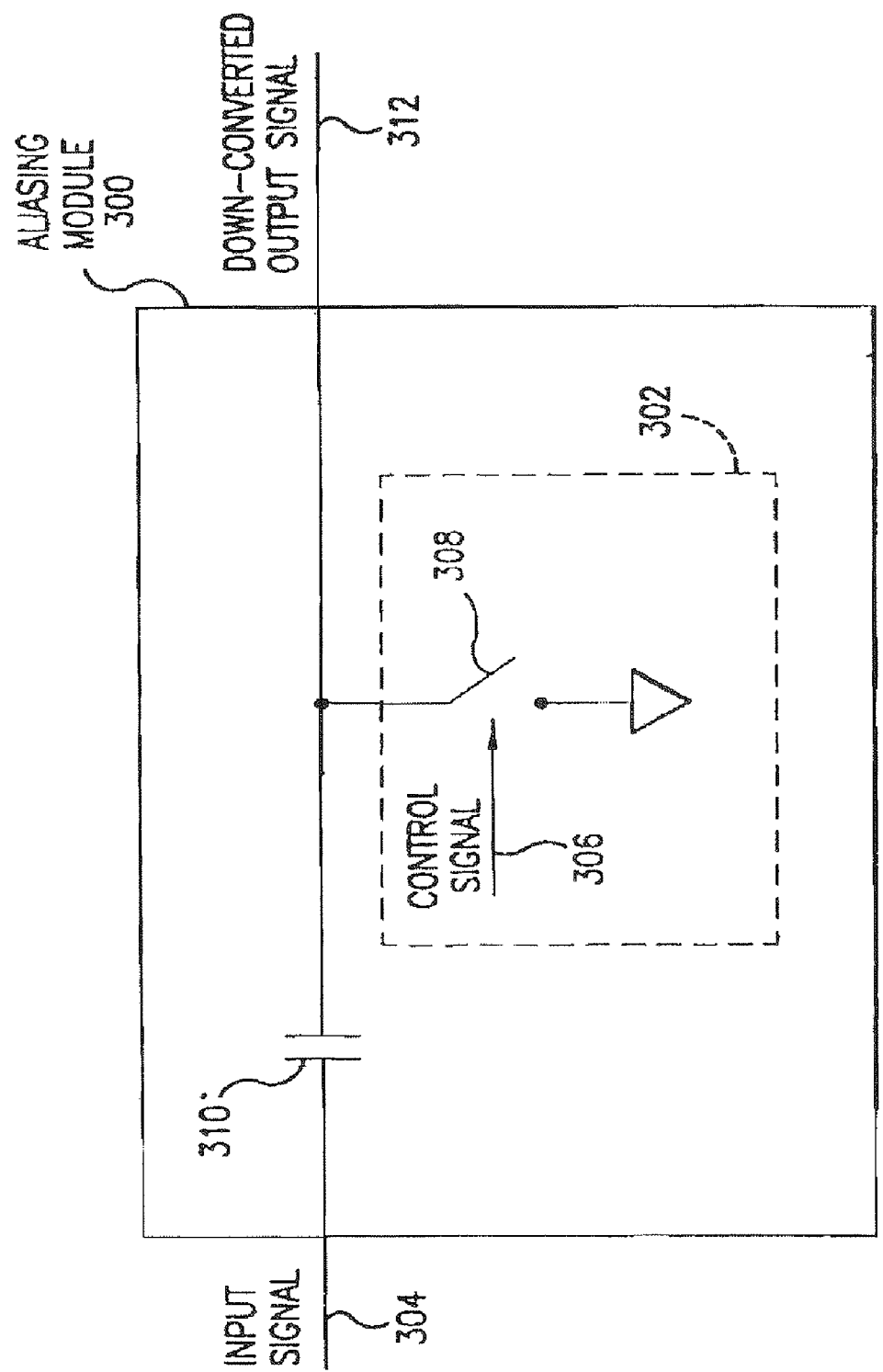

As described herein, embodiments of the invention are implemented using one or more aliasing modules 300 (see for example FIGS. 3A and 3G). Differences between receiver embodiments according to the present invention and conventional receivers are illustrated in FIG. 36-41. For example, consider aliasing module 300 as shown in FIG. 3A. Aliasing module 300 down-converts an input signal 304 to form an output signal 312 as described herein.

FIG. 36 illustrates a modulated carrier signal 3602 that can be down converted using either an aliasing module 300 or a conventional receiver. Signal 3602 has a period of $T_C$.

In this example, to down convert signal 3602 using a conventional receiver, signal 3602 is sampled using a control signal 3702 illustrated in FIG. 37. Control signal 3702 comprises a plurality of sampling impulses 3704. Each impulse 3704 ideally has a zero-width aperture. The sampling period of control signal 3700 must satisfy Nyquests' sampling criteria (i.e., it must be equal to or less than one-half $T_C$).

In contrast to a conventional receiver, to down convert signal 3602 according to the invention, a control signal, for example control signal 3802 shown in FIG. 38, is used. As can be seen in FIG. 38, control signal 3802 comprises sampling apertures having significant width compared to zero-width sampling impulses 3704 of control signal 3702. The width of the sampling apertures of control signal 3802 are $T_A$.

Control signal 3802 is shown having both positive magnitude apertures and negative magnitude apertures. In embodiments of the invention having two aliasing modules 300, the positive magnitude apertures control one aliasing module 300, and the negative magnitude apertures control another aliasing module 300, as described above. For embodiments of the invention having only one aliasing module 300, a control signal having only the positive magnitude apertures or the negative magnitude apertures of control signal 3802 can be used, as described herein. The period of time between two adjacent positive magnitude apertures or two adjacent negative magnitude apertures is $T_D$. As shown in FIG. 38, $T_D$ is greater than $T_C$.

4.2 Charge Transfer and Correlation

Figure 39:
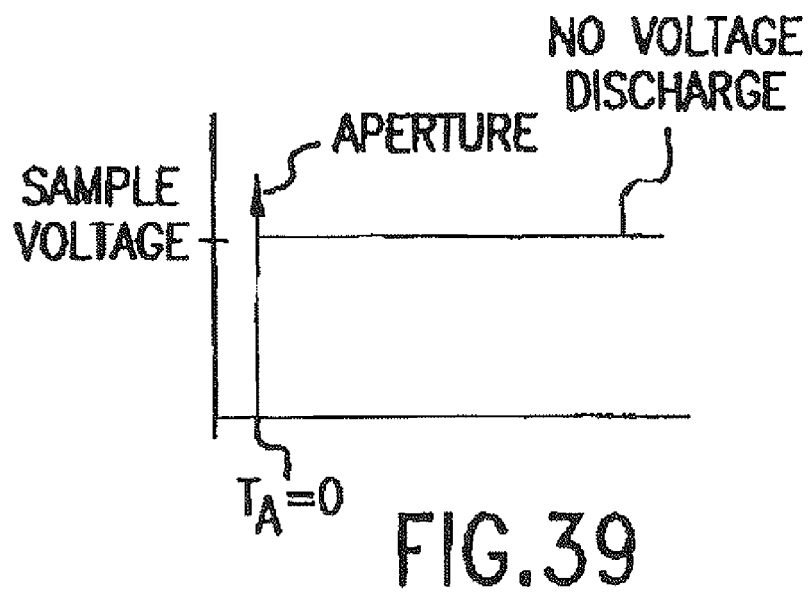
FIG. 39 illustrates an aperture and a voltage signal for a conventional receiver.
Figure 40:
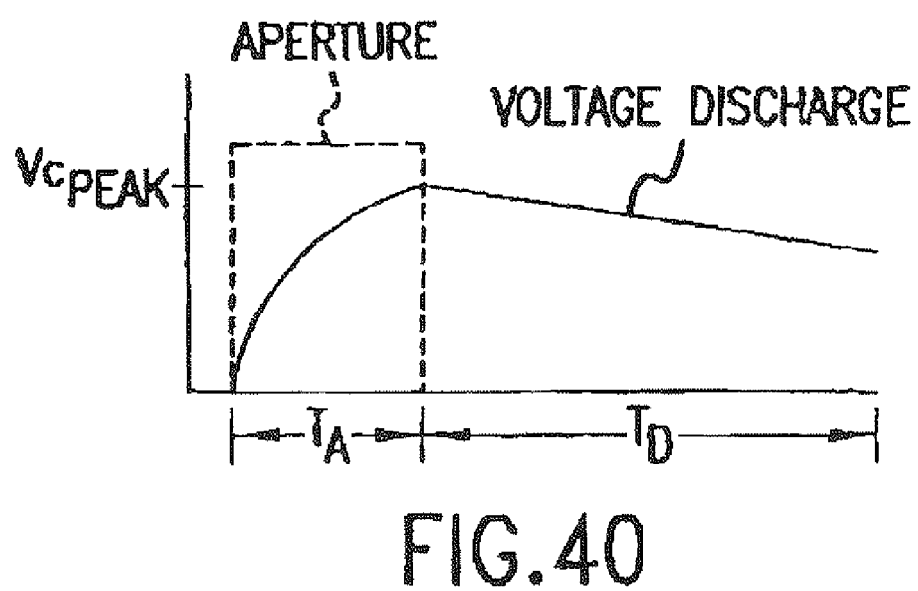
FIG. 40 illustrates an aperture and a voltage signal according to an embodiment of the invention.

The description of the invention that follows teaches one skilled in the relevant arts how to determine a value for one or more capacitors to be used in embodiments of the invention. As described herein, a significant difference between conventional communications systems and the present invention is that conventional communications systems are not intended to transfer non-negligible amounts of energy from a carrier signal to be used in forming a down-converted information signal (i.e., conventional communications system do not exhibit the capacitor discharge feature of the present invention). As illustrated in FIG. 39, the voltage signal across a capacitor, for example, of a conventional sample and hold communications system ideally remains constant (i.e., there is no energy transfer or intended discharge of the charge stored by the capacitor.) In contrast, as illustrated in FIG. 40, and as described herein with regards to embodiments of the invention, energy transfer is a feature of the present invention and capacitors (such as capacitor 310 in FIG. 3A and capacitor 310 in FIG. 3G) used in embodiments of the invention are sized to achieve a percent discharge between apertures of a switching (control) signal.

Figure 41:
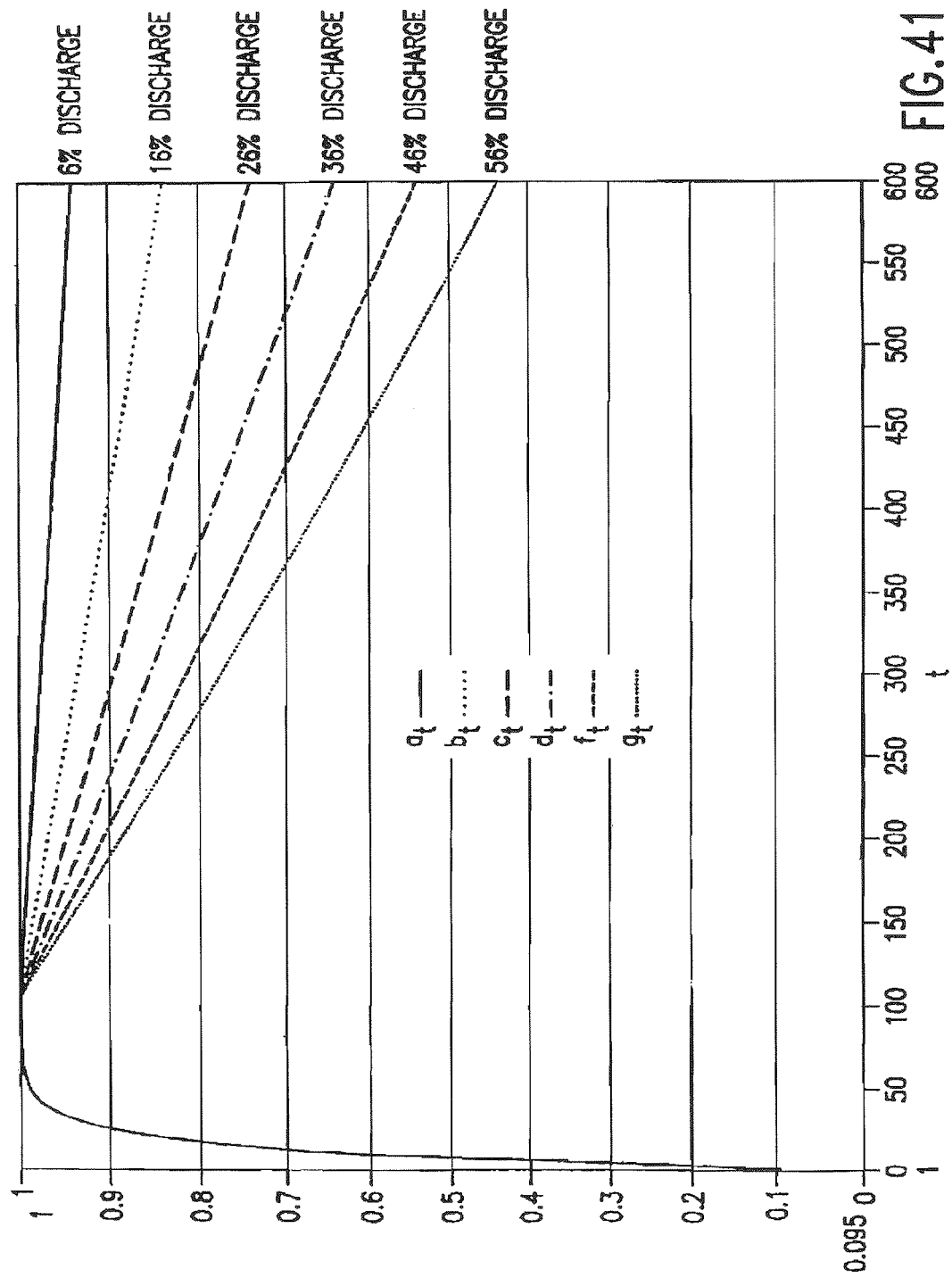
FIG. 41 illustrates voltage signals according to embodiments of the invention.

In embodiments of the invention such as, for example, aliasing modules 300, one or more capacitors are sized to discharge between about six percent to about fifty percent of the total charge stored therein during a period of time that a switching device is open (i.e., between apertures). It is noted that this range is provided for illustrative purposes. Other embodiments of the invention exhibit other discharge percentages. FIG. 41 illustrates the voltage across a capacitor sized according to the invention for different rates of discharge (i.e., charge transfer).

The basic equation for charge transfer is:

$$\frac{dq}{dt} = C\frac{dv}{dt}, \text{ (assuming } C \text{ is constant over time)} \quad \text{EQ. (2)}$$
$$q = CV$$

Similarly the energy u stored by a capacitor can be found from:

$$u = \int_0^q \frac{q_x}{C} dq_x = \frac{q^2}{2C} \quad \text{EQ. (3)}$$

From EQs. (2) and (3):

$$u = \frac{Cv^2}{2} \quad \text{EQ. (4)}$$

Thus, the charge stored by a capacitor is proportional to the voltage across the capacitor, and the energy stored by the capacitor is proportional to the square of the charge or the voltage. Hence, by transferring charge, voltage and energy are also transferred. If little charge is transferred, little energy is transferred, and a proportionally small voltage results unless C is lowered.

The law of conversation of charge is an extension of the law of the conservation of energy. EQ. (2) illustrates that if a finite amount of charge must be transferred in an infinitesimally short amount of time then the voltage, and hence voltage squared, tends toward infinity. Furthermore, $$V_c = \frac{1}{C} \int_0^{T_A} i \, dt \qquad \text{EQ. (5)}$$

This implies an infinite amount of current must be supplied to create the infinite voltage, if $T_A$ is infinitesimally small. As will be understood by a person skilled in the relevant art, such a situation is impractical, especially for a device without gain.

Generally speaking, in radio communications systems, the antenna produces a small amount of power available for the first conversion, even with amplification from an LNA. Hence, if a finite voltage and current restriction do apply to the front end of a radio then a conversion device, which is an impulse sampler, must by definition possess infinite gain. This would not be practical for a switch. What is usually approximated in practice is a fast sample time, charging a small capacitor, then holding the value acquired by a hold amplifier, which preserves the voltage from sample to sample (i.e., a sample and hold system is used).

The analysis that follows shows that given a finite amount of time for energy transfer through a conversion device, the impulse response of the ideal processor, which transfers energy to a capacitor when the input voltage source is a sinusoidal carrier and possesses a finite source impedance, is achieved by embodiments of the present invention. If a significant amount of energy can be transferred in the sampling process, the tolerance on the charging capacitor can be reduced and the requirement for a hold amplifier is significantly reduced or even eliminated.

In embodiments, the maximum amount of energy available over a half sine pulse can be found from:

$$u = \int_0^{T_A} S_i^2(t) \, dt = \frac{A^2 T_A}{2} \; (A^2 \pi / 2 \text{ for } \omega_c = 1) \qquad \text{EQ. (6)}$$

This points to a correlation processor or matched filter processor. If energy is of interest then a useful processor, which transfers all of the half sine energy, is revealed in EQ. (5), where $T_A$ is an aperture equivalent to the half sine pulse. In embodiments, EQ. (6) provides the insight to an enhanced processor.

Consider the following equation sequence:

$$\int_0^\infty h(\tau) S_i(t-\tau) d\tau \Rightarrow \int_0^{T_A} k S_i^2(T_A-\tau) d\tau \Rightarrow \int_{-0}^{T_A} S_i^2(t) dt \qquad \text{EQ. (7)}$$

where $h(\theta) = S_i(T_A - \theta)$ and $t = T_A - \theta$. This is a matched filter equation with the far most right hand side revealing a corr-elator implementation, which is obtained by a change of variables as indicated. Note that the correlator form of the matched filter is a statement of the desired signal energy. Therefore a matched filter/correlator accomplishes acquisition of all the energy available across a finite duration aperture. Such a matched filter/correlator can be implemented as shown in FIG. 54.

Figure 54:
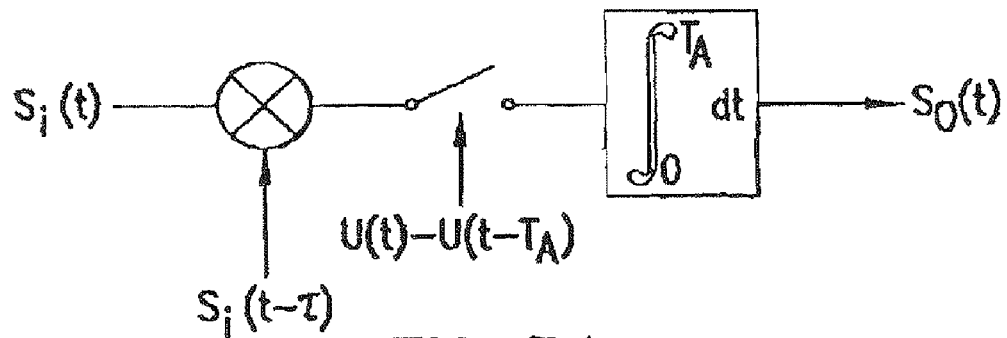
FIGS. 54-56 illustrate example processor embodiments according to the present invention.

In embodiments, when configured for enhanced operation, the example matched filter/correlator of FIG. 54 operates in synchronism with the half sine pulse $S_i(t)$ over the aperture $T_A$. Phase skewing and phase roll will occur for clock frequencies, which are imprecise. Such imprecision can be compensated for by a carrier recovery loop, such as a Costas Loop. A Costas Loop can develop the control for the acquisition clock, which also serves as a sub-harmonic carrier. However, phase skew and non-coherency does not invalidate the enhanced form of the processor provided that the frequency or phase errors are small, relative to $T^{-1}_A$. Non-coherent and differentially coherent processors may extract energy from both I and Q with a complex correlation operation followed by a rectifier or phase calculator. It has been shown that phase skew does not alter the optimum SNR processor formulation. The energy that is not transferred to I is transferred to Q and vice versa when phase skew exists. This is an example processor for a finite duration sample window with finite gain sampling function, where energy or charge is the desired output.

Figure 55:
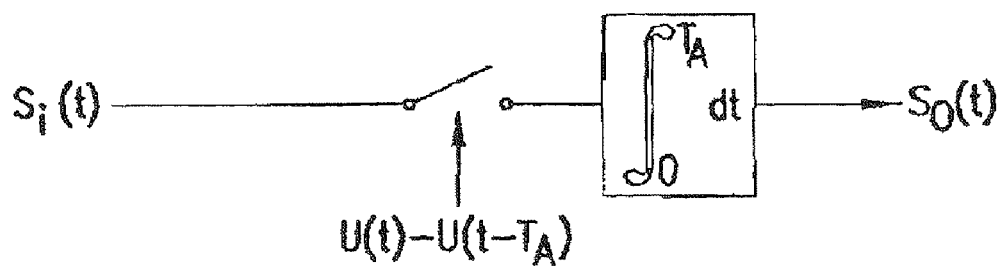

Some matched filter/correlator embodiments according to the present invention might, however, be too expensive and complicated to build for some applications. In such cases, other processes and processors according to embodiments of the invention can be used. The approximation to the matched filter/correlator embodiment shown in FIG. 55 is one embodiment that can be used in such instances. The finite time integrator embodiment of FIG. 55 requires only a switch and an integrator. This embodiment of the present invention has only a 0.91 dB difference in SNR compared to the matched filter/correlator embodiment.

Another low cost and easy to build embodiment of the present invention is an RC processor. This embodiment, shown in FIG. 56, utilizes a low cost integrator or capacitor as a memory across the aperture. If C is suitably chosen for this embodiment, its performance approaches that of the matched filter/correlator embodiment, shown in FIG. 54. Notice the inclusion of the source impedance, R, along with the switch and capacitor. This embodiment nevertheless can approximate the energy transfer of the matched filter/correlator embodiment.

Figure 56:
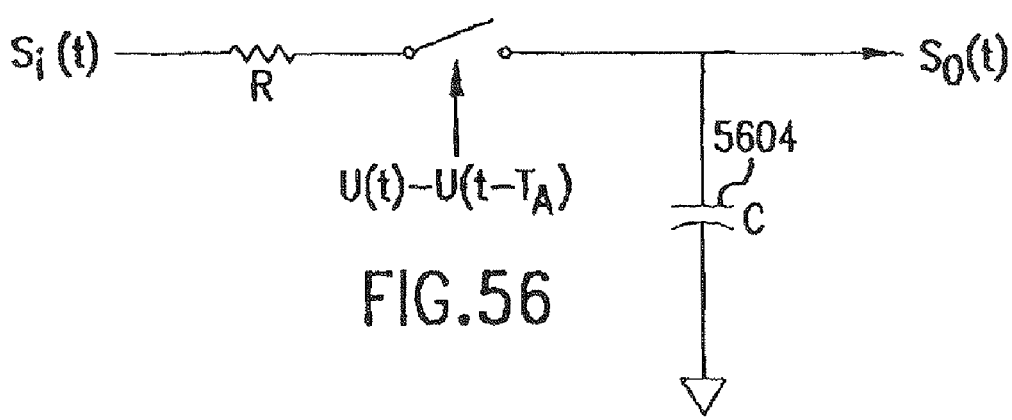

When maximum charge is transferred, the voltage across the capacitor 5604 in FIG. 56 is maximized over the aperture period for a specific RC combination.

Using EQs. (2) and (5) yields:

$$q = C \cdot \frac{1}{C} \int_0^{T_A} i_c \, dt \qquad \text{EQ. (8)}$$

If it is accepted that an infinite amplitude impulse with zero time duration is not available or practical, due to physical parameters of capacitors like ESR, inductance and breakdown voltages, as well as currents, then EQ. (8) reveals the following important considerations for embodiments of the invention:

The transferred charge, q, is influenced by the amount of time available for transferring the charge;

The transferred charge, q, is proportional to the current available for charging the energy storage device; and Maximization of charge, q, is a function of $i_c$, C, and $T_A$.

Therefore, it can be shown that for embodiments:

$$q_{max} = C v_{max} = C \left[ \frac{1}{C} \int_0^{T_A} i_c \, dt \right]_{max} \qquad \text{EQ. (9)}$$

The impulse response for the RC processing network is;

$$h(t) = \frac{e^{\frac{-\tau}{RC}}}{RC}[u(\tau) - u(\tau - T_A)] \qquad \text{EQ. (10)}$$

Suppose that $T_A$ is constrained to be less than or equal to ½ cycle of the carrier period. Then, for a synchronous forcing function, the voltage across a capacitor is given by EQ. (11).

$$V_0(t) = \int_{-\infty}^{t} \sin(\pi f_A \tau) \cdot \frac{e^{\frac{-(t-\tau)}{RC}}}{RC} d\tau \qquad \text{EQ. (11)}$$

Maximizing the charge, q, requires maximizing $V_0(t)$ with respect to t and β.

$$\frac{\partial^2 V_0(t)}{\partial t \partial \beta} = 0 \qquad \text{EQ. (12)}$$

It is easier, however, to set R=1, $T_A$=1, A=1, $f_A = T_A^{-1}$ and then calculate q=c$V_0$ from the previous equations by recognizing that $$q = \frac{\beta^{-1}}{R} V_0 = cV_0,$$

which produces a normalized response.

Figure 57:
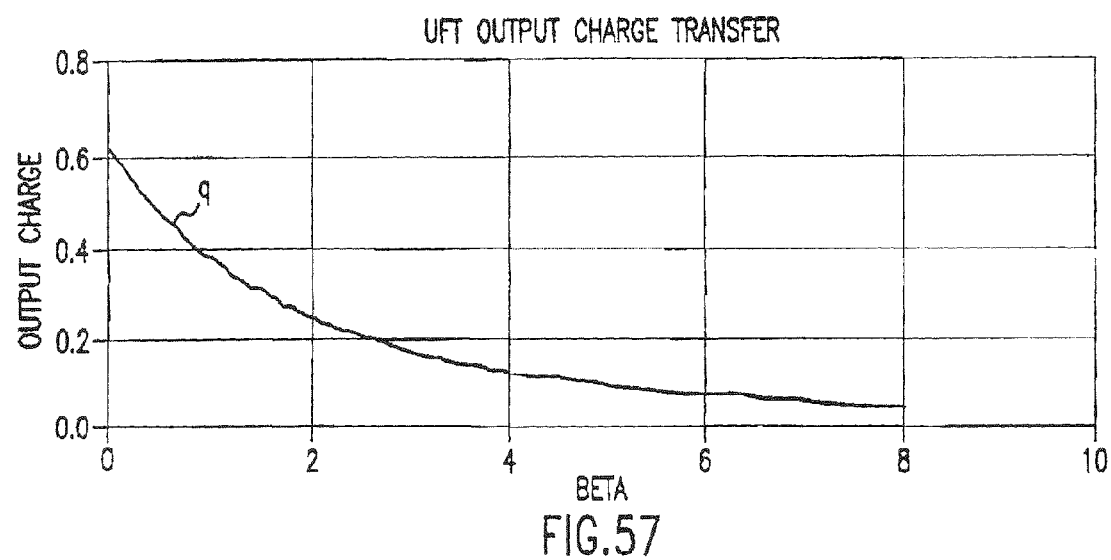
FIG. 57 illustrates the relationship between beta and the output charge of a processor according to an embodiment of the present invention.

FIG. 57 illustrates that increasing C is preferred in various embodiments of the invention. It can be seen in FIG. 57 that as C increases (i.e., as ∃ decreases) the charge transfer also increases. This is what is to be expected based on the optimum SNR solution. Hence, for embodiments of the present invention, an optimal SNR design results in optimal charge transfer. As C is increased, bandwidth considerations should be taken into account.

In embodiments, EQ. (6) establishes $T_A$ as the entire half sine for an optimal processor. However, in embodiments, optimizing jointly for t and β reveals that the RC processor response creates an output across the energy storage capacitor that peaks for $t_{max} \cong 0.75 T_A$, and $\beta_{max} \cong 2.6$, when the forcing function to the network is a half sine pulse.

In embodiments, if the capacitor of the RC processor embodiment is replaced by an ideal integrator then $t_{max} \to T_A$.

$$\beta T_A \cong 1.95 \qquad \text{EQ. (13)}$$

where $\exists = (RC)^{-1}$

For example, for a 2.45 GHz signal and a source impedance of 50Ω, EQ. (13) above suggests the use of a capacitor of ≅2 pf. This is the value of capacitor for the aperture selected, which permits the optimum voltage peak for a single pulse accumulation. For practical realization of some embodiments of the present invention, the capacitance calculated by EQ. (13) is a minimum capacitance. SNR is not considered optimized at $\beta T_A \cong 1.95$. A smaller β yields better SNR and better charge transfer. In embodiments, it turns out that charge can also be enhanced if multiple apertures are used for collecting the charge.

In embodiments, for the ideal matched filter/correlator approximation, $\beta T_A$ is constant and equivalent for both consideration of enhanced SNR and enhanced charge transfer, and charge is accumulated over many apertures for most practical designs. Consider the following example, β=0.25, and $T_A$=1. Thus $\beta T_A$=0.25. At 2.45 GHz, with R=50Ω, C can be calculated from:

$$C \geq \frac{T_A}{R(.25)} \geq 16.3 \text{ pf} \qquad \text{EQ. (14)}$$

The charge accumulates over several apertures, and SNR is simultaneously enhanced melding the best of two features of the present invention. Checking CV for $\beta T_A \cong 1.95$ vs. $\beta T_A$=0.25 confirms that charge is enhanced for the latter.

4.3 Load Resistor Consideration

Figure 58:
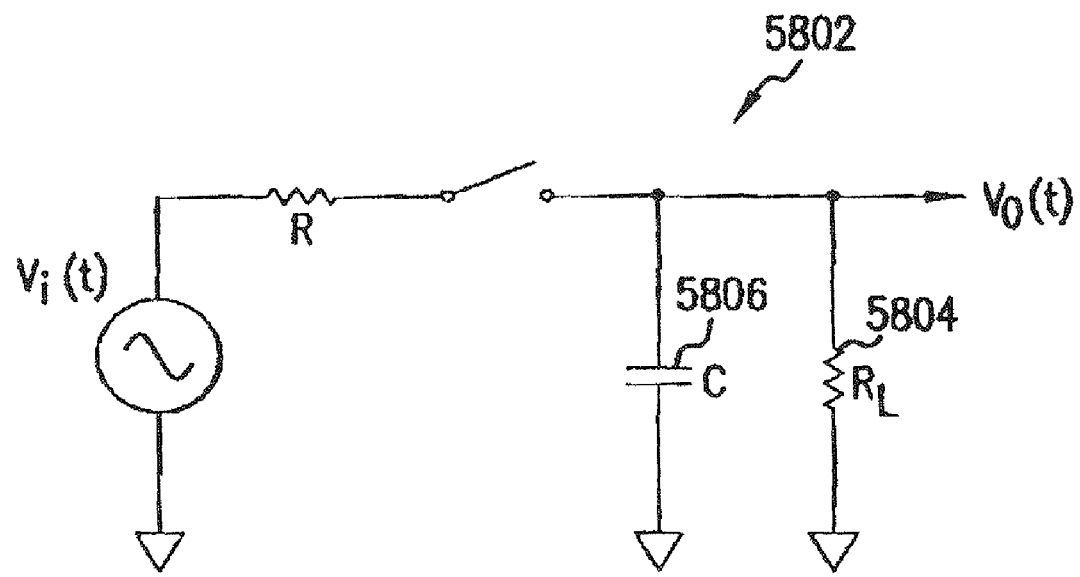
FIG. 58 illustrates an RC processor according to an embodiment of the present invention coupled to a load resistance.

FIG. 58 illustrates an example RC processor embodiment 5802 of the present invention having a load resistance 5804 across a capacitance 5806. As will be apparent to a person skilled in the relevant arts given the description of the invention herein, RC processor 5802 is similar to an aliasing module and/or an energy transfer module according to the invention.

The transfer function of An RC processing embodiment 5802 of the invention (without initial conditions) can be represented by the following equations:

$$H(s) = \frac{1 - e^{-sT_A}}{s}\left(\frac{1}{sCR + k}\right) \qquad \text{EQ. (15)}$$

$$k = \left(\frac{R}{R_L} + 1\right) \qquad \text{EQ. (16)}$$

$$h(t) = \left(\frac{e^{-\frac{t \cdot k}{RC}}}{RC}\right)[u(t) - (t - T_A)] \qquad \text{EQ. (17)}$$

From the equations, it can be seen that $R_L$ 5804, and therefore k, accelerate the exponential decay cycle.

$$V_0(t) = \int_{-\infty}^{t} \sin(\pi f_a \tau) \cdot \frac{e^{-\frac{k(t-\tau)}{RC}}}{RC} d\tau \qquad \text{EQ. (18)}$$

$$V_0(t) = \qquad \text{EQ. (19)}$$
$$\left(\frac{1}{k^2 + (\pi f_A)^2}\right)\left[k \cdot \sin(\pi f_A t) - \pi f_A RC \cdot \cos(\pi f_A t) + RCe^{-\frac{kt}{RC}}\right]$$
$$0 \leq t \leq T_A$$

This result is valid over the acquisition aperture. After the switch is opened, the final voltage that occurred at the sampling instance $t \cong T_A$ becomes an initial condition for a discharge cycle across $R_L$ 5804. The discharge cycle possesses the following response:

$$V_D = \frac{V_A \cdot e^{-\frac{t}{R_L C}}}{R_L C} u(t - T_A) \text{ (single event discharge)} \qquad \text{EQ. (20)}$$

$V_A$ is defined as $V_0(t \cong T_A)$. Of course, if the capacitor 5806 does not completely discharge, there is an initial condition present for the next acquisition cycle.

Figure 59:
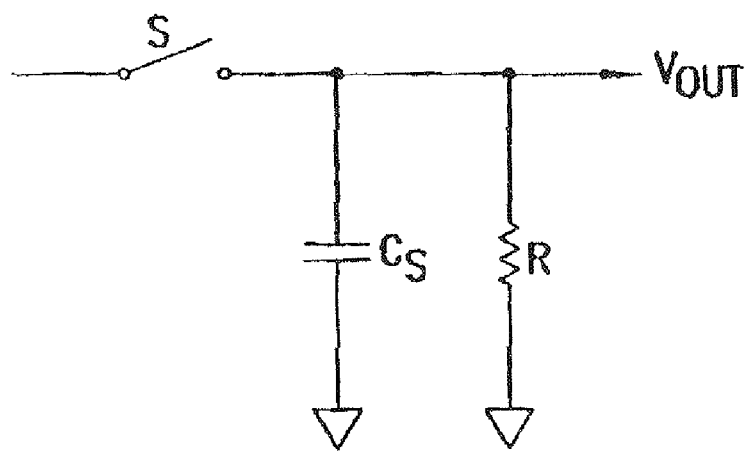
FIG. 59 illustrates an example implementation of the present invention.
Figure 60:
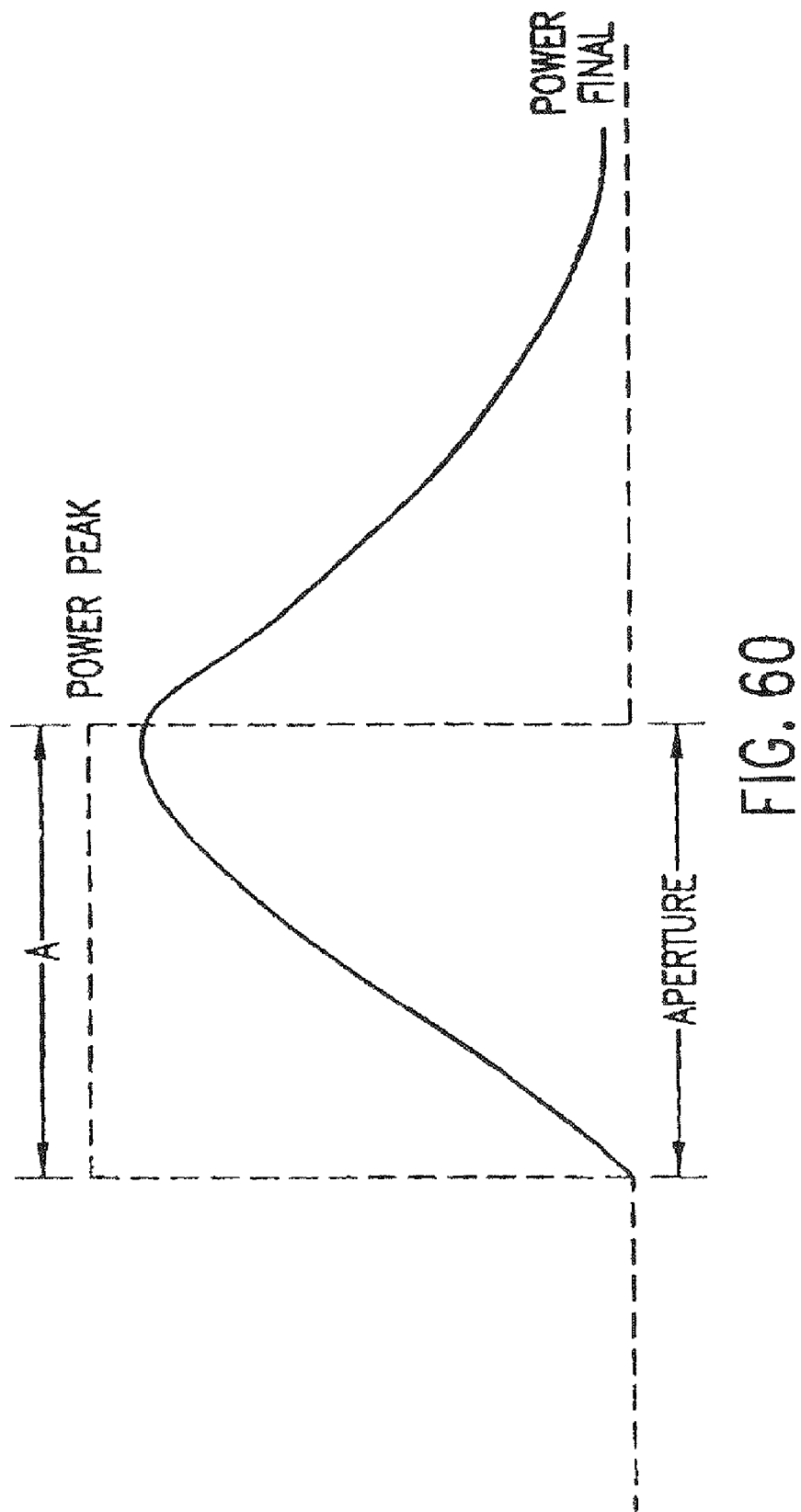
FIG. 60 illustrates an example charge/discharge timing diagram according to an embodiment of the present invention.
Figure 61:
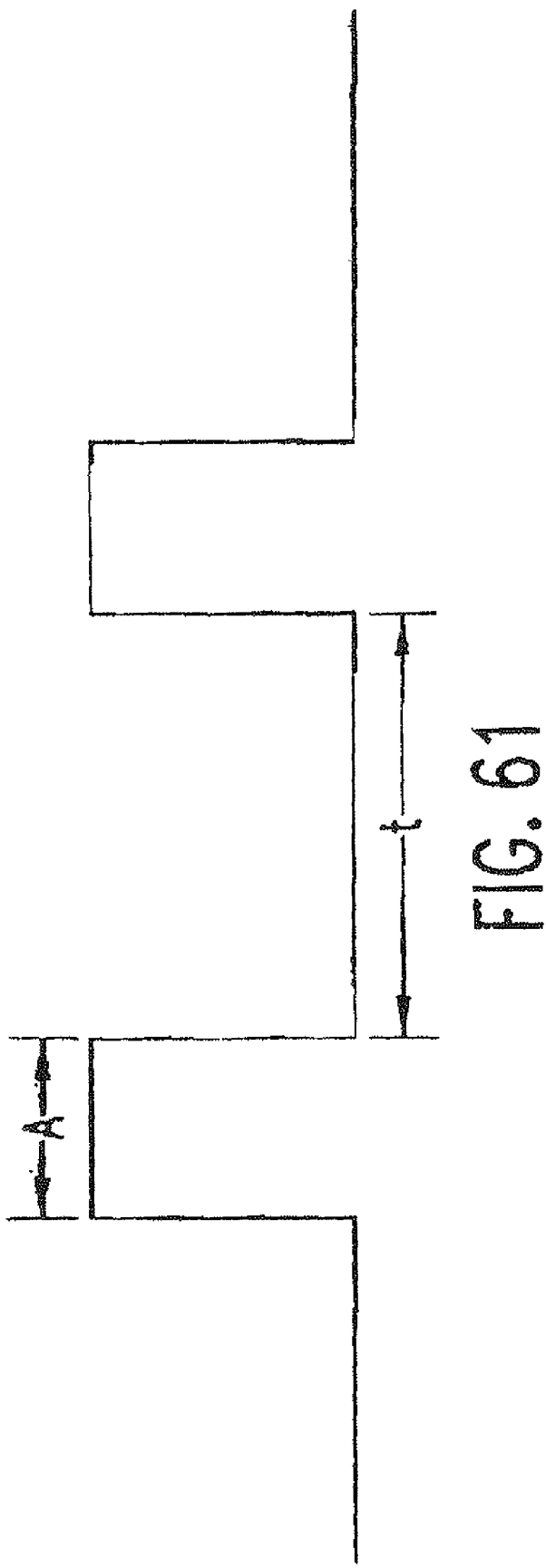
FIG. 61 illustrates example energy transfer pulses (control signal) according to an embodiment of the present invention.

FIG. 59 illustrates an example implementation of the invention, modeled as a switch S, a capacitor $C_S$, and a load resistance R. FIG. 61 illustrates example energy transfer pulses, having apertures A, for controlling the switch S. FIG. 60 illustrates an example charge/discharge timing diagram for the capacitor $C_S$, where the capacitor $C_S$ charges during the apertures A, and discharges between the apertures A.

Equations (21) through (35) derive a relationship between the capacitance of the capacitor $C_S$ ($C_S(R)$), the resistance of the resistor R, the duration of the aperture A (aperture width), and the frequency of the energy transfer pulses (freq LO) in embodiments of the invention. EQ. (31) illustrates that in an embodiment optimum energy transfer occurs when x=0.841 (i.e., in this example, the voltage on the capacitor at the start of the next aperture (charging period) is about 84.1 percent of the voltage on the capacitor at the end of the preceding aperture (charging period)). Based on the disclosure herein, one skilled in the relevant art(s) will realize that values other that 0.841 can be utilized (See, for example, FIG. 41).

$$\phi = \frac{1}{C}\int i(t)\partial t + Ri(t) \quad \text{EQ. (21)}$$

$$\frac{\partial}{\partial t}\phi = \frac{\partial}{\partial t}\left[\frac{1}{C}\int i(t)\partial t + Ri(t)\right] \quad \text{EQ. (22)}$$

$$\phi = \frac{i(t)}{C_s} + \frac{R\partial i(t)}{\partial t} \quad \text{EQ. (23)}$$

$$\phi = \frac{1}{C_s} + R \cdot s \quad \text{EQ. (24)}$$

$$s = \frac{-1}{C_s \cdot R}, \text{ by definition } t_{init}(t) = \frac{V_{C_s}init}{R} \quad \text{EQ. (25)}$$

$$i(t) = \left(\frac{V_{C_s}init}{R}\right) \cdot e^{\left(\frac{-t}{C_s \cdot R}\right)} \quad \text{EQ. (26)}$$

$$V_{out}(t) = R \cdot i(t) = V_{C_s}init \cdot e^{\left(\frac{-t}{C_s \cdot R}\right)} \quad \text{EQ. (27)}$$

Maximum power transfer occurs when:

$$\text{Power\_Final} = \frac{1}{\sqrt{2}} \cdot \text{Peak\_Power} \quad \text{EQ. (28)}$$

$$\text{Power\_Peak} = \frac{(V_{C_s}peak)^2}{R} \quad \text{EQ. (29)}$$

$$\text{Power\_Final} = \frac{(x \cdot V_{C_s}peak)^2}{R} \quad \text{EQ. (30)}$$

Using substitution:

$$\frac{(x \cdot V_{C_s}peak)^2}{R} = \frac{(V_{C_s}peak)^2}{R} \cdot \frac{1}{\sqrt{2}} \quad \text{EQ. (31)}$$

Solving for "x" yields: x=0.841.
Letting $V_{C_s}init=1$ yields $V_{out}(t)=0.841$ when $$t = \frac{1}{freqLO} - \text{Aperture\_Width} \quad \text{EQ. (32)}$$

Using substitution again yields:

$$0.841 = 1 \cdot e^{\left(\frac{\frac{1}{freqLO} - \text{Aperture\_Width}}{C_s \cdot R}\right)} \quad \text{EQ. (33)}$$

$$\ln(0.841) = \left(\frac{\frac{1}{freqLO} - \text{Aperture\_Width}}{C_s \cdot R}\right) \quad \text{EQ. (34)}$$

This leads to the following EQ. (35) for selecting a capacitance.

$$C_s(R) = \left(\frac{\frac{1}{freqLO} - \text{Aperture\_Width}}{-\ln(0.841) \cdot R}\right) \quad \text{EQ. (35)}$$

The following equation according to the invention can be solved to find an expression for the energy accumulated over a bit time, Eb, as shown below.

$$D = \int_0^{T_A}(u(t) - u(t - T_A)) \cdot A\sin(2\pi ft + \theta)dt \quad \text{EQ. (36)}$$

$$D = A\cos(\theta) \cdot \frac{(-\cos(2\pi ft))}{(2\pi)f} \text{ (Evaluated from 0 to } T_A) \quad \text{EQ. (37)}$$

where $u(t)$, $u(t-T_A)$, and A are in volts, and D is expressed in Volts*Volts/Hz.

Realizing the f equals 1/t, D can be written as:

$$D = A\cos(\theta) \cdot \frac{(-\cos(2\pi ft)t)}{(2\pi)} \quad \text{EQ. (38)}$$

where D is now expressed in volts*volts*seconds.

Dividing D by the complex impedance Z of an RC processor according to the invention, when the switch (aperture) is closed, results in:

$$\frac{D}{Z} = A\cos(\theta) \cdot \frac{(-\cos(2\pi ft)t)}{(2\pi)Z} \text{ (Evaluated from 0 to } T_A) \quad \text{EQ. (39)}$$

Since (volts*volts)/Z equals power, and since power equals joules/second, D/Z has units of (joules/second)/second. Thus, D/Z is the amount of energy accumulated over a bit time (Eb).

A more useful expression for the energy accumulated over a bit time (Eb) is:

$$E_b = \sum_{n=1}^{aperturerep\_per\_bit} A_n \cdot \cos(\theta_n)\left(\frac{-\cos(2\pi ft)t}{2\pi Z_n}\right) \quad \text{EQ. (40)}$$

(Evaluated from 0 to $T_A$)

where Eb is expressed in joules per bit.

Referring to the following equation, from above, it can be seen that there is a 2 Bf term in the denominator.

$$D = A \cdot \cos(\phi) \cdot \frac{(-\cos(2 \cdot \pi \cdot f \cdot t))}{(2 \cdot \pi) \cdot f} \quad \text{EQ. (41)}$$

Analysis reveals that this term, and other terms, have physical units that allow a person skilled in the relevant art, given the discussion herein, to understand and relate the resultant quantity in a manner consistent with actual measurements of implementations of the present invention.

Note that as the aperture time Ta becomes smaller, the absolute value of the energy accumulated over a single aperture period is less. However, what is equally important is the fact that the energy continues to accumulate over multiple aperture periods. The number of aperture periods required to reach an optimum value is dependent on two factors: (1) the aperture period, and (2) the complex impedance (Z) of C and R when the switch is closed, as described elsewhere herein. The values of C and R can, therefore, be selected to optimize the energy transfer during the half sine sample period. By including the Z term in the equation, a person skilled in the relevant art can calculate the Energy per Bit (i.e., Eb) directly and relate the results back to embodiments of the present invention, e.g., hardware performance. This analysis can also be used to show that the optimum system performance in terms of bandwidth and power transfer occurs when the aperture period is equal to one-half of a carrier frequency cycle.

4.4 Enhancing the Linear Operating Features of Embodiments of the Invention

The analysis and description that follow explain how to enhance the linearity of embodiments of the invention. As described herein, embodiments of the present invention provide exceptional linearity per milliwatt. For example, rail to rail dynamic range is possible with minimal increase in power. In an example integrated circuit embodiment, the present invention provides +55 dmb IP2, +15 dbm IP3, @ 3.3V, 4.4 ma, −15 dmb LO. GSM system requirements are +22 dbm IP2, −10.5 dmb IP3. CDMA system requirements are +50 dmb IP2, +10 dbm IP3.

As described herein, embodiments of the invention can be implemented using MOSFETs (although the invention is not limited to this example). Thus, for purposes of analysis, it is assumed that an embodiment of the invention is implemented using one or more enhancement MOSFETs having the following parameter:

a channel width (W) equal to 400 microns;
a channel length (L) of 0.5 microns;
a threshold voltage (Vt) equal to 2 volts; and
a k value equal to 0.003 (W/L), or k equal to 0.24.

The drain current ($I_D$) for an N-Channel Enhancement MOSFET is given by the following 2nd order equation:

$$i_D(v_{GS}, v_{DS}) := \begin{cases} K \cdot [2 \cdot (v_{GS} - V_t) \cdot v_{DS} - v_{DS}^2] & \text{if } v_{DS} \leq v_{GS} - V_t \\ [K \cdot (v_{GS} - V_t)^2] & \text{otherwise} \end{cases} \quad \text{EQ. (42)}$$

Note that since EQ. 42 is only a second order equation, we analyze second order distortion.

Figure 42:
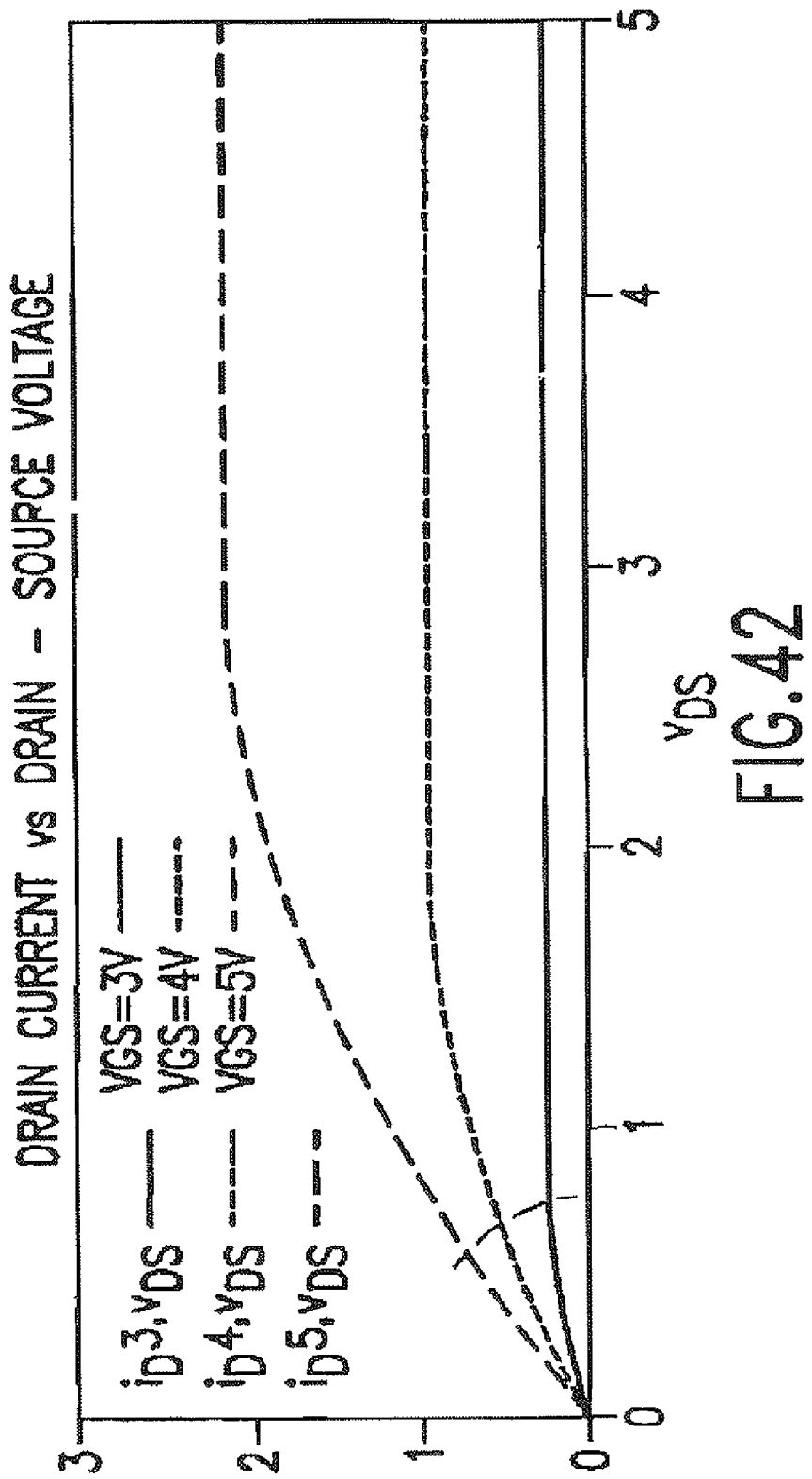
FIG. 42 is a plot of FET drain current as a function of drain-source voltage in embodiments of the invention.

FIG. 42 is a plot of drain current ($I_D$) as a function of drain-source voltage ($V_{DS}$) for three different gate-source voltages (i.e., Vgs equal to 3V, 4V, and 5V). As evident from the $i_D$ versus $v_{DS}$ plot in FIG. 42, the larger the gate-source voltage is, the larger the linear region (larger "ohmic" or "triode" region) is for $v_{DS}$. The linear region is represented by the sloped lines (linear resistances) just to the left of the knee of the curves. The drain current distorts when $v_{DS}$ starts swinging beyond the sloped line, into the knee of the curve.

Figure 43:
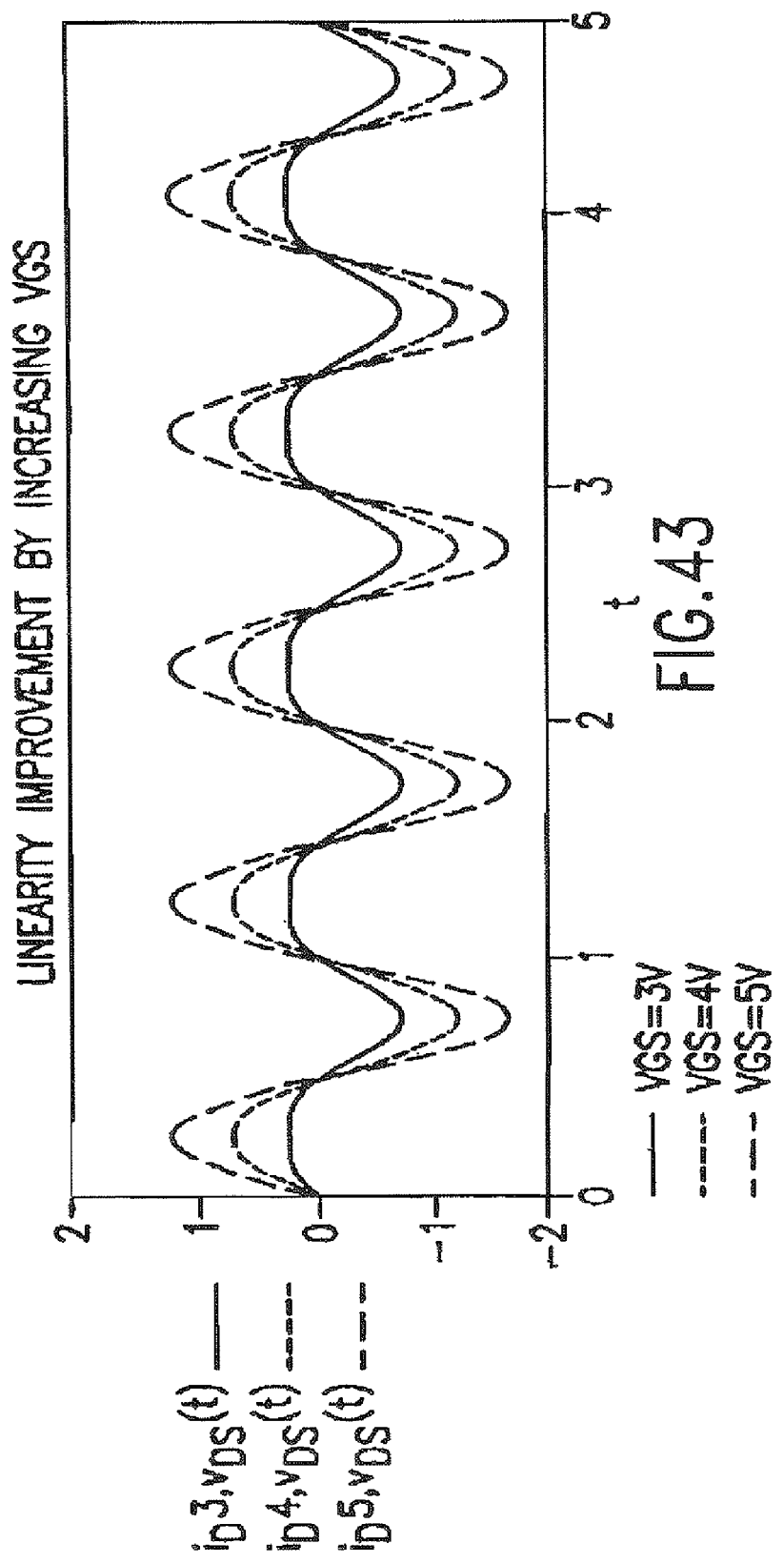
FIG. 43 illustrates how FET linearity is enhanced by increasing drain-source voltage in embodiments of the invention.

FIG. 43 is a plot of the drain current of a typical FET as a function of drain-source voltage and gate-source voltage. It illustrates how linearity is improved by increasing the gate-source voltage. Of particular note, FIG. 43 shows that a FET becomes increasingly linear with increasing $v_{GS}$.

FIG. 43 shows how the drain current of a FET distorts when a sinusoid $V_{DS}(t)$ is applied across the drain and source junction. Therefore, biasing the FET with a larger $V_{GS}$ improves linearity.

Figure 44:
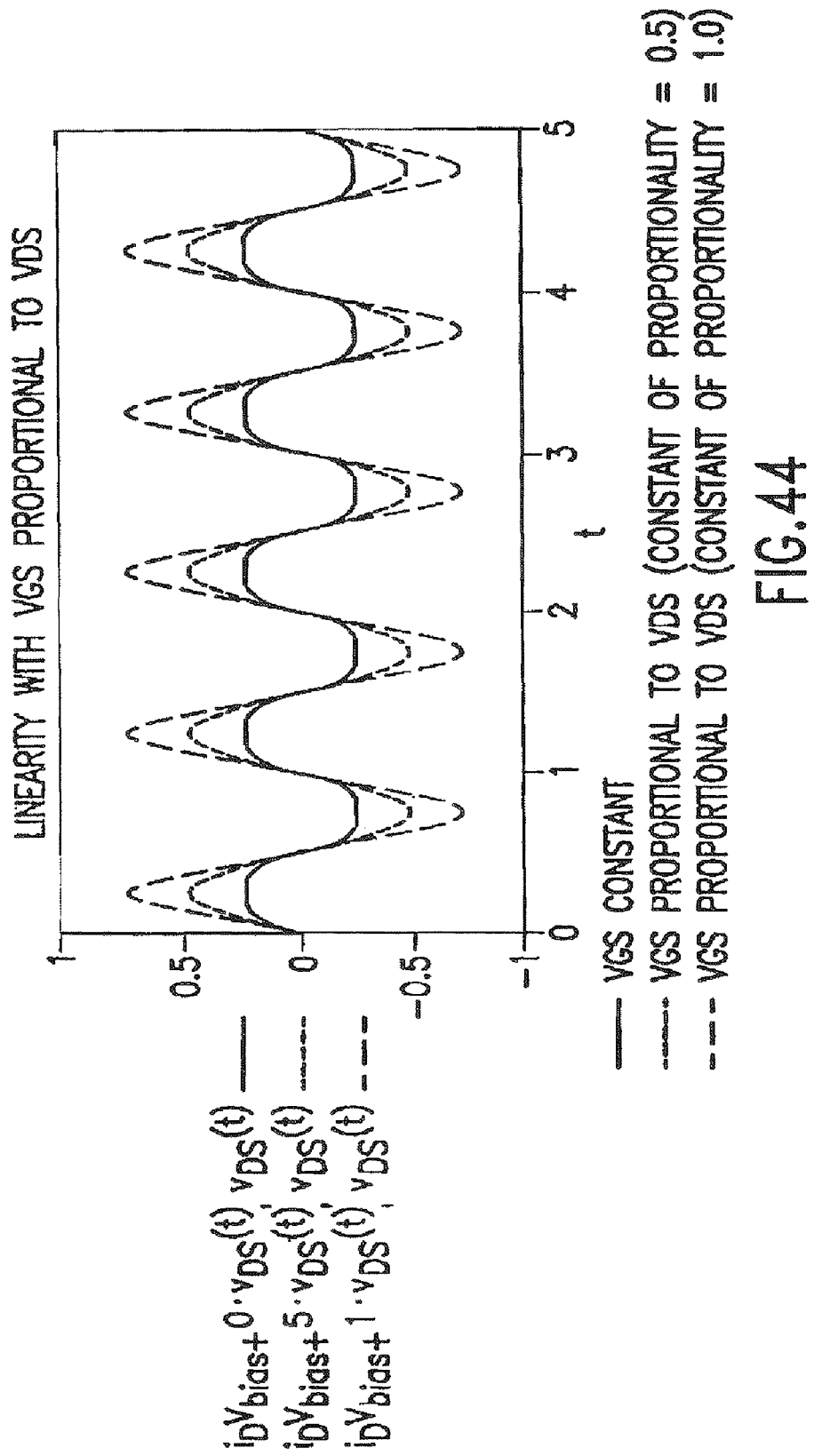
FIG. 44 illustrates how FET linearity is enhanced when gate-source voltage is made proportional to drain-source voltage in embodiments of the invention.
Figure 45A:
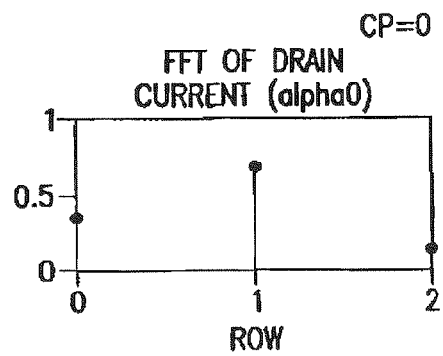
FIGS. 45A-E illustrates how FET drain current distortion is reduced in embodiments of the invention.
Figure 45B:
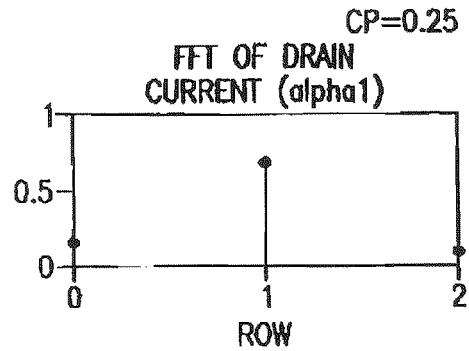
Figure 45C:
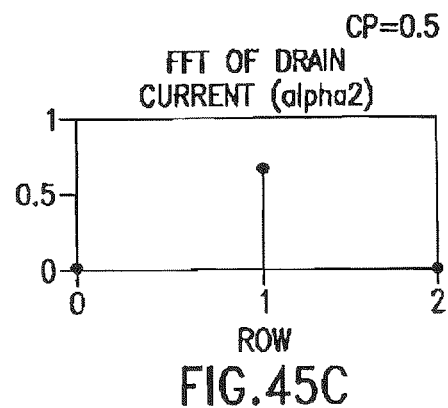
Figure 45D:
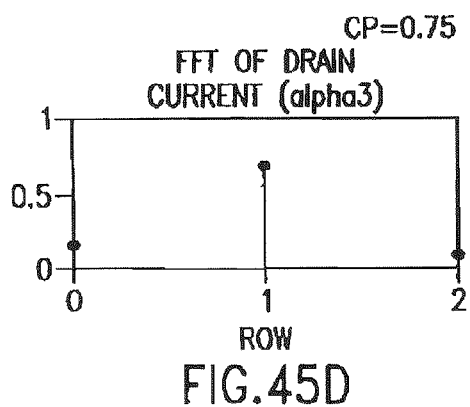
Figure 45E:
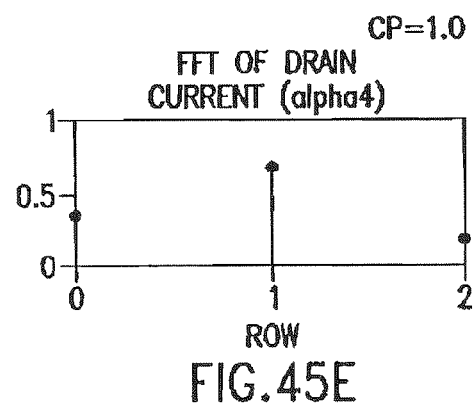

FIG. 44 illustrates what happens when, instead of having a large constant $V_{GS}$, $V_{GS}$ is made to change proportionally to $V_{DS}$. In FIG. 44, three different constants of proportionality have been plotted to illustrate what happens to the linearity when $V_{GS}$ is made to change proportionally to $V_{DS}$. Each of the curves is plotted with the same DC bias of 3 volts on $V_{GS}$. The first curve has a constant of proportionality of zero (i.e., no change of $V_{GS}$ with $V_{DS}$).

As illustrated by the curves in FIG. 44, in embodiments, one can get an additional, significant linearity improvement over the large and constant $V_{GS}$ case, if one makes $V_{GS}$ change proportionally to $V_{DS}$. Furthermore, as shown in FIG. 44, there is an optimum constant of proportionality (i.e., 0.5) in embodiments of the invention.

FIGS. 45A-E are plots of the FFTs of the FET drain currents for different constants of proportionality (CPs). These plots illustrate how second order distortion is affected when using different constants of proportionality. The second order distortion in FIG. 45A (PC=0) is −12.041 dBc. The second order distortion in FIG. 45B (PC=0.25) is −18.062 dBc. The second order distortion in FIG. 45C (PC=0.5) is −318.443 dBc. The second order distortion in FIG. 45D (PC=0.75) is −18.062 dBc. The second order distortion in FIG. 45E (PC=1) is −12.041 dBc.

The plots in FIGS. 45A-E show that there is a significant linearity improvement by making $V_{GS}$ change proportional to $V_{DS}$ over the case where $V_{GS}$ is constant. The optimum constant of proportionality is 0.5, or when $V_{GS}$ is proportional to $V_{DS}$ by a factor of 0.5. It can be shown that choosing constants of proportionality greater than 1 will make the FET linearity worse than having a constant $V_{GS}$ (PC=0). FIGS. 45A-E show, as expected, that the DC term increases as the second order distortion gets worse (i.e., second order distortion produces a DC term).

Figure 46:
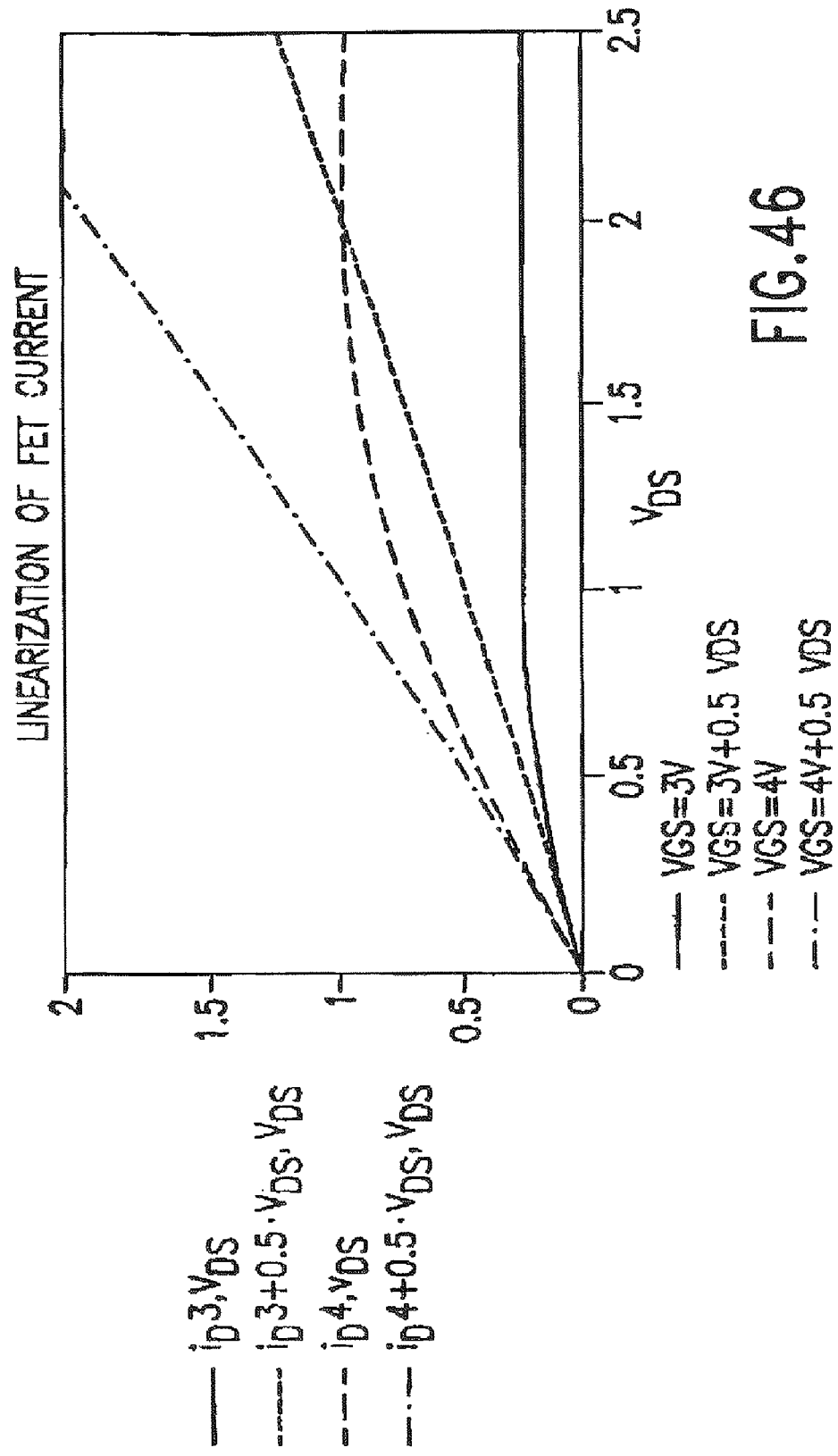
FIGS. 46-53 further illustrate how FET linearity is enhanced in embodiments of the invention.

FIG. 46 shows two sets of curves. One set of curves is a plot of the FET drain current with a constant $V_{GS}$. The other set of curves is a plot of the FET drain current with a $V_{GS}$ signal proportional to one half $V_{DS}$. The FET linearization effect can be seen in FIG. 46.

The FET linearization effect can also be seen mathematically by substituting $V_{GS}=V_{bias}+0.5V_{DS}$ into the FET's drain current equation above to obtain:

$$i_D(v_{DS}) = \begin{cases} K \cdot [2 \cdot [(V_{bias} + 0.5 \cdot v_{DS}) - V_t] \cdot v_{DS} - v_{DS}^2] & \text{if } v_{DS} \leq V_{bias} + 0.5 \cdot v_{DS} - V_t \\ [K \cdot (V_{bias} + 0.5 \cdot v_{DS} - V_t)^2] & \text{otherwise} \end{cases} \quad \text{EQ. (43)}$$

Simplifying this expression yields:

$$i_D(v_{DS}) := \begin{vmatrix} [2 \cdot K \cdot (V_{bias} - V_t)] \cdot v_{DS} & \text{if } v_{DS} \leq 2 \cdot (V_{bias} - V_t) \\ 0.25 \cdot K \cdot [v_{DS} + 2 \cdot (V_{bias} - V_t)]^2 & \text{otherwise} \end{vmatrix} \quad \text{EQ. (44)}$$

Thus, for $v_{DS}$ less than or equal to $2(V_{bias}-V_t)$, the drain current is a linear function of $v_{DS}$ with a slope of $2K(V_{bias}-V_t)$. In this region, making $V_{GS}$ equal to half of $V_{DS}$, cancels the square term $(V_{DS})^2$, leaving only linear terms.

As described herein, embodiments of the invention (see, for example, the embodiments illustrated in FIGS. 18A and 19) exhibit enhanced linearity properties. The enhanced linearity properties are achieved where:

(1) $|V_{GS}| \geq 0.5*Vdd$ (i.e., the instantaneous differential voltage $|V_{GS}|$ is made as large as possible for both NMOS and PMOS devices, thus ensuring that voltage differential $|V_{GS}|$ does not swing below $(0.5*Vdd)$), (2) $|V_{GS}|=|0.5*V_{DS}|+0.5*Vdd$ (i.e., as the RF signal across the drain and source gets larger, the voltage differential $|V_{GS}|$ gets larger by a proportionality factor of 0.5—when the RF signal gets large and one needs more linearity, $V_{GS}$ automatically increases to give more linearity), and/or (3) The drain and source of the NMOS and PMOS devices swap every half RF cycle so that (1) and (2) above are always satisfied.

If an amplitude imbalance occurs, for example, across the FETS in FIG. 19, it will degrade the 2nd order linearity performance of receiver 1902. This is because the amplitude imbalance will change the constant of proportionality relating $v_{GS}$ to $v_{DS}$ from the optimum value of 0.5 to some other value. However, the only amplitude imbalance possible is at RF because the configuration of receiver 1902 guarantees that the baseband waveform will have perfect phase and amplitude balance.

In addition to the advantages already described herein, additional advantages of receiver 1902 include: lower LO to RF reradiation, lower DC offset, and lower current (only one switch). Furthermore, the architecture of receiver 1902 ensures that the baseband differential signals will be amplitude and phase balanced, regardless of the imbalance at the input of the circuit at RF. This is because when the FET switch turns on, the two input capacitors are shorted together in series with a differential voltage across them. The capacitors have no ground reference and thus do not know there is an imbalance. As will be apparent to a person skilled in the relevant arts, the advantages to the configuration of receiver 1902 and UFD module 1938 are significant. In practice, the differential configuration of UFD 1938 has yielded high linearity that is repeatable.

In summary, to enhance the linearity of embodiments of the invention, one should:

(1) maintain the instantaneous voltage differential $V_{GS}$ as large as possible for both the NMOS and PMOS devices; and/or (2) make the voltage differential $V_{GS}$ change proportional to $V_{DS}$ so that $|V_{GS}|=V_{bias}+0.5*|V_{DS}|$.

The enhanced linearity features described herein are also applicable to single-switch embodiments of the invention. Consider, for example, the embodiment shown in FIG. 20E. For this embodiment, $V_{GS}$ increases with $V_{DS}$ over half of an RF cycle. During the other half of the cycle $V_{GS}$ is constant. During the half RF cycle that $V_{GS}$ does increase with $V_{DS}$, it increases at the same rate as $V_{DS}$. The magnitude of $V_{GS}$ is given by EQ. 45 and EQ. 46.

$$|V_{GS}|=|V_{DS}|+0.5*Vdd \text{ (for negative half of RF cycle)} \quad \text{EQ. (45)}$$

$$|V_{GS}|=0.5*Vdd \text{ (for positive half of RF cycle)} \quad \text{EQ. (46)}$$

FIGS. 47-53 further illustrate the enhanced linearity features of embodiments of the invention.

Figure 47:
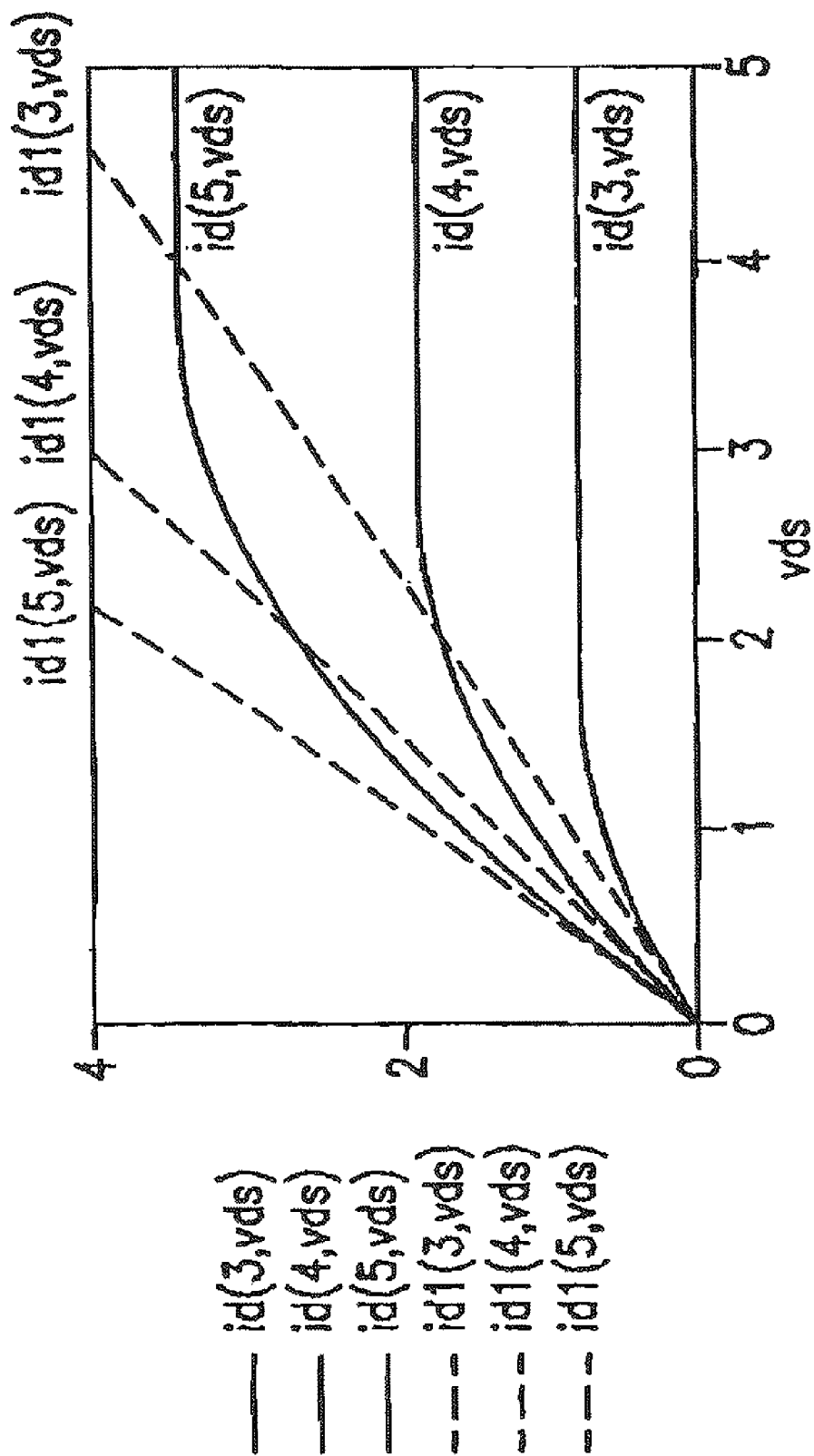

FIG. 47 shows additional plots that illustrate how the linearity of switching devices are enhance, for example, by the architecture of FIG. 19. FIG. 19 shows the current of the switching device when used according to the architecture of a conventional receiver and the architecture of receiver 1902. As described herein, the current of a typical FET switching device is given by EQ. 47 below, and the current of the FET switching device when used according to the embodiment shown in FIG. 19 is given by EQ. 48.

$$id(vgs, vds) := \begin{vmatrix} K \cdot [2 \cdot (vgs - vt) \cdot vds - vds^2] & \text{if } vds \leq vgs - vt \\ [K \cdot (vgs - vt)^2] & \text{otherwise} \end{vmatrix} \quad \text{EQ. (47)}$$

$$id1(vgs, vds) := \begin{vmatrix} K \cdot [2 \cdot (vgs + c \cdot vds - vt) \cdot vds - vds^2] & \text{if } vds \leq (vgs + c \cdot vds - vt) \\ [K \cdot (vgs + c \cdot vds - vt)^2] & \text{otherwise} \end{vmatrix} \quad \text{EQ. (48)}$$

where k=0.24, vt=1.2 volts, c=0.5, and Vds=0 to 5 volts.

FIG. 47 illustrates the current of a typical FET switching device when used in a conventional receiver (id), when used in receiver 1902 (id1), and when used in receiver 2002 (id2). EQ. 49 describes the current in a typical FET switching device. EQ. 50 describes the current in a FET of receiver 1902. EQ. 51 describes the current in a FET of receiver 2002.

$$id(vgs, vds, t) := \begin{vmatrix} K \cdot [2 \cdot (vgs - vt) \cdot vds(t) - vds(t)^2] & \text{if } vds(t) \leq vgs - vt \\ [K \cdot (vgs - vt)^2] & \text{otherwise} \end{vmatrix} \quad \text{EQ. (49)}$$

$$id2(vgs, vds, t) := \begin{vmatrix} K \cdot [2 \cdot (vgs + c \cdot vds(t) - vt) \cdot vds(t) - vds(t)^2] & \text{if } vds(t) \leq (vgs + c \cdot vds(t) - vt) \\ [K \cdot (vgs + c \cdot vds(t) - vt)^2] & \text{otherwise} \end{vmatrix} \quad \text{EQ. (50)}$$

where $c = 0.5$ $$id1(vgs, vds, t) := \begin{vmatrix} K \cdot [2 \cdot (vgs + c \cdot vds(t) - vt) \cdot vds(t) - vds(t)^2] & \text{if } vds(t) \le (vgs + c \cdot vds(t) - vt) \\ [K \cdot (vgs + c \cdot vds(t) - vt)^2] & \text{otherwise} \end{vmatrix} \quad \text{EQ. (51)}$$

where c=1.0

Figure 49:
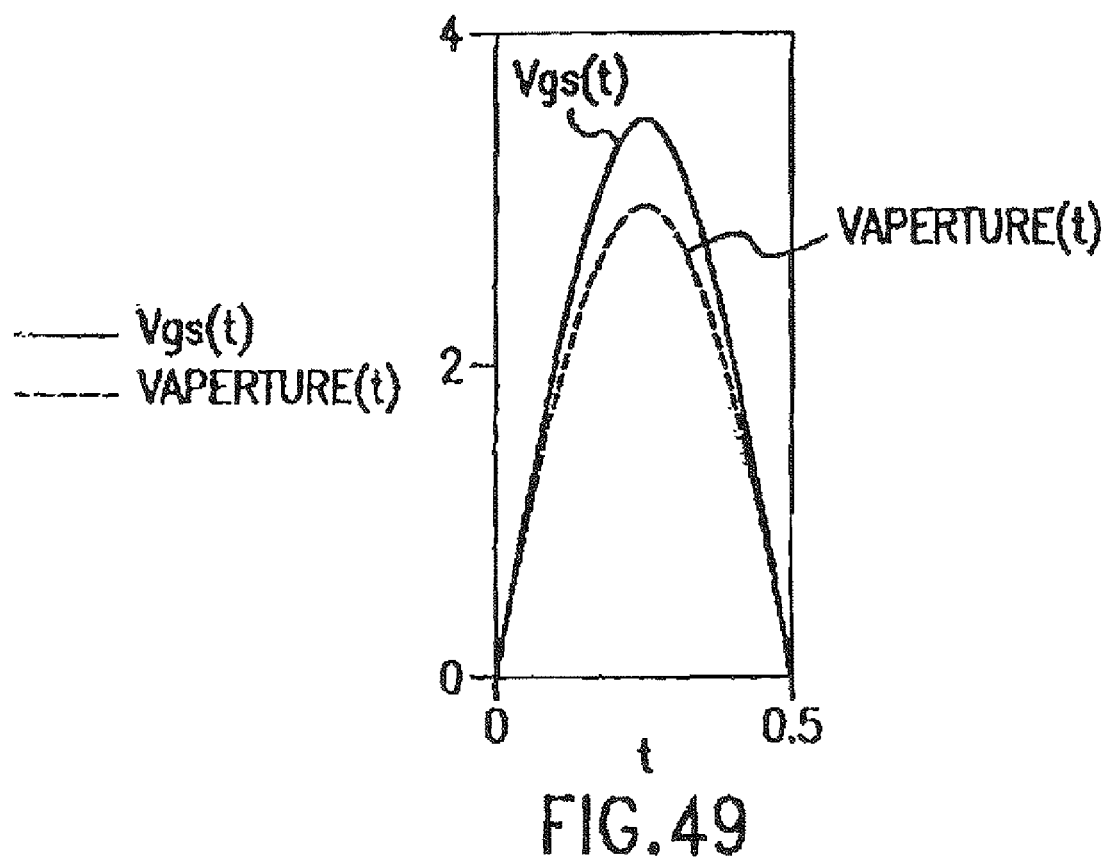

FIG. 49 illustrates the voltage relationship between Vgs and the aperture voltage for receiver 1902.

Figure 48:
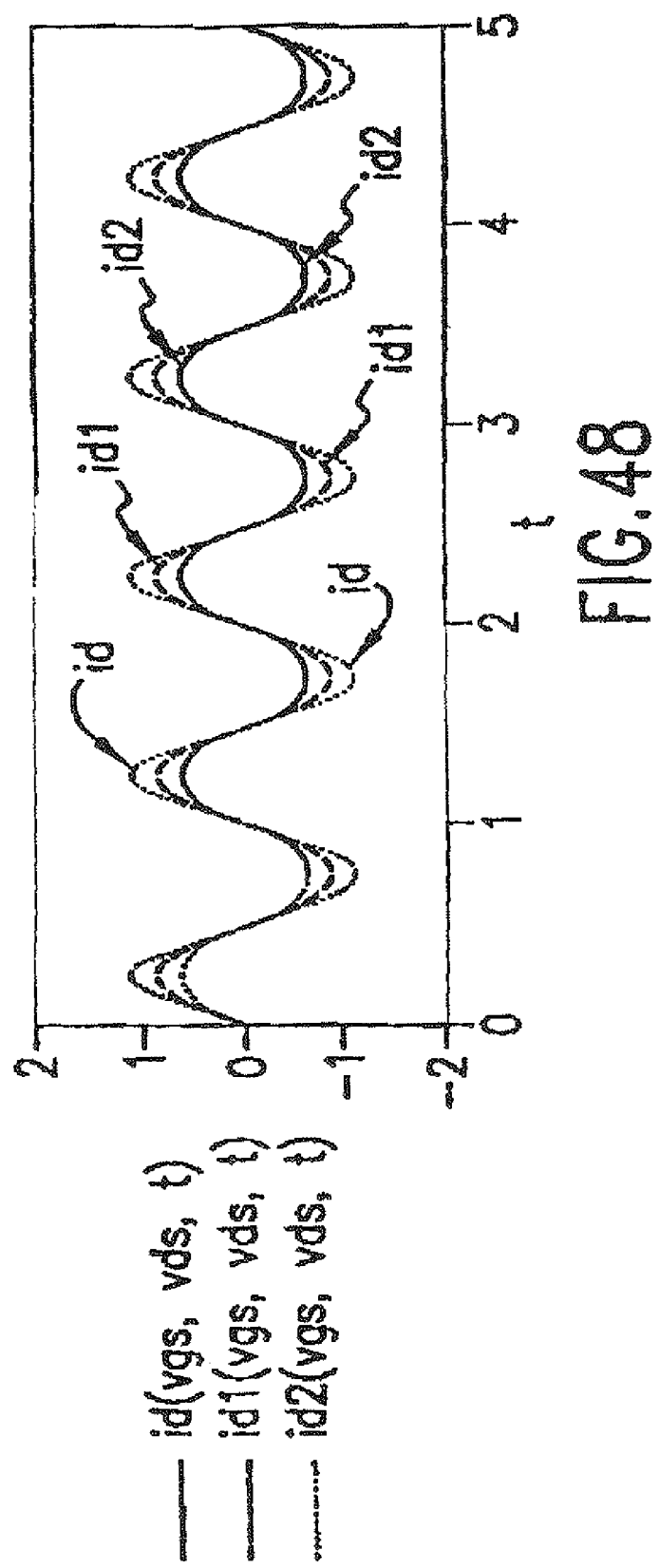
Figure 50:
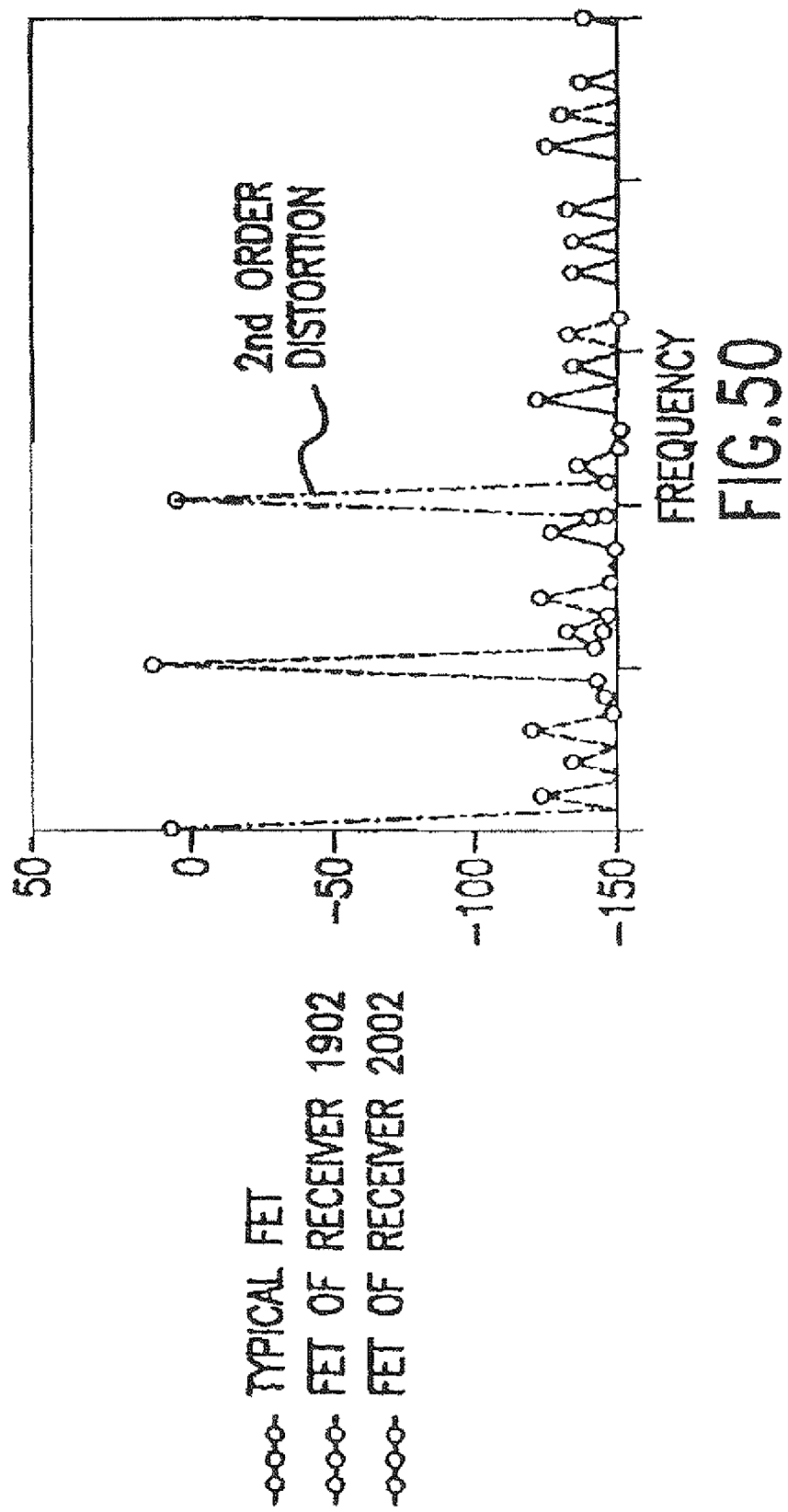
Figure 51:
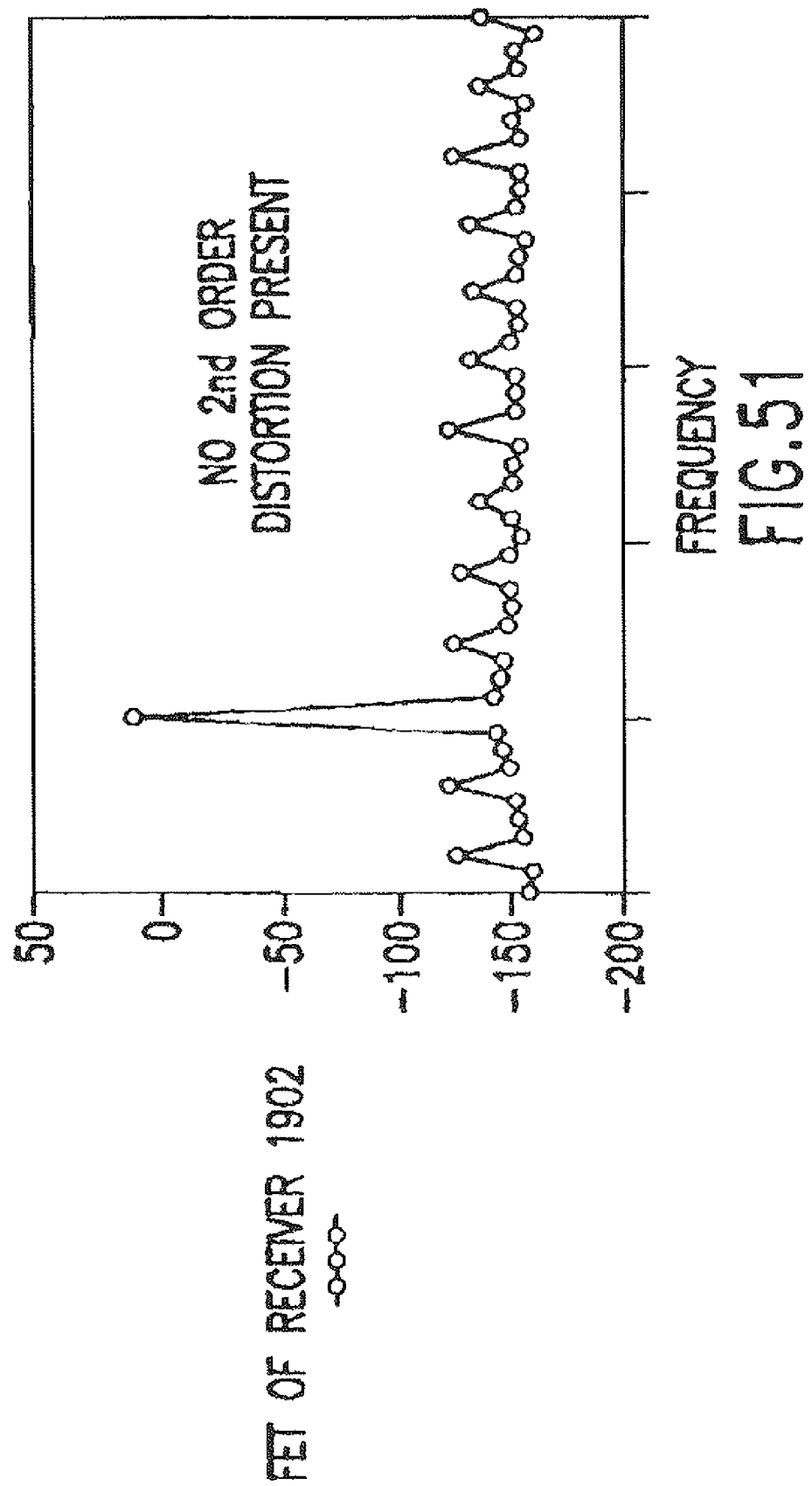
Figure 52:
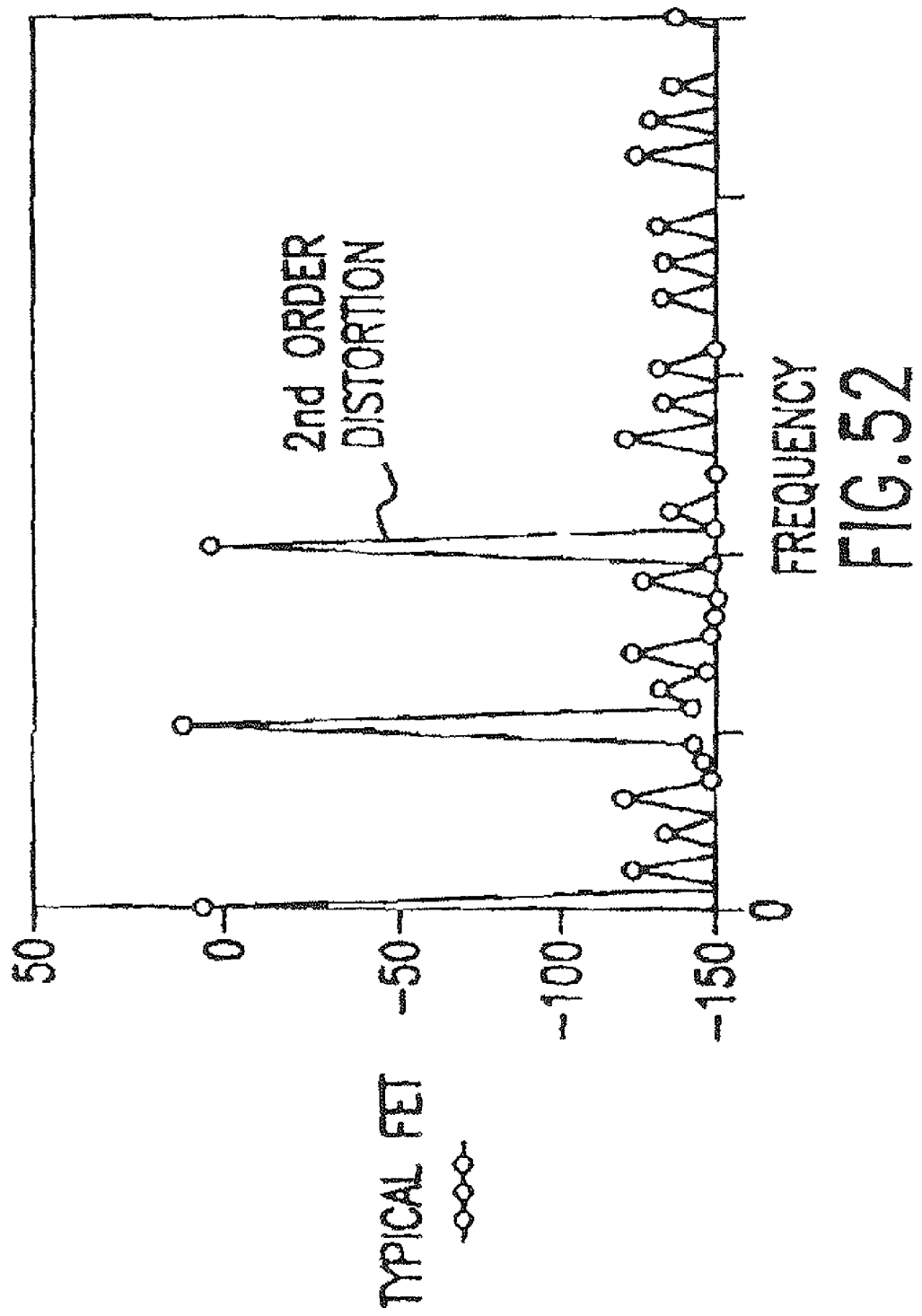
Figure 53:
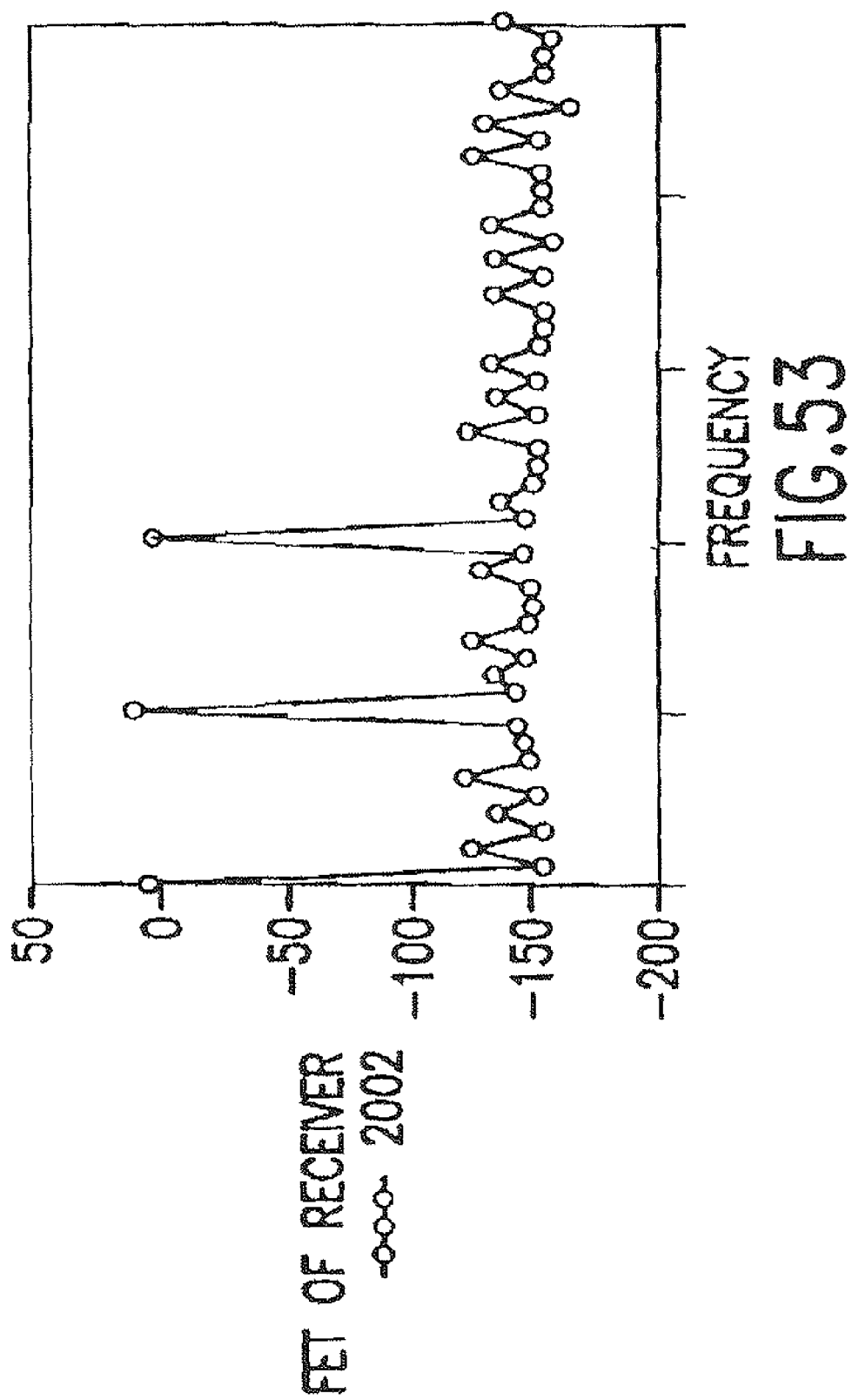

FIGS. 50-53 illustrate the frequency spectrums for the currents of FIG. 48. FIGS. 50-53 are logarithmic plots. FIG. 50 is a combined plot of the frequency spectrum for all three of the current plots of FIG. 48. FIG. 51 is a plot of the frequency spectrum for the current of a FET switching device of receiver 1902. FIG. 52 is a plot of the frequency spectrum for the current of a FET switching device of receiver a typical FET switching device. FIG. 53 is a plot of the frequency spectrum for the current of a FET switching device of receiver 2002. As can be seen in the plots, there is an absence of second order distortion for the FET switching device of receiver 1902.

As will be understood by a person skilled in the relevant arts, these plots herein demonstrate the enhanced linearity features of embodiments of the invention.

5. EXAMPLE METHOD EMBODIMENT OF THE INVENTION

Figure 62:
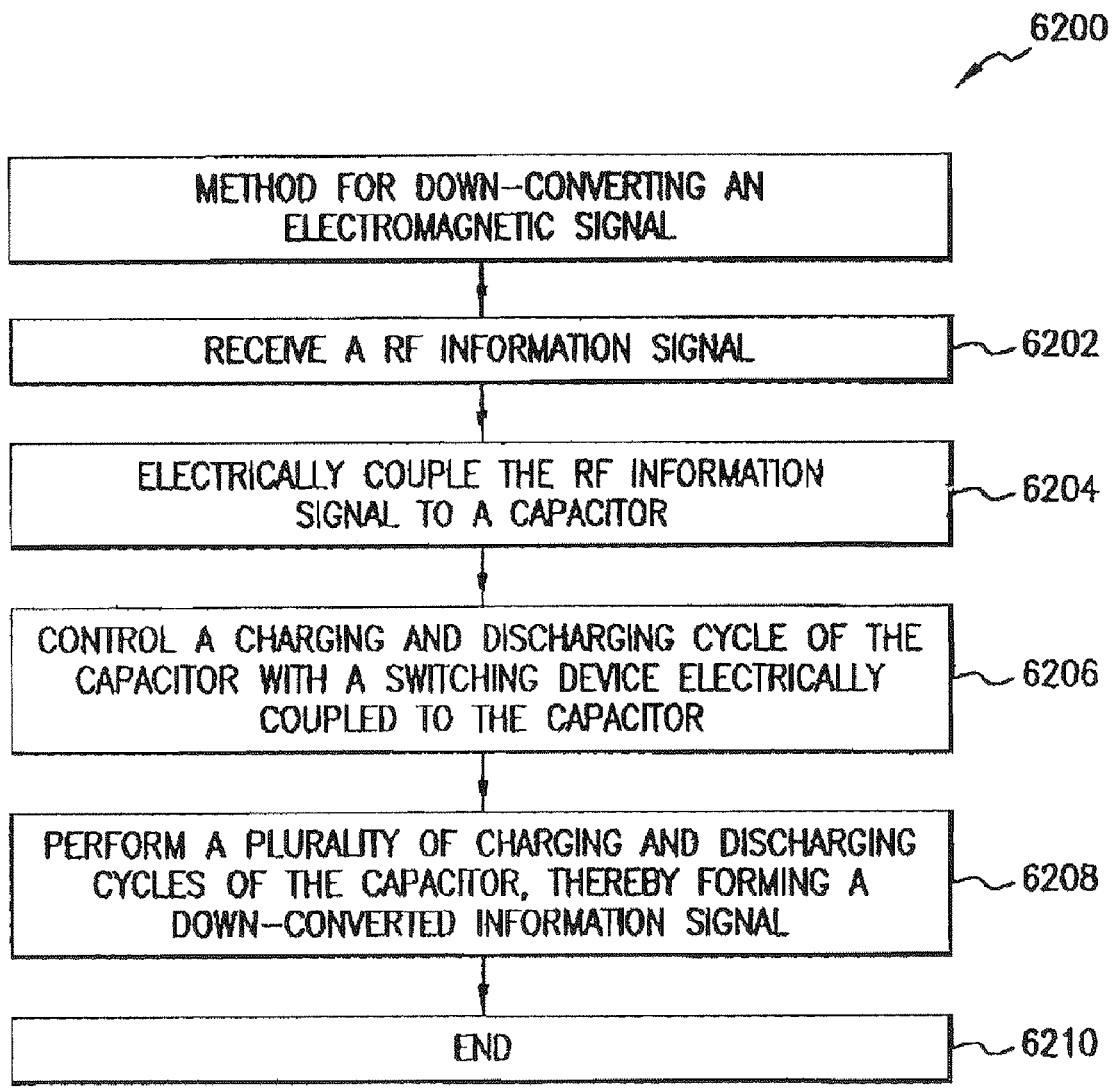
FIG. 62 illustrates a flowchart of a method for down-converting an electromagnetic signal according to an embodiment of the present invention.

FIG. 62 illustrates a flowchart of a method 6200 for down-converting an electromagnetic signal according to an embodiment of the present invention. This method can be implemented using any of the receiver and/or transceiver embodiments of the present invention described herein. Method 6200 is described with reference to the embodiment illustrated in FIG. 16O. As described below, method 6200 comprises five steps.

In step 6202, a RF information signal is received. The RF signal can be received by any known means, for example, using an antenna or a cable. In embodiments, the RF signal may be amplified using a low-noise amplifier and/or filtered after it is received. These steps, however, are not required in accordance with method 6200.

In step 6204, the received RF information signal is electrically coupled to a capacitor. For the receiver shown in FIG. 16O, the RF signal is electrically coupled to the carrier(+) port of receiver 1602 and capacitor 1604. When used herein, the phrase "A is electrically coupled to B" does not foreclose the possibility that there may be other components physically between A and B. For receiver 1602, the received RF signal is inverted (e.g., using an inverter as shown in FIG. 17), and the inverted RF signal is coupled to the carrier(−) port and capacitor 1606. In embodiments (e.g., 2001), there is no need to invert the received RF information signal. Thus, the step of inverting the received RF signal is not required in accordance with method 6200.

In accordance with method 6200, the RF information signal may also be electrically coupled to a capacitor using a switching device coupled to the capacitor. For example, for receiver 1688 shown in FIG. 16H, the received RF signal is coupled to capacitor 1604 through switching device 1608. Similarly, the inverted RF signal is coupled to capacitor 1606 through switching device 1610. Thus, as will be understood by a person skilled in the relevant arts, two or more devices can be electrically coupled yet not physically coupled.

In step 6206, a switching device, electrically coupled to the capacitor, is used to control a charging and discharging cycle of the capacitor. In FIG. 16O, switching device 1608 is used to control the charging and discharging of capacitor 1604. As described above, when switching device 1608 is closed, the RF signal coupled to capacitor 1604 causes a charge to be stored on capacitor 1604. This charging cycle is control by the apertures of control signal 1646, as described herein. During a period of time that switching device 1608 is open (i.e., between the apertures of control signal 1646), a percentage of the total charge stored on capacitor 1604 is discharged. As described herein, capacitor 1604 is sized in accordance with embodiments of the invention to discharge between about six percent to about fifty percent of the total charge stored therein during a period of time that switching device 1608 is open (although other ranges apply to other embodiments of the invention). In a similar manner, switching device 1614 is used to control the charging and discharging of capacitor 1606 so that between about six percent to about fifty percent of the total charge stored therein is discharged during a period of time that switching device 1610 is open.

In step 6208, a plurality of charging and discharging cycles of the capacitor is performed in accordance with the techniques and features of the invention described herein, thereby forming a down-converted information signal. The number of charging and discharging cycles needed to down-convert a received information signal is dependent on the particular apparatus used and the RF signal received, as well as other factors. Method 6200 ends at step 6210 when the received RF information signal has been down-converted using the techniques and features of the invention described herein.

In embodiments of the invention, the down-converted signal has a carrier signal riding on top of the down-converted signal. Thus, as described herein, this carrier signal can be removed, for example, by filtering the down-converted signal or by amplifying the down-converted signal with a band-limited amplifier. For the embodiment of the invention shown in FIG. 16O, the carrier signal riding on the down-converted signal is removed using amplifiers 1620 and 1624. As will be understood by a person skilled in the relevant arts, amplifiers 1620 and 1624 are intended to operate on signals having a lower range of frequencies than carrier signals. Thus, amplifiers 1620 and 1624 act as filters to a carrier signal riding on top of a down converted signal. In embodiments of the invention, a low pass filter is used to remove the carrier signal as described herein, and as would be known to a person skilled in the relevant arts.

6. CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for down-converting an electromagnetic signal, comprising:
   (1) receiving an RF information signal;
   (2) electrically coupling the RF information signal to a capacitor according to a control signal operating at an aliasing rate selected so that energy of the RF information signal is sampled and applied to the capacitor at a frequency that is equal to or less than twice the frequency of the RF information signal; and
   (3) controlling a charging and discharging cycle of the capacitor using the control signal to control a switching device electrically coupled to the capacitor so that the energy transferred from the RF information signal to the capacitor directly forms a down-converted signal.

2. The method according to claim 1, further comprising amplifying said down-converted signal.

3. The method according to claim 1, further comprising generating a control signal to control said switching device.

4. The method according to claim 3, wherein said control signal comprises a train of pulses, each pulse having a first and a second edge.

5. The method according to claim 1, wherein said switching device closes on the first edge of each pulse.

6. The method according to claim 5, wherein said switching device opens on the second edge of each pulse.

7. The method according to claim 1, wherein energy from said RF information signal is stored in said capacitor when said switching device is closed.

* * * * *